United States Patent
Umezaki

(10) Patent No.: US 10,325,932 B2
(45) Date of Patent: *Jun. 18, 2019

(54) SEMICONDUCTOR DEVICE, AND DISPLAY DEVICE AND ELECTRONIC DEVICE HAVING THE SAME

(71) Applicant: Semiconductor Energy Laboratory Co., Ltd., Kanagawa-ken (JP)

(72) Inventor: Atsushi Umezaki, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 178 days.

This patent is subject to a terminal disclaimer.

(21) Appl. No.: 15/222,378

(22) Filed: Jul. 28, 2016

(65) Prior Publication Data

US 2017/0033125 A1    Feb. 2, 2017

Related U.S. Application Data

(63) Continuation of application No. 14/143,535, filed on Dec. 30, 2013, now Pat. No. 9,406,699, which is a
(Continued)

(30) Foreign Application Priority Data

Jan. 7, 2006  (JP) ................................ 2006-001941

(51) Int. Cl.
*G11C 19/00*  (2006.01)
*H01L 27/12*  (2006.01)
(Continued)

(52) U.S. Cl.
CPC ........ *H01L 27/124* (2013.01); *G02F 1/13624* (2013.01); *G09G 3/20* (2013.01);
(Continued)

(58) Field of Classification Search
None
See application file for complete search history.

(56) References Cited

U.S. PATENT DOCUMENTS 5,410,583 A   4/1995  Weisbrod et al.
5,812,284 A   9/1998  Mizutani et al.
(Continued)

FOREIGN PATENT DOCUMENTS

CN   001553455 A   12/2004
EP   0 535 569 A2   4/1993
(Continued)

OTHER PUBLICATIONS

Jang, Y.H. et al., "P-5: A-Si TFT Integrated Gate Driver With AC-Driven Single Pull-Down Structure," SID Digest '06: SID International Symposium Digest of Technical Papers, Jun. 6, 2006, vol. 37, pp. 208-211.
(Continued)

*Primary Examiner* — Tuan T Lam
(74) *Attorney, Agent, or Firm* — Husch Blackwell LLP

(57) ABSTRACT

An object is to provide a semiconductor device which can suppress characteristic deterioration in each transistor without destabilizing operation. In a non-selection period, a transistor is turned on at regular intervals, so that a power supply potential is supplied to an output terminal of a shift register circuit. A power supply potential is supplied to the output terminal of the shift register circuit through the transistor. Since the transistor is not always on in a non-selection period, a shift of the threshold voltage of the transistor is suppressed. In addition, a power supply potential is supplied to the output terminal of the shift register circuit through the transistor at regular intervals. Therefore, the shift register circuit can suppress noise which is generated in the output terminal.

21 Claims, 125 Drawing Sheets

Related U.S. Application Data continuation of application No. 11/649,876, filed on Jan. 4, 2007, now Pat. No. 8,742,811.

(51) Int. Cl.

| | | |
|---|---|---|
| *G02F 1/1362* | (2006.01) | |
| *G09G 3/20* | (2006.01) | |
| *G09G 3/325* | (2016.01) | |
| *G09G 3/36* | (2006.01) | |
| *G11C 19/28* | (2006.01) | |
| *H03K 19/003* | (2006.01) | |
| *H03K 3/356* | (2006.01) | |
| *G09G 3/3266* | (2016.01) | |
| *G09G 3/3258* | (2016.01) | |

(52) U.S. Cl.
CPC ............ *G09G 3/325* (2013.01); *G09G 3/3674* (2013.01); *G11C 19/28* (2013.01); *H01L 27/1214* (2013.01); *H03K 3/356* (2013.01); *H03K 3/356104* (2013.01); *H03K 19/00369* (2013.01); *G09G 3/3258* (2013.01); *G09G 3/3266* (2013.01); *G09G 3/3677* (2013.01); *G09G 3/3696* (2013.01); *G09G 2300/0408* (2013.01); *G09G 2300/0809* (2013.01); *G09G 2310/0286* (2013.01); *G09G 2310/0289* (2013.01); *G09G 2310/0297* (2013.01); *G09G 2310/08* (2013.01); *G09G 2330/021* (2013.01)

(56) References Cited

U.S. PATENT DOCUMENTS

| | | | |
|---|---|---|---|
| 5,949,398 A | 9/1999 | Kim | |
| 6,052,426 A | 4/2000 | Maurice | |
| 6,144,466 A | 11/2000 | Mizutani et al. | |
| 6,300,928 B1 | 10/2001 | Kim | |
| 6,380,687 B1 | 4/2002 | Yamazaki | |
| 6,426,743 B1 | 7/2002 | Yeo et al. | |
| 6,552,496 B2 | 4/2003 | Yamazaki | |
| 6,556,646 B1 | 4/2003 | Yeo et al. | |
| 6,611,248 B2 | 8/2003 | Kanbara et al. | |
| 6,690,347 B2 | 2/2004 | Jeon et al. | |
| 6,774,573 B2 | 8/2004 | Yamazaki | |
| 6,845,140 B2 | 1/2005 | Moon et al. | |
| 6,850,090 B2 | 2/2005 | Aoki | |
| 6,885,723 B2 | 4/2005 | Yu | |
| 6,928,135 B2 | 8/2005 | Sasaki et al. | |
| 6,975,142 B2 | 12/2005 | Azami et al. | |
| 7,023,410 B2 | 4/2006 | Lee et al. | |
| 7,202,863 B2 | 4/2007 | Kimura et al. | |
| 7,203,264 B2 | 4/2007 | Lo et al. | |
| 7,256,422 B2 | 8/2007 | Yamazaki | |
| 7,289,096 B2 | 10/2007 | Jeon et al. | |
| 7,317,779 B2 | 1/2008 | Moon et al. | |
| 7,327,161 B2 * | 2/2008 | Jang | G11C 19/287 326/46 |
| 7,336,254 B2 | 2/2008 | Iwasaki et al. | |
| 7,405,716 B2 | 7/2008 | Lee et al. | |
| RE40,673 E | 3/2009 | Kanbara et al. | |
| 7,548,027 B2 | 6/2009 | Yamazaki | |
| 7,586,478 B2 | 9/2009 | Azami et al. | |
| 7,646,841 B2 | 1/2010 | Moon et al. | |
| 7,903,079 B2 | 3/2011 | Azami et al. | |
| 8,102,340 B2 | 1/2012 | Lee et al. | |
| 8,107,586 B2 * | 1/2012 | Shin | G09G 3/3677 377/64 |
| 8,284,151 B2 | 10/2012 | Azami et al. | |
| 8,659,532 B2 | 2/2014 | Azami et al. | |
| 8,742,811 B2 | 6/2014 | Umezaki | |
| 2002/0158666 A1 | 10/2002 | Azami et al. | |
| 2002/0167026 A1 | 11/2002 | Azami et al. | |
| 2002/0190326 A1 | 12/2002 | Nagao et al. | |
| 2003/0020520 A1 | 1/2003 | Miyake et al. | |
| 2003/0052848 A1 | 3/2003 | Yamaguchi | |
| 2003/0231735 A1 | 12/2003 | Moon et al. | |
| 2004/0028172 A1 * | 2/2004 | Yu | G11C 19/00 377/64 |
| 2004/0140839 A1 | 7/2004 | Nagao et al. | |
| 2004/0165692 A1 * | 8/2004 | Moon | G09G 3/20 377/64 |
| 2004/0253781 A1 | 12/2004 | Kimura et al. | |
| 2005/0001805 A1 * | 1/2005 | Jeon | G02F 1/136286 345/92 |
| 2005/0062515 A1 | 3/2005 | Nagao et al. | |
| 2005/0220262 A1 * | 10/2005 | Moon | G11C 19/00 377/64 |
| 2006/0001637 A1 | 1/2006 | Pak et al. | |
| 2006/0146978 A1 * | 7/2006 | Jang | G09G 3/3677 377/64 |
| 2008/0012816 A1 | 1/2008 | Moon | |
| 2014/0159045 A1 | 6/2014 | Azami et al. | |

FOREIGN PATENT DOCUMENTS

| | | |
|---|---|---|
| EP | 0 651 395 A2 | 5/1995 |
| EP | 0 801 376 A2 | 10/1997 |
| EP | 1 065 723 A2 | 1/2001 |
| EP | 1 160 796 A2 | 12/2001 |
| EP | 1 231 594 A1 | 8/2002 |
| EP | 1 253 718 A1 | 10/2002 |
| EP | 1 445 862 A2 | 8/2004 |
| EP | 1 684 310 A1 | 7/2006 |
| JP | 58-182196 A | 10/1983 |
| JP | 05-267636 A | 10/1993 |
| JP | 07-182891 A | 7/1995 |
| JP | 10-031202 A | 2/1998 |
| JP | 2000-155550 A | 6/2000 |
| JP | 2001-076868 A | 3/2001 |
| JP | 2001-350438 A | 12/2001 |
| JP | 2002-328643 A | 11/2002 |
| JP | 2003-066868 A | 3/2003 |
| JP | 2003-163586 A | 6/2003 |
| JP | 2004-078172 A | 3/2004 |
| JP | 2004-524639 | 8/2004 |
| JP | 2004-246358 A | 9/2004 |
| JP | 2005-522734 | 7/2005 |
| JP | 2005-285168 A | 10/2005 |
| JP | 2006-024350 A | 1/2006 |
| JP | 5164383 B2 | 3/2013 |
| JP | 5371158 B2 | 12/2013 |
| JP | 5371161 B1 | 12/2013 |
| JP | 2014-032737 A | 2/2014 |
| JP | 2014-160533 A | 9/2014 |
| WO | WO 1995/031804 A1 | 11/1995 |
| WO | WO 2002/065062 A2 | 8/2002 |
| WO | WO 2003/087921 A2 | 10/2003 |
| WO | WO 2004/006435 A1 | 1/2004 |
| WO | WO 2007/080813 A1 | 7/2007 |

OTHER PUBLICATIONS

International Search Report re Application No. PCT/JP2006/326348, dated Mar. 20, 2007.

Written Opinion re Application No. PCT/JP2006/326348, dated Mar. 20, 2007.

* cited by examiner

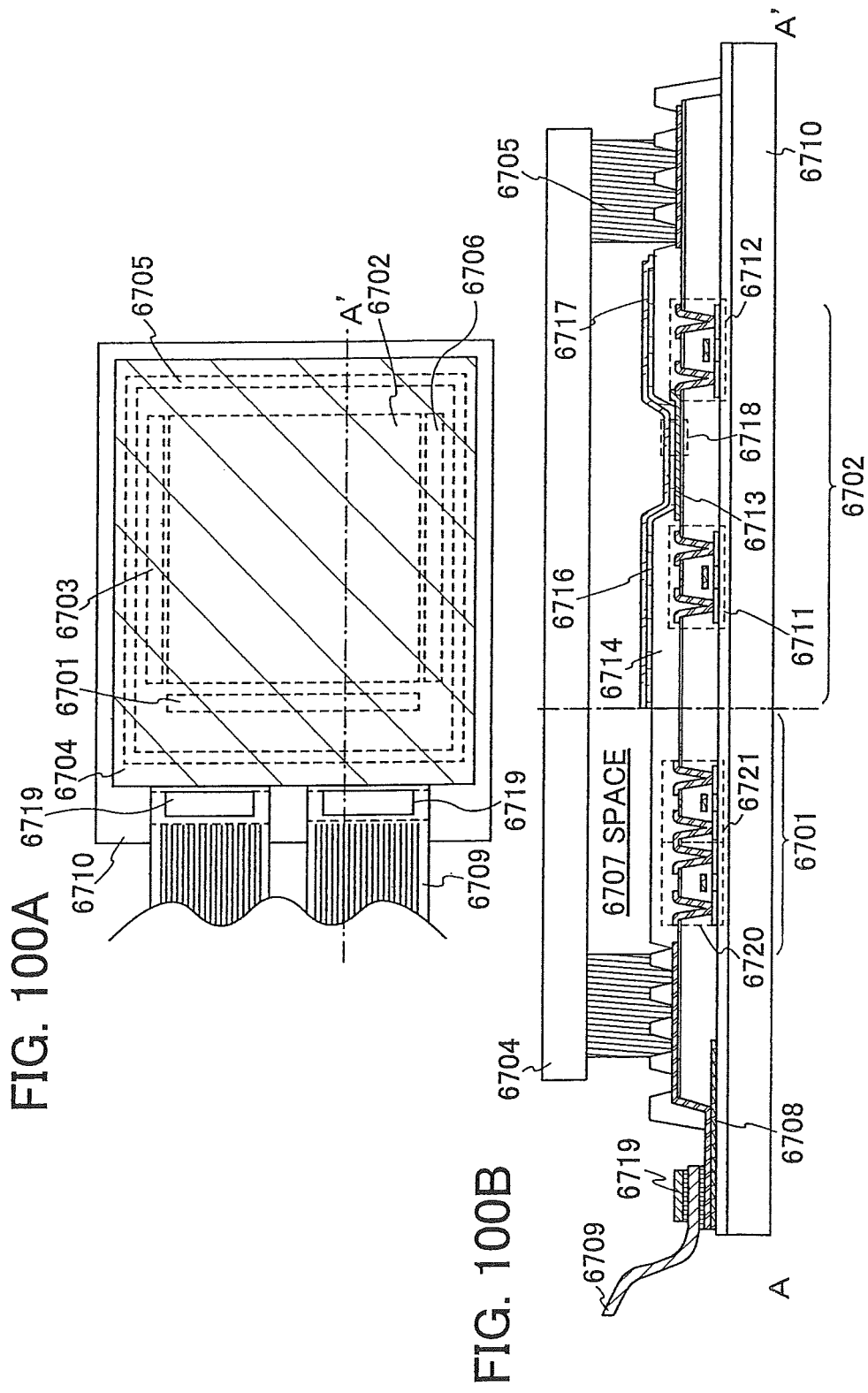

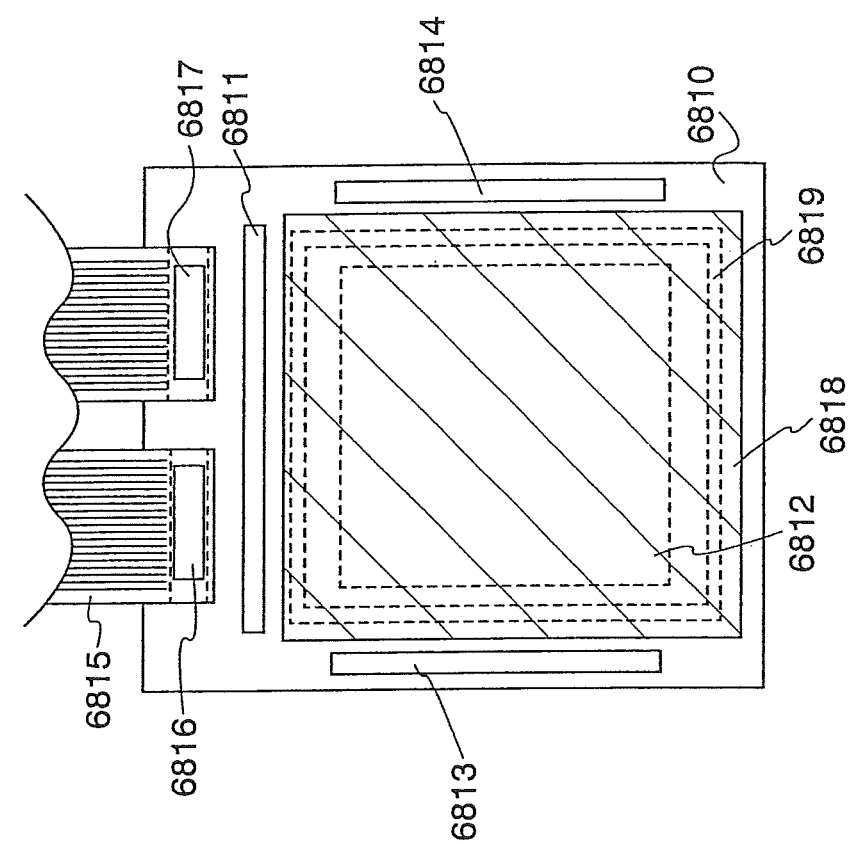
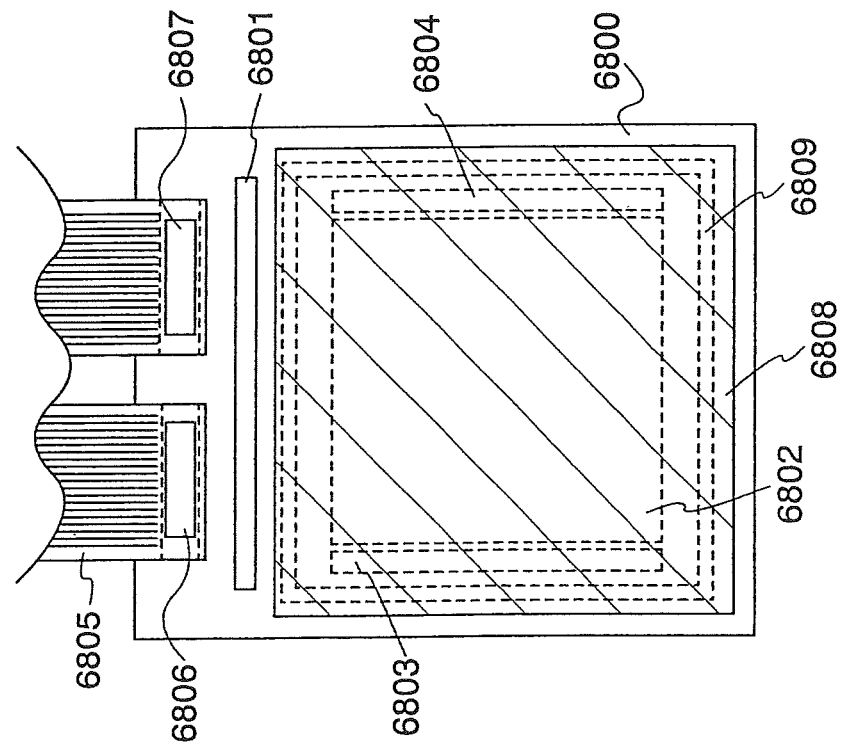

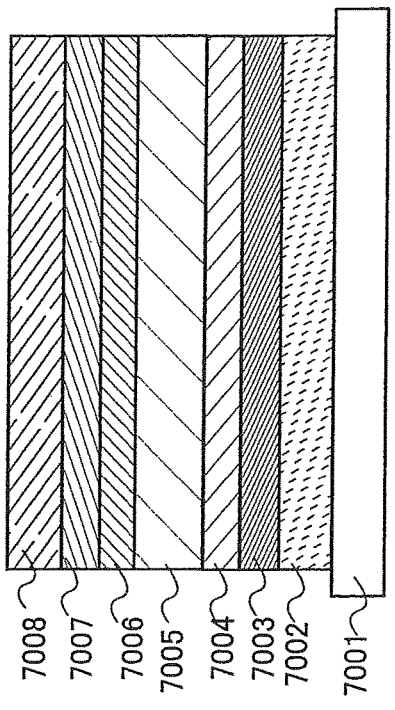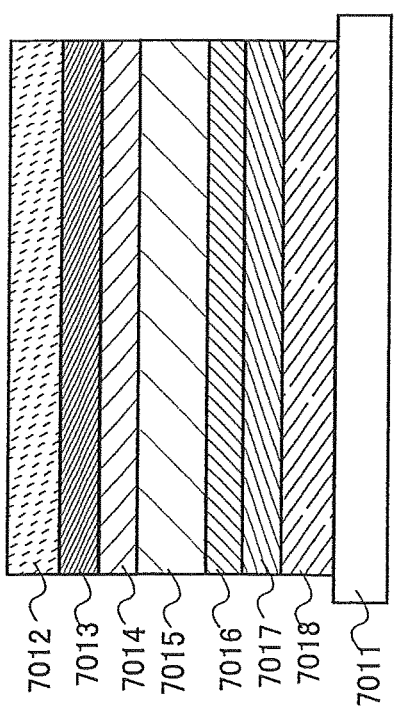
FIG. 103A
FIG. 103B

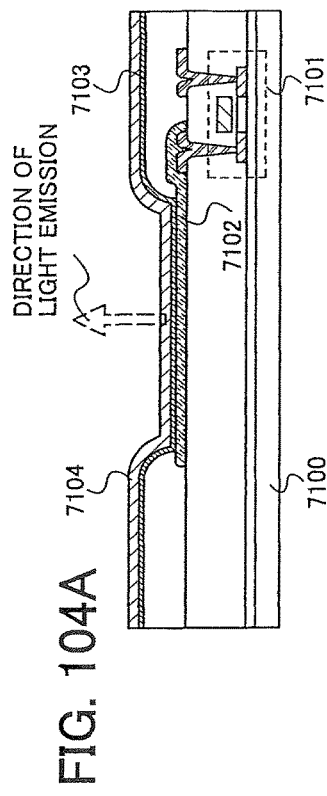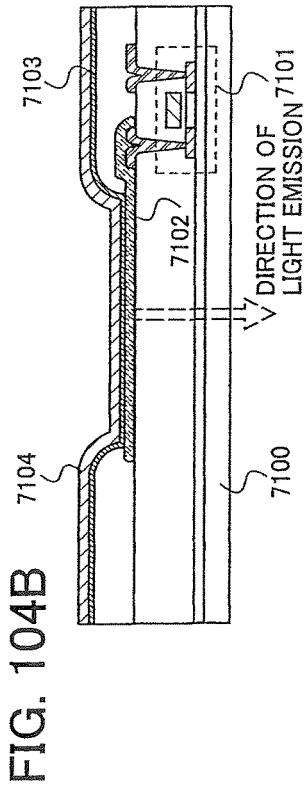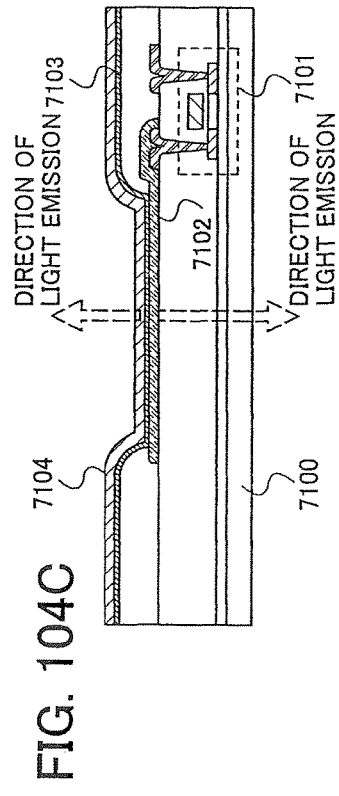

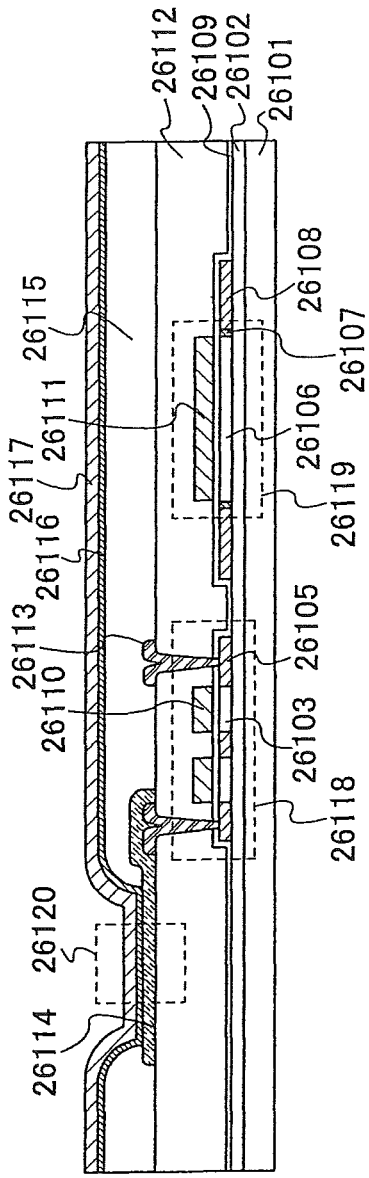
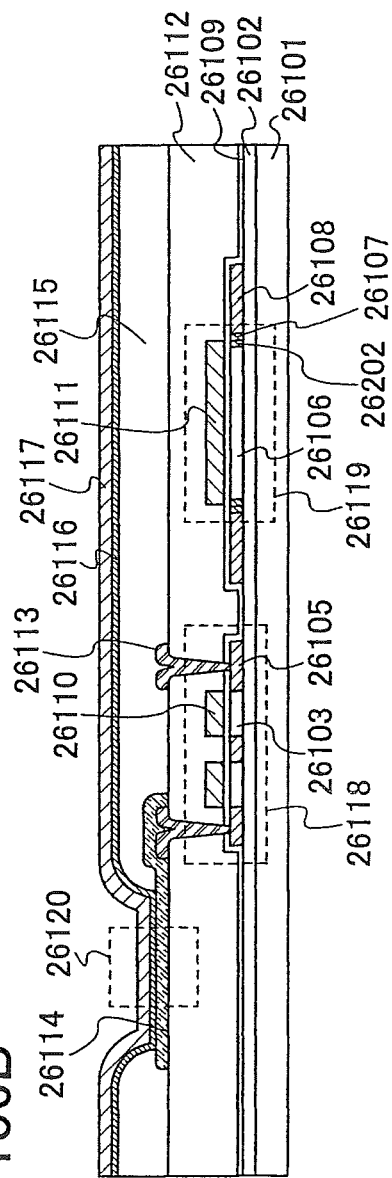
FIG. 106A
FIG. 106B

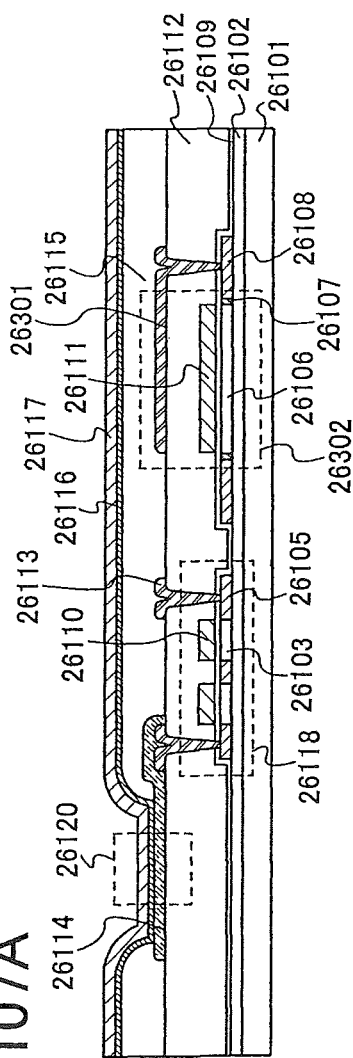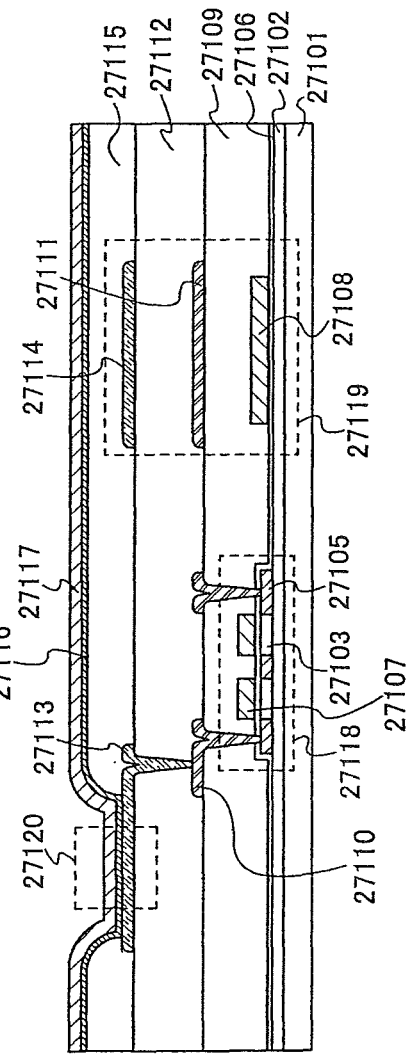

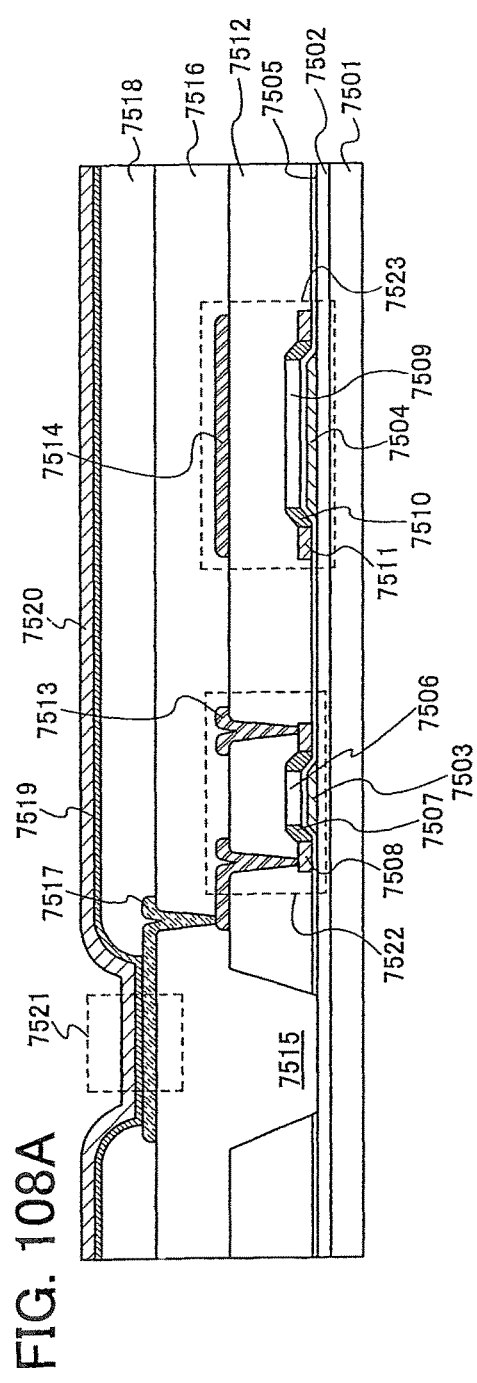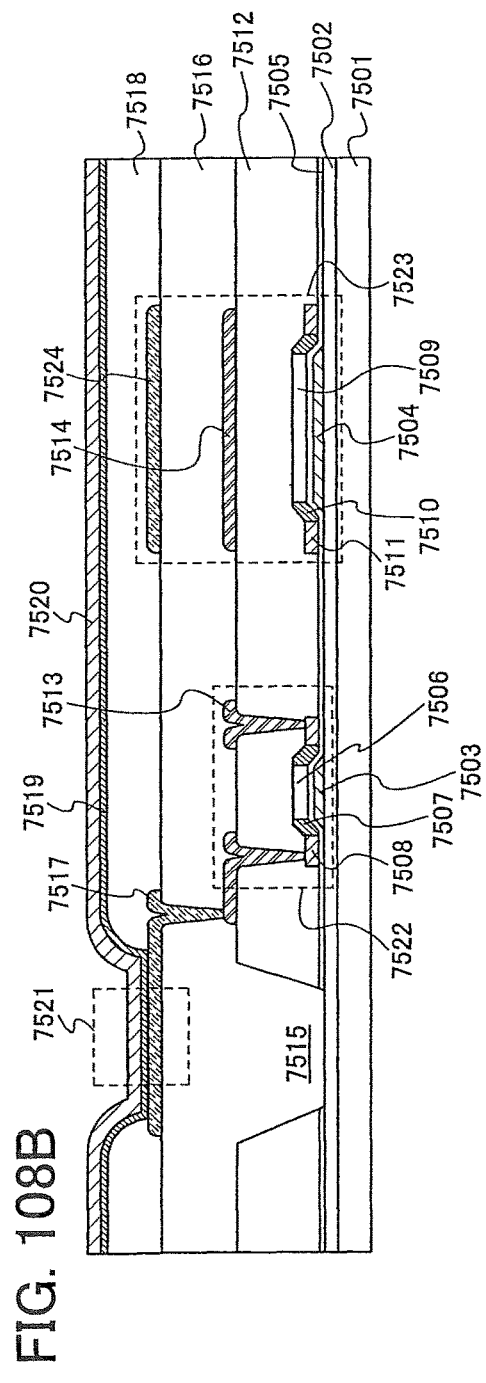

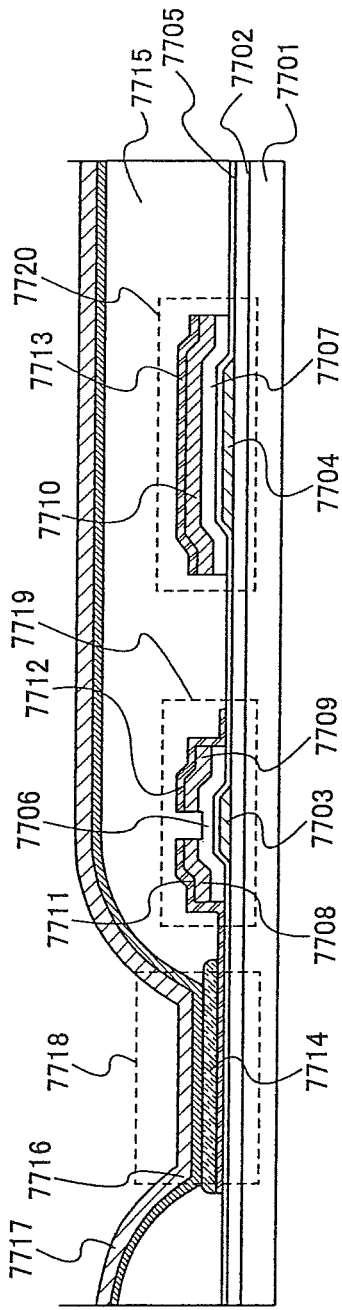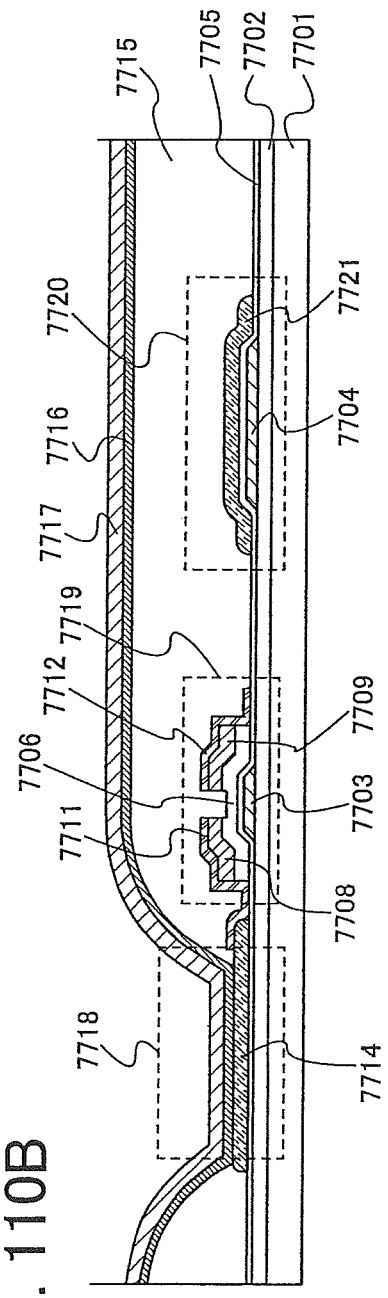

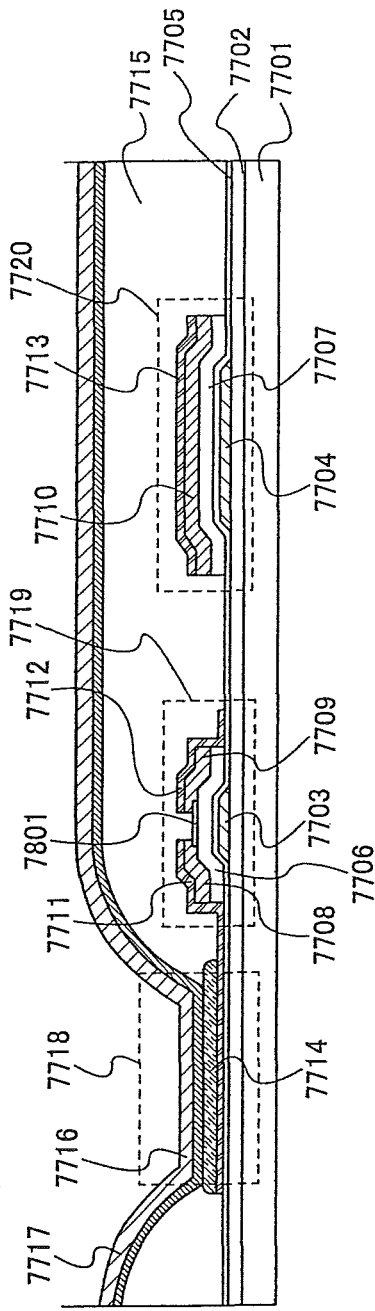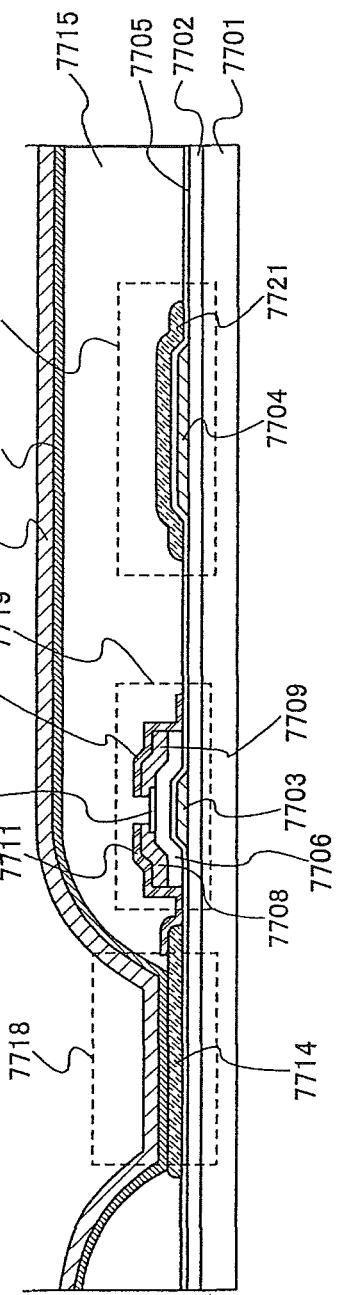
FIG. 111A
FIG. 111B

SEMICONDUCTOR DEVICE, AND DISPLAY DEVICE AND ELECTRONIC DEVICE HAVING THE SAME

This application is a continuation of U.S. application Ser. No. 14/143,535 filed on Dec. 30, 2013 (now U.S. Pat. No. 9,406,699 issued Aug. 2, 2016) which is a continuation of U.S. application Ser. No. 11/649,876 filed on Jan. 4, 2007 (now U.S. Pat. No. 8,742,811 issued Jun. 3, 2014), which are all incorporated herein by reference.

TECHNICAL FIELD

The present invention relates to a semiconductor device. In particular, the invention relates to a shift register which is formed by using transistors. In addition, the invention relates to a display device having the semiconductor device and an electronic device having the display device.

BACKGROUND ART

In recent years, since a large display device such as a liquid crystal television is increased, a display device such as a liquid crystal display device or a light-emitting device has been actively developed. In particular, a technique where a pixel circuit and a driver circuit including a shift register circuit or the like (hereinafter described as an internal circuit) are formed over the same substrate by using transistors which are formed by using an amorphous semiconductor over an insulator has been actively developed, since the technique greatly contributes to low power consumption and low cost. The internal circuit formed over the insulator is connected to a controller IC or the like arranged outside the insulator (hereinafter described as an external circuit) through a FPC or the like, and its operation is controlled.

In addition, a shift register circuit which is formed by using transistors made of an amorphous semiconductor has been devised as the internal circuit formed over the insulator (see Reference 1: PCT International Publication No. 95/31804).

However, since the shift register circuit has a period in which an output terminal is in a floating state, noise is easily generated in the output terminal. Due to the noise generated in the output terminal, a malfunction of the shift register circuit occurs.

In order to solve the aforementioned problems, a shift register circuit where an output terminal does not become a floating state has been devised. This shift register circuit is operated by a so-called static driving (see Reference 2: Japanese Published Patent Application No. 2004-78172).

The shift register circuit disclosed in Reference 2 can realize the static driving. Therefore, the output terminal does not become a floating state in this shift register circuit so that noise generated in the output terminal can be reduced.

DISCLOSURE OF INVENTION

In the aforementioned shift register circuit disclosed in Reference 2, its operating periods are divided into a selection period in which one selection signal is output and a non-selection period in which a non-selection signal is output, and most periods in these operating periods become non-selection periods. In the non-selection period, a low potential is supplied to the output terminal through a transistor. That is, this transistor for supplying the low potential to the output terminal is on in most periods in the operating periods of the shift register circuit.

It is known that characteristics in a transistor which is manufactured by using an amorphous semiconductor deteriorate in accordance with a time in which the transistor is turned on and a potential applied to the transistor. In particular, a threshold voltage shift where the threshold voltage of a transistor rises becomes obvious when the characteristics of the transistor deteriorate. This threshold voltage shift is one of big causes of the malfunction of the shift register circuit.

In view of the aforementioned problems, it is an object of the invention to provide a shift register circuit where noise is reduced in a non-selection period and deterioration of a transistor can be suppressed, a semiconductor device or a display device having the shift register circuit, or an electronic device having the display device.

In the invention, a transistor included in a semiconductor device is not always on to suppress characteristic deterioration of the transistor.

A semiconductor device in accordance with one aspect of the invention includes a first transistor, a second transistor, a third transistor, an inverter, a first wiring, a second wiring, and a third wiring. A first terminal of the first transistor is electrically connected to the first wiring; a second terminal of the first transistor is electrically connected to a second terminal of the second transistor; and a gate terminal of the first transistor is electrically connected to a first terminal of the inverter. A first terminal of the second transistor is electrically connected to the second wiring, and a gate terminal of the second transistor is electrically connected to a second terminal of the third transistor. A first terminal of the third transistor is electrically connected to the third wiring, and a gate terminal of the third transistor is electrically connected to a second terminal of the inverter. The gate terminal of the first transistor is electrically connected to a transistor for making the gate terminal of the first transistor into a floating state.

A semiconductor device in accordance with one aspect of the invention includes a first transistor, a second transistor, a third transistor, a fourth transistor, a fifth transistor, a first wiring, a second wiring, a third wiring, and a fourth wiring. A first terminal of the first transistor is electrically connected to the first wiring; a second terminal of the first transistor is electrically connected to a second terminal of the second transistor; and a gate terminal of the first transistor is electrically connected to a gate terminal of the fourth transistor. A first terminal of the second transistor is electrically connected to the second wiring, and a gate terminal of the second transistor is electrically connected to a second terminal of the third transistor. A first terminal of the third transistor is electrically connected to the third wiring, and a gate terminal of the third transistor is electrically connected to a second terminal of the fourth transistor and a second terminal of the fifth transistor. A first terminal of the fourth transistor is electrically connected to the second wiring. A first terminal of the fifth transistor is electrically connected to the fourth wiring, and a gate terminal of the fifth transistor is electrically connected to the fourth wiring. The gate terminal of the first transistor is electrically connected to a transistor for making the gate terminal of the first transistor into a floating state.

A semiconductor device in accordance with one aspect of the invention includes a first transistor, a second transistor, a third transistor, a fourth transistor, a fifth transistor, a sixth transistor, a first wiring, a second wiring, a third wiring, a fourth wiring, and a fifth wiring. A first terminal of the first transistor is electrically connected to the first wiring; a second terminal of the first transistor is electrically connected to a second terminal of the second transistor; and a gate terminal of the first transistor is electrically connected to a gate terminal of the fourth transistor and a second terminal of the sixth transistor. A first terminal of the second transistor is electrically connected to the second wiring, and a gate terminal of the second transistor is electrically connected to a second terminal of the third transistor. A first terminal of the third transistor is electrically connected to the third wiring, and a gate terminal of the third transistor is electrically connected to a second terminal of the fourth transistor and a second terminal of the fifth transistor. A first terminal of the fourth transistor is electrically connected to the second wiring. A first terminal of the fifth transistor is electrically connected to the fourth wiring, and a gate terminal of the fifth transistor is electrically connected to the fourth wiring. A first terminal of the sixth transistor is electrically connected to the fourth transistor, and a gate terminal of the sixth transistor is electrically connected to the fifth wiring.

A semiconductor device in accordance with one aspect of the invention includes a first transistor, a second transistor, a third transistor, a fourth transistor, a fifth transistor, a sixth transistor, a seventh transistor, a first wiring, a second wiring, a third wiring, a fourth wiring, and a fifth wiring. A first terminal of the first transistor is electrically connected to the first wiring; a second terminal of the first transistor is electrically connected to a second terminal of the second transistor; and a gate terminal of the first transistor is electrically connected to a gate terminal of the fourth transistor, a second terminal of the sixth transistor, and a second terminal of the seventh transistor. A first terminal of the second transistor is electrically connected to the second wiring, and a gate terminal of the second transistor is electrically connected to a second terminal of the third transistor and a gate terminal of the seventh transistor. A first terminal of the third transistor is electrically connected to the third wiring, and a gate terminal of the third transistor is electrically connected to a second terminal of the fourth transistor and a second terminal of the fifth transistor. A first terminal of the fourth transistor is electrically connected to the second wiring. A first terminal of the fifth transistor is electrically connected to the fourth wiring, and a gate terminal of the fifth transistor is electrically connected to the fourth wiring. A first terminal of the sixth transistor is electrically connected to the fourth transistor, and a gate terminal of the sixth transistor is electrically connected to the fifth wiring. A first terminal of the seventh transistor is electrically connected to the second wiring.

A semiconductor device in accordance with one aspect of the invention includes a first transistor, a second transistor, a third transistor, a fourth transistor, a fifth transistor, a sixth transistor, a seventh transistor, an eighth transistor, a first wiring, a second wiring, a third wiring, a fourth wiring, a fifth wiring, and a sixth wiring. A first terminal of the first transistor is electrically connected to the first wiring; a second terminal of the first transistor is electrically connected to a second terminal of the second transistor; and a gate terminal of the first transistor is electrically connected to a gate terminal of the fourth transistor, a second terminal of the sixth transistor, a second terminal of the seventh transistor, and a second terminal of the eighth transistor. A first terminal of the second transistor is electrically connected to the second wiring, and a gate terminal of the second transistor is electrically connected to a second terminal of the third transistor and a gate terminal of the seventh transistor. A first terminal of the third transistor is electrically connected to the third wiring, and a gate terminal of the third transistor is electrically connected to a second terminal of the fourth transistor and a second terminal of the fifth transistor. A first terminal of the fourth transistor is electrically connected to the second wiring. A first terminal of the fifth transistor is electrically connected to the fourth wiring, and a gate terminal of the fifth transistor is electrically connected to the fourth wiring. A first terminal of the sixth transistor is electrically connected to the fourth transistor, and a gate terminal of the sixth transistor is electrically connected to the fifth wiring. A first terminal of the seventh transistor is electrically connected to the second wiring. A first terminal of the eighth transistor is electrically connected to the second wiring, and a gate terminal of the eighth transistor is electrically connected to the sixth wiring.

In addition, in the invention, the ratio (W/L) of channel width W to channel length L of the fourth transistor may be equal to or ten times as large the ratio W/L of channel width W to channel length L of the fifth transistor.

In addition, in the invention, the first transistor and the third transistor may have the same conductivity type.

In addition, in the invention, the first transistor and the fourth transistor may be n-channel transistors or may be p-channel transistors.

In addition, in the invention, a capacitor which is electrically connected between the second terminal and the gate terminal of the first transistor may be provided.

In addition, in the invention, capacitance may be formed by using a MOS transistor as a substitute for the capacitor.

In addition, in the invention, the capacitor includes a first electrode, a second electrode, and an insulator which is held between the first electrode and the second electrode. The first electrode may be a semiconductor layer; the second electrode may be a gate wiring layer; and the insulator may be a gate insulating film.

In addition, in the invention, a clock signal may be supplied to the first wiring and an inverted clock signal which differs in phase from the clock signal by 180 degrees may be supplied to the third wiring.

A display device in accordance with one aspect of the invention includes a plurality of pixels and a driver circuit. Each of the plurality of pixels is controlled by the driver circuit. The driver circuit includes a plurality of transistors and a circuit for not always turning on each of the plurality of transistors.

In addition, in the invention, the driver circuit may include the above-described semiconductor device.

In addition, in the invention, each of the plurality of pixels includes at least one transistor. A transistor included in each of the plurality of pixels and a transistor included in the driver circuit may have the same conductivity type.

In addition, in the invention, each of the plurality of pixels and the driver circuit may be formed over the same substrate.

In addition, a display device of the invention may be applied to an electronic device.

As described above, in the invention, in order not to always turn on the second transistor and the seventh transistor, on states or off states of the second transistor and the seventh transistor are controlled by the signal which is supplied to the third wiring.

In addition, in order not to turn on the second transistor when the first transistor is turned on, the third transistor is turned off by connecting the gate terminal of the first transistor to the gate terminal of the second transistor through the inverter. When the second transistor is turned off before the third transistor is turned off, the second transistor is continuously kept off. Accordingly, the first wiring and the second wiring are not electrically connected to each other through the first transistor and the second transistor.

Note that in the case where a potential of the first wiring is changed when the first transistor is on and the second transistor is off, a potential of the second terminal of the first transistor is also changed. At this time, a potential of the gate terminal of the first transistor is changed at the same time by the capacitive coupling of the capacitor when the gate terminal of the first transistor is in a floating state. Here, when the potential of the gate terminal of the first transistor is changed to a value which is greater than or equal to the sum of the potential of the first wiring and the threshold voltage of the first transistor, or to a value which is less than or equal to the sum of the potential of the first wiring and the threshold voltage of the first transistor, the first transistor is continuously kept on. In this manner, the invention has a function of turning on the first transistor to set the first terminal and the second terminal of the first transistor to have the same potentials, even if the potential of the first wiring is changed.

Note that a switch described in this specification can employ an electrical switch, or a mechanical switch, for example. That is, any element can be employed as long as it can control a current flow, and thus, a switch is not limited to a certain element. For example, it may be a transistor, a diode (e.g., a PN junction diode, a PIN diode, a Schottky diode, or a diode-connected transistor), or a logic circuit combining such elements. Therefore, in the case of employing a transistor as a switch, the polarity (conductivity type) of the transistor is not particularly limited to a certain type since it operates just as a switch. However, when off-current is preferred to be small, a transistor of a polarity with small off-current is preferably employed. A transistor provided with an LDD region, a transistor with a multi-gate structure, or the like is given as an example of a transistor with small off-current. In addition, it is preferable that an n-channel transistor be employed when a potential of a source terminal of the transistor which is operated as a switch is closer to a low-potential-side power supply (e.g., Vss, GND, or 0 V), while a p-channel transistor be employed when the potential of the source terminal is closer to a high-potential-side power supply (e.g., Vdd). This is because the transistor is easily operated as the switch since the absolute value of a voltage between a gate and a source of the transistor can be increased. Note that a CMOS switch may also be employed by using both n-channel and p-channel transistors.

Note that in the invention, description "being connected" is synonymous with description "being electrically connected". Accordingly, other elements or switches may be sandwiched between elements.

Note that a display element, a display device which is a device including a display element, a light-emitting element, and a light-emitting device which is a device including a light-emitting element can employ various modes and include various elements. For example, a display medium, the contrast of which changes by an electromagnetic action, such as an EL element (e.g., an organic EL element, an inorganic EL element, or an EL element containing both organic and inorganic materials), an electron-emissive element, a liquid crystal element, electronic ink, or the like can be applied. Note that display devices using EL elements include an EL display; display devices using electron-emissive elements include a field emission display (FED), an SED-type flat panel display (SED: Surface-conduction Electron-emitter Display), or the like; display devices using liquid crystal elements include a liquid crystal display; and display devices using electronic ink include electronic paper.

Note that in the invention, the type of a transistor which can be applied is not limited to a certain type. A thin film transistor (TFT) using a non-single crystalline semiconductor film typified by amorphous silicon or polycrystalline silicon, a transistor formed by using a semiconductor substrate or an SOI substrate, a MOS transistor, a junction transistor, a bipolar transistor, a transistor using a compound semiconductor such as ZnO or a-InGaZnO, a transistor using an organic semiconductor or a carbon nanotube, or other transistors can be applied. In addition, a type of a substrate over which a transistor is formed is not limited to a certain type. The transistor can be arranged over a single crystalline substrate, an SOI substrate, a glass substrate, a plastic substrate, or the like.

Note that as described above, various types of transistors may be employed in the invention, and such transistors can be formed over various types of substrates. Accordingly, all of the circuits may be formed over a glass substrate, a plastic substrate, a single crystalline substrate, an SOI substrate, or any other substrates. Alternatively, some of the circuits may be formed over a substrate while the other parts of the circuits may be formed over another substrate. That is, not all of the circuits are required to be formed over the same substrate. For example, a part of the circuits may be formed by using transistors over a glass substrate and the other parts of the circuits may be formed over a single crystalline substrate, so that the IC chip is connected to the glass substrate by COG (Chip On Glass). Alternatively, the IC chip may be connected to the glass substrate by TAB (Tape Automated Bonding) or a printed circuit board.

The structure of a transistor is not limited to a certain type. For example, a multi-gate structure having two or more gate electrodes may be used. In addition, a structure where gate electrodes are formed above and below a channel may be employed. In addition, any of the following structures may be employed: a structure where a gate electrode is formed above a channel; a structure where a gate electrode is formed below a channel; a staggered structure; an inversely staggered structure; and a structure where a channel region is divided into a plurality of regions, and the divided regions are connected in parallel or in series. Further, a channel (or a part of it) may overlap with a source electrode or a drain electrode. Furthermore, an LDD (Lightly Doped Drain) region may be provided.

It is to be noted that in this specification, one pixel means the minimum unit of an image. Accordingly, in the case of a full color display device which is made of color elements of R (red), G (green), and B (blue), one pixel is formed by using a dot of a color element of R, a dot of a color element of and a dot of a color element of B.

It is also to be noted that in this specification, when it is described that pixels are arranged in matrix, the description includes not only a case where pixels are arranged in a so-called grid pattern by combining vertical stripes and lateral stripes, but also a case where dots of three color elements (e.g., RGB) are arranged in a so-called delta pattern in the case of performing a full color display with three color elements. In addition, sizes of light-emitting regions may be different between respective dots of color elements.

A transistor is an element including at least three terminals of a gate, a drain, and a source, and has a channel region between a drain region and a source region. Here, since a source region and a drain region of the transistor may change depending on the structure, operating conditions, and the like of the transistor, it is difficult to define which is a source region or a drain region. Therefore, in this specification, one of regions functioning as a source region and a drain region is described as a first terminal and the other region is described as a second terminal.

Note that in this specification, a semiconductor device means a device having a circuit including semiconductor elements (e.g., transistors or diodes). The semiconductor device may also include all devices that can function by utilizing semiconductor characteristics. A display device includes not only a display panel itself where a plurality of pixels including display elements such as liquid crystal elements or EL elements are formed over the same substrate as a peripheral driver circuit for driving the pixels, but also a display panel attached with a flexible printed circuit (FPC) or a printed wiring board (PWB). In addition, a light-emitting device means a device using self-luminous display elements such as EL elements or elements used for an FED.

A semiconductor device of the invention can turn on a transistor, on/off of which is controlled by a signal supplied to a third wiring at regular intervals. Thus, since the transistor of a shift register circuit which uses the semiconductor device of the invention is not always on in a non-selection period, the threshold voltage shift of the transistor can be suppressed. In addition, a power supply potential is supplied to an output terminal of the shift register circuit which uses the semiconductor device of the invention through the transistor at regular intervals. Therefore, the shift register circuit which uses the semiconductor device of the invention can suppress noise which is generated in the output terminal.

BRIEF DESCRIPTION OF DRAWINGS

In the accompanying drawings:
FIGS. 100A and 100B are diagrams showing Embodiment 4;

FIGS. 101A and 101B are diagrams showing Embodiment 4;

FIGS. 103A and 103B are diagrams showing Embodiment 4;

FIGS. 104A to 104C are diagrams showing Embodiment 4;

FIGS. 106A and 106B are diagrams showing Embodiment 4;

FIGS. 107A and 107B are diagrams showing Embodiment 4;

FIGS. 108A and 108B are diagrams showing Embodiment 4;

FIGS. 110A and 110B are diagrams showing Embodiment 4;

FIGS. 111A and 111B are diagrams showing Embodiment 4;

BEST MODE FOR CARRYING OUT THE INVENTION

Hereinafter, the invention is described below by way of embodiment modes and embodiments with reference to the drawings. However, the invention can be implemented by various modes and it is to be understood that various changes and modifications will be apparent to those skilled in the art. Unless such changes and modifications depart from the spirit and the scope of the invention, they should be construed as being included therein. Therefore, the invention is not limited to the description of embodiment modes and embodiments.

Embodiment Mode 1

Figure 1:
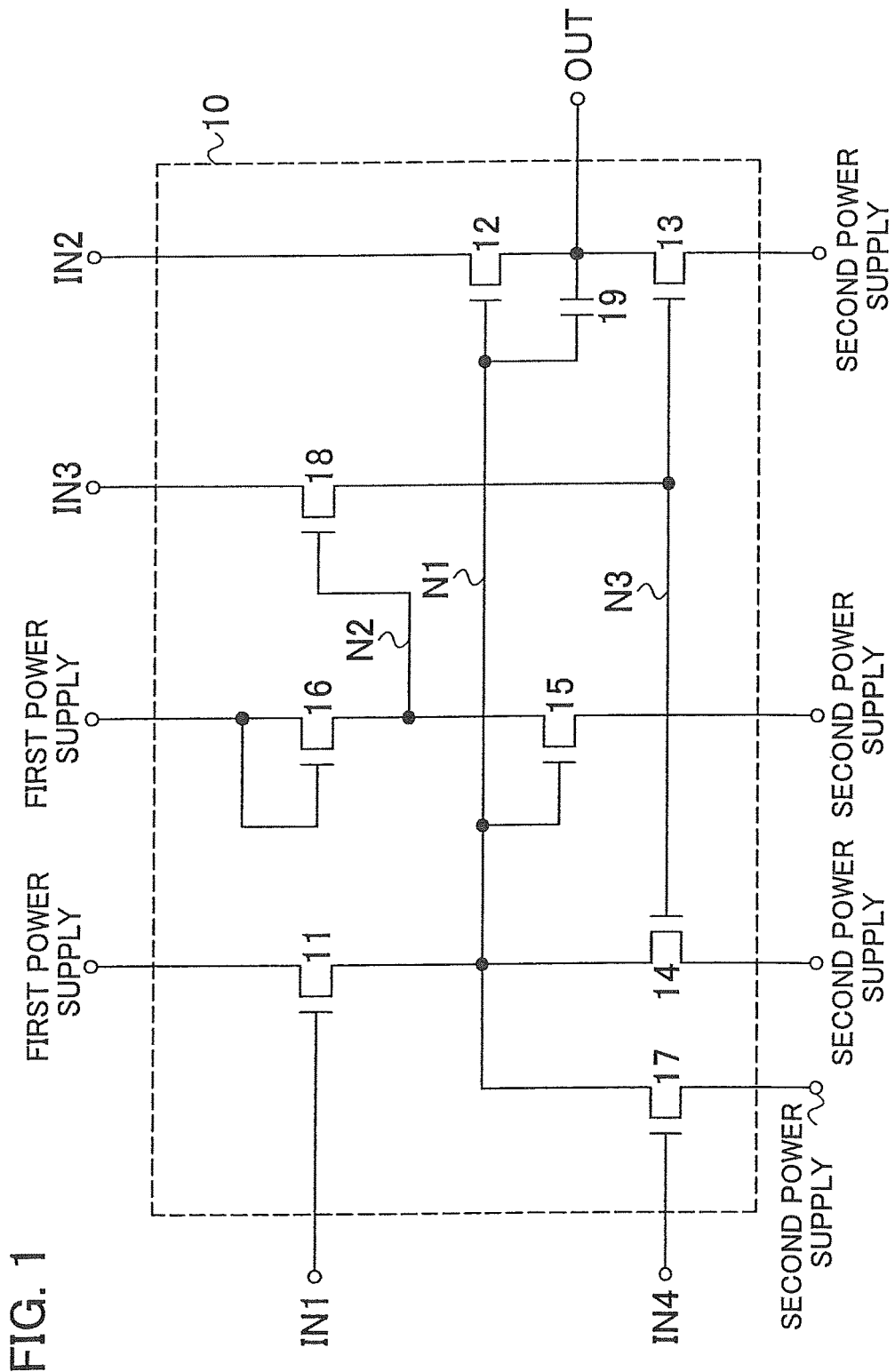
FIG. 1 is a diagram showing Embodiment Mode 1.

FIG. 1 shows one mode of a flip-flop circuit 10 of a shift register circuit of the invention. The shift register circuit of the invention includes a plurality stages of the flip-flop circuits 10. The flip-flop circuit 10 shown in FIG. 1 includes a transistor 11, a transistor 12, a transistor 13, a transistor 14, a transistor 15, a transistor 16, a transistor 17, a transistor 18, and a capacitor 19 having two electrodes. However, the capacitor 19 is not necessarily provided in the case where the gate capacitance of the transistor 12 can be used as the capacitor 19.

As shown in the flip-flop circuit 10, a gate terminal of the transistor 11 is connected to an input terminal IN1. A first terminal of the transistor 11 is connected to a first power supply. A second terminal of the transistor 11 is connected to a gate terminal of the transistor 12, a second terminal of the transistor 14, a gate terminal of the transistor 15, a second terminal of the transistor 17, and a second electrode of the capacitor 19. A first terminal of the transistor 15 is connected to a second power supply, and a second terminal of the transistor 15 is connected to a second terminal of the transistor 16 and a gate terminal of the transistor 18. A gate terminal and a first terminal of the transistor 16 are connected to the first power supply. A first terminal of the transistor 18 is connected to an input terminal IN3, and a second terminal of the transistor 18 is connected to a gate terminal of the transistor 13 and a gate terminal of the transistor 14. A first terminal of the transistor 13 is connected to the second power supply. A second terminal of the transistor 13 is connected to a first electrode of the capacitor 19, a second terminal of the transistor 12, and an output terminal OUT. A first terminal of the transistor 12 is connected to an input terminal IN2. A first terminal of the transistor 14 is connected to the second power supply. A gate terminal of the transistor 17 is connected to an input terminal IN4, and a first terminal of the transistor 17 is connected to the second power supply.

It is to be noted that in the flip-flop circuit 10, a node of the second terminal of the transistor 11, the gate terminal of the transistor 12, the second terminal of the transistor 14, the gate terminal of the transistor 15, the second terminal of the transistor 17, and the second electrode of the capacitor 19 is denoted by N1. A node of the second terminal of the transistor 15, the second terminal of the transistor 16 and the gate terminal of the transistor 18 is denoted by N2. A node of the gate terminal of the transistor 13, the gate terminal of the transistor 14, and the second terminal of the transistor 18 is denoted by N3.

In addition, a power supply potential VDD is supplied to the first power supply, and a power supply potential VSS is supplied to the second power supply. A potential difference (VDD−VSS) between the power supply potential VDD of the first power supply and the power supply potential VSS of the second power supply corresponds to a power supply voltage of the flip-flop circuit 10. Further, the power supply potential VDD is higher than the power supply potential VSS.

Further, a control signal is supplied to each of the input terminals IN1 to IN4. In addition, the output terminal OUT outputs an output signal. An output signal of a flip-flop circuit 10 in the previous stage is supplied to the input terminal IN1 as the control signal. An output signal of a flip-flop circuit 10 in the next stage is supplied to the input terminal IN4 as the control signal.

Moreover, each of the transistors 11 to 18 is an n-channel transistor. However, each of the transistors 11 to 18 may be a p-channel transistor.

Figure 2:
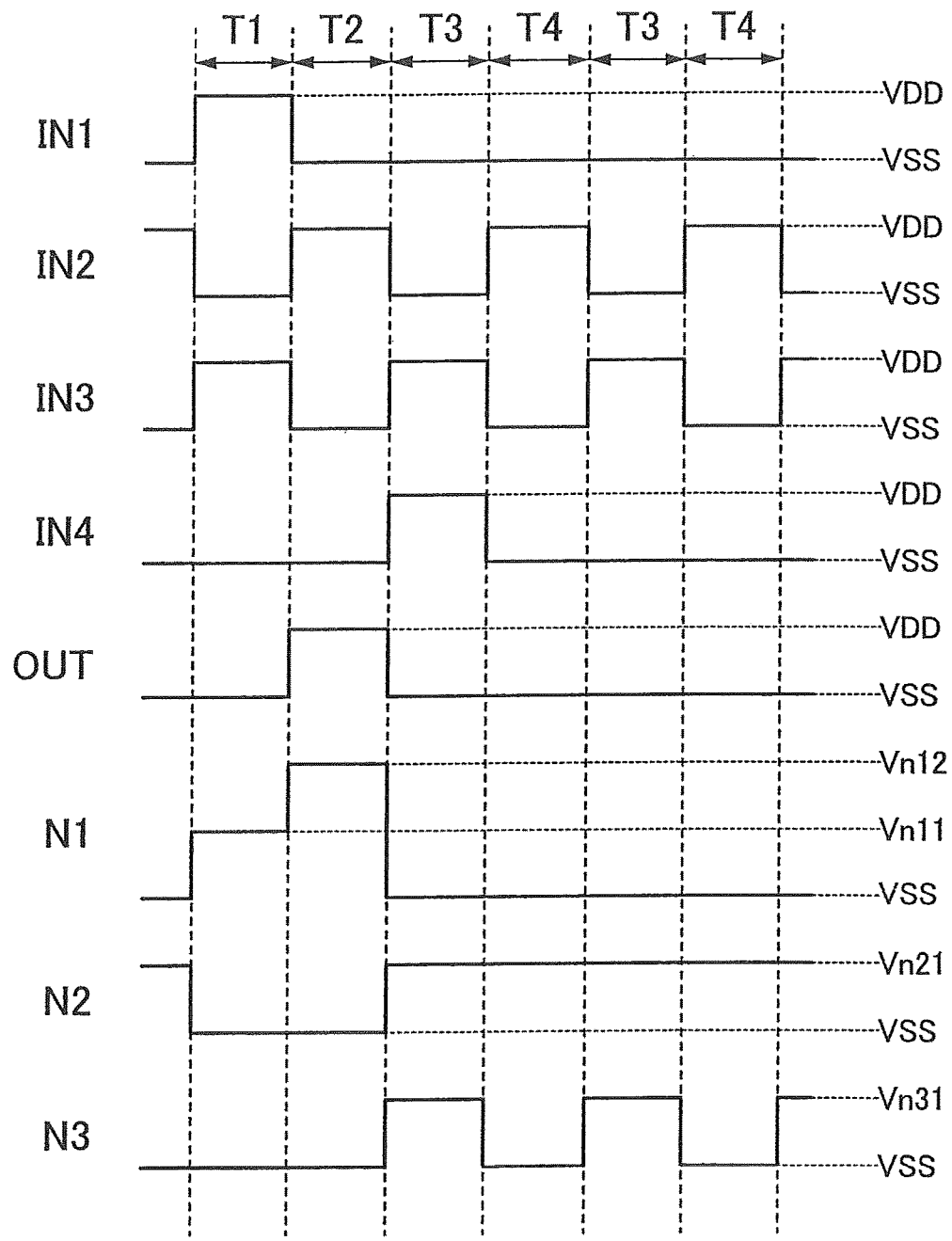
FIG. 2 is a timing chart showing Embodiment Mode 1.

Next, an operation of the flip-flop circuit 10 shown in FIG. 1 is described with reference to a timing chart shown in FIG. 2. FIG. 2 is a timing chart of the control signal which is supplied to each of the input terminals N1 to 1N4, the output signal which is output from the output terminal OUT, and potentials of the nodes N1 to N3 shown in FIG. 1. The timing chart shown in FIG. 2 is divided into a period T1 to a period T4 for convenience.

It is to be noted that in periods after the period T4, the period T3 and the period T4 are sequentially repeated. In addition, in FIG. 2, the period T1 is defined as a selection preparation period; the period T2 is defined as a selection period; and the period T3 and the period T4 are defined as non-selection periods. That is, one selection preparation period, one selection period, and a plurality of non-selection periods are sequentially repeated.

In addition, in the timing chart shown in FIG. 2, each of the control signal and the output signal has two values. That is, each of these signals is a digital signal. One of the potentials of the digital signal is VDD which is the same potential as the first power supply potential (hereinafter also described as a potential VDD or an H level) when the digital signal is an H signal, and the other of the potentials of the digital signal is VSS which is the same potential as the second power supply potential (hereinafter also described as a potential VSS or an L level) when the digital signal is an L signal.

Further, FIGS. 3 to 6 show connection states of the flip-flop circuits 10 corresponding to operations in the period T1 to the period T4, respectively.

Moreover, in FIGS. 3 to 6, transistors shown in solid lines are on and transistors shown in broken lines are off. Wirings shown in solid lines are connected to power supplies or input terminals, and wirings shown in broken line are not connected to the power supplies or the input terminals.

Next, the operation in each period is described with reference to FIGS. 3 to 6.

Figure 3:
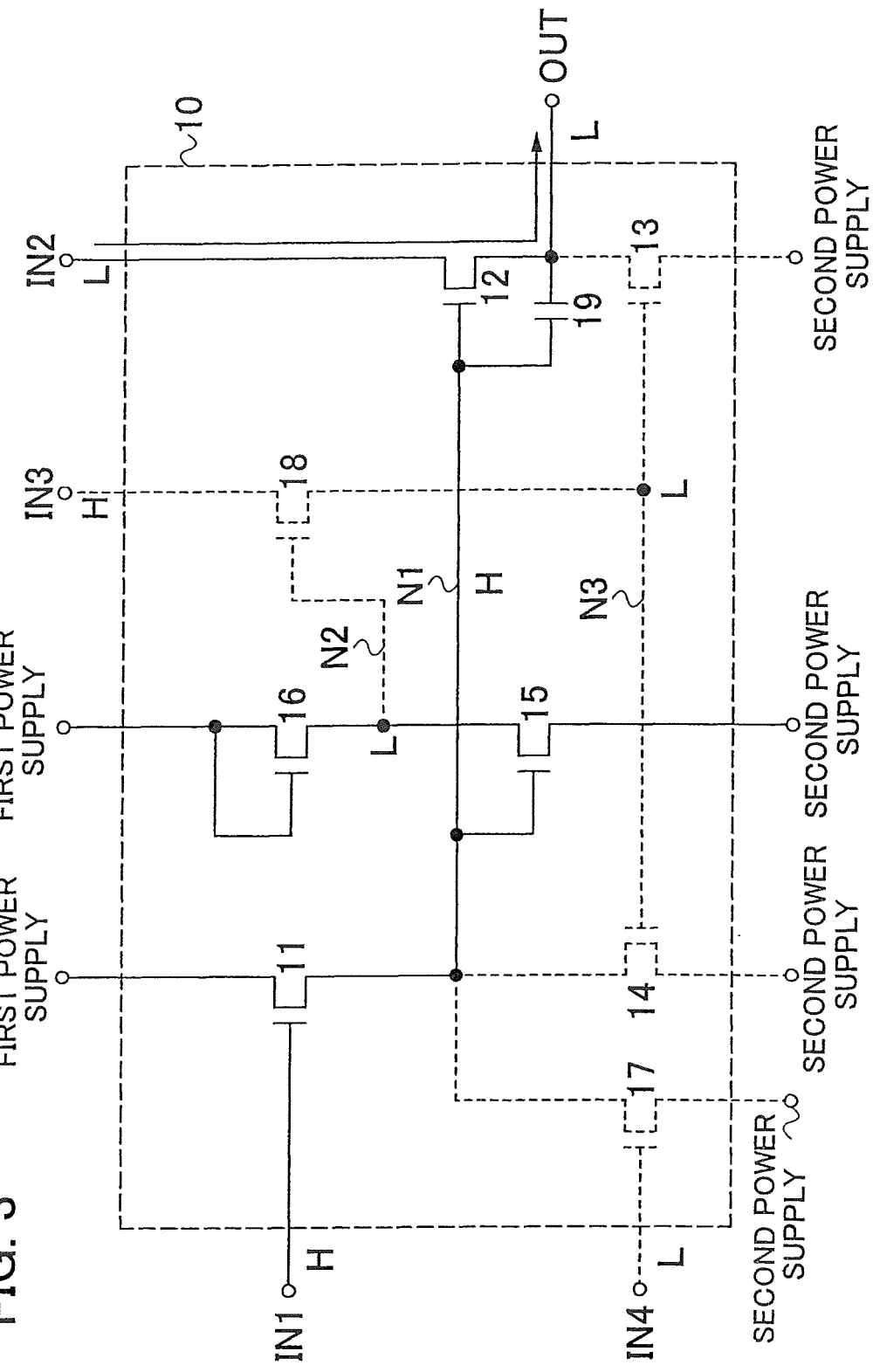
FIG. 3 is a diagram showing Embodiment Mode 1.

First, an operation of the flip-flop circuit 10 in the period T1 is described with reference to FIG. 3. FIG. 3 is a diagram showing a connection state of the flip-flop circuit 10 in the period T1.

In the period T1, the input terminal IN1 becomes an H level to turn on the transistor 11, and the input terminal IN4 becomes an L level to turn off the transistor 17. Since the node N3 is held at VSS obtained in the period T3 which is described later, the transistor 14 is turned off. The node N1 is electrically connected to the first power supply through the transistor 11, and a potential of the node N1 rises to be Vn11. When the node N1 becomes Vn11, the transistor 11 is turned off. Here, Vn11 is a value obtained by subtracting the threshold voltage Vth11 of the transistor 11 from the power supply potential VDD (VDD−Vth11). Note that Vn11 is a potential which can turn on the transistor 12 and the transistor 15.

When the potential of the node N1 becomes Vn11, the transistor 11 is turned off and the transistor 12 and the transistor 15 are turned on. The node N2 is electrically connected to the second power supply through the transistor 15 and is electrically connected to the first power supply through the transistor 16, and a potential of the node N2 rises to be Vn21. Here, Vn21 is determined by an operating point of the transistor 16 and the transistor 15. Note that the transistor 15 and the transistor 16 form an inverter using the two transistors. Accordingly, when an H-level signal is input into the gate terminal of the transistor 15 (the node N1), an L-level signal is input into the node N2. Here, Vn21 is a potential which can turn off the transistor 18. Accordingly, since the transistor 18 is off even when the input terminal IN3 is at an H level, the node N3 can be held at VSS. Since the input terminal IN2 becomes an L level, and the output terminal OUT is electrically connected to the input terminal IN2 through the transistor 12, a potential of the output terminal OUT becomes VSS.

Since the potential of the node N2 becomes Vn21 and the transistor 18 is off, the node N3 is held at VSS and the transistor 13 and the transistor 14 are turned off.

By the above-described operations, the transistor 12 is on and the output terminal OUT is set at an L level in the period T1. In addition, since the transistor 11 is off, the node N1 is set in a floating sate.

Figure 4:
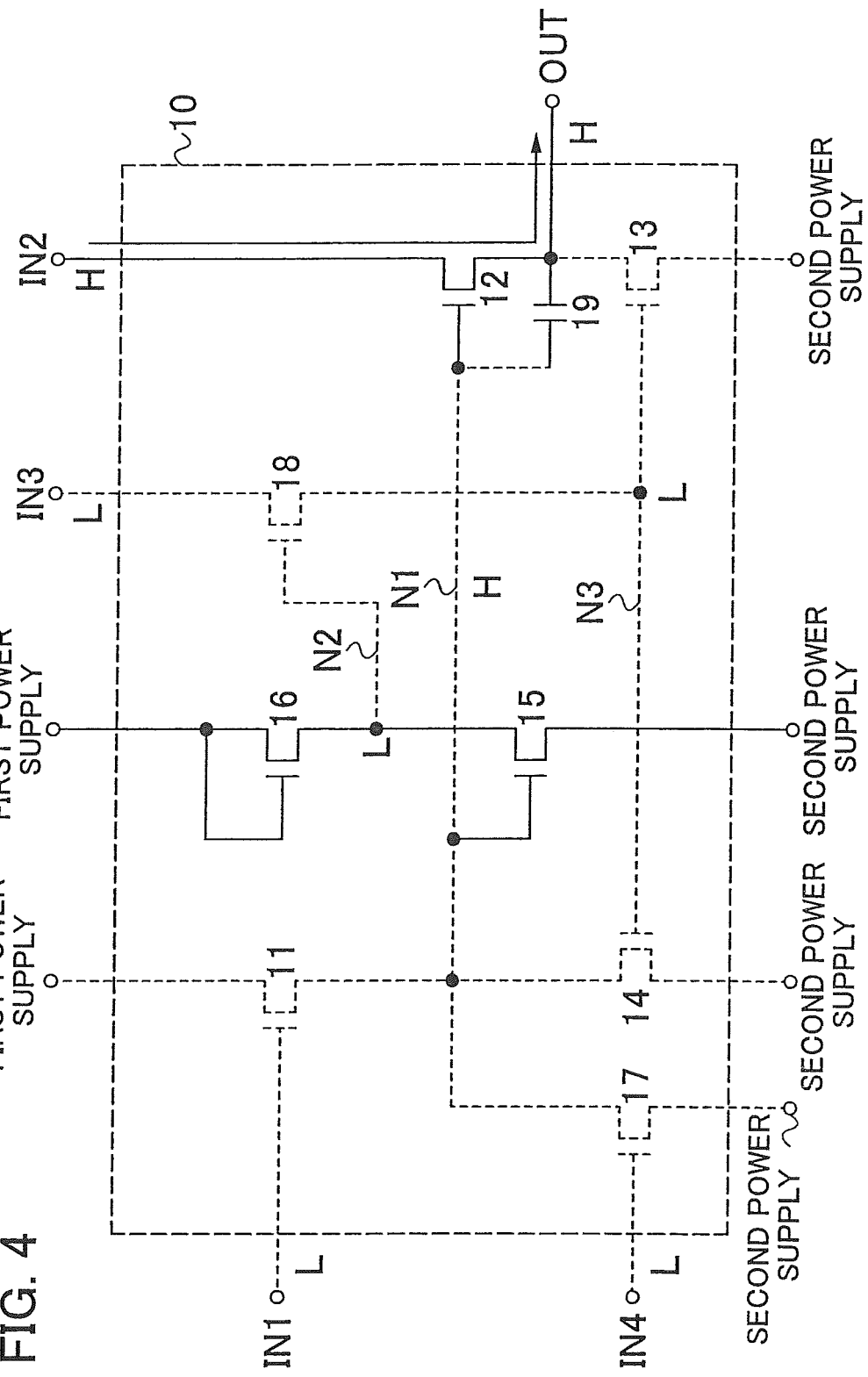
FIG. 4 is a diagram showing Embodiment Mode 1.

Next, an operation of the flip-flop circuit 10 in the period T2 is described with reference to FIG. 4. FIG. 4 is a diagram showing a connection state of the flip-flop circuit 10 in the period T2.

In the period T2, the input terminal IN1 becomes an L level and the transistor 11 is off. The input terminal IN4 is unchanged at an L level and the transistor 17 is off. Therefore, the node N1 is kept in a floating state from the period T1 to hold the potential Vn11 in the period T1.

Since the potential of the node N1 is held at Vn11, the transistor 12 is on. The input terminal IN2 becomes an H level. Then, since the output terminal OUT is electrically connected to the input terminal IN2 through the transistor 12, the potential of the output terminal OUT rises from VSS. The potential of the node N1 is changed into Vn12 by the capacitive coupling of the capacitor 19 to keep the on state of the transistor 12. A so-called bootstrap operation is performed. Accordingly, the potential of the output terminal OUT rises to a potential equal to VDD which is a potential of the input terminal IN2. Note that Vn12 is a value which is greater than or equal to the sum of the potential VDD and the threshold voltage Vth12 of the transistor 12.

The transistor 15 is continuously kept on even when the potential of the node N1 becomes Vn12. Therefore, the potential of the node N2 and a potential of the node N3 have the same potentials as those in the period T1.

By the above-described operations, the potential of the node N1 which is in a floating state is raised by the bootstrap operation, so that the transistor 12 is continuously kept on in the period T2. Thus, the potential of the output terminal OUT is set at VDD so that the output terminal OUT has an H level.

Figure 5:
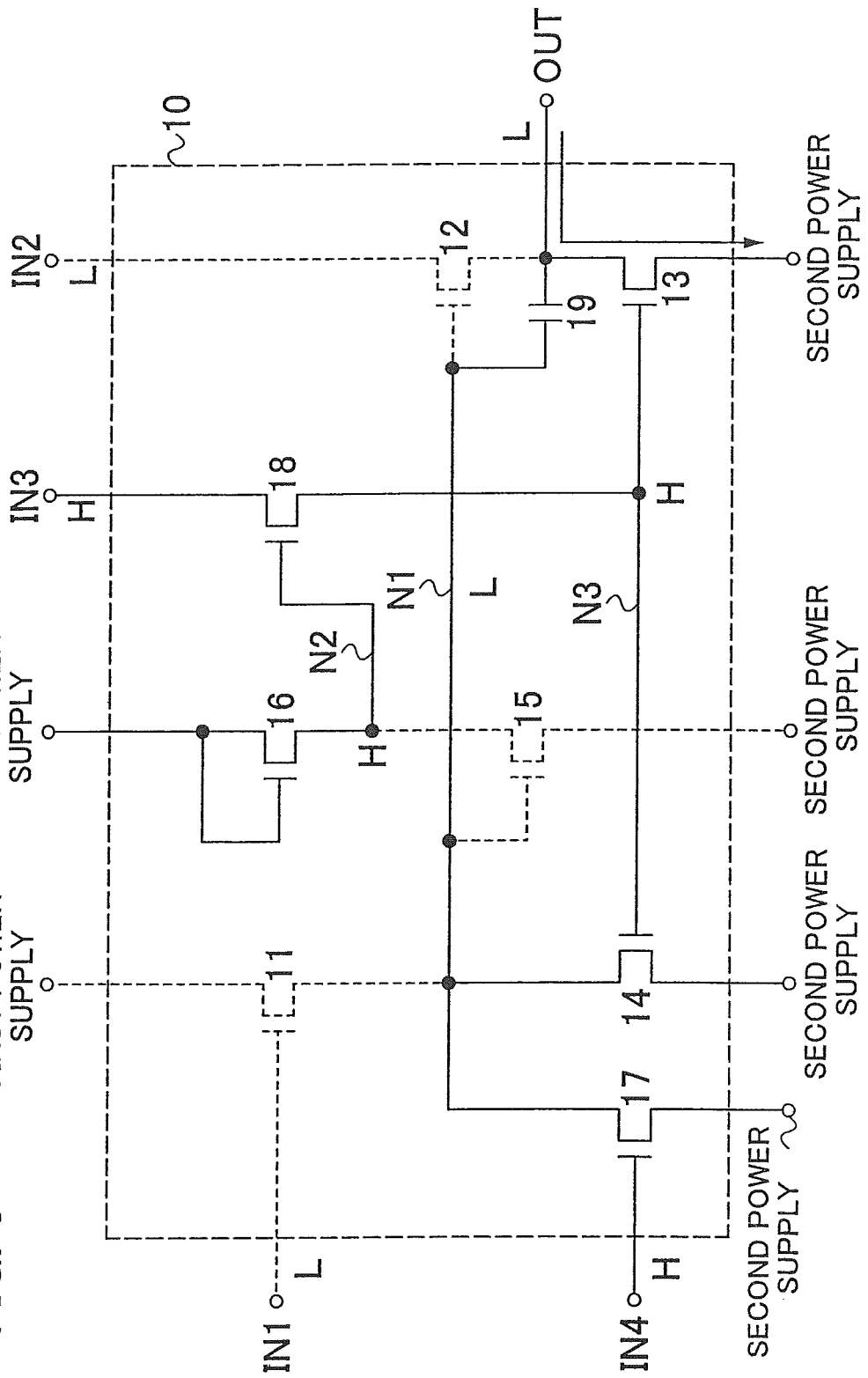
FIG. 5 is a diagram showing Embodiment Mode 1.

Next, an operation of the flip-flop circuit 10 in the period T3 is described with reference to FIG. 5. FIG. 5 is a diagram showing a connection state of the flip-flop circuit 10 in the period T3.

In the period T3, the input terminal IN1 is unchanged at an L level and the transistor 11 is off. The input terminal IN4 becomes an H level to turn on the transistor 17. Then, the node N1 is electrically connected to the second power supply through the transistor 17 so that the potential of the node N1 becomes VSS.

The potential of the node N1 becomes VSS to turn off the transistor 12 and the transistor 15. Since the node N2 is electrically connected to the first power supply through the transistor 16, the potential of the node N2 rises to be Vn22. Here, Vn22 is a value obtained by subtracting the threshold voltage Vth16 of the transistor 16 from the power supply potential VDD (VDD−Vth16). Note that Vn22 is a potential which can turn on the transistor 18.

When the potential of the node N2 becomes Vn22, the transistor 18 is turned on. Then, since the input terminal IN3 becomes an H level, the node N3 is electrically connected to the input terminal IN3 through the transistor 18 and a potential of the node N3 becomes Vn31. Here, Vn31 is a value obtained by subtracting the threshold voltage Vth18 of the transistor 18 from Vn22 which is the potential of the node N2 (Vn22−Vth18). Note that Vn31 corresponds to a value obtained by subtracting the threshold voltage Vth16 of the transistor 16 and the threshold voltage Vth18 of the transistor 18 from the power supply potential VDD (VDD−Vth16−Vth18). Note that Vn31 is a potential which can turn on the transistor 13 and the transistor 14.

When the potential of the node N3 becomes Vn31, the transistor 13 is turned on. Then, since the output terminal OUT is electrically connected to the second power supply through the transistor 13, the potential of the output terminal OUT becomes VSS.

By the above-described operations, VSS is supplied to the node N1 to turn off the transistor 12 and the transistor 15 in the period T3. In addition, the node N3 is set at an H level to turn on the transistor 13 and the transistor 14. Accordingly, the potential of the output terminal OUT is set at VSS so that the output terminal OUT has an L level.

Figure 6:
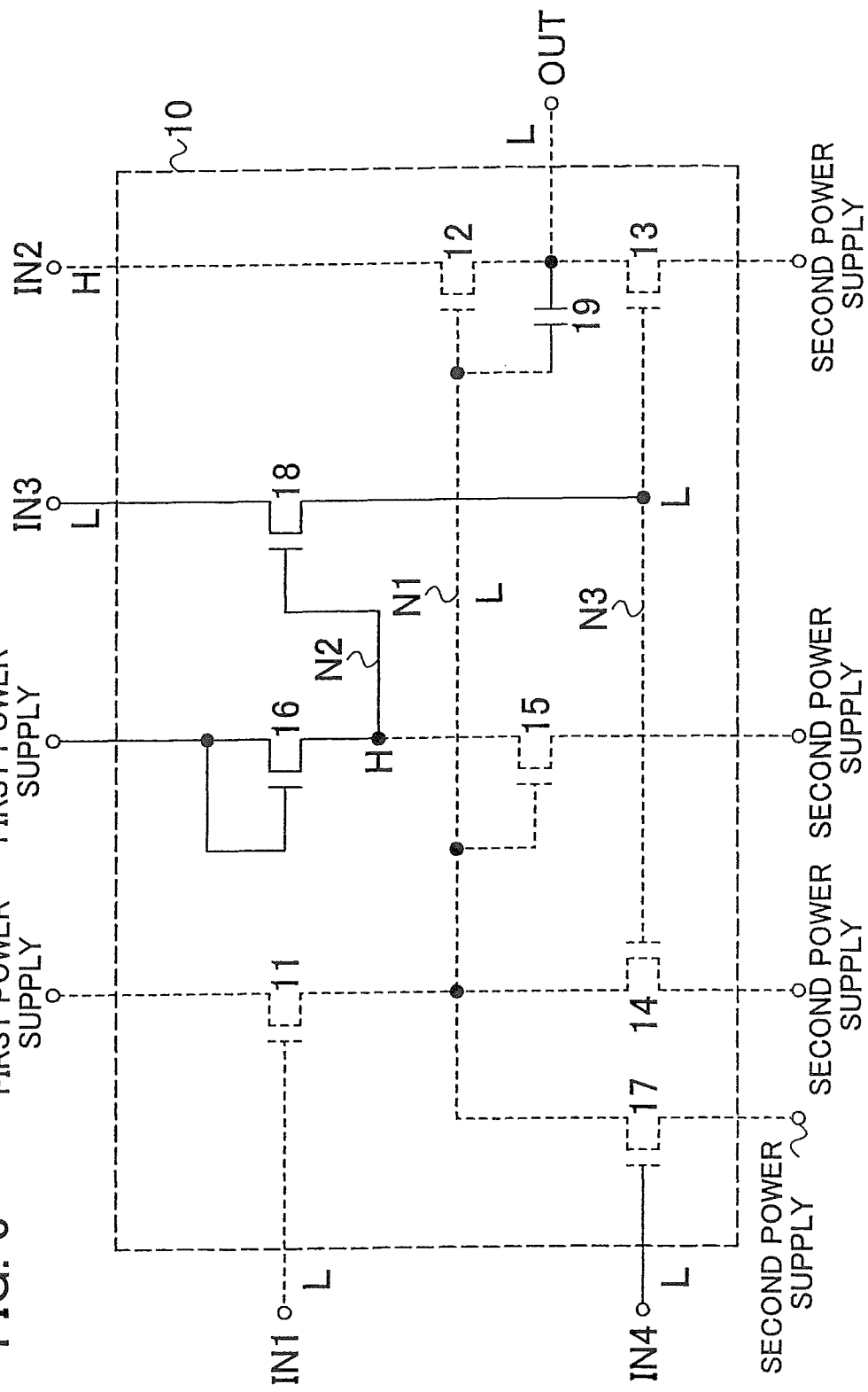
FIG. 6 is a diagram showing Embodiment Mode 1.

Next, an operation of the flip-flop circuit 10 in the period T4 is described with reference to FIG. 6. FIG. 6 is a diagram showing a connection state of the flip-flop circuit 10 in the period T4.

In the period T4, the input terminal IN3 becomes an L level and the potential of the node N3 becomes VSS. Thus, the transistor 13 and the transistor 14 are turned off. The input terminal IN4 becomes an L level to turn off the transistor 17. Therefore, the node N1 becomes a floating state and the potential of the node N1 is held at VSS.

Since the potential of the node N1 is unchanged at VSS, the transistor 12 and the transistor 15 are continuously kept off. Accordingly, the node N2 is continuously kept at Vn22 and the transistor 18 is continuously kept on.

Since the transistor 12 and the transistor 13 are turned off, the output terminal OUT becomes a floating state. Thus, the potential of the output terminal OUT is held at VSS.

By the above-described operations, the potential of the output terminal OUT is held at VSS so that the transistor 13 and the transistor 14 can be turned off in the period T4. Since the transistor 13 and the transistor 14 are not always on, characteristic deterioration of the transistor 13 and the transistor 14 can be suppressed.

Relations among the period T1 to the period T4 are described. The next period of the period T1 is the period T2; the next period of the period T2 is the period T3; and next period of the period T3 is the period T4. Here, the next period of the period T4 is the period T1 or the period T3. That is, the next period of the period T4 is the period T1 when the input terminal IN1 becomes an H level, or the next period of the period T4 is the period T3 when the input terminal IN1 is unchanged at an L level. In addition, when the period T3 is the next period of the period T4, the input terminal IN4 is unchanged at an L level and the transistor 17 is continuously kept off.

Here, functions of the transistors 11 to 18 and the capacitor 19 are described below.

The transistor 11 has a function as a switch which selects whether to connect the first power supply and the node N1 or not in accordance with the control signal which is supplied to the input terminal IN1. In the period T1, the transistor 11 has functions of supplying the power supply potential VDD to the node N1 and being turned off when the potential of the node N1 becomes Vn11.

In addition, the transistor 11 has a function of making the node N1 into a floating state in accordance with the control signal which is supplied to the input terminal IN1. In the period T1 and the period T2, the transistor 11 has a function of being turned off when the potential of the node N1 becomes greater than or equal to Vn11.

The transistor 12 has a function as a switch which selects whether to connect the input terminal IN2 and the output terminal OUT or not in accordance with the potential of the node N1. In the period T1, the transistor 12 has a function of supplying VSS to the output terminal OUT. In the period T2, the transistor 12 has a function of supplying VDD to the output terminal OUT.

The transistor 13 has a function as a switch which selects whether to connect the second power supply and the output terminal OUT or not in accordance with the potential of the node N3. In the period T3, the transistor 13 has a function of supplying the power supply potential VSS to the output terminal OUT.

The transistor 14 has a function as a switch which selects whether to connect the second power supply and the node N1 or not in accordance with the potential of the node N3. In the period T3, the transistor 14 has a function of supplying the power supply potential VSS to the node N1.

The transistor 15 has a function as a switch which selects whether to connect the second power supply and the node N2 or not in accordance with the potential of the node N1. In the period T1 and the period T2, the transistor 15 has a function of supplying the power supply potential VSS to the node N2.

The transistor 16 has a function as a diode having an input terminal connected to the first power supply and an output terminal connected to the node N2.

The transistor 17 has a function as a switch which selects whether to connect the second power supply and the node N1 or not in accordance with the control signal which is supplied to the input terminal IN4. In the period T3 which is after the period T2, the transistor 17 has a function of supplying the power supply voltage VSS to the node N1.

The transistor 18 has a function as a switch which selects whether to connect the input terminal IN3 and the node N3 or not in accordance with the potential of the node N2. In the period T3, the transistor 18 has a function of supplying VDD to the node N3. In the period T4, the transistor 18 has a function of supplying VSS to the node N3.

The capacitor 19 has a function for changing the potential of the node N1 in accordance with the potential of the output terminal OUT. In the period T2, the capacitor 19 has a function of raising the potential of the node N1 by the rise of the potential of the output terminal OUT.

In this manner, in the flip-flop circuit 10 shown in FIG. 1, the transistor 13 and the transistor 14 are turned on in the period T3 and turned off in the period T4, so that the transistor 13 and the transistor 14 can be prevented from always being on. Accordingly, characteristic deterioration of the transistor 13 and the transistor 14 can be suppressed. Therefore, in the flip-flop circuit 10 shown in FIG. 1, a malfunction due to the characteristic deterioration of the transistor 13 and the transistor 14 can also be suppressed.

In addition, when the transistor 13 and the transistor 14 are turned on, the power supply potential VSS is supplied to the output terminal OUT and the node N1. Therefore, in the flip-flop circuit 10 shown in FIG. 1, the power supply potential VSS can be supplied to the output terminal OUT and the node N1 at regular intervals, so that fluctuation in the potentials of the output terminal OUT and the node N1 can be suppressed.

Further, the flip-flop circuit 10 shown in FIG. 1 is formed by using all n-channel transistors so that amorphous silicon can be used as a semiconductor layer. Thus, a manufacturing process can be simplified, so that a manufacturing cost can be reduced and yield can be improved. In addition, a large display panel can be made. Furthermore, by using the flip-flop circuit of the invention, the life of the semiconductor device can be extended even in the case of using a transistor made from amorphous silicon, characteristics of which easily deteriorate.

It is to be noted that in the period T1 to the period T4, elements such as transistors or switches may be provided in the flip-flop circuits 10 so as to satisfy the states in FIGS. 3 to 6, respectively.

It is to be noted that the capacitor 19 is preferably formed by using a gate wiring layer and a semiconductor layer. The gate wiring layer and the semiconductor layer are stacked with a gate insulating film interposed therebetween. Since the film thickness of the gate insulating film is much thinner than other insulating layers such as an interlayer film, the capacitor can have a small area and high capacity when the gate insulating film is used as an insulator.

In addition, the size (W/L) of the transistor 15 is preferably larger than that of the transistor 16. Here, W means the channel width of a transistor and L means the channel length of the transistor. When the transistor 15 is turned on, the potential of the node N2 is determined by the operating point of the transistor 15 and the transistor 16. That is, if the size of the transistor 15 is not sufficiently larger than that of the transistor 16, the potential of the node N2 becomes higher, so that the transistor 18 cannot be turned off. Accordingly, in order to turn off the transistor 18, the size of the transistor 15 should be sufficiently larger than that of the transistor 16.

In addition, the size of the transistor 15 is preferably four times as large as that of the transistor 16 or more. More preferably, the size of the transistor 15 is ten times as large as that of the transistor 16 or more. When the power supply voltage is low, the ratio of the sizes of the transistor 15 to the transistor 16 may be approximately 4:1. However, when the power supply voltage becomes higher, the ratio of the sizes of the transistor 15 to the transistor 16 should be approximately 10:1.

Here, when a level-shift circuit or the like is connected to the output terminal OUT of the flip-flop circuit 10, the ratio of the sizes of the transistor 15 to the transistor 16 is preferably 4:1 or more. This is because the amplitude voltage of an output signal of the flip-flop circuit 10 is increased by the level-shift circuit or the like, so that the flip-flop circuit 10 often operates with a low power supply voltage.

Alternatively, when the level-shift circuit or the like is not connected to the output terminal OUT of the flip-flop circuit 10, the ratio of the sizes of the transistor 15 to the transistor 16 is preferably 10:1 or more. This is because the output signal of the flip-flop circuit 10 is applied to some kind of operation without being level shifted, so that the flip-flop circuit 10 often operates with a high power supply voltage.

Note that each of the power supply potentials and potentials of the control signals may be any potential as long as it can control on/off of a target transistor.

For example, the power supply potential VDD may be higher than an H-level potential of a control signal. This is because the potential of the node N3 is Vn31 (VDD−Vth16−Vth18), so that Vn31 which is the potential of the node N3 becomes higher when the power supply potential VDD becomes higher. Accordingly, the transistor 13 and the transistor 14 can be surely turned on even when the threshold voltages of the transistor 13 and the transistor 14 become higher due to the characteristic deterioration of the transistor 13 and the transistor 14.

In addition, the power supply potential VDD may be a potential lower than the H-level potential of the control signal as long as it can control on/off of each transistor.

Note that the capacitor 19 is not necessarily provided when gate capacitance (parasitic capacitance) between the gate terminal and the second terminal of the transistor 12 is sufficiently large.

Figure 7:
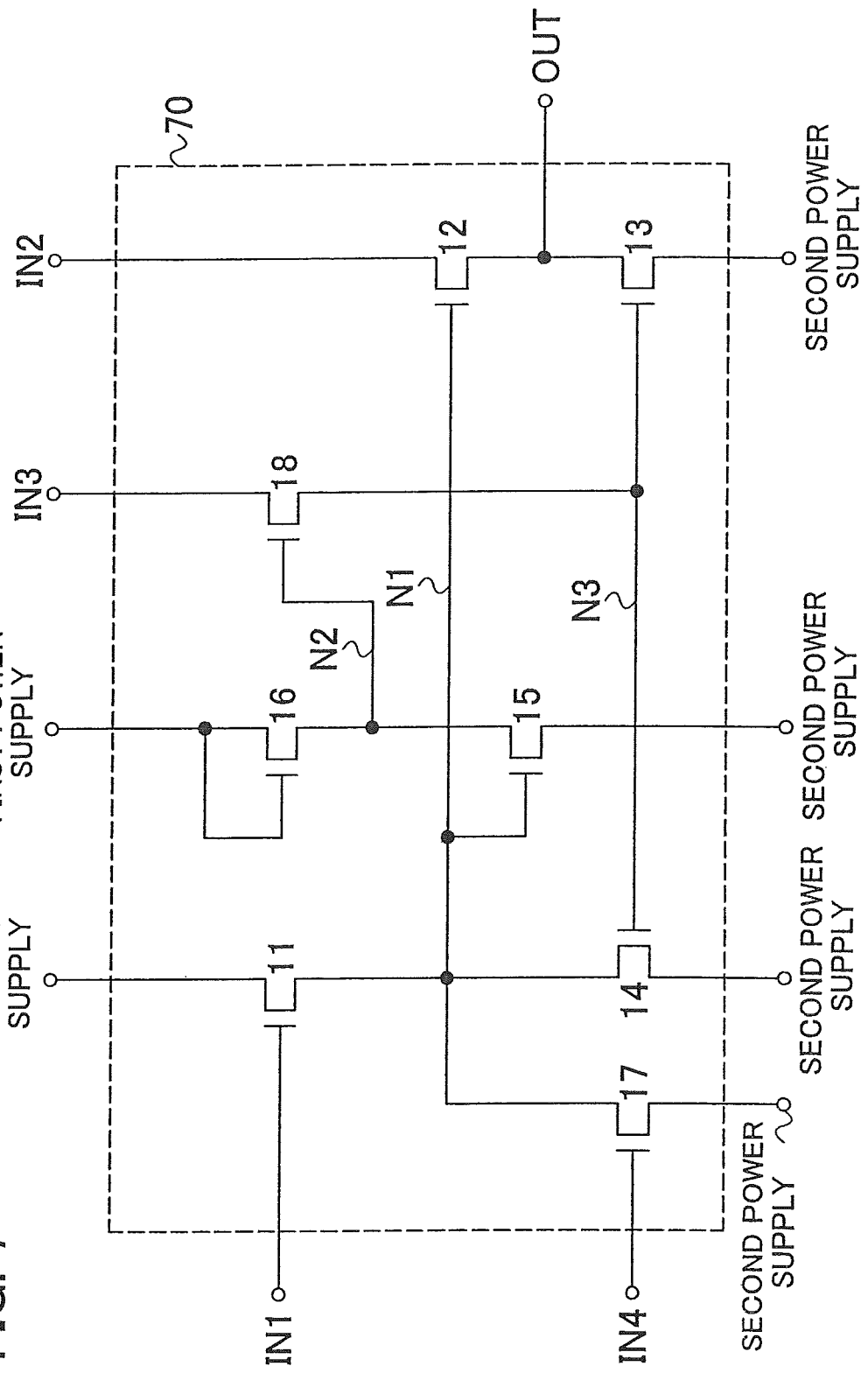
FIG. 7 is a diagram showing Embodiment Mode 1.

For example, the capacitor 19 is not necessary connected as in a flip-flop circuit 70 in FIG. 7. Accordingly, since the number of elements in the flip-flop circuit 70 is one less than the number of elements in the flip-flop circuit 10, each element can be arranged in high density in the flip-flop circuit 70.

Figure 10:
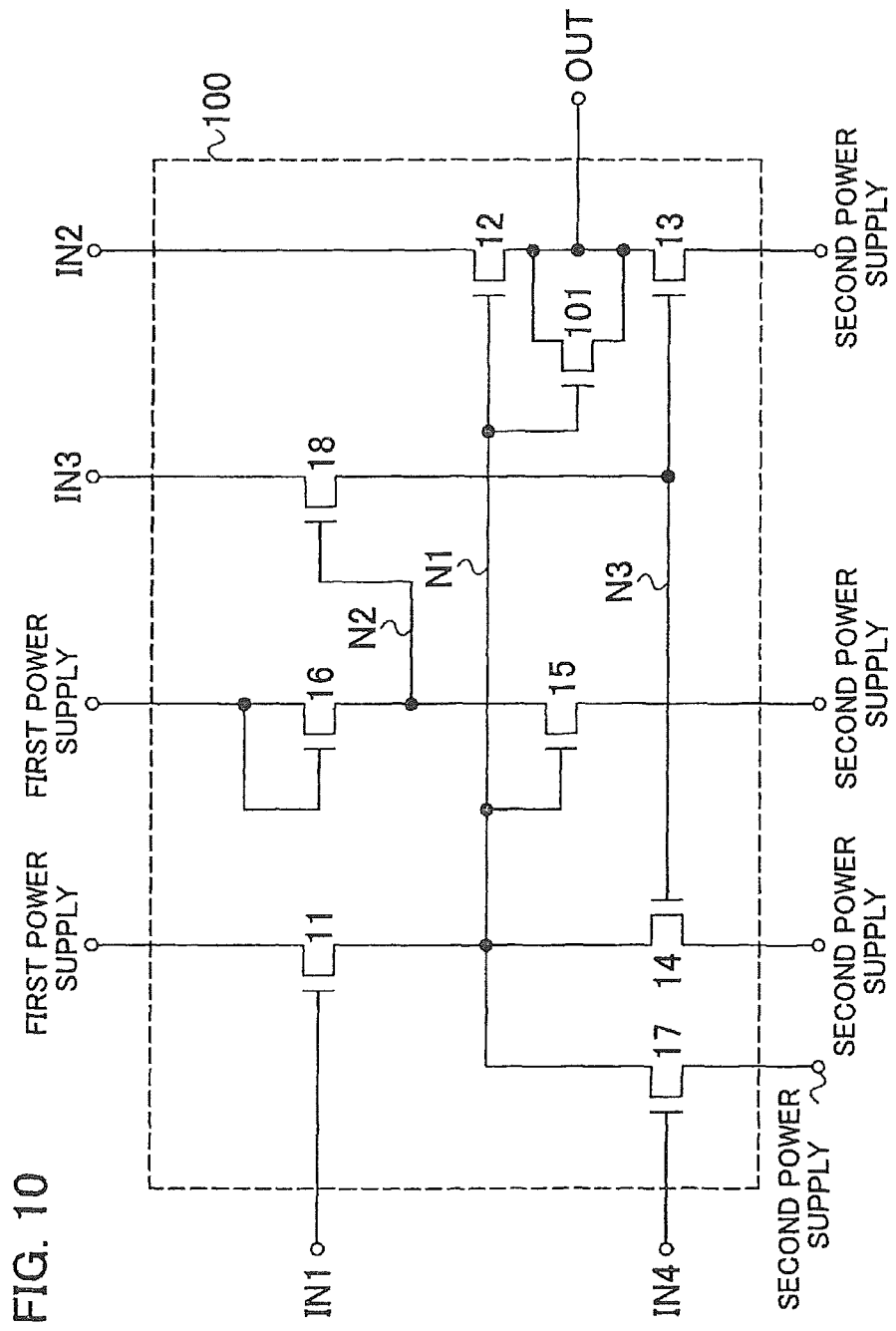
FIG. 10 is a diagram showing Embodiment Mode 1.

In addition, as another example, a capacitor may be formed by using a transistor 101 as in a flip-flop circuit 100 in FIG. 10. This is because the gate capacitance of the transistor 101 sufficiently functions as a capacitor when the transistor 101 is on.

It is to be noted that since the transistor 101 is on in the period T1 and the period T2 (at the time of performing the bootstrap operation), a channel region is formed in the transistor 101 so that the transistor 101 functions as the capacitor. On the other hand, since the transistor 101 is off in the period T3 and the period T4 (at the time of not performing the bootstrap operation), a channel region is not formed in the transistor 101, so that the transistor 101 does not function as the capacitor or functions as a small capacitor.

Here, by forming the capacitor by using the transistor 101 as in the flip-flop circuit 100 in FIG. 10 which is described above, the transistor 101 functions as the capacitor only when needed (in the period T1 and the period T2), and the transistor 101 does not function as the capacitor when not needed (in the period T3 and the period T4). Therefore, the flip-flop circuit 100 hardly malfunctions due to changes in the potentials of the node N1 and the output terminal OUT.

Note that the transistor 101 has the same polarity as that of the transistor 12.

It is also to be noted that the first terminal of the transistor 11 may be connected anywhere in the period T1 and the period T2 as long as it can make the node N1 into a floating state.

Figure 8:
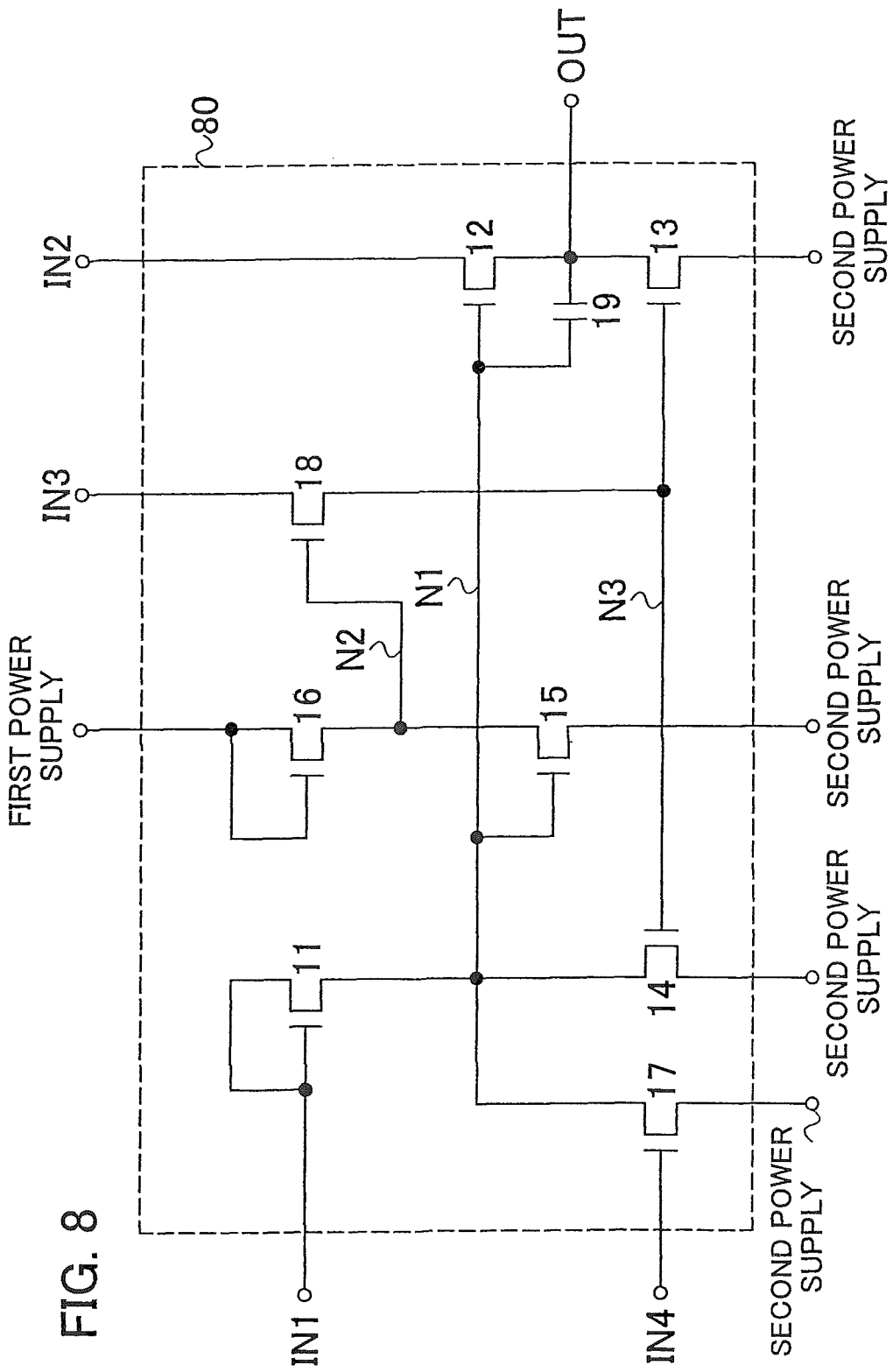
FIG. 8 is a diagram showing Embodiment Mode 1.

For example, the first terminal of the transistor 11 may be connected to the input terminal IN1 as in a flip-flop circuit 80 in FIG. 8. This is because the node N1 can be made into a floating state in the period T1 and the period T2 even when the first terminal of the transistor 11 is connected to the input terminal IN1.

Note that in the flip-flop circuit 10 in FIG. 1, noise is generated in the first power supply by parasitic capacitance between the first terminal and the gate terminal of the transistor 11 when the potential of the input terminal IN1 is changed. In addition, when a current is supplied from the first power supply to the node N1 by on/off of the transistor 11, noise is generated in the first power supply by a voltage drop due to the current. Such noise is generated by changes in the potential of the input terminal IN1.

Here, by connecting as in the flip-flop circuit 80 in FIG. 8 which is described above, the above-described noise can be suppressed. In addition, by suppressing the noise in the first power supply, another circuit using the first power supply can operate stably.

It is to be noted that another circuit using the first power supply corresponds to an inverter circuit, a level-shift circuit, a latch circuit, a PWC circuit, or the like which is connected to the output terminal OUT of the flip-flop circuit 80.

Note also that any element can be used as the transistor 16 as long as it can form an inverter circuit with the transistor 15. The transistor 16 does not necessarily have rectifying properties; any element can be used as long as a voltage is generated in the element when a current is supplied thereto.

For example, a resistor 91 may be connected as a substitute for the transistor 16 as in a flip-flop circuit 90 in FIG.

9. This is because an inverter circuit can be formed by using the resistor 91 and the transistor 15 even when the resistor 91 is connected as a substitute for the transistor 16.

Note that when the transistor 15 is off, the potential of the node N2 becomes VDD which is the same potential as that of the first power supply. In addition, the potential of the node N3 at this time becomes a value obtained by subtracting the threshold voltage Vth18 of the transistor 18 from the power supply potential VDD (VDD−Vth18).

Figure 9:
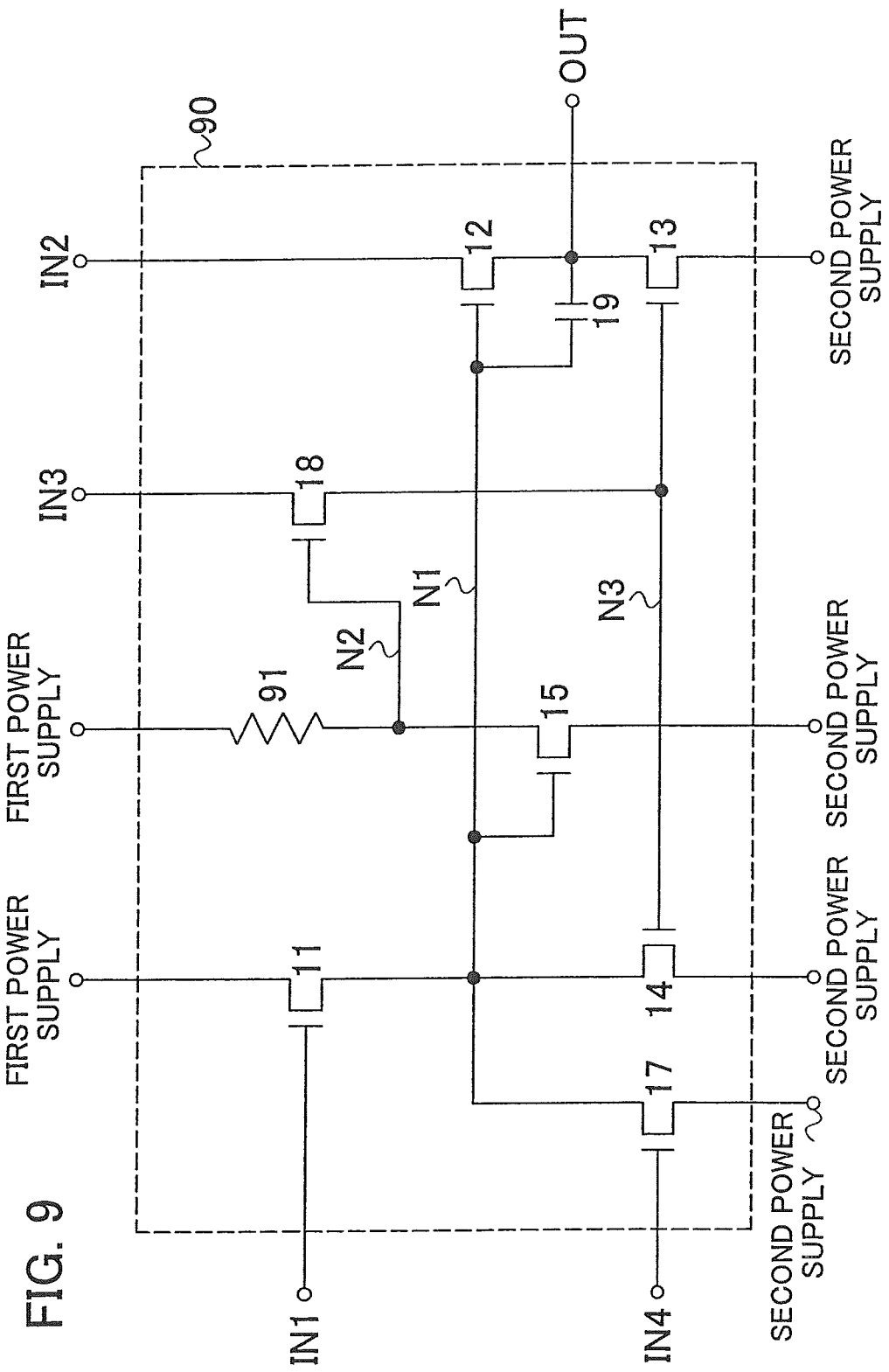
FIG. 9 is a diagram showing Embodiment Mode 1.

Here, by using the resistor 91 as a substitute for the transistor 16 as in the flip-flop circuit 90 in FIG. 9 which is described above, the potential of the node N2 becomes VDD and the potential of the node N3 only becomes lower than VDD by the threshold voltage Vth18 of the transistor 18 even when the threshold voltage of each transistor becomes higher due to characteristic deterioration, and thus, the transistor 13 and the transistor 14 can be easily turned on.

It is to be noted that although a control signal is supplied to each of the input terminal IN1, the input terminal IN2, the input terminal IN3, and the input terminal IN4, the invention is not limited to this.

For example, each of the input terminal IN1, the input terminal IN2, the input terminal IN3, and the input terminal IN4 may be supplied with the power supply potential VDD, the power supply potential VSS, or another potential.

It is to be noted that although the first terminal of the transistor 11 and the first terminal of the transistor 16 are connected to the first power supply, the invention is not limited to this.

For example, the first terminal of the transistor 11 and the first terminal of the transistor 16 may be connected to different power supplies, respectively. In that case, a potential of a power supply connected to the first terminal of the transistor 16 is preferably higher than a potential of a power supply connected to the first terminal of the transistor 11.

As another example, a control signal may be supplied to each of the first terminal of the transistor 11 and the first terminal of the transistor 16.

It is to be noted that although the first terminal of the transistor 13, the first terminal of the transistor 14, and the first terminal of the transistor 17 are connected to the second power supply, the invention is not limited to this.

For example, the first terminal of the transistor 13, the first terminal of the transistor 14, and the first terminal of the transistor 17 may be connected to different power supplies, respectively.

As another example, a control signal may be supplied to each of the first terminal of the transistor 13, the first terminal of the transistor 14, and the first terminal of the transistor 17.

Although the flip-flop circuit 10 shown in FIG. 1 is formed by using all n-channel transistors, the flip-flop circuit 10 shown in FIG. 1 may be formed by using all p-channel transistors as well. Here, a flip-flop circuit which is formed by using transistors which are all p-channel transistors is shown in FIG. 11.

Figure 11:
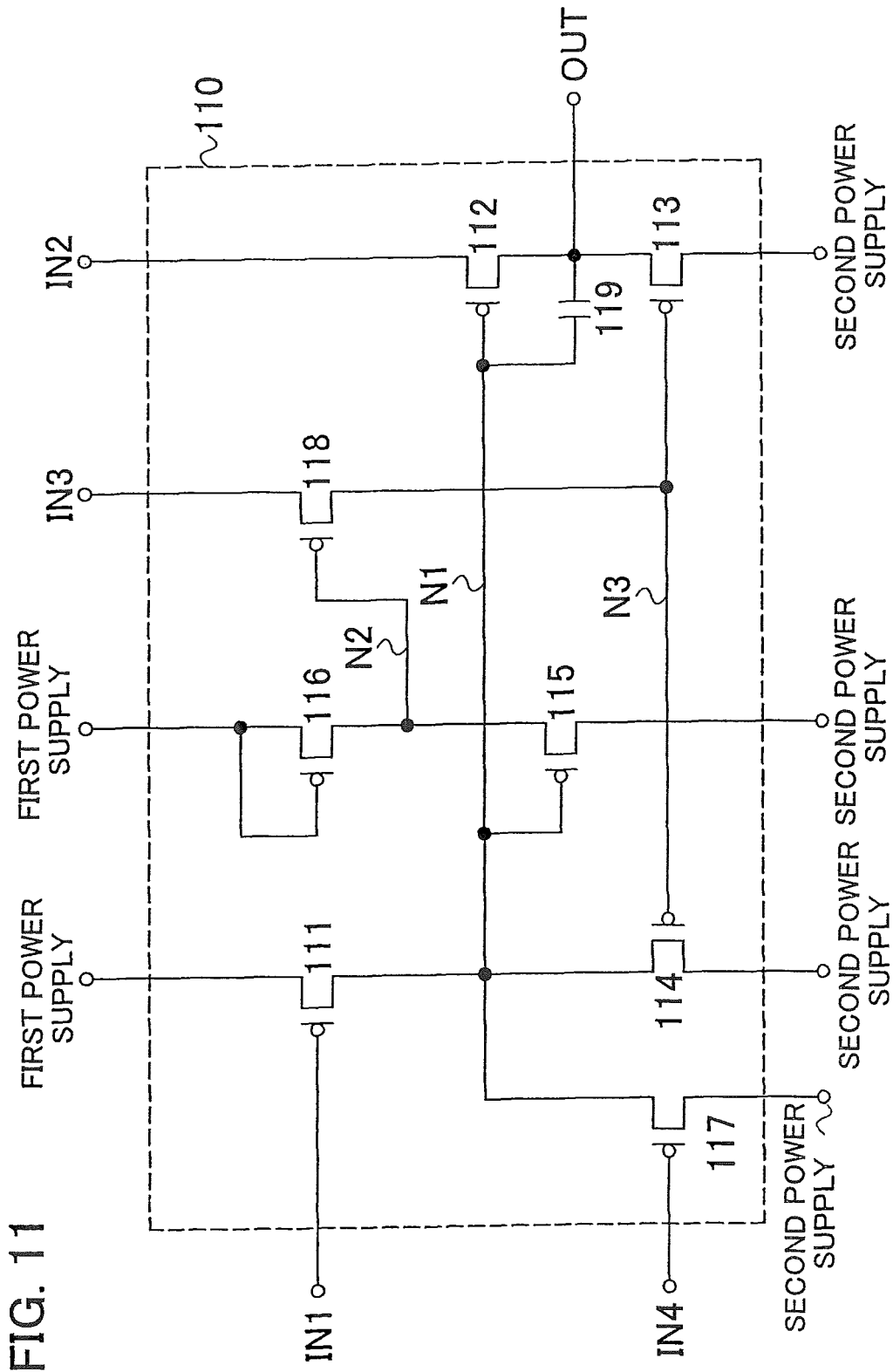
FIG. 11 is a diagram showing Embodiment Mode 1.

FIG. 11 shows one mode of a flip-flop circuit 110 of the shift register circuit of the invention. The shift register circuit of the invention includes a plurality of the flip-flop circuits 110. The flip-flop circuit 110 shown in FIG. 11 includes a transistor 111, a transistor 112, a transistor 113, a transistor 114, a transistor 115, a transistor 116, a transistor 117, a transistor 118, and a capacitor 119 having two electrodes. However, the capacitor 119 is not necessarily provided in the case where the gate capacitance of the transistor 112 can be used as a substitute for the capacitor 119.

As shown in the flip-flop circuit 110, a gate terminal of the transistor 111 is connected to the input terminal IN1. A first terminal of the transistor 111 is connected to the first power supply. A second terminal of the transistor 111 is connected to a gate terminal of the transistor 112, a second terminal of the transistor 114, a gate terminal of the transistor 115, a second terminal of the transistor 117, and a second electrode of the capacitor 119. A first terminal of the transistor 115 is connected to the second power supply, and a second terminal of the transistor 115 is connected to a second terminal of the transistor 116 and a gate terminal of the transistor 118. A gate terminal and a first terminal of the transistor 116 are connected to the first power supply. A first terminal of the transistor 118 is connected to the input terminal IN3, and a second terminal of the transistor 118 is connected to a gate terminal of the transistor 113 and a gate terminal of the transistor 114. A first terminal of the transistor 113 is connected to the second power supply. A second terminal of the transistor 113 is connected to a first electrode of the capacitor 119, a second terminal of the transistor 112, and the output terminal OUT. A first terminal of the transistor 112 is connected to the input terminal IN2. A first terminal of the transistor 114 is connected to the second power supply. A gate terminal of the transistor 117 is connected to the input terminal IN4, and a first terminal of the transistor 117 is connected to the second power supply.

It is to be noted that in the flip-flop circuit 110, a node of the second terminal of the transistor 111, the gate terminal of the transistor 112, the second terminal of the transistor 114, the gate terminal of the transistor 115, the second terminal of the transistor 117, and the second electrode of the capacitor 119 is denoted by N1. A node of the second terminal of the transistor 115, the second terminal of the transistor 116 and the gate terminal of the transistor 118 is denoted by N2. A node of the gate terminal of the transistor 113, the gate terminal of the transistor 114, and the second terminal of the transistor 118 is denoted by N3.

In addition, the power supply potential VSS is supplied to the first power supply, and the power supply potential VDD is supplied to the second power supply. A potential difference (VDD−VSS) between the power supply potential VSS of the first power supply and the power supply potential VDD of the second power supply corresponds to a power supply voltage of the flip-flop circuit 110. The power supply potential VDD is higher than the power supply potential VSS.

Further, a control signal is supplied to each of the input terminals IN1 to IN4. In addition, the output terminal OUT outputs an output signal. An output signal of a flip-flop circuit 110 in the previous stage is supplied to the input terminal IN1 as the control signal. An output signal of a flip-flop circuit 110 in the next stage is supplied to the input terminal IN4 as the control signal.

Moreover, each of the transistors 111 to 118 is a p-channel transistor. However, each of the transistors 111 to 118 may be an n-channel transistor.

Figure 12:
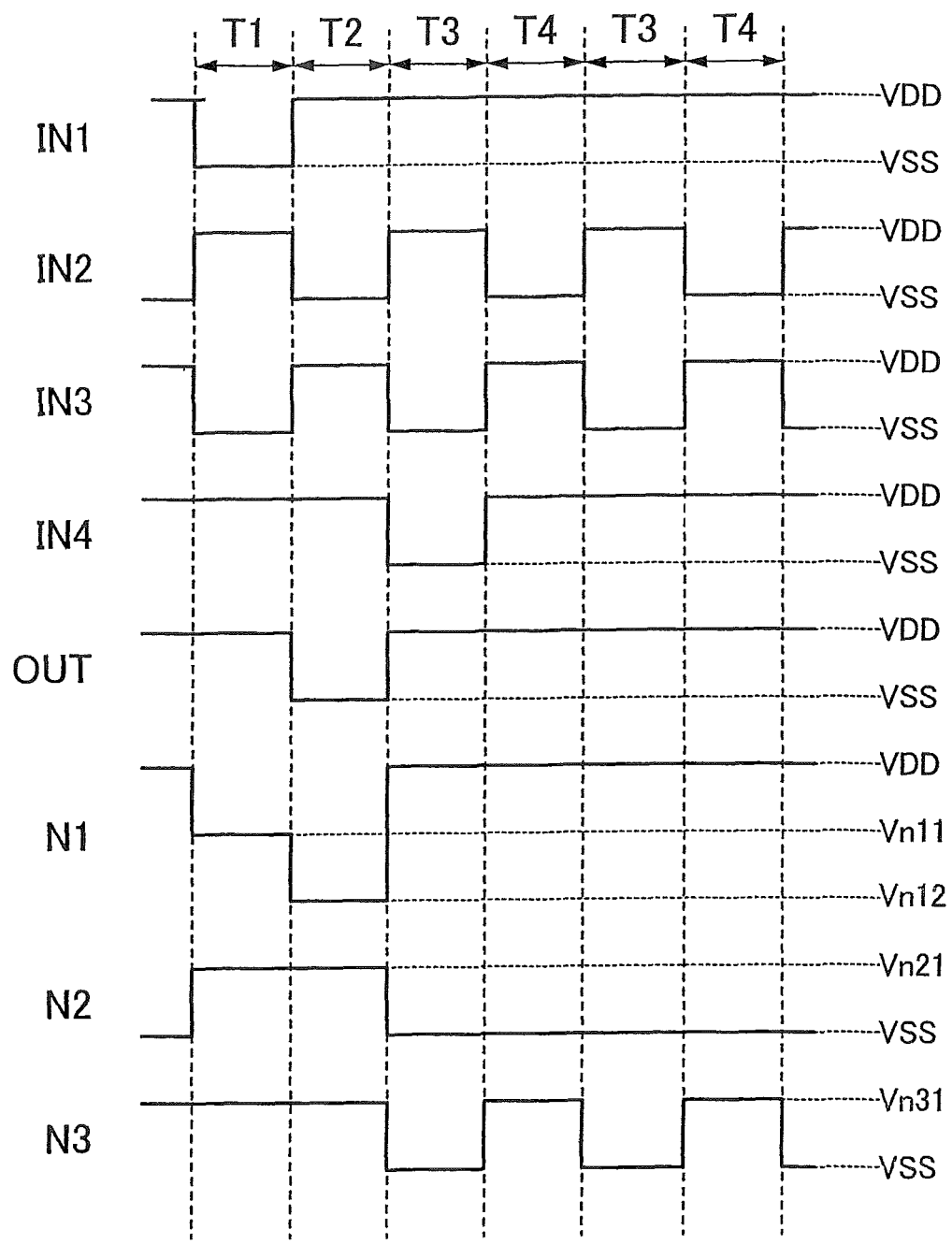
FIG. 12 is a timing chart showing Embodiment Mode 1.

Next, an operation of the flip-flop circuit 110 shown in FIG. 11 is described with reference to a timing chart shown in FIG. 12. FIG. 12 is a timing chart of the control signal which is supplied to each of the input terminals IN1 to IN4, the output signal which is output from the output terminal OUT, and potentials of the nodes N1 to N3 shown in FIG. 11. Note that with respect to the timing of the control signal and the output signal, an H level and an L level are inverted from those in the case where the flip-flop circuit is formed by using all n-channel transistors (FIG. 1). The timing chart shown in FIG. 12 is divided into a period T1 to a period T4 for convenience.

It is to be noted that in periods after the period T4, the period T3 and the period T4 are sequentially repeated. In addition, in FIG. 12, the period T1 is defined as a selection preparation period; the period T2 is defined as a selection period; and the period T3 and the period T4 are defined as non-selection periods. That is, one selection preparation period, one selection period, and a plurality of non-selection periods are sequentially repeated.

In addition, in the timing chart shown in FIG. 12, each of the control signal and the output signal is a digital signal having two values. One of the two values of the digital signal is VDD which is the same potential as the second power supply potential (hereinafter also described as a potential VDD or an H level) when the digital signal is an H signal, and the other of the two values of the digital signal is VSS which is the same potential as the first power supply potential (hereinafter also described as a potential VSS or an L level) when the digital signal is an L signal.

Next, operations of the flip-flop circuit 110 in each period are described.

First, an operation of the flip-flop circuit 110 in the period T1 is described.

In the period T1, the input terminal IN1 becomes an L level to turn on the transistor 111, and the input terminal IN4 becomes an H level to turn off the transistor 117. Since the node N3 is held at VDD obtained in the period T3 which is described later, the transistor 114 is turned off. The node N1 is electrically connected to the first power supply through the transistor 111, and a potential of the node N1 lowers to be Vn11. When the node N1 becomes Vn11, the transistor 111 is turned off. Here, Vn11 is a value which is the sum of the power supply potential VSS and the absolute value of the threshold voltage Vth111 of the transistor 111 (VSS+|Vth111|). Note that Vn111 is a potential which can turn on the transistor 112 and the transistor 115.

When the potential of the node N1 becomes Vn111, the transistor 111 is turned off and the transistor 112 and the transistor 115 are turned on. The node N2 is electrically connected to the second power supply through the transistor 115 and is electrically connected to the first power supply through the transistor 116, and a potential of the node N2 becomes Vn21. Here, Vn21 is determined by an operating point of the transistor 116 and the transistor 115. Note that the transistor 115 and the transistor 116 form an inverter using the two transistors. Accordingly, when an L-level signal is input into the gate terminal of the transistor 115 (the node N1), an H-level signal is input into the node N2. Here, Vn21 is a potential which can turn off the transistor 118. Accordingly, since the transistor 118 is off even when the input terminal IN3 is at an L level, the node N3 can be held at VDD. Since the input terminal IN2 becomes an H level, and the output terminal OUT is electrically connected to the input terminal IN2 through the transistor 112, the potential of the output terminal OUT becomes VDD.

Since the potential of the node N2 becomes Vn21 and the transistor 118 is off, the node N3 is held at VDD and the transistor 113 and the transistor 114 are turned off.

By the above-described operations, the transistor 112 is on and the output terminal OUT is set at an H level in the period T1. In addition, since the transistor 111 is off, the node N1 is set in a floating sate.

Next, an operation of the flip-flop circuit 110 in the period T2 is described.

In the period T2, the input terminal IN1 becomes an H level and the transistor 111 is off. The input terminal IN4 is unchanged at an H level and the transistor 117 is off. Therefore, the node N1 is kept in a floating state from the period T1 to hold the potential Vn11 in the period T1.

Since the potential of the node N1 is held at Vn11, the transistor 112 is on. The input terminal IN2 becomes an L level. Then, since the output terminal OUT is electrically connected to the input terminal IN2 through the transistor 112, the potential of the output terminal OUT lowers from VDD. The potential of the node N1 is changed into Vn12 by the capacitive coupling of the capacitor 119 to keep the on state of the transistor 112. A so-called bootstrap operation is performed. Accordingly, the potential of the output terminal OUT lowers to a potential equal to VSS which is a potential of the input terminal IN2. Note that Vn12 is a value which is less than or equal to a value obtained by subtracting the absolute value of the threshold voltage Vth112 of the transistor 112 from the potential VSS (VSS−|Vth112|). Since the input terminal IN2 becomes an L level, and the output terminal OUT is electrically connected to the input terminal IN2 through the transistor 112, the potential of the output terminal OUT becomes VSS.

The transistor 115 is continuously kept on even when the potential of the node N1 becomes Vn12. Therefore, the potential of the node N2 and the potential of the node N3 have the same potentials as those in the period T1.

By the above-described operations, the potential of the node N1 which is in a floating state is lowered by the bootstrap operation, so that the output terminal OUT has VSS.

Next, an operation of the flip-flop circuit 110 in the period T3 is described.

In the period T3, the input terminal IN1 is unchanged at an H level and the transistor 111 is off. The input terminal IN4 becomes an L level to turn on the transistor 117. Then, the node N1 is electrically connected to the second power supply through the transistor 117 so that the potential of the node N1 becomes VDD.

The potential of the node N1 becomes VDD to turn off the transistor 112 and the transistor 115. Since the node N2 is electrically connected to the first power supply through the transistor 116, the potential of the node N2 lowers to be Vn22. Here, Vn22 is a value which is the sum of the power supply potential VSS and the absolute value of the threshold voltage Vth116 of the transistor 116 (VSS+|Vth116|). Note that Vn22 is a potential which can turn on the transistor 118.

When the potential of the node N2 becomes Vn22, the transistor 118 is turned on. Then, since the input terminal IN3 becomes an L level, the node N3 is electrically connected to the input terminal IN3 through the transistor 118 and the potential of the node N3 becomes Vn31. Here, Vn31 is a value which is the sum of Vn22 which is the potential of the node N2 and the absolute value of the threshold voltage Vth118 of the transistor 118 (Vn22+|Vth118|). Note that Vn31 corresponds to a value which is the sum of the power supply potential VSS, the absolute value of the threshold voltage Vth116 of the transistor 116, and the absolute value of the threshold voltage Vth118 of the transistor 118 (VSS+|Vth116|+|Vth118|). In addition, Vn31 is a potential which can turn on the transistor 113 and the transistor 114.

When the potential of the node N3 becomes Vn31, the transistor 113 is turned on. Then, since the output terminal OUT is electrically connected to the second power supply through the transistor 113, the potential of the output terminal OUT becomes VDD.

By the above-described operations, VDD is supplied to the node N1 to turn off the transistor 112 and the transistor 115 in the period T3. In addition, the node N3 is set at an L level to turn on the transistor 113 and the transistor 114. Accordingly, the potential of the output terminal OUT is set at VDD so that the output terminal OUT has an H level.

Next, an operation of the flip-flop circuit 110 in the period T4 is described.

In the period T4, the input terminal IN3 becomes an H level and the potential of the node N3 becomes VDD. Thus, the transistor 113 and the transistor 114 are turned off. The input terminal IN4 becomes an H level to turn off the transistor 117. Therefore, the node N1 becomes a floating state and the potential of the node N1 is held at VDD.

Since the potential of the node N1 is unchanged at VDD, the transistor 112 and the transistor 115 are continuously kept off. Accordingly, the node N2 is unchanged at Vn22 and the transistor 118 is continuously kept on.

Since the transistor 112 and the transistor 113 are turned off, the output terminal OUT becomes a floating state. Thus, the potential of the output terminal OUT is held at VDD.

By the above-described operations, the potential of the output terminal OUT is held at VDD so that the transistor 113 and the transistor 114 can be turned off in the period T4. Since the transistor 113 and the transistor 114 are not always on, characteristic deterioration of the transistor 113 and the transistor 114 can be suppressed.

Relations among the period T1 to the period T4 are described. The next period of the period T1 is the period T2; the next period of the period T2 is the period T3; and next period of the period T3 is the period T4. Here, the next period of the period T4 is the period T1 or the period T3. That is, the next period of the period T4 is the period T1 when the input terminal IN1 becomes an L level, or the next period of the period T4 is the period T3 when the input terminal IN1 is unchanged at an H level. In addition, when the period T3 is the next period of the period T4, the input terminal IN4 is unchanged at an H level and the transistor 117 is continuously kept off.

Here, the transistor 111 to the transistor 118, and the capacitor 119 have the same functions as those of the transistor 11 to the transistor 18, and the capacitor 19 shown in FIG. 1, respectively.

In this manner, in the flip-flop circuit 110 shown in FIG. 11, the transistor 113 and the transistor 114 are turned on in the period T3 and turned off in the period T4, so that the transistor 113 and the transistor 114 can be prevented from always being on. Accordingly, the characteristic deterioration of the transistor 113 and the transistor 114 can be suppressed. Therefore, in the flip-flop circuit 110 shown in FIG. 11, a malfunction due to the characteristic deterioration of the transistor 113 and the transistor 114 can also be suppressed.

In addition, when the transistor 113 and the transistor 114 are turned on, the power supply potential VDD is supplied to the output terminal OUT and the node N1. Therefore, in the flip-flop circuit 110 shown in FIG. 11, the power supply potential VDD can be supplied to the output terminal OUT and the node N1 at regular intervals, so that fluctuation in the potentials of the output terminal OUT and the node N1 can be suppressed.

Further, in the flip-flop circuit 110 shown in FIG. 11, polysilicon can be used as a semiconductor layer, so that a manufacturing process can be simplified. Thus, a manufacturing cost can be reduced and yield can be improved. Furthermore, since characteristics in polysilicon hardly deteriorate, the life of the semiconductor device can be more extended than the case of using amorphous silicon as the semiconductor layer. By using the flip-flop circuit of the invention, the life of the semiconductor device can be more extended. Moreover, since the mobility of a transistor using polysilicon is high, the flip-flop circuit 110 can operate at high speed.

It is to be noted that the capacitor 119 is preferably formed by using a gate wiring layer and a semiconductor layer. The gate wiring layer and the semiconductor layer are stacked with a gate insulating film interposed therebetween. Since the film thickness of the gate insulating film is much thinner than other insulating layers such as an interlayer film, the capacitor can have a small area and high capacity when the gate insulating film is used as an insulator.

In addition, the size (W/L) of the transistor 115 is preferably larger than that of the transistor 116. Here, W means the channel width of a transistor and L means the channel length of the transistor. When the transistor 115 is turned on, the potential of the node N2 is determined by the operating point of the transistor 115 and the transistor 116. That is, if the size of the transistor 115 is not sufficiently larger than that of the transistor 116, the potential of the node N2 becomes higher, so that the transistor 118 cannot be turned off. Accordingly, in order to turn off the transistor 118, the size of the transistor 115 should be sufficiently larger than that of the transistor 116.

In addition, the size of the transistor 115 is preferably four times as large as that of the transistor 116 or more. More preferably, the size of the transistor 115 is ten times as large as that of the transistor 116 or more. When the power supply voltage is low, the ratio of the sizes of the transistor 115 to the transistor 116 may be approximately 4:1. However, when the power supply voltage becomes higher, the ratio of the sizes of the transistor 115 to the transistor 116 should be approximately 10:1.

Here, when a level-shift circuit or the like is connected to the output terminal OUT of the flip-flop circuit 110, the ratio of the sizes of the transistor 115 to the transistor 116 is preferably 4:1 or more. This is because the amplitude voltage of an output signal of the flip-flop circuit 110 is increased by the level-shift circuit or the like, so that the flip-flop circuit 110 often operates with a low power supply voltage.

Alternatively, when the level-shift circuit or the like is not connected to the output terminal OUT of the flip-flop circuit 110, the ratio of the sizes of the transistor 115 to the transistor 116 is preferably 10:1 or more. This is because the output signal of the flip-flop circuit 110 is applied to some kind of operation without being level shifted, so that the flip-flop circuit 110 often operates with a high power supply voltage.

Note that each of the power supply potentials and potentials of the control signals may be any potential as long as it can control on/off of a target transistor.

For example, the power supply potential VSS may be a potential lower than an L-level potential of a control signal. This is because the potential of the node N3 is Vn31 (VSS+|Vth116|+|Vth118|), so that Vn31 which is the potential of the node N3 becomes lower when the power supply potential VSS becomes lower. Accordingly, the transistor 113 and the transistor 114 can be surely turned on even when the threshold voltages of the transistor 113 and the transistor 114 become lower due to the characteristic deterioration of the transistor 113 and the transistor 114.

In addition, the power supply potential VSS may be a potential higher than the L-level potential of the control signal as long as it can control on/off of each transistor.

Note that the capacitor 119 is not necessarily provided when gate capacitance (parasitic capacitance) between the gate terminal and the second terminal of the transistor 112 is sufficiently large.

Figure 13:
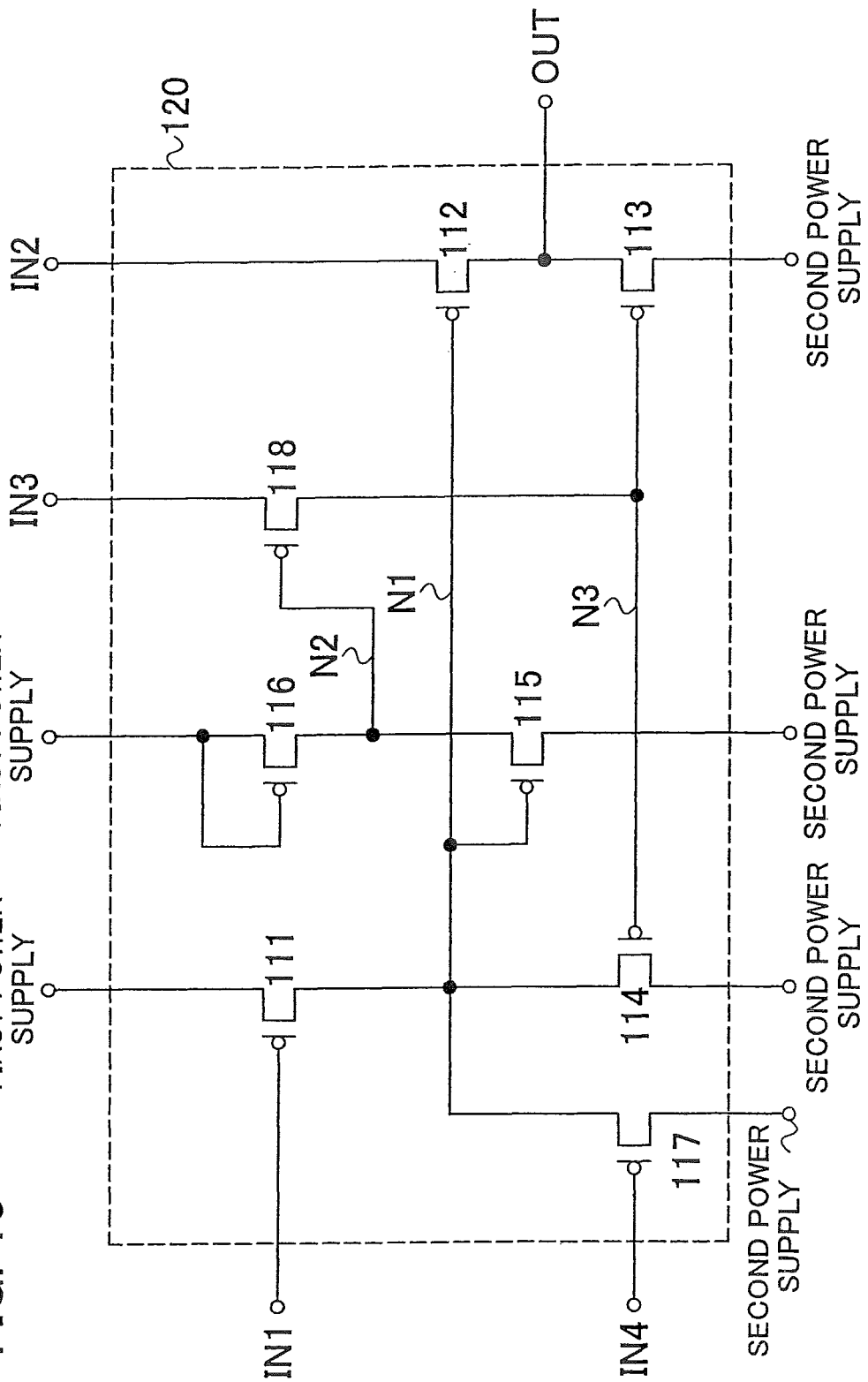
FIG. 13 is a diagram showing Embodiment Mode 1.

For example, the capacitor 119 is not necessary connected as in a flip-flop circuit 130 in FIG. 13. Accordingly, since the number of elements in the flip-flop circuit 130 is one less than the number of elements in the flip-flop circuit 110, each element can be arranged in high density in the flip-flop circuit 130.

Figure 16:
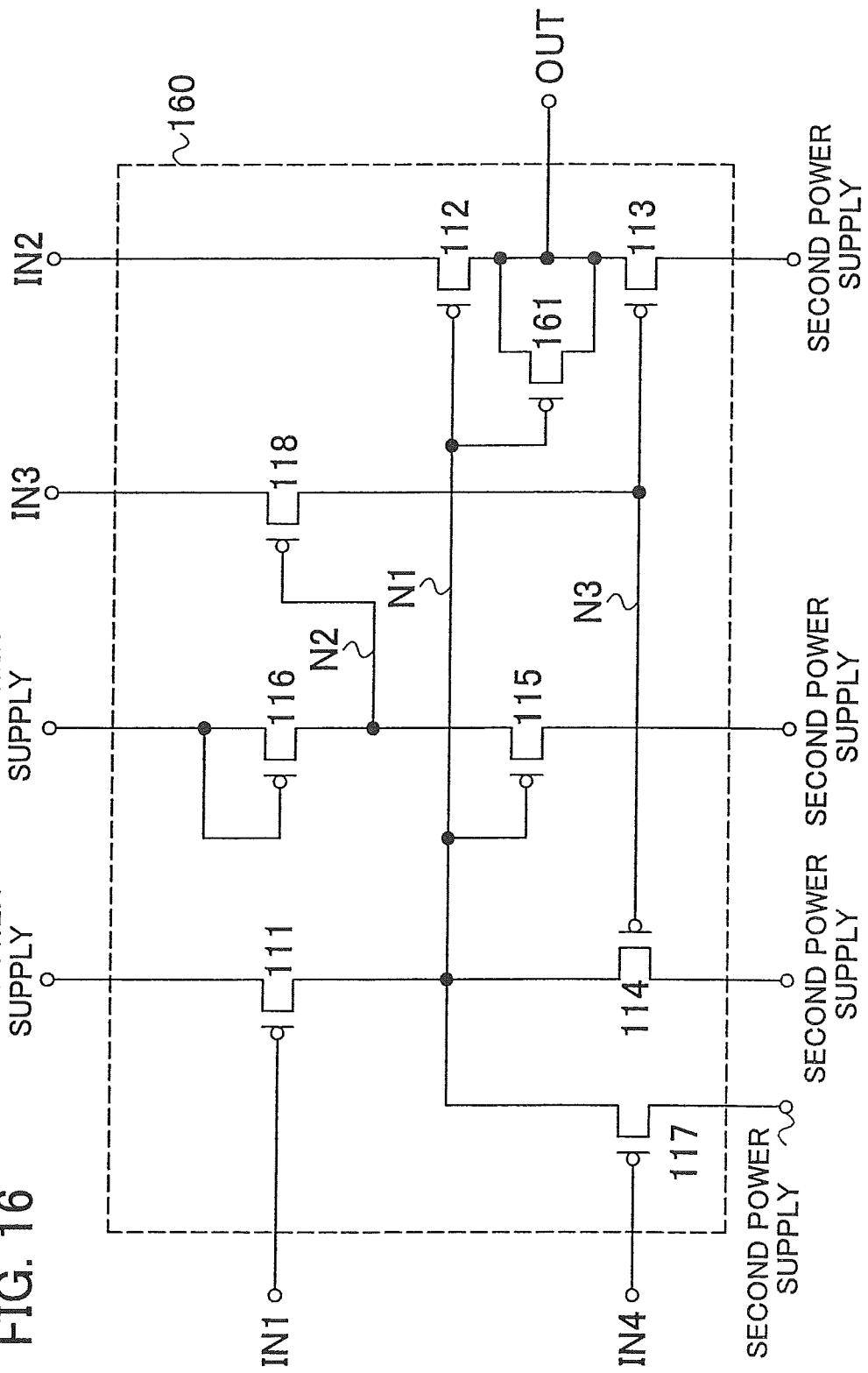
FIG. 16 is a diagram showing Embodiment Mode 1.

In addition, as another example, a capacitor may be formed by using a transistor 161 as in a flip-flop circuit 160 in FIG. 16. This is because the gate capacitance of the transistor 161 sufficiently functions as a capacitor when the transistor 161 is on.

It is to be noted that since the transistor 161 is on in the period T1 and the period T2 (at the time of performing the bootstrap operation), a channel region is formed in the transistor 161 so that the transistor 161 functions as a capacitor. On the other hand, since the transistor 161 is off in the period T3 and the period T4 (at the time of not performing the bootstrap operation), a channel region is not formed in the transistor 161 so that the transistor 161 does not function as a capacitor or functions as a small capacitor.

Here, by forming the capacitor by using the transistor 161 as in the flip-flop circuit 160 in FIG. 16 which is described above, the transistor 161 functions as the capacitor only when needed (in the period T1 and the period T2), and the transistor 161 does not function as the capacitor when not needed (in the period T3 and the period T4). Therefore, the flip-flop circuit 160 hardly malfunctions due to changes in the potentials of the node N1 and the output terminal OUT.

Note that the transistor 161 has the same polarity as that of the transistor 112.

It is also to be noted that the first terminal of the transistor 111 may be connected anywhere in the period T1 and the period T2 as long as it can make the node N1 into a floating state.

Figure 14:
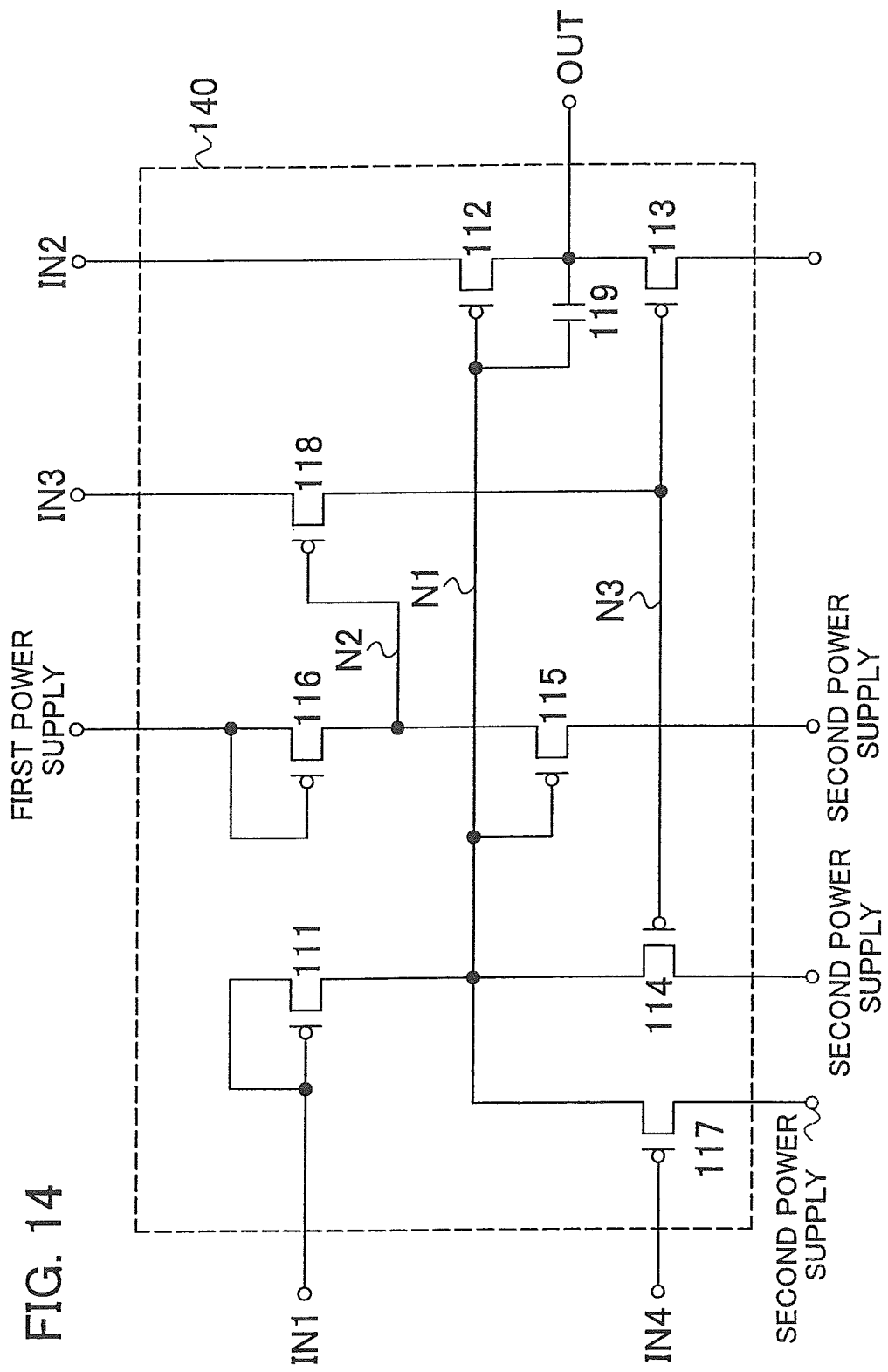
FIG. 14 is a diagram showing Embodiment Mode 1.

For example, the first terminal of the transistor 111 may be connected to the input terminal IN1 as in a flip-flop circuit 140 in FIG. 14. This is because the node N1 can be made into a floating state in the period T1 and the period T2 even when the first terminal of the transistor 111 is connected to the input terminal IN1.

Note that in the flip-flop circuit 110 in FIG. 11, noise is generated in the first power supply by parasitic capacitance between the first terminal and the gate terminal of the transistor 111 when the potential of the input terminal IN1 is changed. In addition, when a current is supplied from the first power supply to the node N1 by on/off of the transistor 111, noise is generated in the first power supply by a voltage drop due to the current. Such noise is generated by changes in the potential of the input terminal IN1.

Here, by connecting as in the flip-flop circuit 140 in FIG. 14 which is described above, the above-described noise can be suppressed. In addition, by suppressing the noise in the first power supply, another circuit using the first power supply can operate stably.

It is to be noted that another circuit using the first power supply corresponds to an inverter circuit, a level-shift circuit, a latch circuit, a PWC circuit, or the like which is connected to the output terminal OUT of the flip-flop circuit 140.

Note also that any element can be used as the transistor 116 as long as it can form an inverter circuit with the transistor 115. The transistor 116 does not necessarily have rectifying properties; any element can be used as long as a voltage is generated in the element when a current is supplied thereto.

Figure 15:
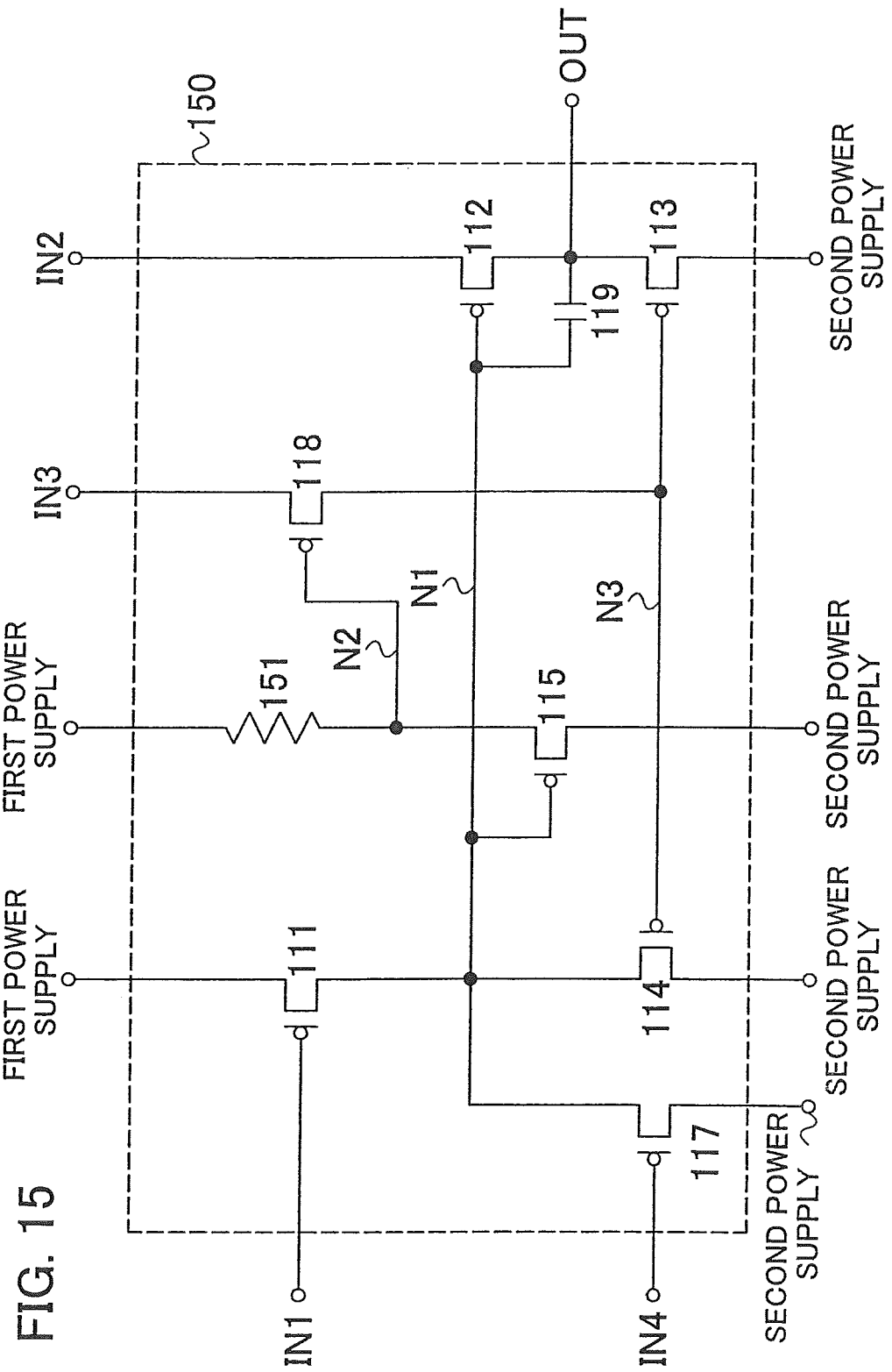
FIG. 15 is a diagram showing Embodiment Mode 1.

For example, a resistor 151 may be connected as a substitute for the transistor 116 as in a flip-flop circuit 150 in FIG. 15. This is because an inverter circuit can be formed by using the resistor 151 and the transistor 115 even when the resistor 151 is connected as a substitute for the transistor 116.

Note that when the transistor 115 is off, the potential of the node N2 becomes VSS which is the same potential as that of the first power supply. In addition, the potential of the node N3 at this time becomes a value which is the sum of the power supply potential VSS and the absolute value of the threshold voltage Vth118 of the transistor 118 (VSS+ |Vth118|).

Here, by using the resistor 151 as a substitute for the transistor 116 as in the flip-flop circuit 150 in FIG. 15 which is described above, the potential of the node N2 becomes VSS and the potential of the node N3 only becomes higher than VSS by the threshold voltage Vth118 of the transistor 118 even when the threshold voltage of each transistor becomes higher due to characteristic deterioration, and thus, the transistor 113 and the transistor 114 can be easily turned on.

It is to be noted that although a control signal is supplied to each of the input terminal IN1, the input terminal IN2, the input terminal IN3, and the input terminal IN4, the invention is not limited to this.

For example, each of the input terminal IN1 the input terminal IN2, the input terminal IN3, and the input terminal IN4 may be supplied with the power supply potential VDD, the power supply potential VSS, or another potential.

It is to be noted that although the first terminal of the transistor 111 and the first terminal of the transistor 116 are connected to the first power supply, the invention is not limited to this.

For example, the first terminal of the transistor 111 and the first terminal of the transistor 116 may be connected to different power supplies, respectively. In that case, a potential of a power supply connected to the first terminal of the transistor 116 is preferably higher than a potential of a power supply connected to the first terminal of the transistor 111.

As another example, a control signal may be supplied to each of the first terminal of the transistor 111 and the first terminal of the transistor 116.

It is to be noted that although the first terminal of the transistor 113, the first terminal of the transistor 114, and the first terminal of the transistor 117 are connected to the second power supply, the invention is not limited to this.

For example, the first terminal of the transistor 113, the first terminal of the transistor 114, and the first terminal of the transistor 117 may be connected to different power supplies, respectively.

Note that this embodiment mode can be freely implemented in combination with any description in other embodiment modes and embodiments in this specification. That is, in a non-selection period, the transistor in the shift register circuit of the invention is turned on at regular intervals, so that a power supply potential is supplied to the output terminal. Therefore, the power supply potential is supplied to the output terminal of the shift register circuit through the transistor. Since the transistor is not always on in the non-selection period, the threshold voltage shift of the transistor can be suppressed. Further, the power supply potential is supplied to the output terminal of the shift register circuit through the transistor at regular intervals.

Therefore, the shift register circuit can suppress noise which is generated in the output terminal.

Embodiment Mode 2

In this embodiment mode, a configuration of a shift register circuit of the invention is described.

Figure 17:
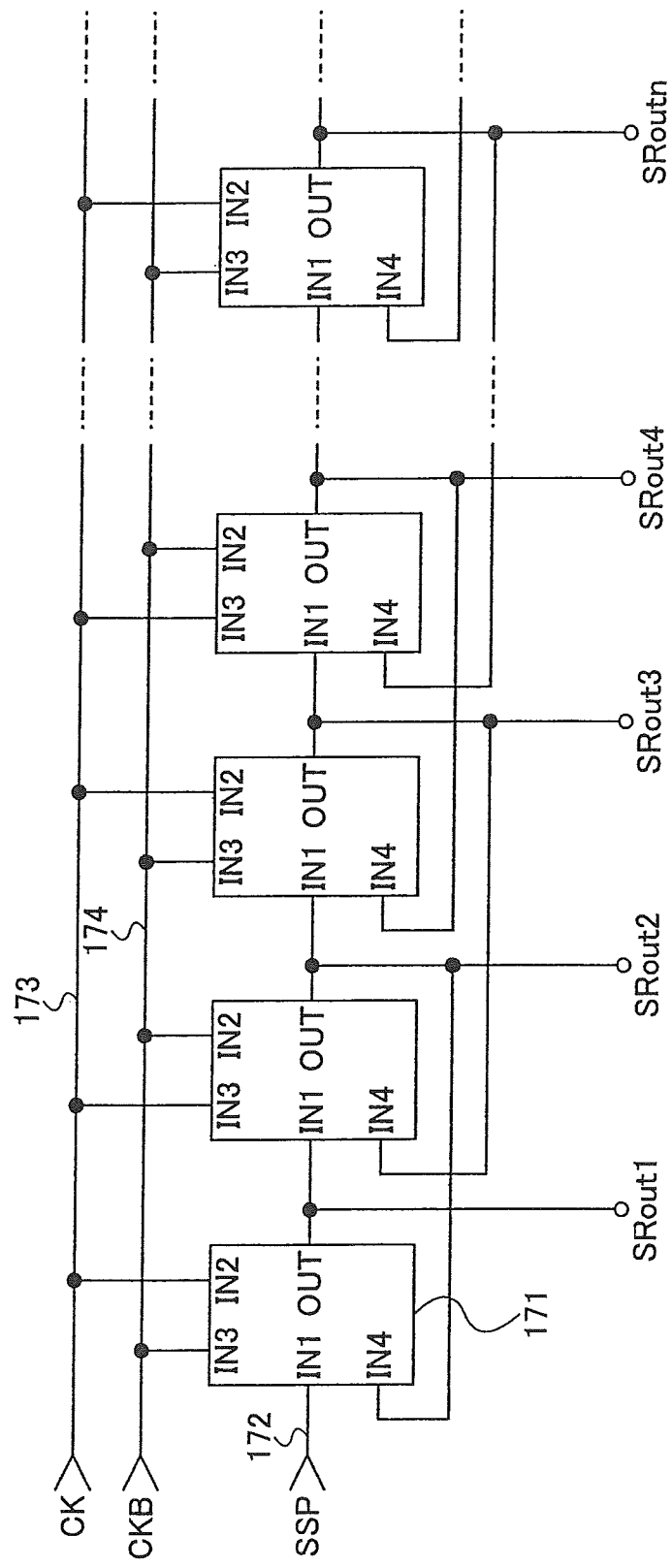
FIG. 17 is a diagram showing Embodiment Mode 2.

FIG. 17 shows one mode of the shift register circuit of the invention. A shift register circuit shown in FIG. 17 includes a plurality of flip-flop circuits 171, a control signal line 172, a control signal line 173, and a control signal line 174.

As shown in the shift register circuit in FIG. 17, the input terminal IN1 in each of the flip-flop circuits 171 is connected to the output terminal OUT of a flip-flop circuit 171 in the previous stage. The output terminal OUT is connected to the input terminal IN1 of a flip-flop circuit 171 in the next stage, the input terminal IN4 of a flip-flop circuit 171 in the previous stage, and the output terminal SRout of the shift register circuit. Note that the input terminal IN1 of a flip-flop circuit 171 in a first stage is connected to the control signal line 172. In addition, the input terminal IN4 of a flip-flop circuit 171 in the last stage is connected to a power supply. In flip-flop circuits 171 in odd-numbered stages, input terminals IN2 are connected to the control signal line 173 and input terminals IN3 are connected to the control signal line 174. On the other hand, in flip-flop circuits 171 in even-numbered stages, input terminals IN2 are connected to the control signal line 174 and input terminals IN3 are connected to the control signal line 173.

Note that flip-flop circuits which are similar to those shown in Embodiment Mode 1 can be used as the flip-flop circuits 171.

In addition, input terminals IN1 to IN4 and output terminals OUT which are similar to those shown in Embodiment Mode 1 can be used as the input terminals IN1 to IN4 and the output terminals OUT of the flip-flop circuits 171.

Further, an output terminal SRout in a first stage of the shift register circuit of the invention is denoted by SRout1; an output terminal SRout in a second stage of the shift register circuit of the invention is denoted by SRout2; an output terminal SRout in a third stage of the shift register circuit of the invention is denoted by SRout3; an output terminal SRout in a fourth stage of the shift register circuit of the invention is denoted by SRout4; an output terminal SRout in an n-th stage of the shift register circuit of the invention is denoted by SRoutn.

In addition, in the flip-flop circuits 171, a power supply and a power supply line are not illustrated for convenience. The first power supply and the second power supply which are described in Embodiment Mode 1 can be used as the power supply and the power supply line. Accordingly, the potential difference (VDD−VSS) between the power supply potential VDD of the first power supply and the power supply potential VSS of the second power supply corresponds to a power supply voltage of the flip-flop circuit 171.

Further, control signals SSP, CK, and CKB are supplied to the control signal line 172 to the control signal line 174, respectively. In addition, output signals of the flip-flop circuits 171 in the first stage to fourth stage and the n-th stage are supplied to the output terminals SRout1 to SRout4 and the output terminal SRoutn of the shift register circuit, respectively.

Figure 18:
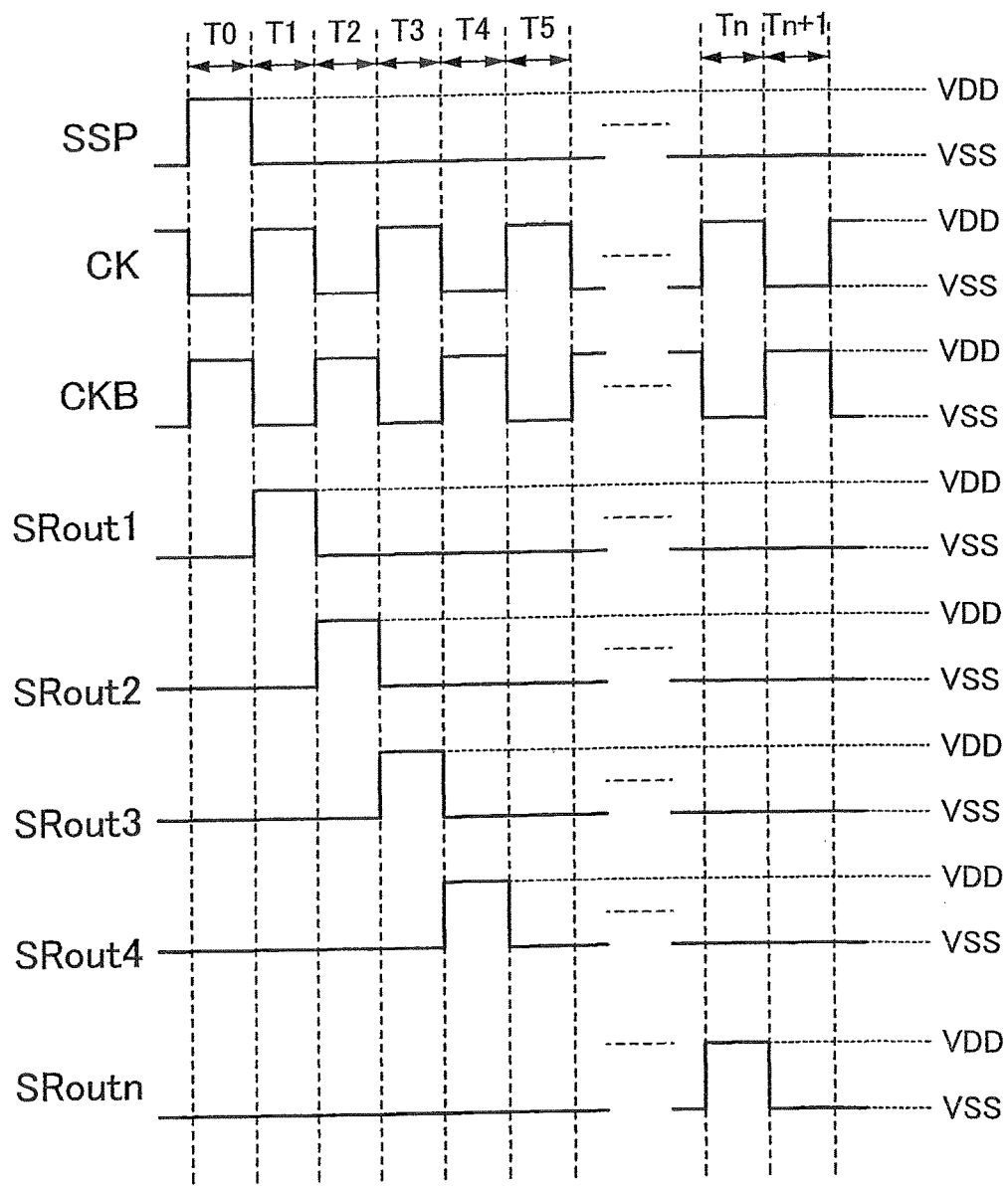
FIG. 18 is a timing chart showing Embodiment Mode 2.

Next, operations of the shift register circuit shown in FIG. 17 are described with reference to a timing chart shown in FIG. 18. FIG. 18 is a timing chart of the control signals SSP, CK, and CKB supplied to the control signal lines 172 to 174, respectively, and the output signals of the output terminals SRout1 to SRout4 and the output terminal SRoutn. In addition, the timing chart shown in FIG. 18 is divided into a period T0 to a period T5, a period Tn, and a period Tn+1 for convenience.

It is to be noted that FIG. 18 is a timing chart in the case of using n-channel transistors as transistors. That is, FIG. 18 is a timing chart in the case of using the flip-flop circuits shown in FIG. 1 and FIGS. 7 to 10 as the flip-flop circuits 171.

Note that in the timing chart shown in FIG. 18, each of a control signal and the output signal is a digital signal having two values similar to Embodiment Mode 1.

The operations of the shift register circuit shown in FIG. 17 are described with reference to FIG. 18.

First, an operation of the shift register circuit in the period T0 is described. In the period T0, the control signal SSP is at an H level; the control signal CK is at an L level; and the control signal CKB is at an H level.

In the flip-flop circuit 171 in the first stage, the input terminal IN1 becomes an H level; the input terminal IN2 becomes an L level; the input terminal IN3 becomes an H level; and the input terminal IN4 becomes an L level. Thus, the output terminal OUT becomes an L level. This state is the same as that of the timing chart shown in FIG. 2 in the period T1.

In the flip-flop circuits 171 in the odd-numbered stages except for the first stage, the input terminal IN1 becomes an L level; the input terminal IN2 becomes an L level; the input terminal IN3 becomes an H level; and the input terminal IN4 becomes an L level. Thus, the output terminal OUT becomes an L level. This state is the same as that of the timing chart shown in FIG. 2 in the period T3.

In the flip-flop circuits 171 in the even-numbered stages, the input terminal IN1 becomes an L level; the input terminal IN2 becomes an H level; the input terminal IN3 becomes an L level; and the input terminal IN4 becomes an L level. Thus, the output terminal OUT becomes an L level. This state is the same as that of the timing chart shown in FIG. 2 in the period T4.

In this manner, all the output terminals SRout of the shift register circuit are at an L level.

Next, an operation of the shift register circuit in the period T1 is described. In the period T1, the control signal SSP is at an L level; the control signal CK is at an H level; and the control signal CKB is at an L level.

In the flip-flop circuit 171 in the first stage, the input terminal IN1 becomes an L level; the input terminal IN2 becomes an H level; the input terminal IN3 becomes an L level; and the input terminal IN4 is unchanged at an L level. Thus, the output terminal OUT becomes an H level. This state is the same as that of the timing chart shown in FIG. 2 in the period T2.

In the flip-flop circuit 171 in the second stage, the input terminal IN1 becomes an H level; the input terminal IN2 becomes an L level; the input terminal IN3 becomes an H level; and the input terminal IN4 is unchanged at an L level. Thus, the output terminal OUT is unchanged at an L level. This state is the same as that of the timing chart shown in FIG. 2 in the period T1.

In the flip-flop circuits 171 in the odd-numbered stages except for the first stage, the input terminal IN1 is unchanged at an L level; the input terminal IN2 becomes an H level; the input terminal IN3 becomes an L level; and the input terminal IN4 is unchanged at an L level. Thus, the output terminal OUT is unchanged at an L level. This state is the same as that of the timing chart shown in FIG. 2 in the period T4.

In the flip-flop circuits 171 in the even-numbered stages except for the second stage, the input terminal IN1 is unchanged at an L level; the input terminal IN2 becomes an L level; the input terminal IN3 becomes an H level; and the input terminal IN4 is unchanged at an L level. Thus, the output terminal OUT is unchanged at an L level. This state is the same as that of the timing chart shown in FIG. 2 in the period T3.

In this manner, the output terminal SRout1 of the shift register circuit becomes an H level, and other output terminals SRout are unchanged at an L level.

Next, an operation of the shift register circuit in the period T2 is described. In the period T2, the control signal SSP becomes an L level; the control signal CK becomes an L level; and the control signal CKB becomes an H level.

In the flip-flop circuit 171 in the first stage, the input terminal IN1 is unchanged at an L level; the input terminal IN2 becomes an L level; the input terminal IN3 becomes an L level; and the input terminal IN4 becomes an H level. Thus, the output terminal OUT becomes an L level. This state is the same as that of the timing chart shown in FIG. 2 in the period T3.

In the flip-flop circuit 171 in the second stage, the input terminal IN1 becomes an L level; the input terminal IN2 becomes an H level; the input terminal IN3 becomes an L level; and the input terminal IN4 is unchanged at an L level. Thus, the output terminal OUT becomes an H level. This state is the same as that of the timing chart shown in FIG. 2 in the period T2.

In the flip-flop circuit 171 in the third stage, the input terminal IN1 becomes an H level; the input terminal IN2 becomes an L level; the input terminal IN3 becomes an H level; and the input terminal IN4 is unchanged at an L level. Thus, the output terminal OUT is unchanged at an L level. This state is the same as that of the timing chart shown in FIG. 2 in the period T1.

In the flip-flop circuits 171 in the odd-numbered stages except for the first stage and the third stage, the input terminal IN1 is unchanged at an L level; the input terminal IN2 becomes an L level; the input terminal IN3 becomes an H level; and the input terminal IN4 is unchanged at an L level. Thus, the output terminal OUT is unchanged at an L level. This state is the same as that of the timing chart shown in FIG. 2 in the period T3.

In the flip-flop circuits 171 in the even-numbered stages except for the second stage, the input terminal IN1 is unchanged at an L level; the input terminal IN2 becomes an H level; the input terminal IN3 becomes an L level; and the input terminal IN4 is unchanged at an L level. Thus, the output terminal OUT is unchanged at an L level. This state is the same as that of the timing chart shown in FIG. 2 in the period T4.

In this manner, the output terminal SRout1 of the shift register circuit becomes an L level; the output terminal SRout2 becomes an H level; and other output terminals SRout are unchanged at an L level.

Similarly in the later periods, the output terminal SRout3 of the shift register circuit becomes an H level in the period T3; the output terminal SRout4 of the shift register circuit becomes an H level in the period T4; the output terminal SRout5 of the shift register circuit in the fifth stage becomes an H level in the period T5; and the output terminal SRoutn of the shift register circuit in the n-th stage becomes an H level in the period Tn. In this manner, the output terminals of the shift register circuit sequentially become an H level only for one period. In addition, one period corresponds to a half period of the control signal CK or the control signal CKB.

By the above-described operations, the output terminals SRout of the shift register circuits shown in FIG. 17 can be set at an H level one stage by one stage. In addition, by using the flip-flop circuits shown in Embodiment Mode 1 as the flip-flop circuits 171, the flip-flop circuits shown in FIG. 17 hardly malfunction due to characteristic deterioration of the transistors so that noise of the output signals is reduced.

Figure 19:
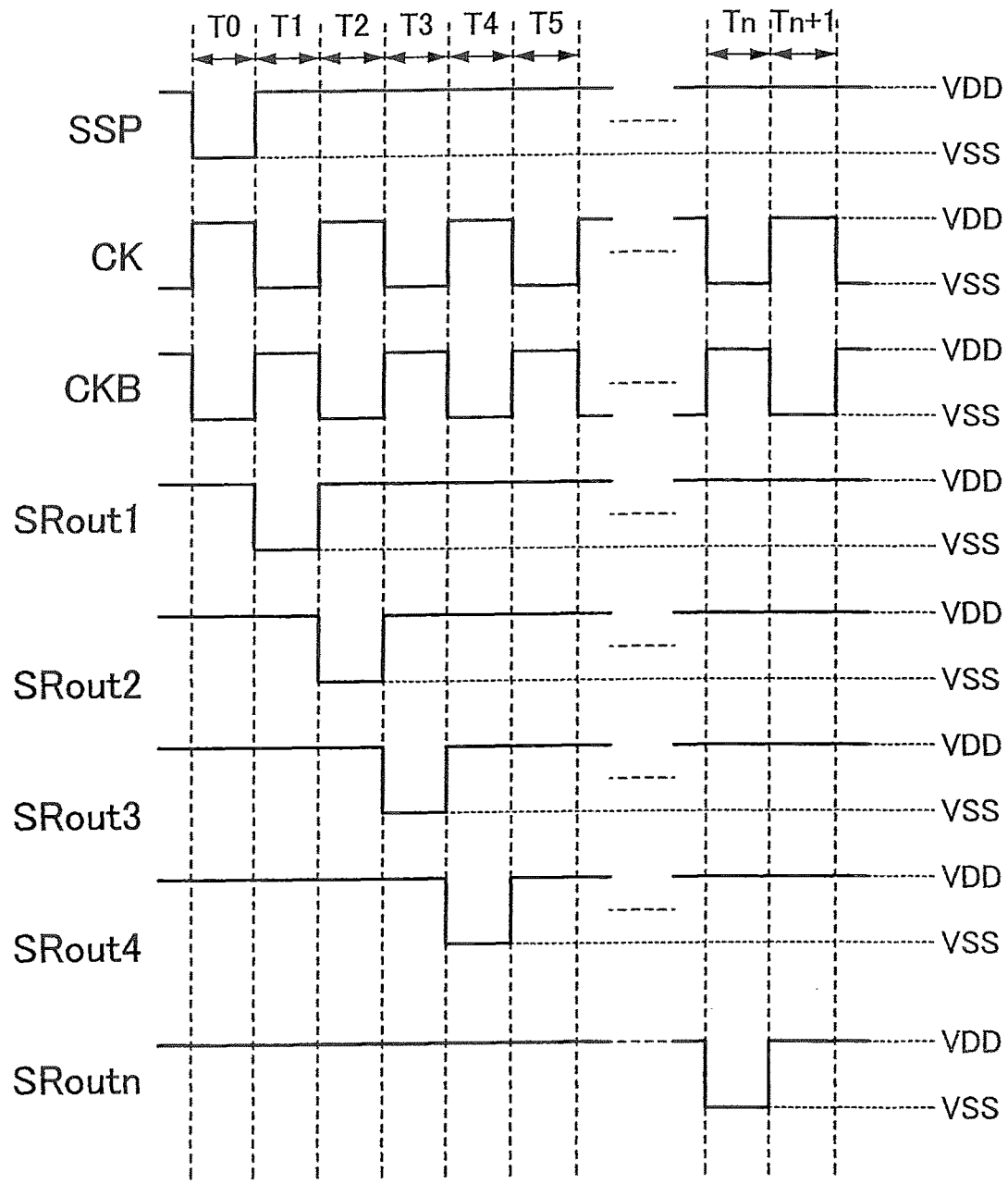
FIG. 19 is a timing chart showing Embodiment Mode 2.

Although FIG. 18 shows the timing chart in the case where the transistors of the flip-flop circuits 171 are n-channel transistors, FIG. 19 shows a timing chart in the case where transistors of the flip-flop circuits 171 are p-channel transistors. That is, FIG. 19 is a timing chart in the case of using the flip-flop circuits shown in FIG. 11 and FIGS. 13 to 16 as the flip-flop circuits 171.

Next, operations of the shift register circuit shown in FIG. 17 are described with reference to a timing chart shown in FIG. 19. FIG. 19 is a timing chart of the control signals SSP, CK, and CKB supplied to the control signal lines 172 to 174, respectively, and the output signals of the output terminals SRout1 to SRout4 and the output terminal SRoutn shown in FIG. 17. In addition, the timing chart shown in FIG. 19 is divided into a period T0 to a period T5, a period Tn, and a period Tn+1 for convenience. Note that with respect to the timing of the control signals and the output signals, an H level and an L level are inverted from those in the case where the flip-flop circuit 171 is formed by using all n-channel transistors (FIG. 18).

Note that in the timing chart shown in FIG. 19, each of the control signal and the output signal is a digital signal having two values similar to Embodiment Mode 1.

The operations of the shift register circuit shown in FIG. 17 are described with reference to FIG. 19.

First, an operation of the shift register circuit in the period T0 is described. In the period T0, the control signal SSP is at an L level; the control signal CK is at an H level; and the control signal CKB is at an L level.

In the flip-flop circuit 171 in the first stage, the input terminal IN1 becomes an L level; the input terminal IN2 becomes an H level; the input terminal IN3 becomes an L level; and the input terminal IN4 becomes an H level. Thus, the output terminal OUT becomes an H level. This state is the same as that of the timing chart shown in FIG. 12 in the period T1.

In the flip-flop circuits 171 in the odd-numbered stages except for the first stage, the input terminal IN1 becomes an L level; the input terminal IN2 becomes an H level; the input terminal IN3 becomes an L level; and the input terminal IN4 becomes an H level. Thus, the output terminal OUT becomes an H level. This state is the same as that of the timing chart shown in FIG. 12 in the period T3.

In the flip-flop circuits 171 in the even-numbered stages, the input terminal IN1 becomes an H level; the input terminal IN2 becomes an L level; the input terminal IN3 becomes an H level; and the input terminal IN4 becomes an H level. Thus, the output terminal OUT becomes an H level. This state is the same as that of the timing chart shown in FIG. 12 in the period T4.

In this manner, all the output terminals SRout of the shift register circuit are at an H level.

Next, an operation of the shift register circuit in the period T1 is described. In the period T1, the control signal SSP is at an H level; the control signal CK is at an L level; and the control signal CKB is at an H level.

In the flip-flop circuit 171 in the first stage, the input terminal IN1 becomes an H level; the input terminal IN2 becomes an L level; the input terminal IN3 becomes an H level; and the input terminal IN4 is unchanged at an H level. Thus, the output terminal OUT becomes an L level. This state is the same as that of the timing chart shown in FIG. 12 in the period T2.

In the flip-flop circuit 171 in the second stage, the input terminal IN1 becomes an L level; the input terminal IN2 becomes an H level; the input terminal IN3 becomes an L level; and the input terminal IN4 is unchanged at an H level. Thus, the output terminal OUT is unchanged at an H level. This state is the same as that of the timing chart shown in FIG. 12 in the period T1.

In the flip-flop circuits 171 in the odd-numbered stages except for the first stage, the input terminal IN1 is unchanged at an H level; the input terminal IN2 becomes an L level; the input terminal IN3 becomes an H level; and the input terminal IN4 is unchanged at an H level. Thus, the output terminal OUT is unchanged at an H level. This state is the same as that of the timing chart shown in FIG. 12 in the period T4.

In the flip-flop circuits 171 in the even-numbered stages except for the second stage, the input terminal IN1 is unchanged at an H level; the input terminal IN2 becomes an H level; the input terminal IN3 becomes an L level; and the input terminal IN4 is unchanged at an H level. Thus, the output terminal OUT is unchanged at an H level. This state is the same as that of the timing chart shown in FIG. 12 in the period T3.

In this manner, the output terminal SRout1 of the shift register circuit becomes an L level, and other output terminals SRout are unchanged at an H level.

Next, an operation of the shift register circuit in the period T2 is described. In the period T2, the control signal SSP is at an H level; the control signal CK is at an H level; and the control signal CKB is at an L level.

In the flip-flop circuit 171 in the first stage, the input terminal IN1 is unchanged at an H level; the input terminal IN2 becomes an H level; the input terminal IN3 becomes an L level; and the input terminal IN4 becomes an L level. Thus, the output terminal OUT becomes an H level. This state is the same as that of the timing chart shown in FIG. 12 in the period T3.

In the flip-flop circuit 171 in the second stage, the input terminal IN1 becomes an H level; the input terminal IN2 becomes an L level; the input terminal IN3 becomes an H level; and the input terminal IN4 is unchanged at an H level. Thus, the output terminal OUT becomes an L level. This state is the same as that of the timing chart shown in FIG. 12 in the period T2.

In the flip-flop circuit 171 in the third stage, the input terminal IN1 becomes an L level; the input terminal IN2 becomes an H level; the input terminal IN3 becomes an L level; and the input terminal IN4 is unchanged at an H level. Thus, the output terminal OUT is unchanged at an H level. This state is the same as that of the timing chart shown in FIG. 12 in the period T1.

In the flip-flop circuits 171 in the odd-numbered stages except for the first stage and third stage, the input terminal IN1 is unchanged at an H level; the input terminal IN2 becomes an H level; the input terminal IN3 becomes an L level; and the input terminal IN4 is unchanged at an H level. Thus, the output terminal OUT is unchanged at an H level. This state is the same as that of the timing chart shown in FIG. 12 in the period T3.

In the flip-flop circuits 171 in the even-numbered stages except for the second stage, the input terminal IN1 is unchanged at an H level; the input terminal IN2 becomes an L level; the input terminal IN3 becomes an H level; and the input terminal IN4 is unchanged at an H level. Thus, the output terminal OUT is unchanged at an H level. This state is the same as that of the timing chart shown in FIG. 12 in the period T4.

In this manner, the output terminal SRout1 of the shift register circuit becomes an H level; the output terminal SRout2 becomes an L level; and other output terminals SRout are unchanged at an H level.

Similarly in the later periods, the output terminal SRout3 of the shift register circuit becomes an L level in the period T3; the output terminal SRout4 of the shift register circuit becomes an L level in the period T4; the output terminal SRout5 of the shift register circuit in the fifth stage becomes an L level in the period T5; and the output terminal SRoutn of the shift register circuit in the n-th stage becomes an L level in the period Tn. In this manner, the output terminals of the shift register circuit sequentially become an L level only for one period. In addition, one period corresponds to a half period of the control signal CK or the control signal CKB.

By the above-described operations, the output terminal SRout of the shift register circuit shown in FIG. 17 can be set at an L level one stage by one stage. In addition, by using the flip-flop circuits shown in Embodiment Mode 1 as the flip-flop circuits 171, the flip-flop circuits shown in FIG. 17 hardly malfunction due to characteristic deterioration of the transistors so that noise of the output signals is reduced.

It is to be noted that the flip-flop circuits 171 may be any flip-flop circuits as long as they can supply selection signals to the output terminals SRout of the shift register circuit sequentially from the first stage.

Note that the output terminals OUT of the flip-flop circuits 171 may be connected to the output terminals SRout of the shift register circuit through various elements and circuits. Various elements and circuits correspond to a logic circuit such as an inverter circuit, a buffer circuit, a NAND circuit, a NOR circuit, a tristate buffer circuit, or a PWC circuit, and a switch, a resistor, a capacitor, another element, or the like. In addition, by combining with these elements or circuits, various circuits can be formed.

It is to be noted that although a control signal is supplied to each of the control signal lines 172 to 174, the invention is not limited to this.

For example, each of the control signal lines 172 to 174 may be supplied with the power supply potential VDD, the power supply potential VSS, or another potential.

It is to be noted that although the control signal CK is supplied to the control signal line 173 and the control signal CKB is supplied to the control signal line 174, the invention is not limited to this.

For example, the control signal CK may be supplied to the control signal line 173 and an inverted signal of the control signal CK may be supplied to the control signal line 174 through an inverter circuit. Alternatively, an inverted signal of the control signal CKB may be supplied to the control signal line 173 through an inverter circuit and the control signal CKB may be supplied to the control signal line 174. Note that this inverter circuit is preferably formed over the same substrate as the shift register circuit.

It is to be noted that although the input terminal IN4 of the flip-flop circuit 171 in the last stage is connected to the power supply, the invention is not limited to this.

For example, the input terminal IN4 of the flip-flop circuit 171 in the last stage may be connected to any one of the control signal lines 172 to 174, to another control signal line, or to the output terminal OUT of the flip-flop circuit 171 in another stage.

Note that this embodiment mode can be freely implemented in combination with any description in other embodiment modes and embodiments in this specification. That is, in a non-selection period, the transistor in the shift register circuit of the invention is turned on at regular intervals, so that a power supply potential is supplied to the output terminal. Therefore, the power supply potential is supplied to the output terminal of the shift register circuit through the transistor. Since the transistor is not always on in the non-selection period, the threshold voltage shift of the transistor can be suppressed. Further, the power supply potential is supplied to the output terminal of the shift register circuit through the transistor at regular intervals. Therefore, the shift register circuit can suppress noise which is generated in the output terminal.

Embodiment Mode 3

In this embodiment mode, a structure example in the case of using the flip-flop circuit described in Embodiment Mode 1, the shift register circuit described in Embodiment Mode 2, and the like as a part of a driver circuit is described.

A structure example of a driver circuit which can be applied to a gate driver is described with reference to FIGS. 20 to 27. Note that driver circuits in FIGS. 20 to 27 can be applied not only to gate drivers but also to any circuit structures.

Figure 20:
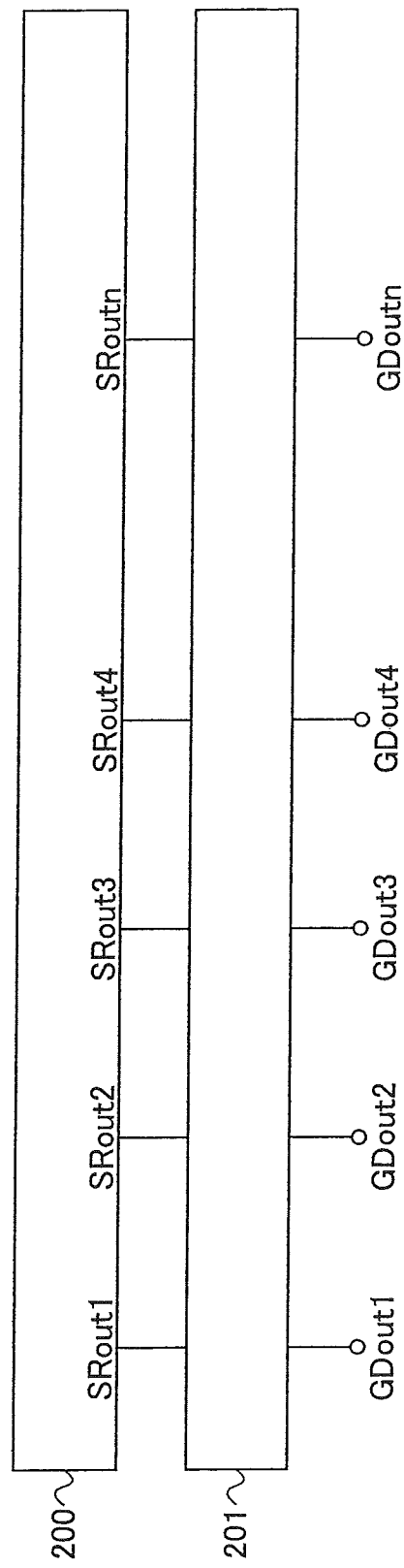
FIG. 20 is a diagram showing Embodiment Mode 3.

FIG. 20 shows one mode of a gate driver of the invention. The gate driver of the invention includes a shift register circuit 200 and a buffer circuit 201.

As shown in the gate driver in FIG. 20, an output terminal SRout of the shift register circuit 200 is connected to an output terminal GDout of the gate driver through the buffer circuit 201.

Note that the shift register circuit 200 is similar to that described in Embodiment Mode 2.

In addition, output terminals SRout1 to SRout4 and an output terminal SRoutn of the shift register circuit 200 are the same as those described in Embodiment Mode 2.

Further, an output terminal GDout in a first stage of the gate driver of the invention is denoted by GDout1; an output terminal GDout in a second stage of the gate driver of the invention is denoted by GDout2; an output terminal GDout in a third stage of the gate driver of the invention is denoted by GDout3; and an output terminal GDout in an n-th stage of the gate driver of the invention is denoted by GDoutn.

In addition, the buffer circuit 201 includes a logic circuit such as an inverter circuit, a buffer circuit, a NAND circuit, a NOR circuit, a tristate buffer circuit, or a PWC circuit, a switch, a resistor, a capacitor, another element, or the like. In addition, by combining with these elements and circuits, various circuits can be formed.

Further, in the gate driver in FIG. 20, a power supply line and a control signal line are not illustrated for convenience.

Furthermore, in the case where the shift register circuit 200 is formed by using an n-channel transistor, the buffer circuit 201 is preferably formed by using an n-channel transistor as well. In the case where the shift register circuit 200 is formed by using a p-channel transistor, the buffer circuit 201 is preferably formed by using a p-channel transistor as well.

In addition, in the case where the shift register circuit 200 is formed by using an n-channel transistor, an output signal of the shift register circuit 200 is the same as that of the timing chart in FIG. 18. In the case where the shift register circuit 200 is formed by using a p-channel transistor, an output signal of the shift register circuit 200 is the same as that of the timing chart in FIG. 19.

Here, a specific structure example of the buffer circuit 201 is described. FIGS. 21 to 27 show structure examples of the gate driver including the buffer circuit. Note that a structure of the buffer circuit 201 is not limited to structures in FIGS. 21 to 27.

Figure 21:
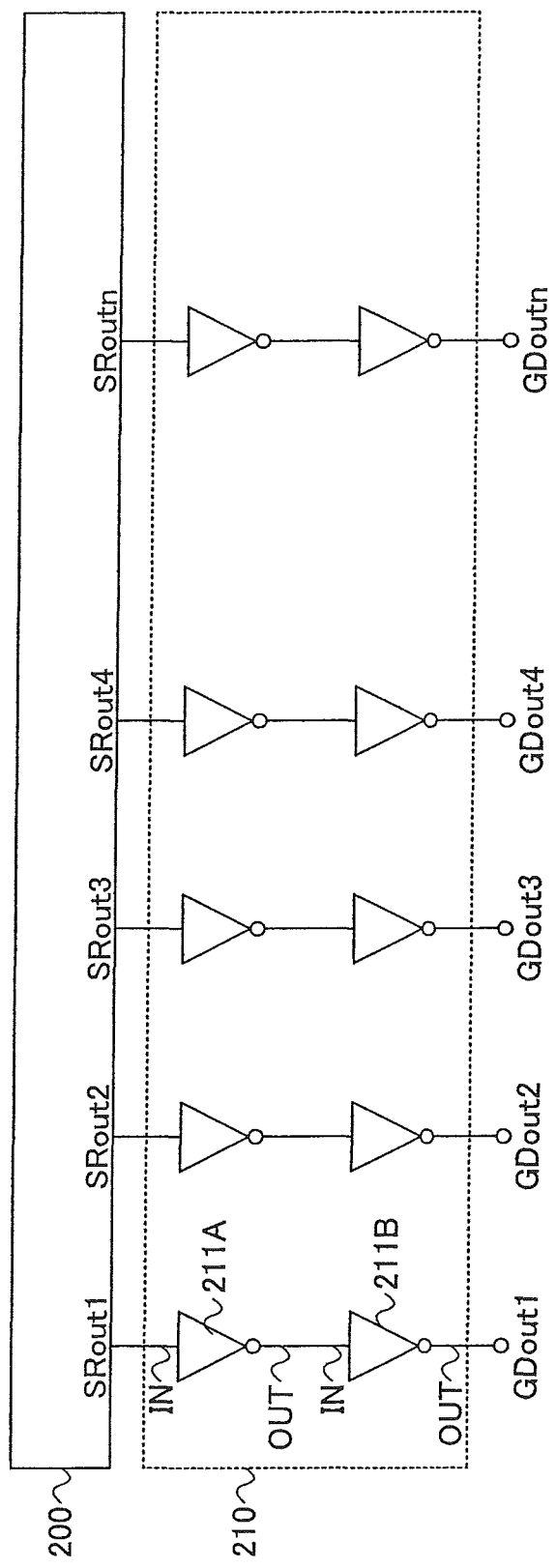
FIG. 21 is a diagram showing Embodiment Mode 3.

FIG. 21 specifically shows one mode of the gate driver including the buffer circuit of the invention. A gate driver in FIG. 21 includes the shift register circuit 200 and a buffer circuit 210. The buffer circuit 210 includes an inverter circuit 211A in the first stage and an inverter circuit 211B in the second stage.

As shown in the gate driver in FIG. 21, the output terminal SRout of the shift register circuit 200 is connected to the output terminal GDout of the gate driver through the buffer circuit 210.

Connection relations in the buffer circuit 210 are described. The input terminal IN of the inverter circuit 211A is connected to the output terminal SRout of the shift register circuit 200, and the output terminal OUT of the inverter circuit 211A is connected to the input terminal IN of the inverter circuit 211B. The output terminal OUT of the inverter circuit 211B is connected to the output terminal GDout of the gate driver. That is, in the buffer circuit 210, two inverter circuits 211A and 211B are connected in series for each output terminal SRout of the shift register circuit 200 in each stage.

Operations of the gate driver in FIG. 21 in the case where the output terminal SRout is at an H level and in the case where the output terminal SRout is at an L level are described, respectively.

First, the case where the output terminal SRout is at an H level is described. Since the output terminal SRout is connected to the output terminal GDout through the two inverter circuits 211A and 211B, the output terminal GDout becomes to be at an H level.

Next, the case where the output terminal SRout is at an L level is described. Since the output terminal SRout is connected to the output terminal GDout through the two inverter circuits 211A and 211B, the output terminal GDout becomes to be at an L level.

By the above-described operations, the output terminal GDout becomes to be at an H level when the output terminal SRout becomes to be at an H level. In addition, the output terminal GDout becomes to be at an L level when the output terminal SRout becomes to be at an L level.

In addition, since the inverter circuits 211A and 211B have rectifying properties, adverse effect of noise in the output terminal SRout on the output terminal GDout of the gate driver can be suppressed.

It is to be noted that although the two inverter circuits 211A and 211B are connected in series in the buffer circuit 210, a plurality of inverter circuits 211 may be connected in series. For example, in the case where an odd number of inverter circuits 211 are connected in series, the output terminal GDout becomes to be at the opposite level to that of the output terminal SRout. In the case where an even number of inverter circuits 211 are connected in series, the output terminal GDout becomes to be at the same level as that of the output terminal SRout.

It is to be noted that although the two inverter circuits 211A and 211B are connected in series in the buffer circuit 210, a plurality of inverter circuits 211 may be connected in parallel as well. This reduces current density in the inverter circuits 211A and 211B, so that characteristic deterioration of elements forming the inverter circuits 211A and 211B can be suppressed.

Figure 22:
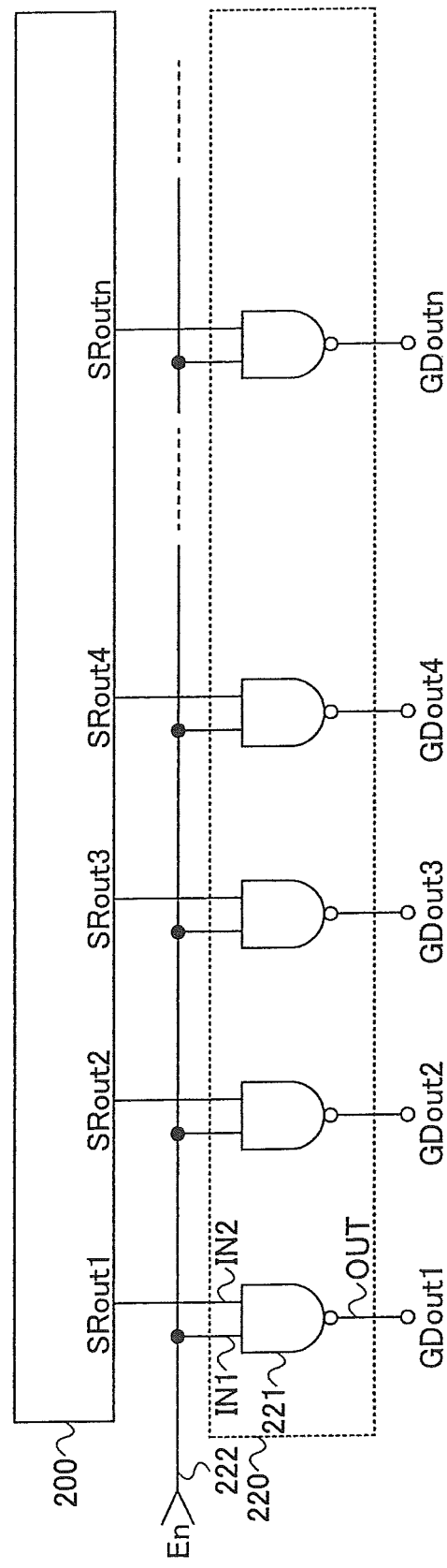
FIG. 22 is a diagram showing Embodiment Mode 3.

FIG. 22 specifically shows another mode of the gate driver including the buffer circuit of the invention. A gate driver in FIG. 22 includes the shift register circuit 200, a buffer circuit 220, and a control signal line 222. The buffer circuit 220 includes a NAND circuit 221.

As shown in the gate driver in FIG. 22, the output terminal SRout of the shift register circuit 200 is connected to the output terminal GDout of the gate driver through the buffer circuit 220.

Connection relations in the buffer circuit 220 are described. The input terminal IN1 of the NAND circuit 221 is connected to the control signal line 222; the input terminal IN2 of the NAND circuit 221 is connected to the output terminal SRout of the shift register circuit 200; and the output terminal OUT of the NAND circuit 221 is connected to the output terminal GDout of the gate driver.

In addition, an enable signal En is supplied to the control signal line 222. The enable signal En is a digital signal.

Operations of the gate driver in FIG. 22 in the cases where the control signal line 222 is at an H level and is at an L level, and in the cases where the output terminal SRout is at an H level and is at an L level are described, respectively.

First, the case where the control signal line 222 is at an H level and the output terminal SRout at an H level is described. The input terminal IN1 of the NAND circuit 221 becomes to be at an H level and the input terminal IN2 of the NAND circuit 221 becomes to be at an H level. Accordingly, since the output terminal OUT of the NAND circuit 221 becomes to be at an L level, the output terminal GDout of the gate driver becomes to be at an L level.

Next, the case where the control signal line 222 is at an H level and the output terminal SRout is at an L level is described. The input terminal IN1 of the NAND circuit 221 becomes to be at an H level and the input terminal IN2 of the NAND circuit 221 becomes to be at an L level. Accordingly, since the output terminal OUT of the NAND circuit 221 becomes to be at an H level, the output terminal GDout of the gate driver becomes to be at an H level.

Next, the case where the control signal line 222 is at an L level and the output terminal SRout is at an H level is described. The input terminal IN1 of the NAND circuit 221 becomes to be at an L level and the input terminal IN2 of the NAND circuit 221 becomes to be at an H level. Accordingly, since the output terminal OUT of the NAND circuit 221 becomes to be at an H level, the output terminal GDout of the gate driver becomes to be at an H level.

Next, the case where the control signal line 222 is at an L level and the output terminal SRout is at an L level is described. The input terminal IN1 of the NAND circuit 221 becomes to be at an L level and the input terminal IN2 of the NAND circuit 221 becomes to be at an L level. Accordingly, since the output terminal OUT of the NAND circuit 221 becomes to be at an H level, the output terminal GDout of the gate driver becomes to be at an H level.

By the above-described operations, when the control signal line 222 is at an H level, the output terminal GDout of the gate driver becomes to be at an L level when the output terminal SRout is at an H level, whereas the output terminal GDout of the gate driver becomes to be at an H level when the output terminal SRout is at an L level. When the control signal line 222 is at an L level, the output terminal GDout of the gate driver becomes to be at an H level regardless of a potential of the output terminal SRout.

An output signal of the gate driver can be changed arbitrarily by the enable signal En in this manner. In the gate driver in FIG. 22, so-called pulse width control (PWC) can be performed.

Here, the pulse width control is performed by utilizing that the output terminal GDout becomes to be at an H level when the enable signal En is at an L level regardless of the potential of the output terminal SRout. That is, even when the output signal of the shift register circuit 200 has certain L level pulse width (period), the output signal can be shortened by making the enable signal En at an L level.

Note that although the NAND circuit 221 has two input terminals, the NAND circuit 221 may have any number of input terminals as long as the output signal of the shift register circuit 200 is supplied to any one of the input terminals. When the NAND circuit 221 has a plurality of input terminals, the buffer circuit 220 can control the output signal of the gate driver more exactly.

Figure 24:
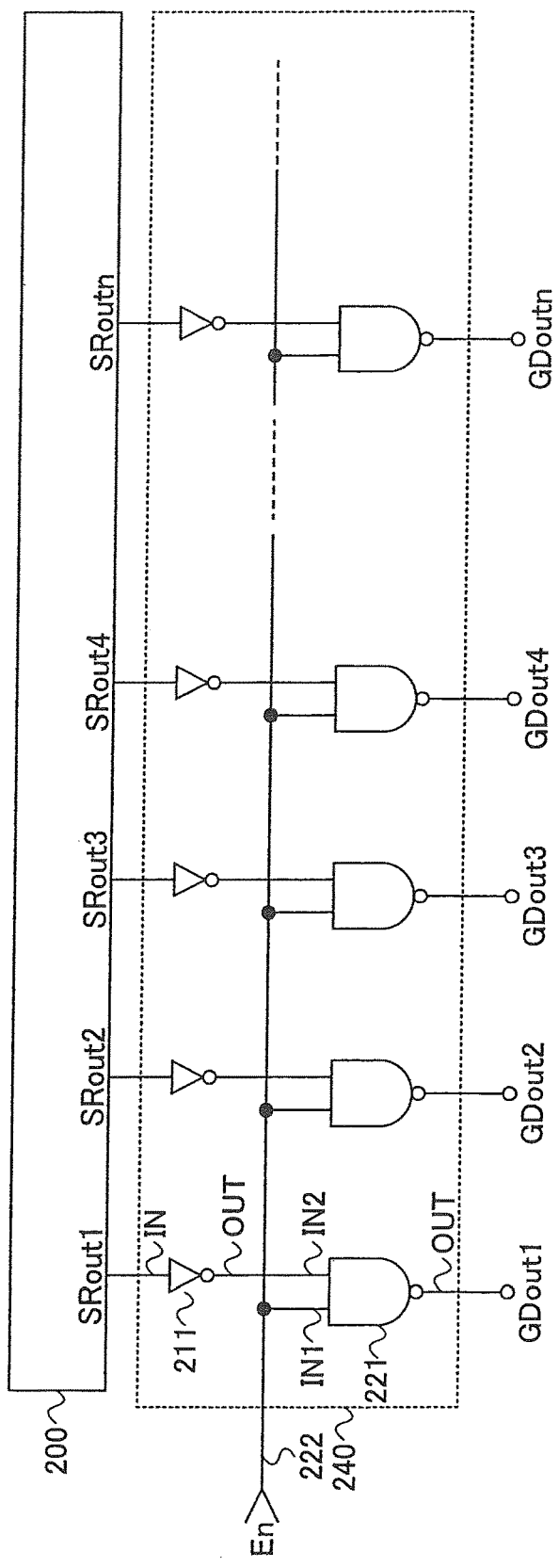
FIG. 24 is a diagram showing Embodiment Mode 3.

It is to be noted that the output terminal SRout may be connected to the input terminal IN2 of the NAND circuit 221 through the inverter circuit 211 as in a buffer circuit 240 in FIG. 24. In this case, when the control signal line 222 is at an H level, the output terminal GDout of the gate driver becomes to be at an H level when the output terminal SRout is at an H level, whereas the output terminal GDout of the gate driver becomes to be at an H level when the output terminal SRout is at an L level. When the control signal line 222 is at an L level, the output terminal GDout of the gate driver becomes to be at an H level regardless of the potential of the output terminal SRout.

Figure 26:
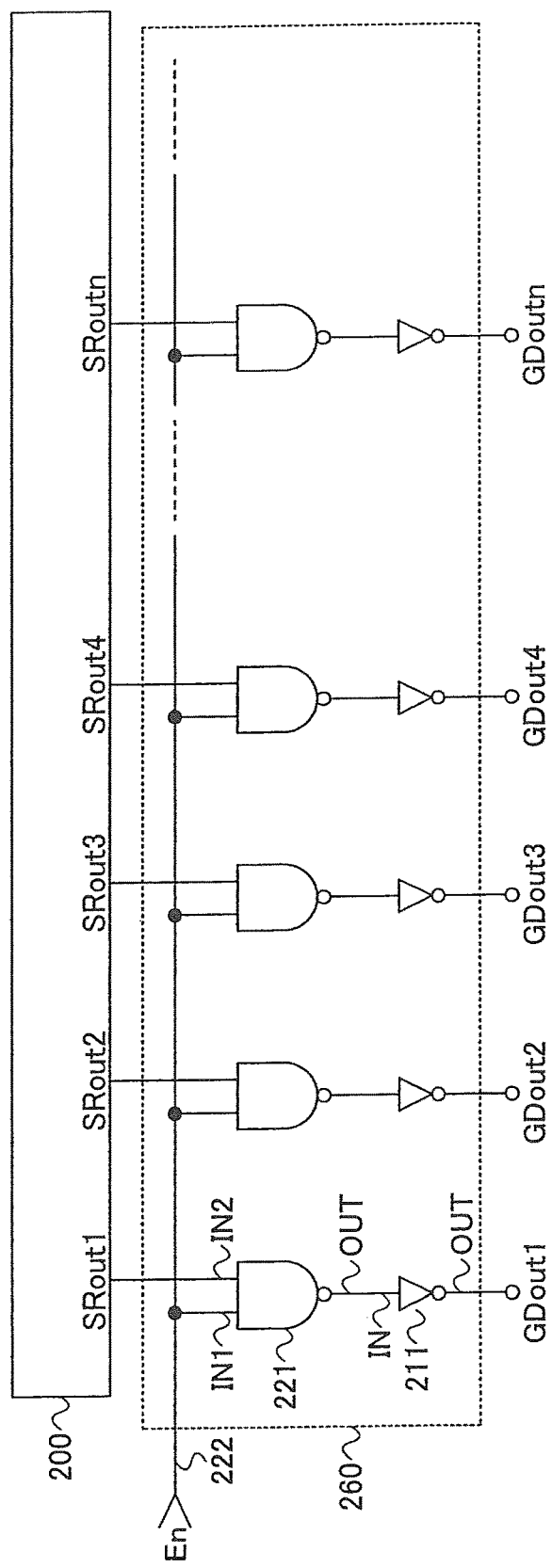
FIG. 26 is a diagram showing Embodiment Mode 3.

It is to be noted that the output terminal OUT of the NAND circuit 221 may be connected to the output terminal GDout of the gate drive through the inverter circuit 211 as in a buffer circuit 260 in FIG. 26. In this case, when the control signal line 222 is at an H level, the output terminal GDout of the gate driver becomes to be at an L level when the output terminal SRout is at an H level, and the output terminal GDout of the gate driver becomes to be at an L level when the output terminal SRout is at an L level. When the control signal line 222 is at an L level, the output terminal GDout of the gate driver becomes to be at an L level regardless of the potential of the output terminal SRout.

It is to be noted that although the enable signal En is supplied to the control signal line 222, the invention is not limited to this.

For example, a different control signal may be supplied to the control signal line 222.

As another example, a power supply may be supplied to the control signal line 222.

Figure 23:
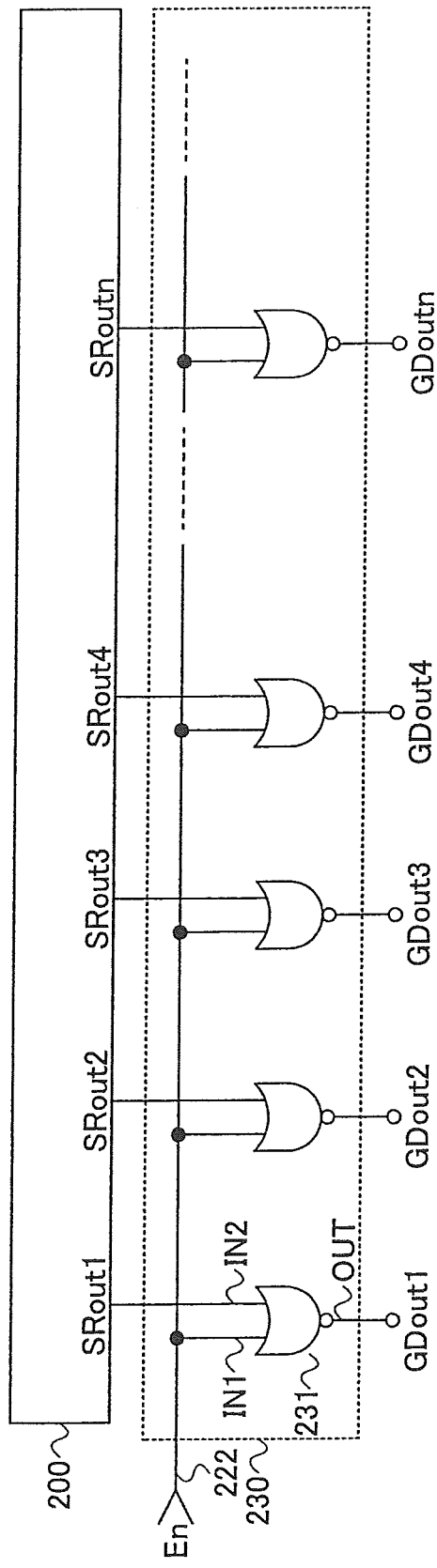
FIG. 23 is a diagram showing Embodiment Mode 3.

FIG. 23 specifically shows another mode of the gate driver including the buffer circuit of the invention. A gate driver in FIG. 23 includes the shift register circuit 200, a buffer circuit 230, and the control signal line 222. The buffer circuit 230 includes a NOR circuit 231.

As shown in the gate driver in FIG. 23, the output terminal SRout of the shift register circuit 200 is connected to the output terminal GDout of the gate driver through the buffer circuit 230.

Connection relations in the buffer circuit 230 are described. The input terminal IN1 of the NOR circuit 231 is connected to the control signal line 222; the input terminal IN2 of the NOR circuit 231 is connected to the output terminal SRout of the shift register circuit 200; and the output terminal OUT of the NOR circuit 231 is connected to the output terminal GDout of the gate driver.

In addition, the enable signal En is supplied to the control signal line 222.

Operations of the gate driver in FIG. 23 in the cases where the control signal line 222 is at an H level and is at an L level, and in the cases where the output terminal SRout of the shift register circuit 200 is at an H level and is at an L level are described, respectively.

First, the case where the control signal line 222 is at an H level and the output terminal SRout of the shift register circuit 200 is at an H level is described. The input terminal IN1 of the NOR circuit 231 becomes to be at an H level and the input terminal IN2 of the NOR circuit 231 becomes to be at an H level. Accordingly, since the output terminal OUT of the NOR circuit 231 becomes to be at an L level, the output terminal GDout of the gate driver becomes to be at an L level.

Next, the case where the control signal line 222 is at an H level and the output terminal SRout of the shift register circuit 200 is at an L level is described. The input terminal IN1 of the NOR circuit 231 becomes to be at an H level and the input terminal IN2 of the NOR circuit 231 becomes to be at an L level. Accordingly, since the output terminal OUT of the NOR circuit 231 becomes to be at an L level, the output terminal GDout of the gate driver becomes to be at an L level.

Next, the case where the control signal line 222 is at an L level and the output terminal SRout of the shift register circuit 200 is at an H level is described. The input terminal IN1 of the NOR circuit 231 becomes to be at an L level and the input terminal IN2 of the NOR circuit 231 becomes to be at an H level. Accordingly, since the output terminal OUT of the NOR circuit 231 becomes to be at an L level, the output terminal GDout of the gate driver becomes to be at an L level.

Next, the case where the control signal line 222 is at an L level and the output terminal SRout of the shift register circuit 200 is at an L level is described. The input terminal IN1 of the NOR circuit 231 becomes to be at an L level and the input terminal IN2 of the NOR circuit 231 becomes to be at an L level. Accordingly, since the output terminal OUT of the NOR circuit 231 becomes to be at an H level, the output terminal GDout of the gate driver becomes to be at an H level.

By the above-described operations, when the control signal line 222 is at an H level, the output terminal GDout of the gate driver becomes to be at an L level regardless of the potential of the output terminal SRout. When the control signal line 222 is at an L level, the output terminal GDout of the gate driver becomes to be at an L level when the output terminal SRout is at an H level, whereas the output terminal GDout of the gate driver becomes to be at an H level when the output terminal SRout is at an L level The output terminal GDout of the gate driver can be changed arbitrarily by the enable signal En in this manner. In the gate driver in FIG. 23, so-called pulse width control (PWC) can be performed.

Here, the pulse width control is performed by utilizing that the output terminal GDout becomes to be at an L level when the enable signal En is at an H level regardless of the potential of the output terminal SRout. That is, even when the output signal of the shift register circuit 200 has certain H level pulse width (period), the output signal can be shortened by making the enable signal En at an H level.

Note that although the NOR circuit 231 has two input terminals, the NOR circuit 231 may have any number of input terminals as long as the output signal of the shift register circuit 200 is supplied to any one of the input terminals. When the NOR circuit 231 has a plurality of input terminals, the buffer circuit 230 can control the output signal of the gate driver more correctly.

Figure 25:
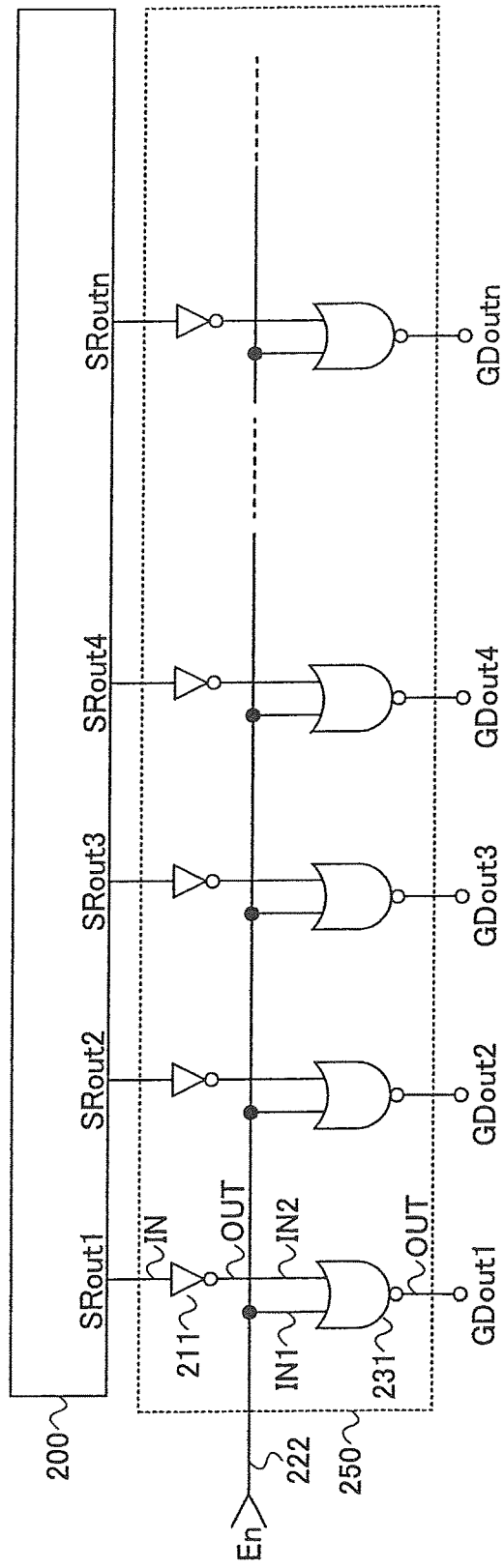
FIG. 25 is a diagram showing Embodiment Mode 3.

It is to be noted that the output terminal SRout of the shift register circuit 200 may be connected to the input terminal IN2 of the NOR circuit 231 through the inverter circuit 211 as in a buffer circuit 250 in FIG. 25. In this case, when the control signal line 222 is at an H level, the output terminal GDout of the gate driver becomes to be at an L level regardless of the potential of the output terminal SRout. When the control signal line 222 is at an L level, the output terminal GDout of the gate driver becomes to be at an H level when the output terminal SRout is at an H level, and the output terminal GDout of the gate driver becomes to be at an L level when the output terminal SRout is at an L level.

Figure 27:
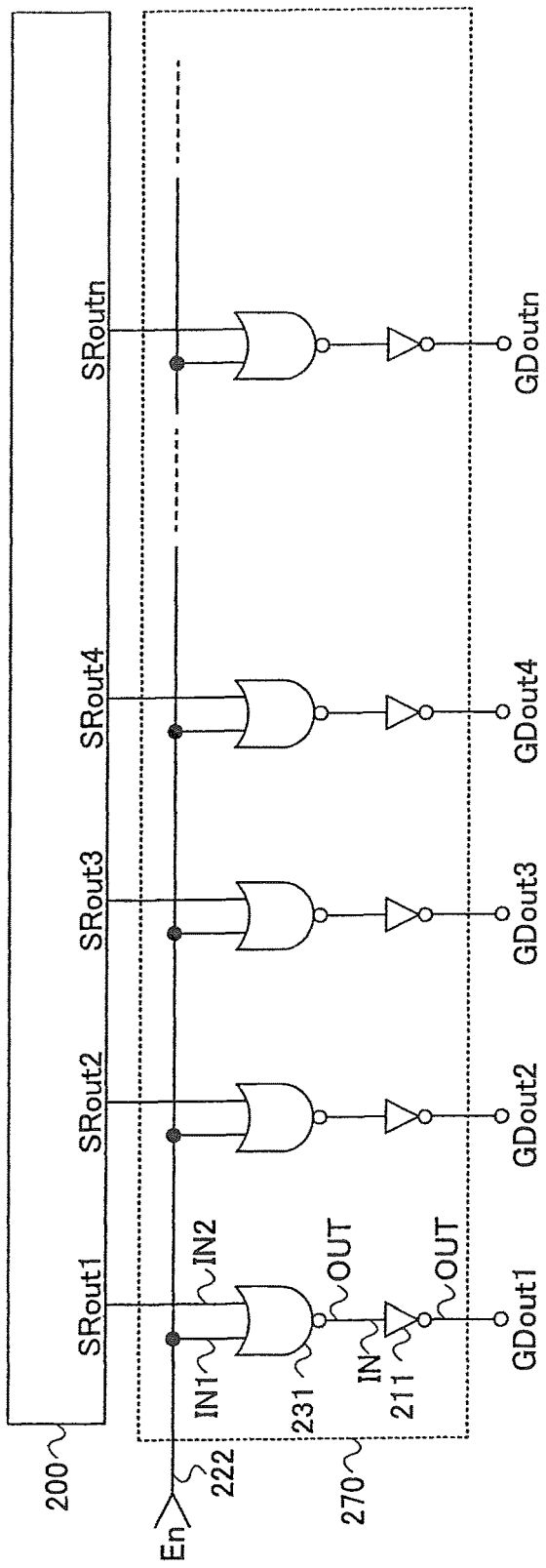
FIG. 27 is a diagram showing Embodiment Mode 3.

It is to be noted that the output terminal OUT of the NOR circuit 231 may be connected to the output terminal GDout of the gate drive through the inverter circuit 211 as in a buffer circuit 270 in FIG. 27. In this case, when the control signal line 222 is at an H level, the output terminal GDout of the gate driver becomes to be at an H level regardless of the potential of the output terminal SRout. When the control signal line 222 is at an L level, the output terminal GDout of the gate driver becomes to be at an H level when the output terminal SRout is at an H level, whereas the output terminal GDout outputs an L-level signal when the output terminal SRout is at an L level.

Here, a suture example which can be applied to the inverter circuit 211 is described.

Figure 28:
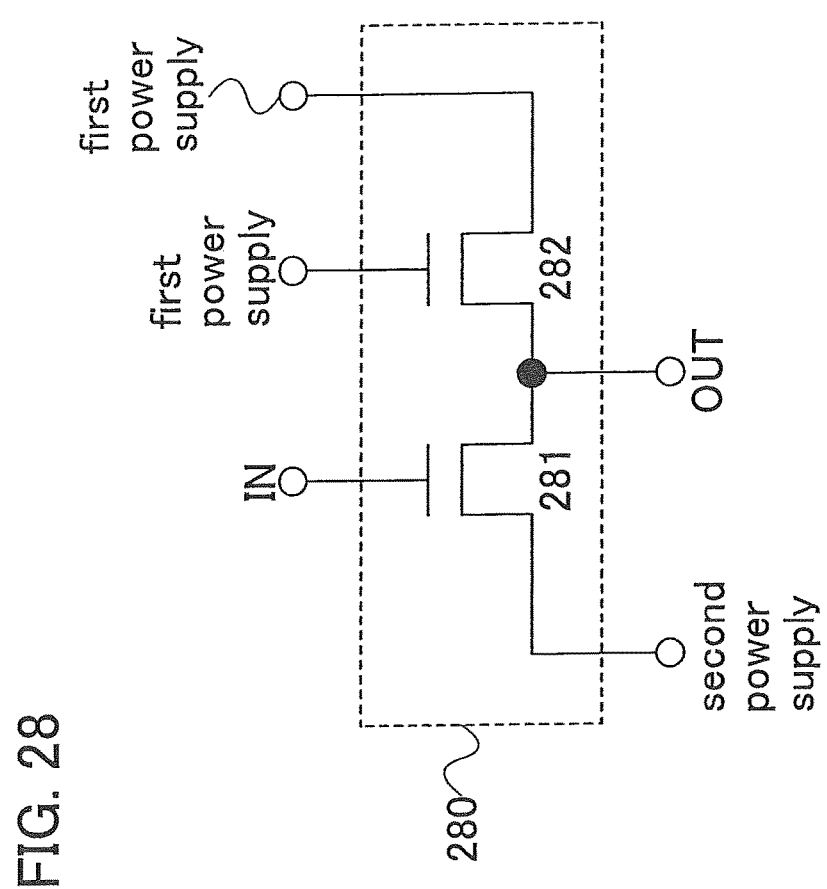
FIG. 28 is a diagram showing Embodiment Mode 3.

FIG. 28 shows one mode of the inverter circuit 211. An inverter circuit 280 in FIG. 28 includes a transistor 281 and a transistor 282.

As shown in the inverter circuit 280 in FIG. 28, a first terminal of the transistor 281 is connected to the second power supply; a second terminal of the transistor 281 is connected to a second terminal of the transistor 282 and the output terminal OUT; and a gate terminal of the transistor 281 is connected to the input terminal IN. A first terminal is connected to the first power supply and a gate terminal of the transistor 282 is connected to the first power supply.

It is to be noted that the power supply potential VDD is supplied to the first power supply and the power supply potential VSS is supplied to the second power supply. The potential difference (VDD−VSS) between the power supply potential VDD of the first power supply and the power supply potential VSS of the second power supply corresponds to a power supply voltage of the inverter circuit 280. In addition, the power supply potential VDD is higher than the power supply potential VSS.

It is to be noted that a digital control signal is supplied to the input terminal IN. In addition, the output terminal OUT outputs an output signal.

In addition, each of the transistor 281 and the transistor 282 is an n-channel transistor.

Operations of the inverter circuit 280 in FIG. 28 in the case where the input terminal IN is at an H level and in the case where the input terminal IN is at an L level are described, respectively.

First, the input terminal IN at an H level is described. When the input terminal IN becomes to be at an H level, the transistor 281 is turned on. The output terminal OUT is electrically connected to the second power supply through the transistor 281 and is electrically connected to the first power supply through the transistor 282, and thus, the potential of the output terminal OUT drops. The potential of the output terminal OUT at this time is determined by an operating point of the transistor 281 and the transistor 282, so that the output terminal OUT becomes to be at an L level.

Next, the input terminal IN at an L level is described. When the input terminal IN becomes to be at an L level, the transistor 281 is turned off. The output terminal OUT is electrically connected to the first power supply through the transistor 282, and the potential of the output terminal OUT rises. The potential of the output terminal OUT at this time becomes a value obtained by subtracting the threshold voltage Vth282 of the transistor 282 from the power supply potential VDD (VDD−Vth282), so that the output terminal OUT becomes to be at an H level.

Figure 32:
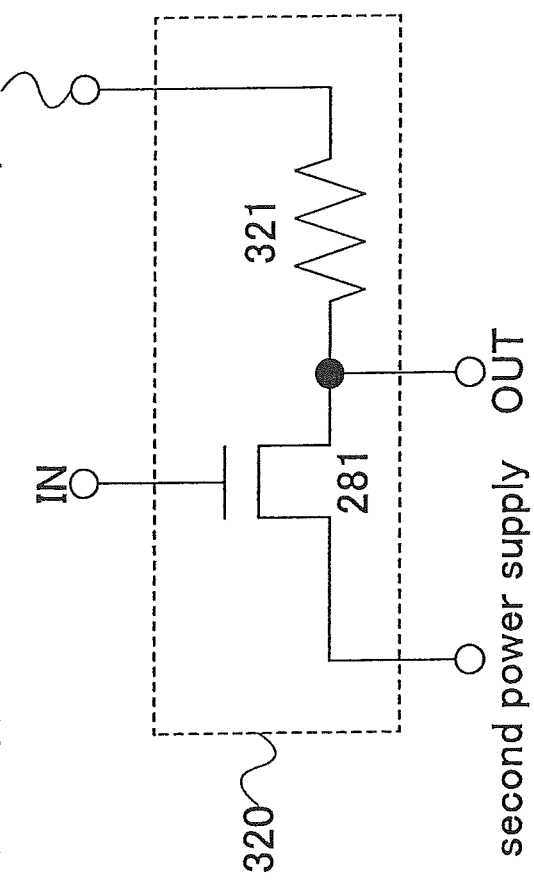
FIG. 32 is a diagram showing Embodiment Mode 3.

The transistor 282 does not necessarily have rectifying properties; any element can be used as long as a voltage is generated in the element when a current is supplied thereto. For example, a resistor 321 may be connected as a substitute for the transistor 282 as in an inverter circuit 320 in FIG. 32.

Here, functions of the transistor 281 and the transistor 282 are described below.

The transistor 281 has a function as a switch which determines whether to connect the second power supply and the output terminal OUT or not in accordance with a potential of the input terminal IN. When the input terminal IN is at an H level, the transistor 281 has a function of supplying the power supply potential VSS to the output terminal OUT.

The transistor 282 has a function as a diode.

Figure 29:
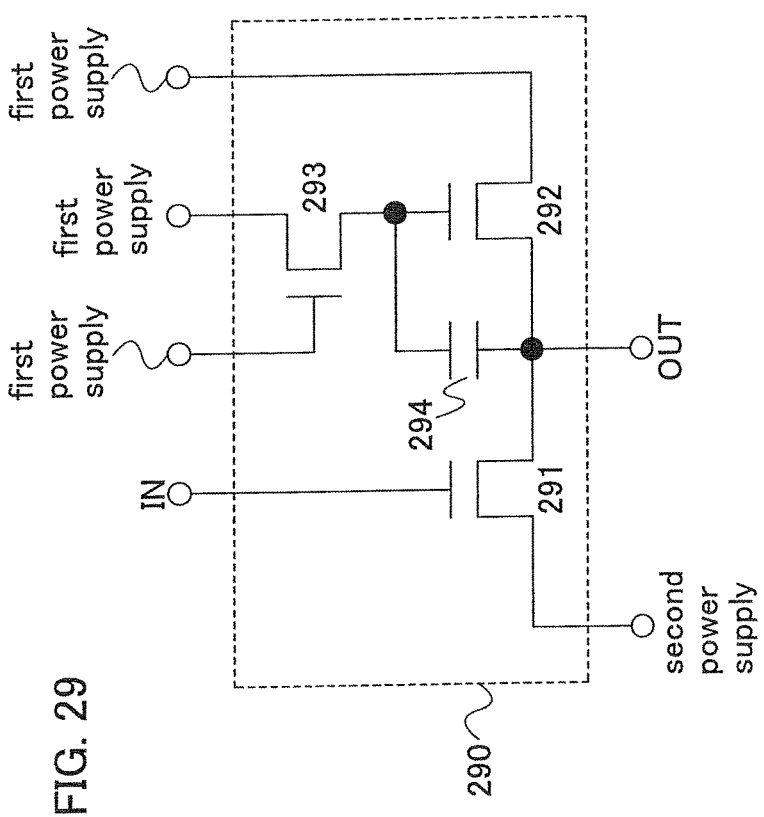
FIG. 29 is a diagram showing Embodiment Mode 3.
Figure 30:
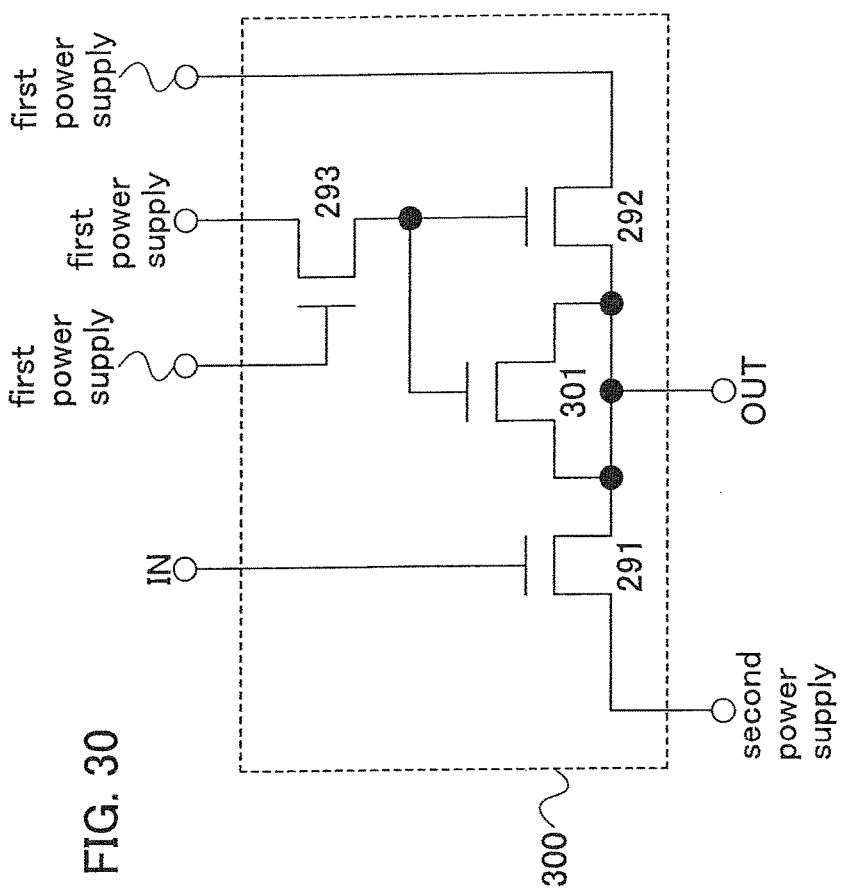
FIG. 30 is a diagram showing Embodiment Mode 3.
Figure 31:
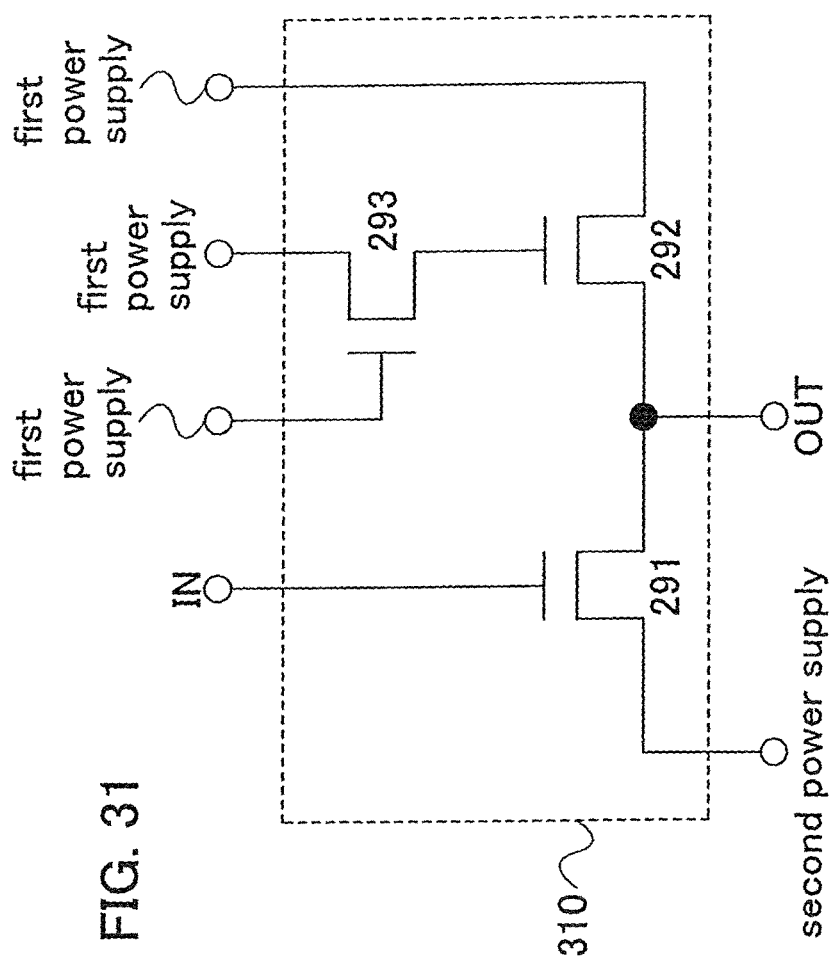
FIG. 31 is a diagram showing Embodiment Mode 3.

FIG. 29 shows another mode of the inverter circuit 211. An inverter circuit 290 shown in FIG. 29 includes a transistor 291, a transistor 292, a transistor 293, and a capacitor 294 having two electrodes. Note that the capacitor 294 is not necessarily provided.

As shown in the inverter circuit 290 in FIG. 29, a first terminal of the transistor 291 is connected to the second power supply; a second terminal of the transistor 291 is connected to a second terminal of the transistor 292, a second electrode of the capacitor 294 and the output terminal OUT; and a gate terminal of the transistor 291 is connected to the input terminal IN. A first terminal of the transistor 292 is connected to the first power supply, and a gate terminal of the transistor 292 is connected to a second terminal of the transistor 293 and a first electrode of the capacitor 294. A first terminal is connected to the first power supply and a gate terminal of the transistor 293 is connected to the first power supply.

Note that a first power supply, a second power supply, an input terminal IN, and an output terminal OUT which are the same as those shown in FIG. 28 can be used as the first power supply, the second power supply, the input terminal IN, and the output terminal OUT.

In addition, each of the transistors 291 to 293 is an n-channel transistor.

Operations of the inverter circuit 290 in FIG. 29 in the case where the input terminal IN is at an H level and in the case where the input terminal IN is at an L level are described, respectively.

First, the input terminal IN at an H level is described. When the input terminal IN becomes to be at an H level, the transistor 291 is turned on. A potential of the gate terminal of the transistor 292 becomes to be at a potential value obtained by subtracting the threshold voltage Vth293 of the transistor 293 from the power supply potential VDD (VDD−Vth293), so that the transistor 292 is on. In addition, the gate terminal of the transistor 292 is in a floating state.

Accordingly, the output terminal OUT is electrically connected to the second power supply through the transistor 291 and is electrically connected to the first power supply through the transistor 292, and thus, the potential of the output terminal OUT drops. The potential of the output terminal OUT at this time is determined by an operating point of the transistor 291 and the transistor 292, so that the output terminal OUT becomes to be at an L level.

Next, the input terminal IN at an L level is described. When the input terminal IN becomes to be at an L level, the transistor 291 is turned off. The potential of the gate terminal of the transistor 292 becomes to be at a potential value obtained by subtracting the threshold voltage Vth293 of the transistor 293 from the power supply potential VDD (VDD−Vth293), so that the transistor 292 is on. In addition, the gate terminal of the transistor 292 is in a floating state.

Accordingly, the output terminal OUT is electrically connected to the first power supply through the transistor 292, and the potential of the output terminal OUT rises. The potential of the gate terminal of the transistor 292 rises to a value which is greater than or equal to the sum of the power supply potential VDD and the threshold voltage Vth292 of the transistor 292 by the capacitive coupling of the capacitor 294, so that the transistor 292 is continuously kept on. A so-called bootstrap operation is performed. Accordingly, the potential of the output terminal OUT at this time becomes to be at VDD, so that the output terminal OUT becomes to be at an H level.

In this manner, the H-level potential of the output terminal OUT can be raised to the power supply potential VDD of the first power supply by the bootstrap operation in the inverter circuit 290 in FIG. 29.

Note that a circuit structure of the inverter circuit 290 in FIG. 29 is not limited to the circuit structure in FIG. 29 as long as the bootstrap operation can be performed when the input terminal IN is at an L level. When the input terminal IN is at an H level, a potential may be supplied to the gate terminal of the transistor 292.

Figure 33:
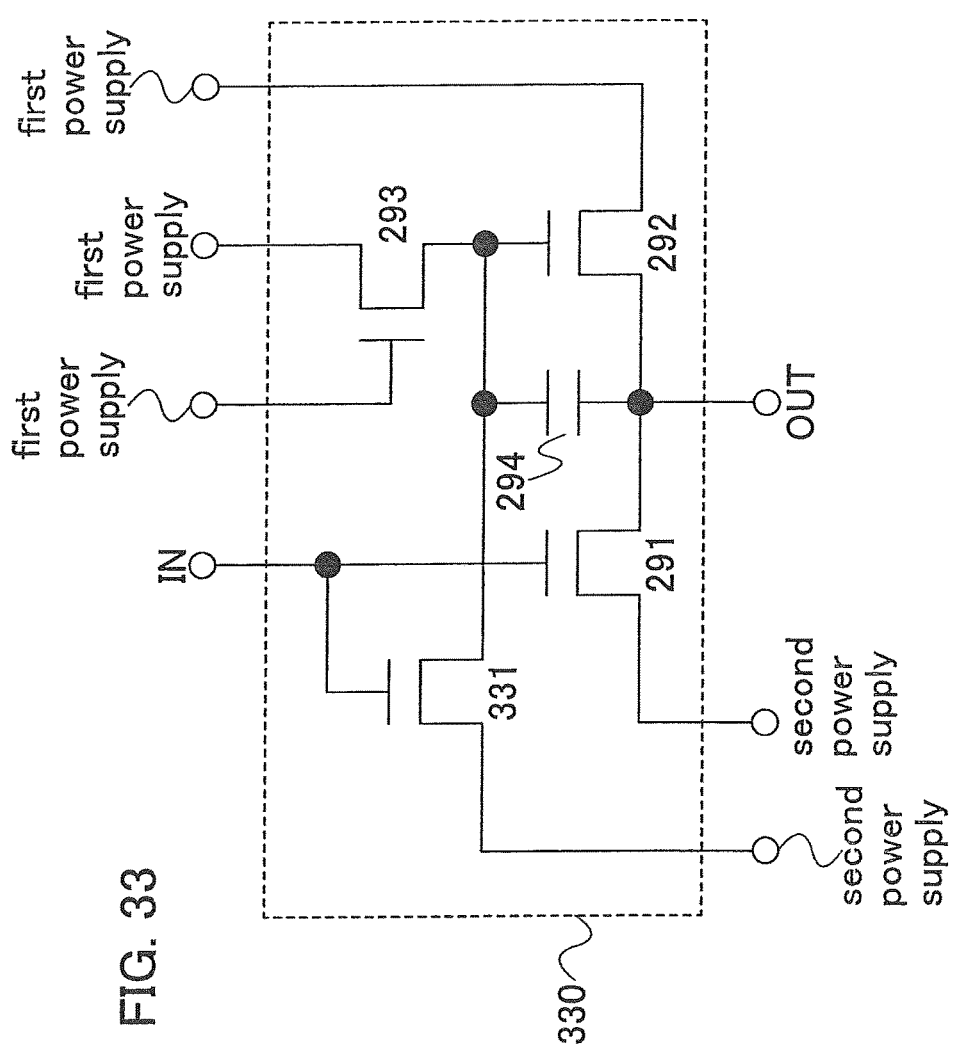
FIG. 33 is a diagram showing Embodiment Mode 3.
Figure 34:
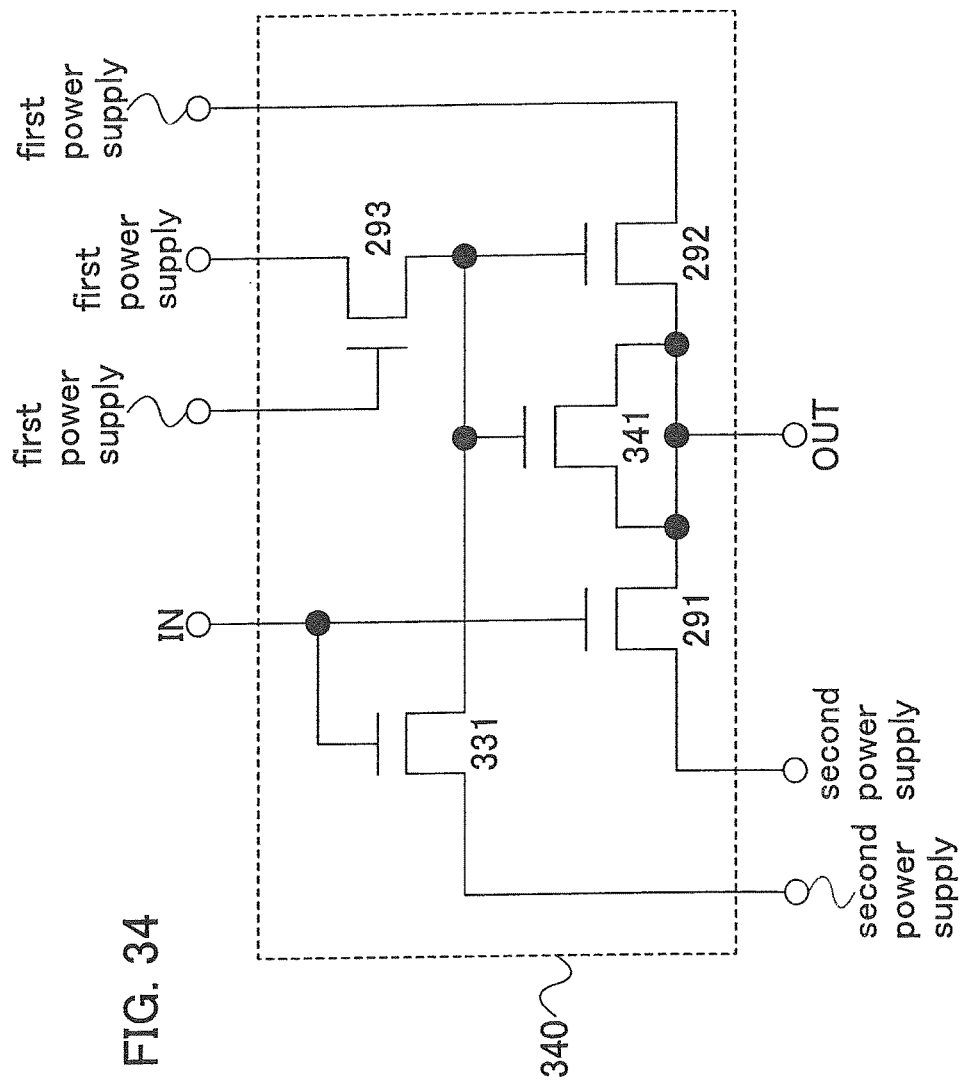
FIG. 34 is a diagram showing Embodiment Mode 3.
Figure 35:
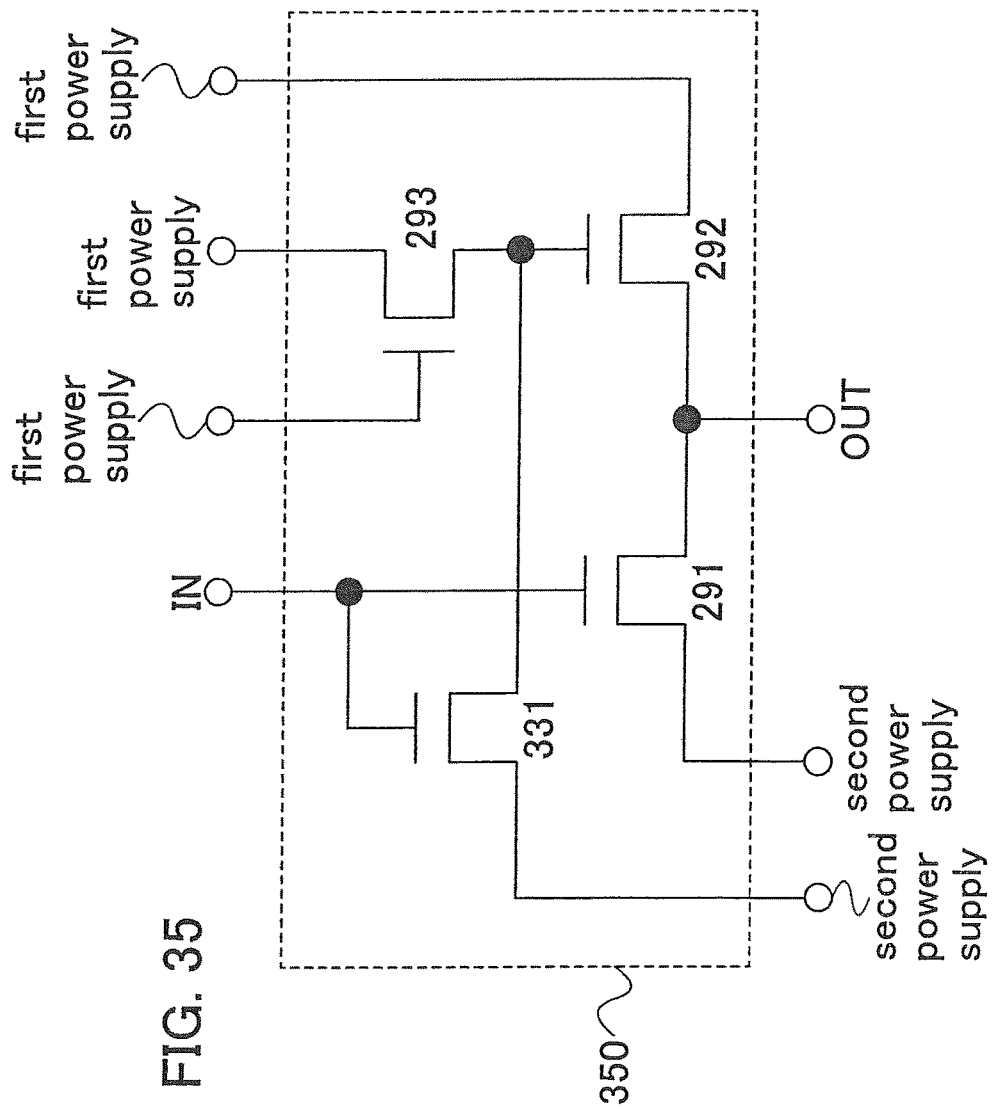
FIG. 35 is a diagram showing Embodiment Mode 3.

For example, a transistor 331 may be additionally provided as in an inverter circuit 330 in FIG. 33. This is because the potential of the output terminal OUT can be made VSS when the output terminal OUT is at an L level. That is, since the transistor 331 is turned on when the input terminal IN is at an H level, the gate terminal of the transistor 292 becomes to be at an L level. Then, the transistor 292 is turned off so that the output terminal OUT is electrically connected only to the second power supply through the transistor 291.

It is to be noted that the transistor 331 is an n-channel transistor.

Figure 36:
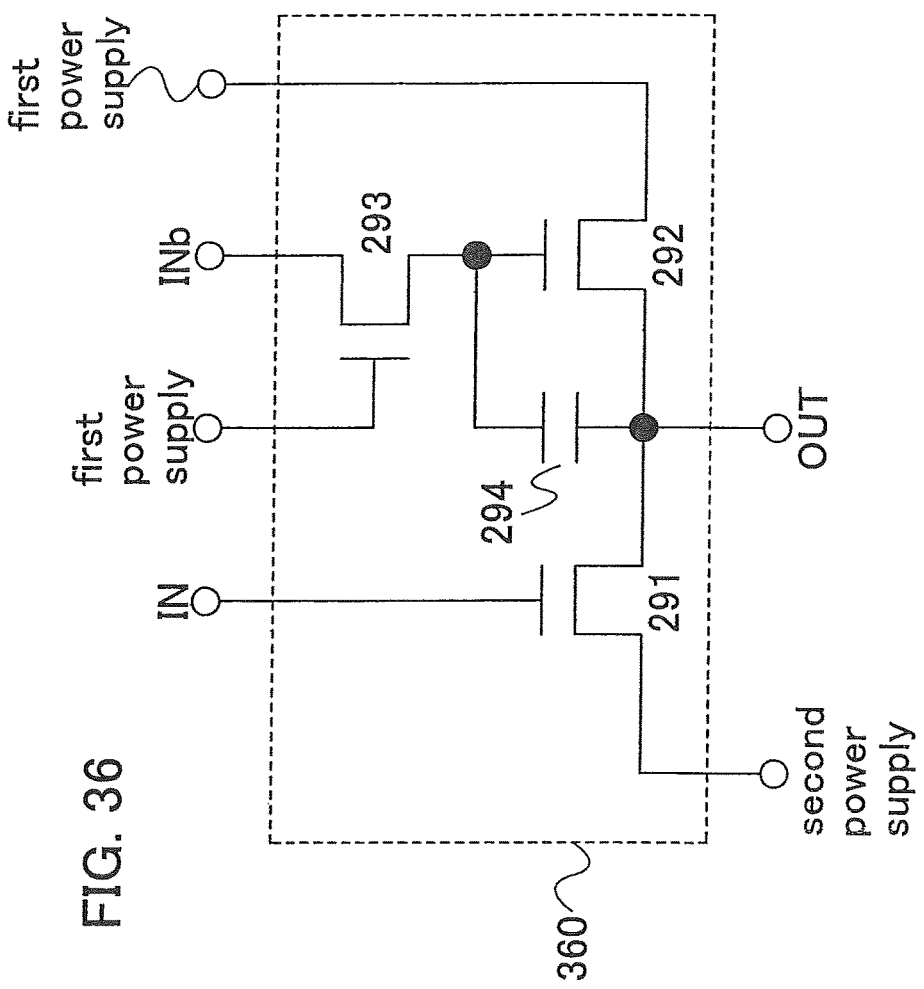
FIG. 36 is a diagram showing Embodiment Mode 3.

As another example, the first terminal of the transistor 293 may be connected to an input terminal INb as in an inverter circuit 360 in FIG. 36. This is because the potential of the output terminal OUT can be made VSS when the out terminal OUT is at an L level. That is, since the input terminal INb becomes to be at an L level when the input terminal IN is at an H level, the gate terminal of the transistor 292 becomes to be at an L level. Then, the transistor 292 is turned off so that the output terminal OUT is electrically connected only to the second power supply through the transistor 291.

It is to be noted that an inverted signal of a signal of the input terminal IN is supplied to the input terminal INb. In addition, a method of producing the signal which is supplied to the input terminal INb is described.

Figure 124:
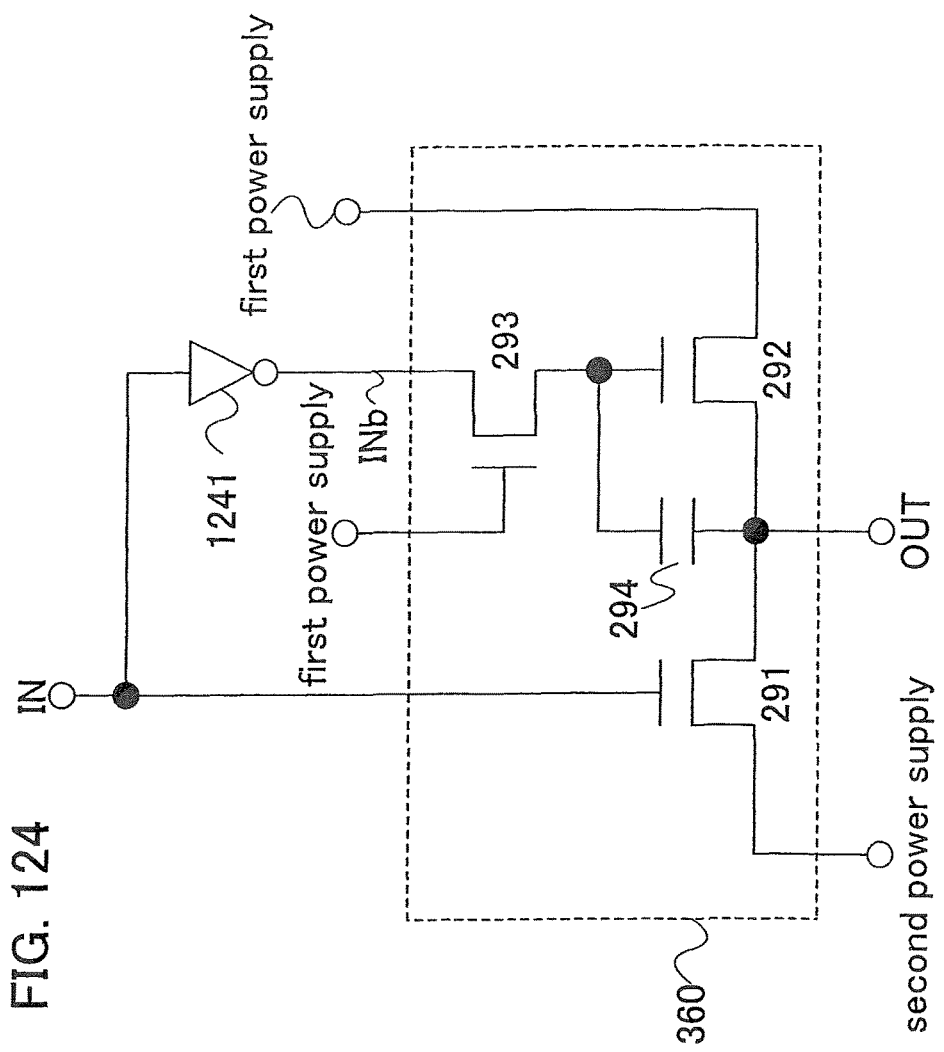
FIG. 124 is a diagram showing Embodiment Mode 3.

For example, a signal of the input terminal IN may be supplied to the input terminal INb through an inverter circuit 1241 as shown in FIG. 124. In addition, the inverter circuits shown in FIGS. 28 to 35 can be applied as the inverter circuit 1241.

Note that the inverted signal inputted to the signal of the input terminal IN is not necessarily supplied to the input terminal INb. In addition, the signal which is supplied to the input terminal INb is described below.

For example, when the input terminal IN is connected to the output terminal SRoutn in the n-th stage, the input terminal INb may be connected to an output terminal SRoutn−1 in the (n−1)th stage.

As another example, when the input terminal IN is connected to the output terminal SRoutn in the n-th stage, the input terminal INb may be connected to an output terminal SRoutn+1 in the (n+1)th stage.

As another example, when the input terminal IN is connected to the output terminal SRoutn in the n-th stage, the input terminal INb may be connected to the node N2 of the flip-flop circuit in the n-th stage. This is because the potential of the node N2 of the flip-flop circuit is an inverted potential of the potential of the output terminal SRout in a non-selection period, so that the potential of the node N2 in the flip-flop circuit can be utilized as an inverted signal. Accordingly, an inverter circuit for producing an inverted signal is not required by supplying the potential of the node N2 of the flip-flop circuit to the input terminal INb of the inverter circuit 360.

As another example, when a control signal (a digital value) is supplied to the input terminal INb, the inverter circuit in FIG. 36 can operate as a tristate buffer circuit. This is because when the input terminal IN becomes to be at an L level and the input terminal INb becomes to be at an L level, the transistor 291 and the transistor 292 are turned off, and thus, the output terminal OUT is not connected to any power supplies. Thus, the inverter circuit 360 can have a function as a tristate buffer circuit or an inverter circuit.

In this manner, a signal can be supplied to the input terminal INb of the inverter circuit 360 by various methods.

An application example of FIG. 29 is further described below.

Figure 39:
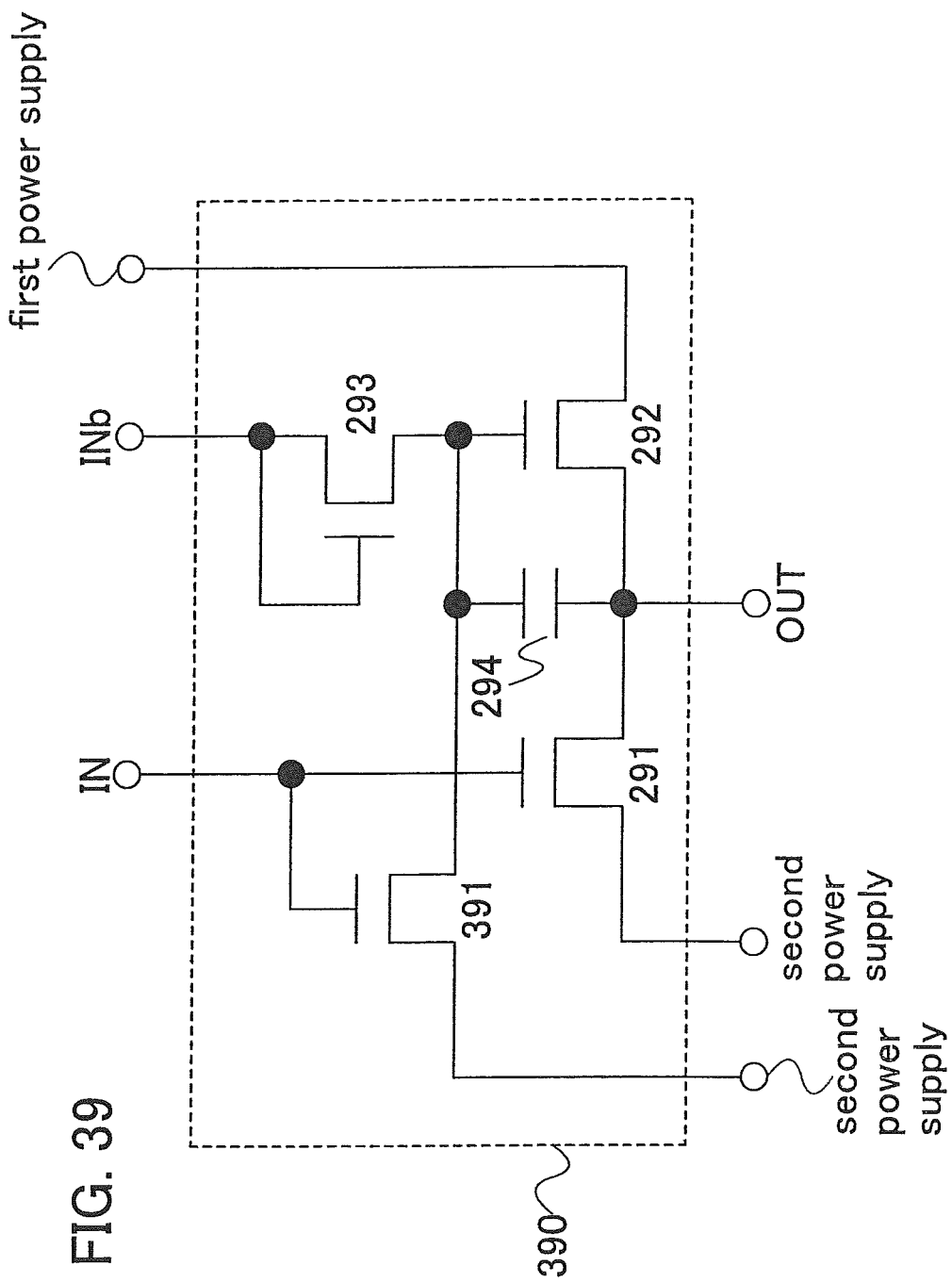
FIG. 39 is a diagram showing Embodiment Mode 3.

As another example, the first terminal and the gate terminal of the transistor 293 may be connected to the input terminal INb, and a transistor 391 may be additionally provided as in an inverter circuit 390 in FIG. 39. This is because the potential of the output terminal OUT can be made VSS when the output terminal OUT is at an L level. That is, when the input terminal INb is at an L level, the gate terminal of the transistor 292 becomes to be at an L level. Then, the transistor 292 is turned off so that the output terminal OUT is electrically connected only to the second power supply through the transistor 291.

Figure 37:
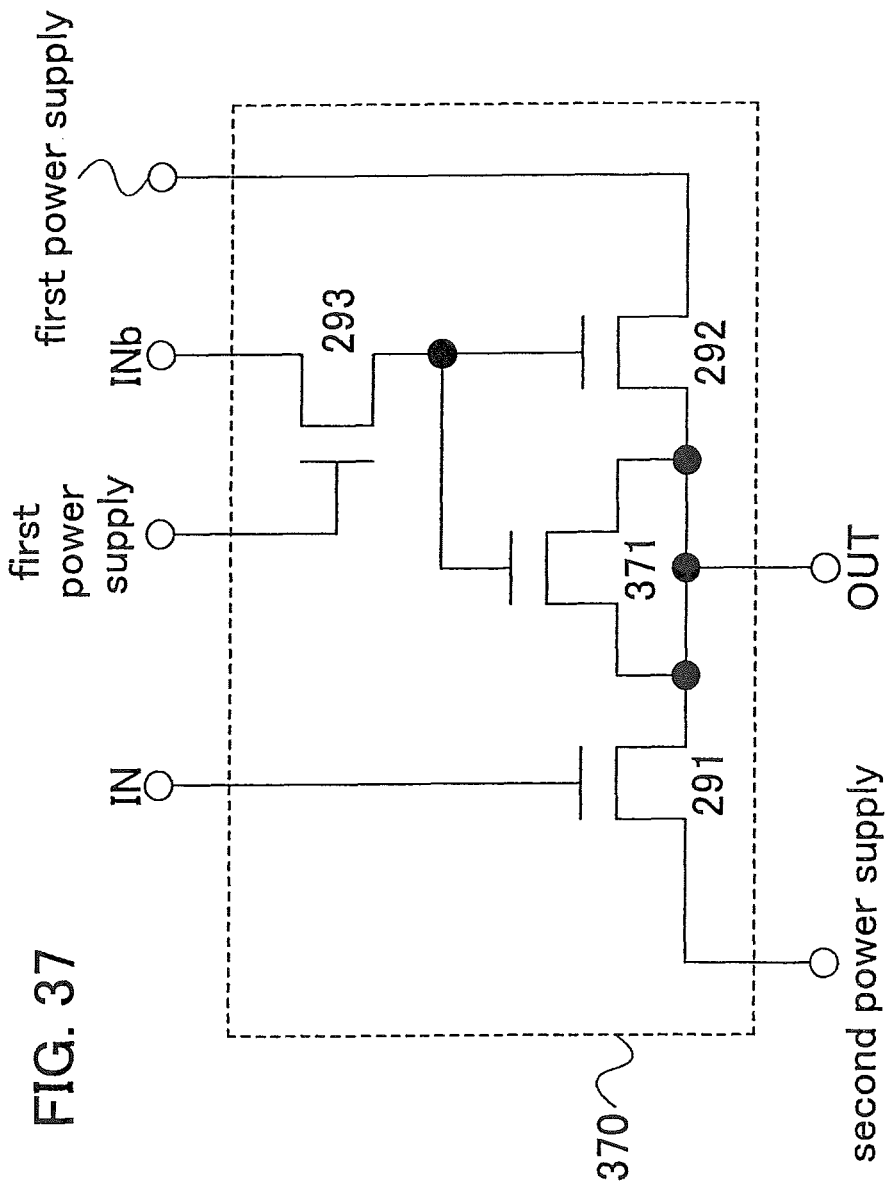
FIG. 37 is a diagram showing Embodiment Mode 3.
Figure 40:
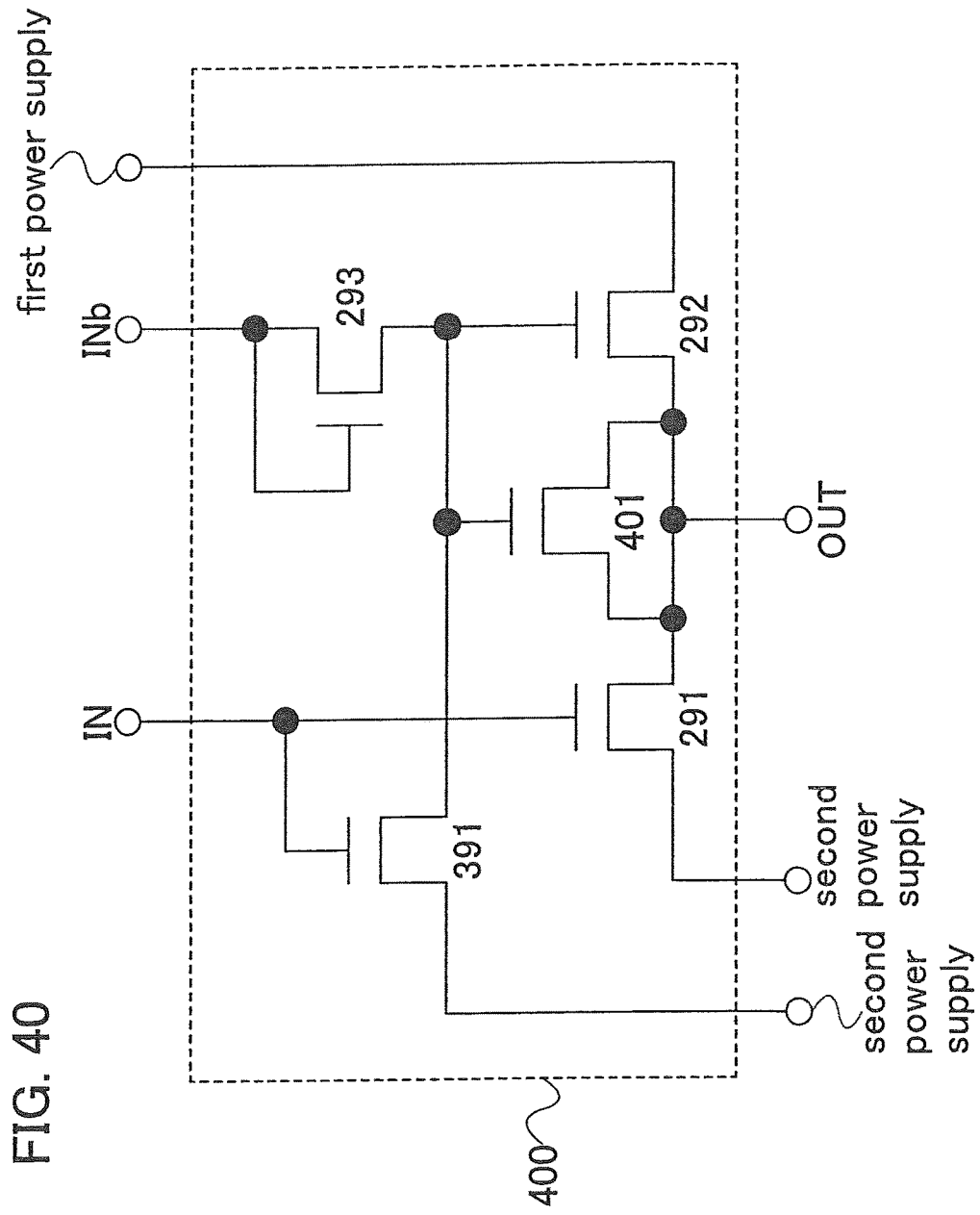
FIG. 40 is a diagram showing Embodiment Mode 3.

Note that any element can be used as the capacitor 294 as long as it has capacitive properties. For example, a transistor 301, a transistor 341, a transistor 371, and a transistor 401 may be connected as a substitute for the capacitor 294, respectively, as in an inverter circuit 300 in FIG. 30, in an inverter circuit 340 in FIG. 34, in an inverter circuit 370 in FIG. 37, and in an inverter circuit 400 in FIG. 40.

Figure 38:
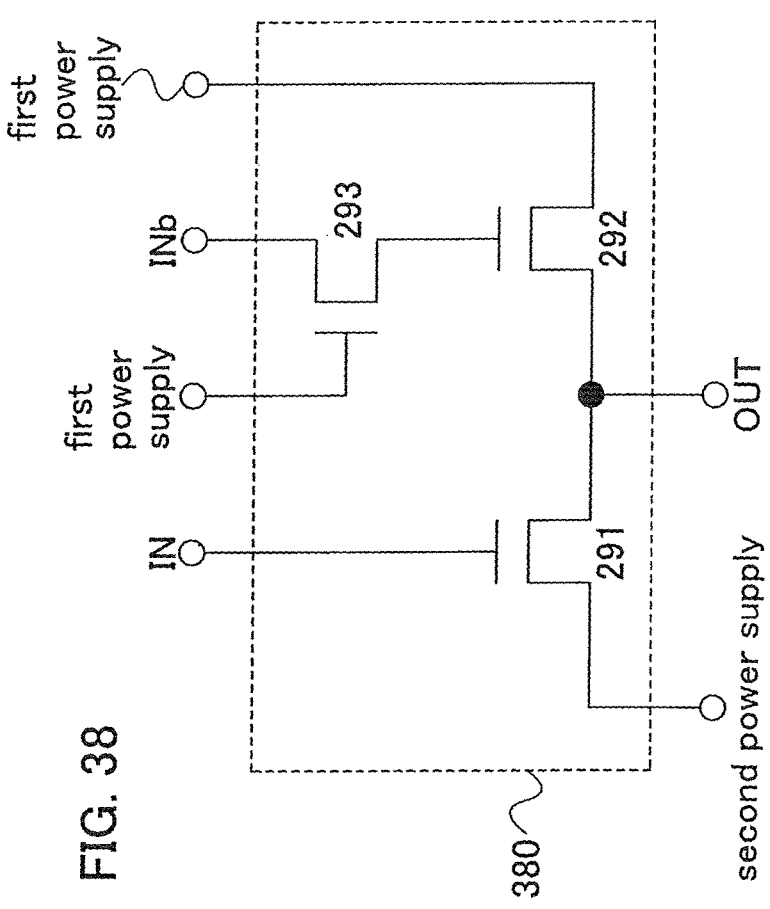
FIG. 38 is a diagram showing Embodiment Mode 3.
Figure 41:
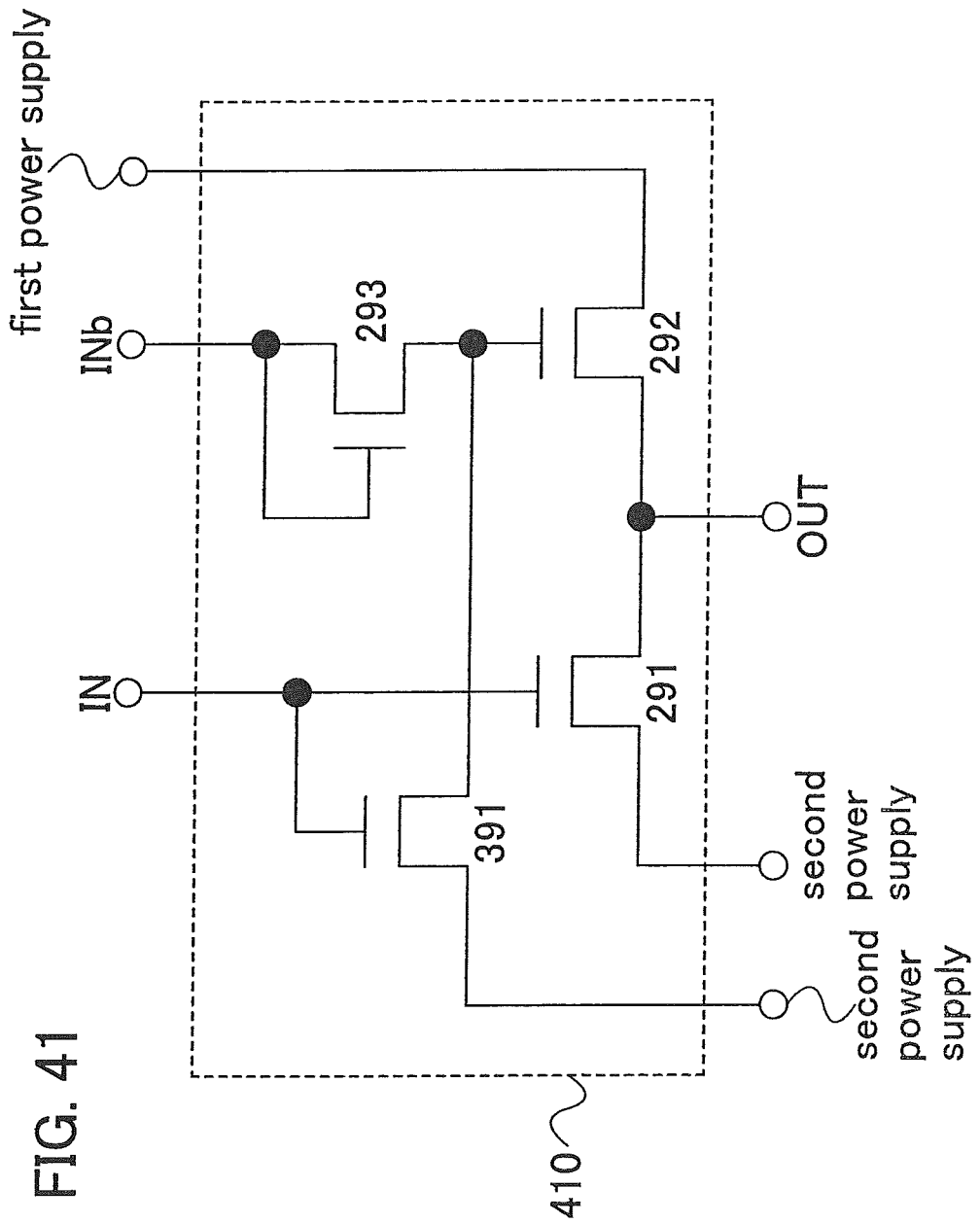
FIG. 41 is a diagram showing Embodiment Mode 3.

Note that the capacitor 294 is not necessarily provided when a capacitance value between the second terminal and the gate terminal of the transistor 292 is sufficiently large. For example, the capacitor 294 is not required to be connected as in an inverter circuit 310 in FIG. 31, in an inverter circuit 350 in FIG. 35, in an inverter circuit 380 in FIG. 38, and in an inverter Circuit 410 in FIG. 41.

Here, functions of the transistors 291 to 293, the transistor 301, the transistor 331, the transistor 341, and the capacitor 294 are described below.

The transistor 291 has a function as a switch which determines whether to connect the second power supply and the output terminal OUT or not in accordance with the potential of the input terminal IN. When the input terminal IN is at an H level, the transistor 291 has a function of supplying the power supply potential VSS to the output terminal OUT.

The transistor 292 has a function as a switch which determines whether to connect the first power supply and the output terminal OUT or not.

The transistor 293 has a function as a diode. In addition, the transistor 293 has a function of making the gate terminal of the transistor 292 into a floating state.

The transistor 301 has a function as a capacitor which is connected between the output terminal OUT and the gate terminal of the transistor 292. When the input terminal IN is at an L level, the transistor 301 has a function of raising the potential of the gate terminal of the transistor 292.

The transistor 331 has a function as a switch which determines whether to connect the second power supply and the gate terminal of the transistor 292 or not in accordance with the potential of the input terminal IN.

The transistor 341 has a function as a capacitor which is connected between the output terminal OUT and the gate terminal of the transistor 292. When the input terminal IN is at an L level, the transistor 341 has a function of raising the potential of the gate terminal of the transistor 292 by a rise of the potential of the output terminal OUT.

The capacitor 294 has a function for changing the potential of the gate terminal of the transistor 292 in accordance with the potential of the output terminal OUT. When the input terminal IN is at an L level, the capacitor 294 has a function of raising the potential of the gate terminal of the transistor 292 by the rise of the potential of the output terminal OUT.

In this manner, in the inverter circuits in FIGS. 28 to 41, the potential of the output terminal OUT can be changed freely by changing the power supply potential VDD when an H-level signal is output. That is, the inverter circuits in FIGS. 28 to 41 can operate not only as inverter circuits, but also as level-shift circuits.

Although the inverter circuits formed by using all n-channel transistors are described in FIGS. 28 to 41, the inverter circuits may be formed by using all p-channel transistors as well. Here, inverter circuits formed by using all p-channel transistors are shown in FIGS. 58 to 71.

Figure 58:
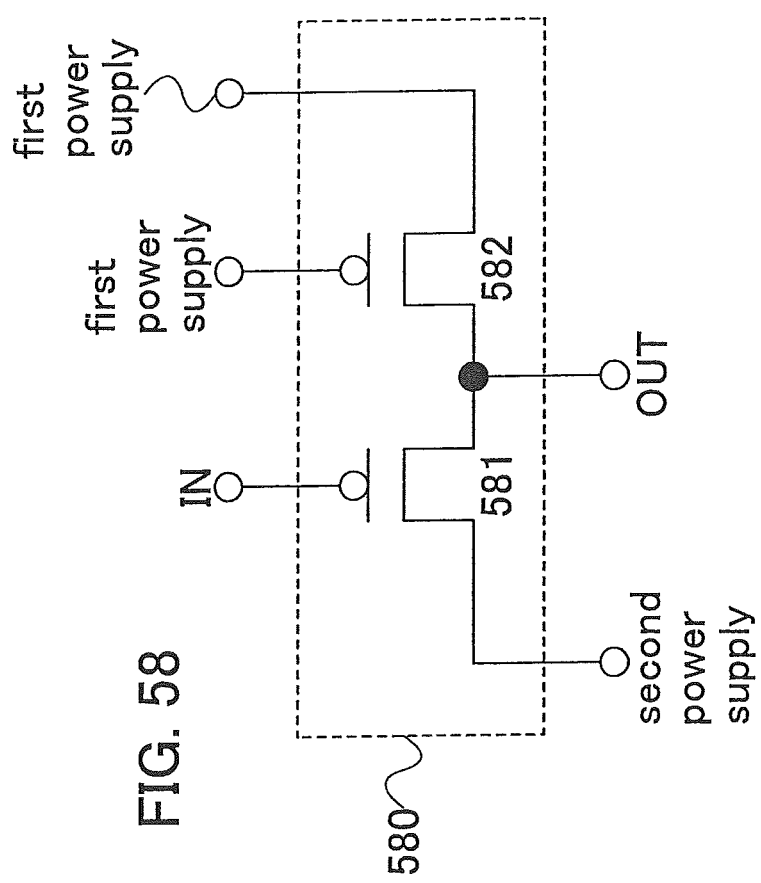
FIG. 58 is a diagram showing Embodiment Mode 3.

FIG. 58 shows one mode of the inverter circuit 211. An inverter circuit 580 in FIG. 58 includes a transistor 581 and a transistor 582.

As shown in the inverter circuit 580 in FIG. 58, a first terminal of the transistor 581 is connected to the second power supply; a second terminal of the transistor 581 is connected to a second terminal of the transistor 582 and the output terminal OUT; and a gate terminal of the transistor 581 is connected to the input terminal IN. A first terminal is connected to the first power supply and a gate terminal of the transistor 582 is connected to the first power supply.

It is to be noted that the power supply potential VSS is supplied to the first power supply and the power supply potential VDD is supplied to the second power supply. The potential difference (VDD−VSS) between the power supply potential VSS of the first power supply and the power supply potential VDD of the second power supply corresponds to a power supply voltage of the inverter circuit 580. In addition, the power supply potential VDD is higher than the power supply potential VSS.

It is to be noted that a digital control signal is supplied to the input terminal IN. In addition, the output terminal OUT outputs an output signal.

In addition, each of the transistor 581 and the transistor 582 is a p-channel transistor.

Operations of the inverter circuit 580 in FIG. 58 in the case where the input terminal IN is at an H level and in the case where the input terminal IN is at an L level are described, respectively.

First, the input terminal IN at an H level is described. When the input terminal IN becomes to be at an H level, the transistor 581 is turned off. The output terminal OUT is electrically connected to the first power supply through the transistor 582, and the potential of the output terminal OUT drops. The potential of the output terminal OUT at this time becomes a value which is the sum of the power supply potential VSS and the absolute value of the threshold voltage Vth582 of the transistor 582 (VSS+|Vth582|), so that the output terminal OUT becomes to be at an L level.

Next, the input terminal IN at an L level is described. When the input terminal IN becomes to be at an L level, the transistor 581 is turned on. The output terminal OUT is electrically connected to the second power supply through the transistor 581 and is electrically connected to the first power supply through the transistor 582, and thus, the potential of the output terminal OUT rises. The potential of the output terminal OUT at this time is determined by an operating point of the transistor 581 and the transistor 582, so that the output terminal OUT becomes to be at an H level.

The transistor 582 does not necessarily have rectifying properties; any element can be used as long as a voltage is generated in the element when a current is supplied thereto. For example, a resistor 621 may be connected as a substitute for the transistor 582 as in an inverter circuit 620 in FIG. 62.

Here, functions of the transistor 581 and the transistor 582 are described below.

The transistor 581 has a function as a switch which determines whether to connect the second power supply and the output terminal OUT or not in accordance with a potential of the input terminal IN. When the input terminal IN is at an L level, the transistor 581 has a function of supplying the power supply potential VDD to the output terminal OUT.

The transistor 582 has a function as a diode.

Figure 59:
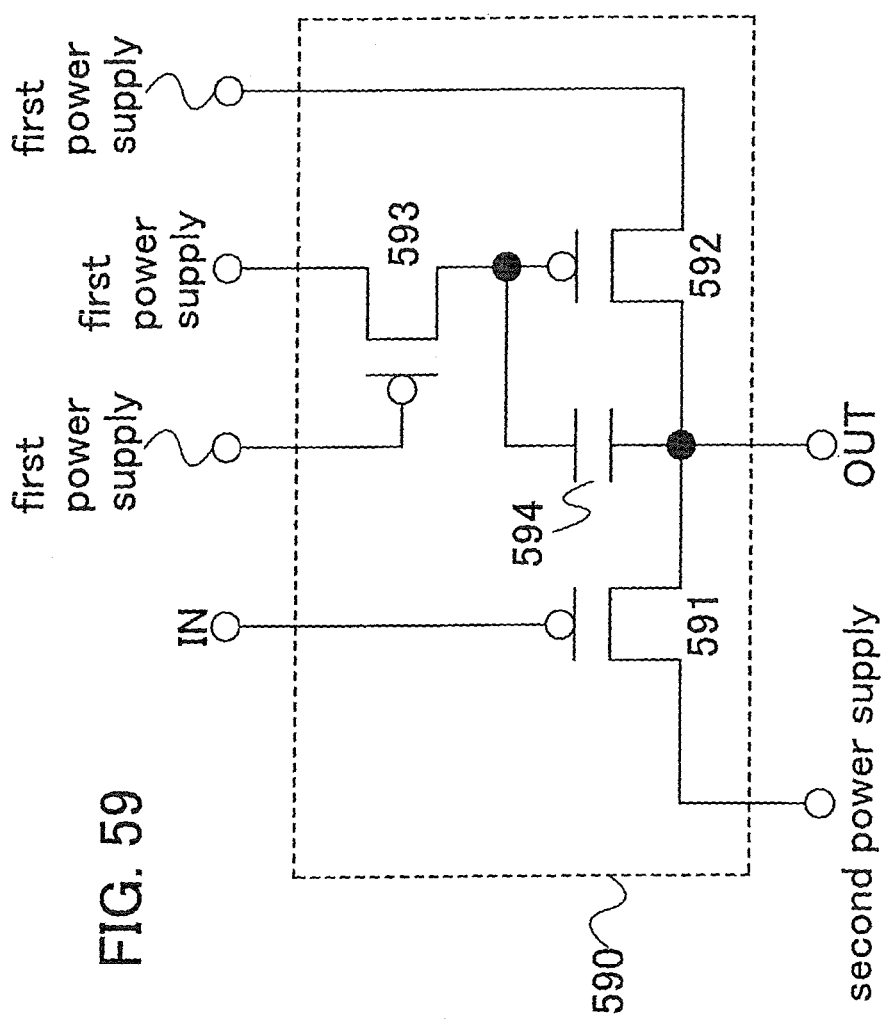
FIG. 59 is a diagram showing Embodiment Mode 3.
Figure 60:
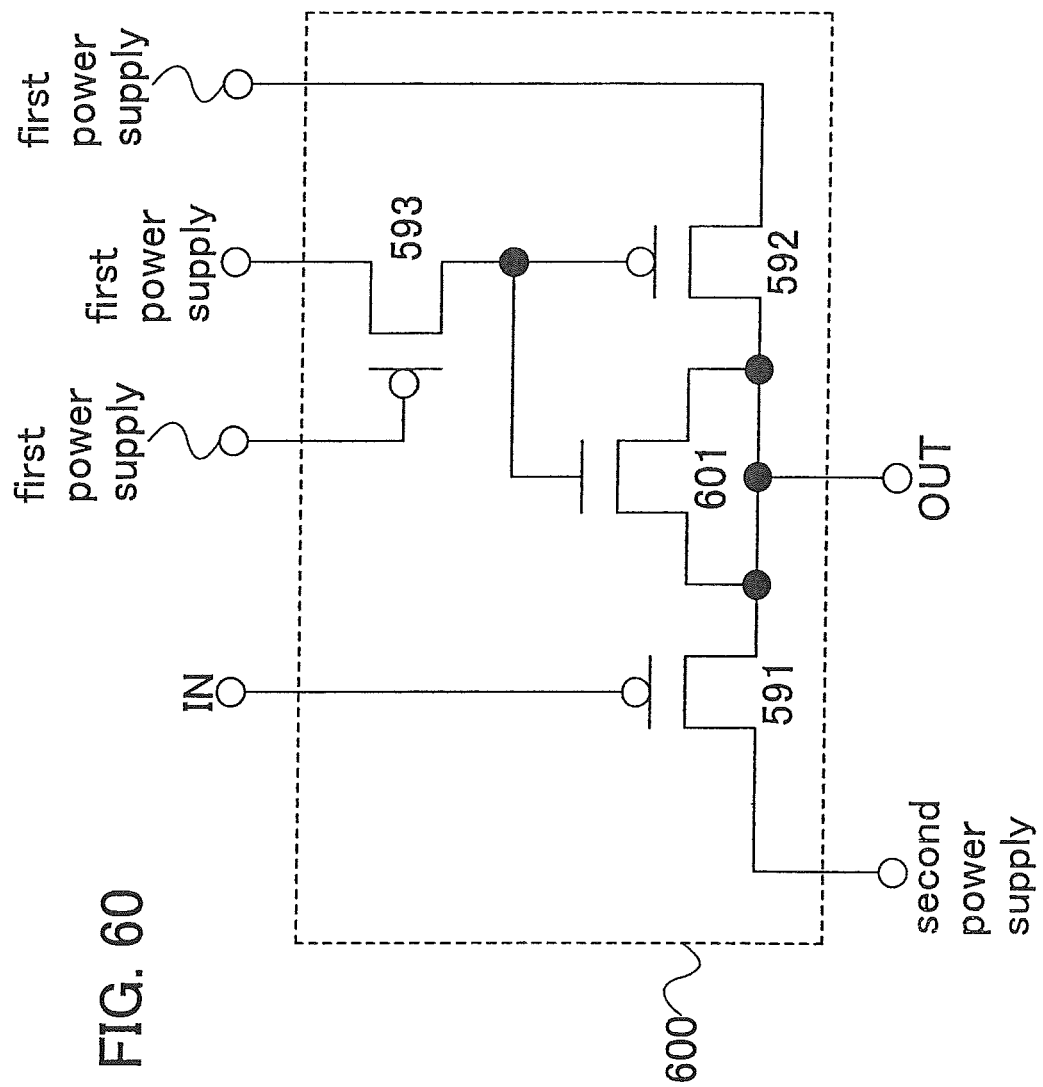
FIG. 60 is a diagram showing Embodiment Mode 3.
Figure 61:
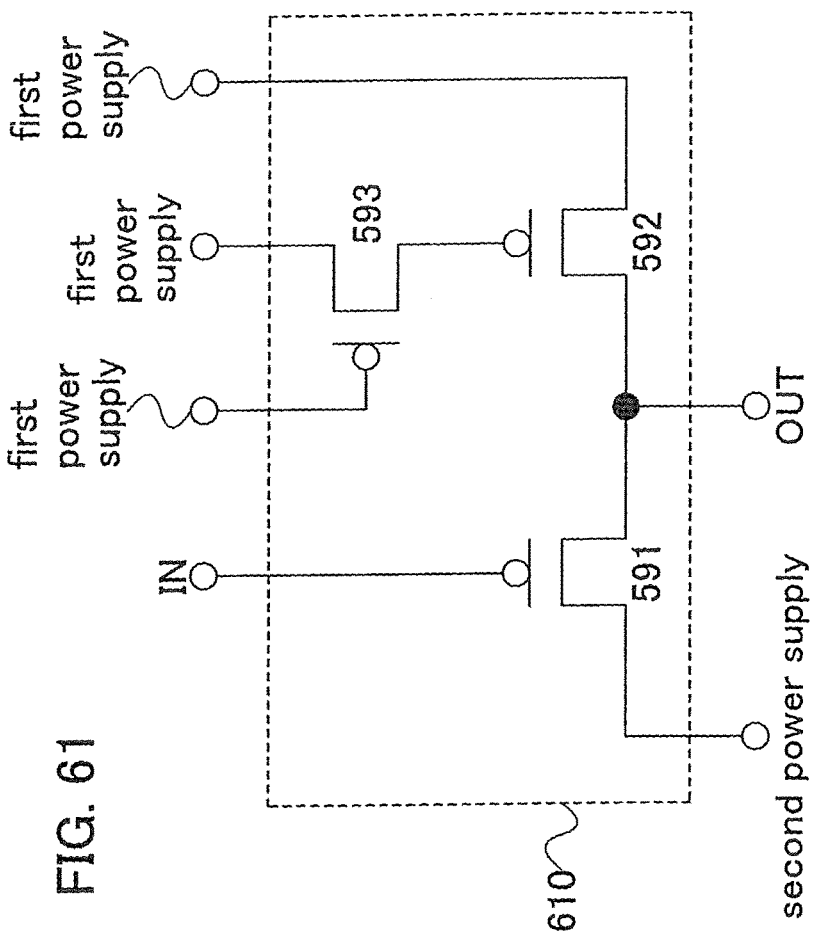
FIG. 61 is a diagram showing Embodiment Mode 3.
Figure 62:
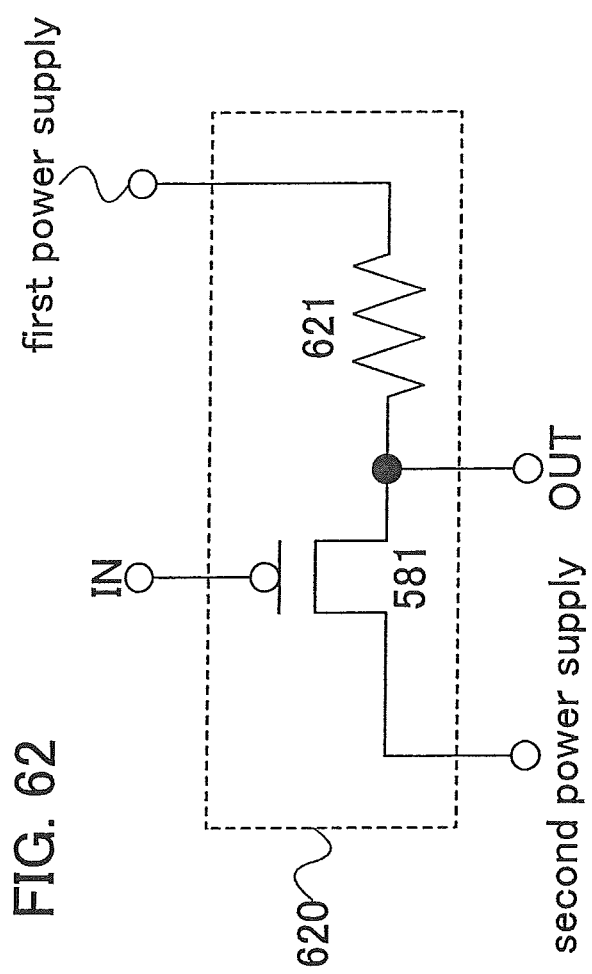
FIG. 62 is a diagram showing Embodiment Mode 3.

FIG. 59 shows another mode of the inverter circuit 211. An inverter circuit 590 shown in FIG. 59 includes a transistor 591, a transistor 592, a transistor 593, and a capacitor 594 having two electrodes. Note that the capacitor 594 is not necessarily provided.

As shown in the inverter circuit 590 in FIG. 59, a first terminal of the transistor 591 is connected to the second power supply; a second terminal of the transistor 591 is connected to a second terminal of the transistor 592, a second electrode of the capacitor 594, and the output terminal OUT; and a gate terminal of the transistor 591 is connected to the input terminal IN. A first terminal of the transistor 592 is connected to the first power supply, and a gate terminal of the transistor 592 is connected to a second terminal of the transistor 593 and a first electrode of the capacitor 594. A first terminal is connected to the first power supply and a gate terminal of the transistor 593 are connected to the first power supply.

Note that a first power supply, a second power supply, an input terminal IN, and an output terminal OUT which are the same as those shown in FIG. 58 can be used as the first power supply, the second power supply, the input terminal IN, and the output terminal OUT.

In addition, each of the transistors 591 to 593 is a p-channel transistor.

Operations of the inverter circuit 590 in FIG. 59 in the case where the input terminal IN is at an H level and in the case where the input terminal IN is at an L level are described, respectively.

First, the input terminal IN at an H level is described. When the input terminal IN becomes to be at an H level, the transistor 591 is turned off. A potential of the gate terminal of the transistor 592 becomes a value which is the sum of the power supply potential VSS and the absolute value of the threshold voltage Vth593 of the transistor 593 (VSS+|Vth593|), so that the transistor 592 is on. In addition, the gate terminal of the transistor 592 is in a floating state.

Accordingly, the output terminal OUT is electrically connected to the first power supply through the transistor 592, and thus, the potential of the output terminal OUT drops. The potential of the gate terminal of the transistor 592 drops to a value which is less than or equal to a value obtained by subtracting the absolute value of the threshold voltage Vth592 of the transistor 592 from the power supply potential VSS (VSS−|Vth592|) by the capacitive coupling of the capacitor 594, so that the transistor 592 is continuously kept on. A so-called bootstrap operation is performed. Accordingly, the potential of the output terminal OUT at this time becomes VSS, so that the output terminal OUT becomes to be at an L level.

Next, the input terminal IN at an L level is described. When the input terminal IN becomes to be at an L level, the transistor 591 is turned on. The potential of the gate terminal of the transistor 592 becomes a value of the sum of the power supply potential VSS and the absolute value of the threshold voltage Vth593 of the transistor 593 (VSS+|Vth593|), so that the transistor 592 is on. In addition, the gate terminal of the transistor 592 is in a floating state.

Accordingly, the output terminal OUT is electrically connected to the second power supply through the transistor 591 and is electrically connected to the first power supply through the transistor 592, and the potential of the output terminal OUT rises. The potential of the output terminal OUT at this time is determined by an operating point of the transistor 591 and the transistor 592, so that the output terminal OUT becomes to be at an H level.

In this manner, the L-level potential of the output terminal OUT can be lowered to the power supply potential VSS of the first power supply by the bootstrap operation in the inverter circuit 590 in FIG. 59.

Note that a circuit structure of the inverter circuit 590 in FIG. 59 is not limited to the circuit structure in FIG. 59 as long as the bootstrap operation can be performed when the input terminal IN is at an H level. When the input terminal IN is at an L level, a potential may be supplied to the gate terminal of the transistor 592.

Figure 63:
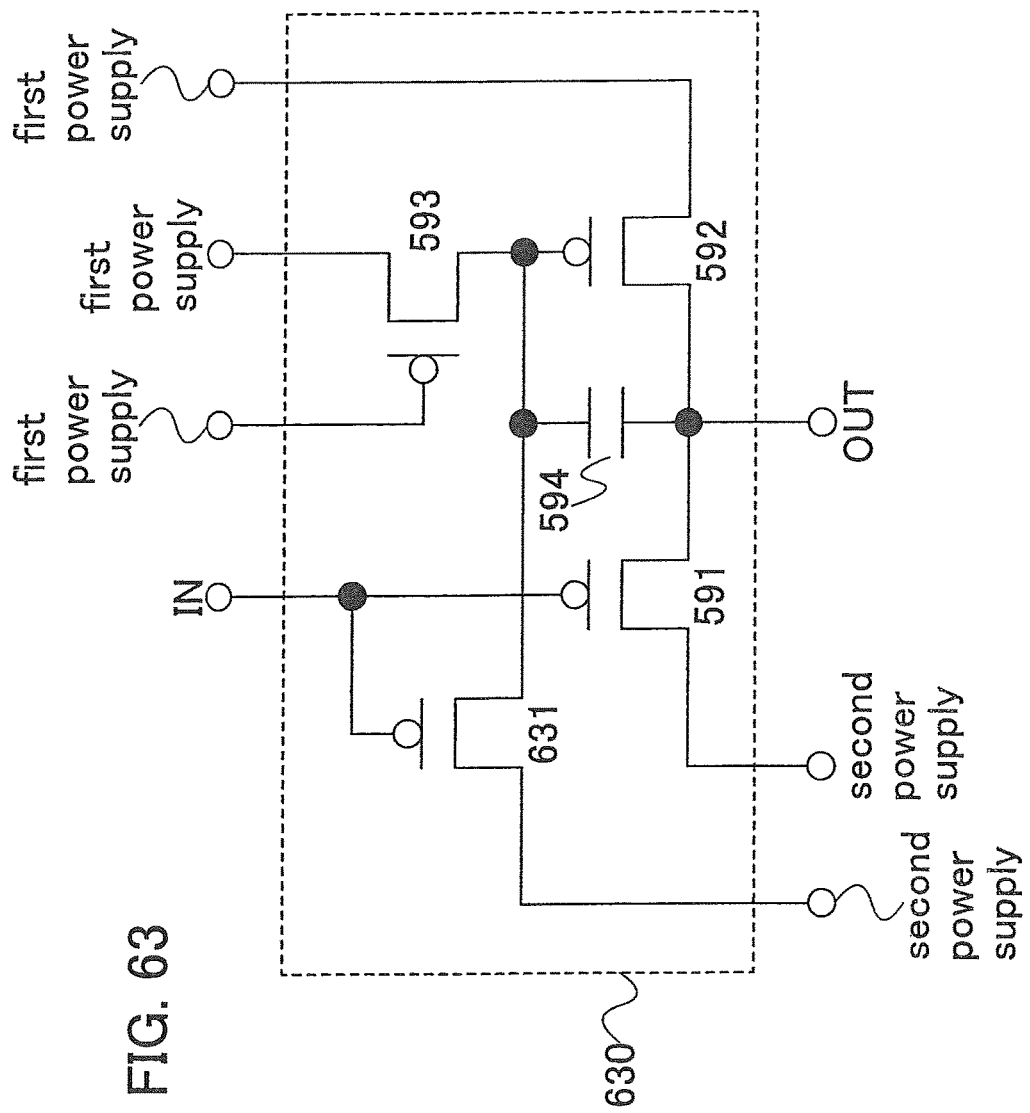
FIG. 63 is a diagram showing Embodiment Mode 3.
Figure 64:
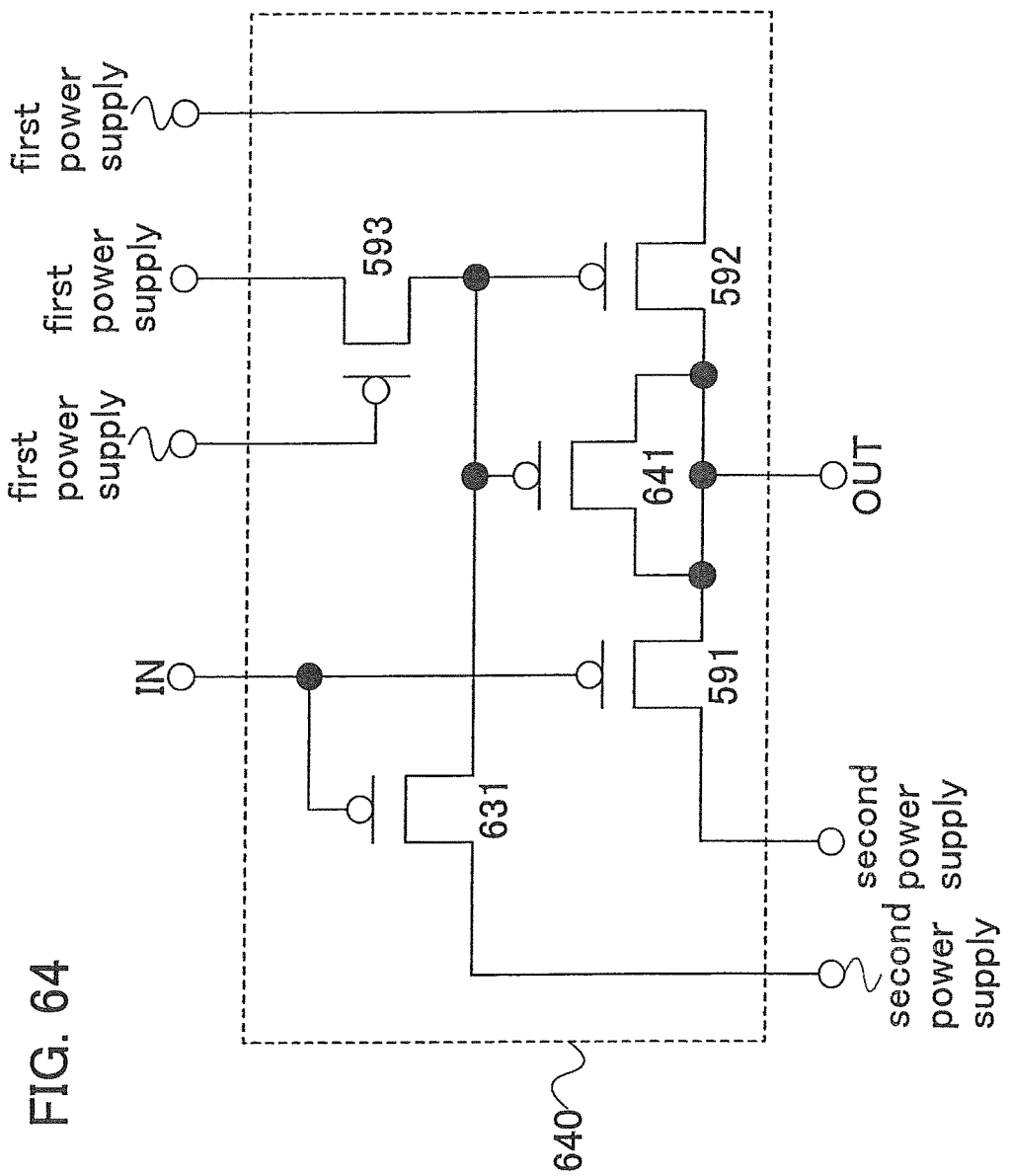
FIG. 64 is a diagram showing Embodiment Mode 3.
Figure 65:
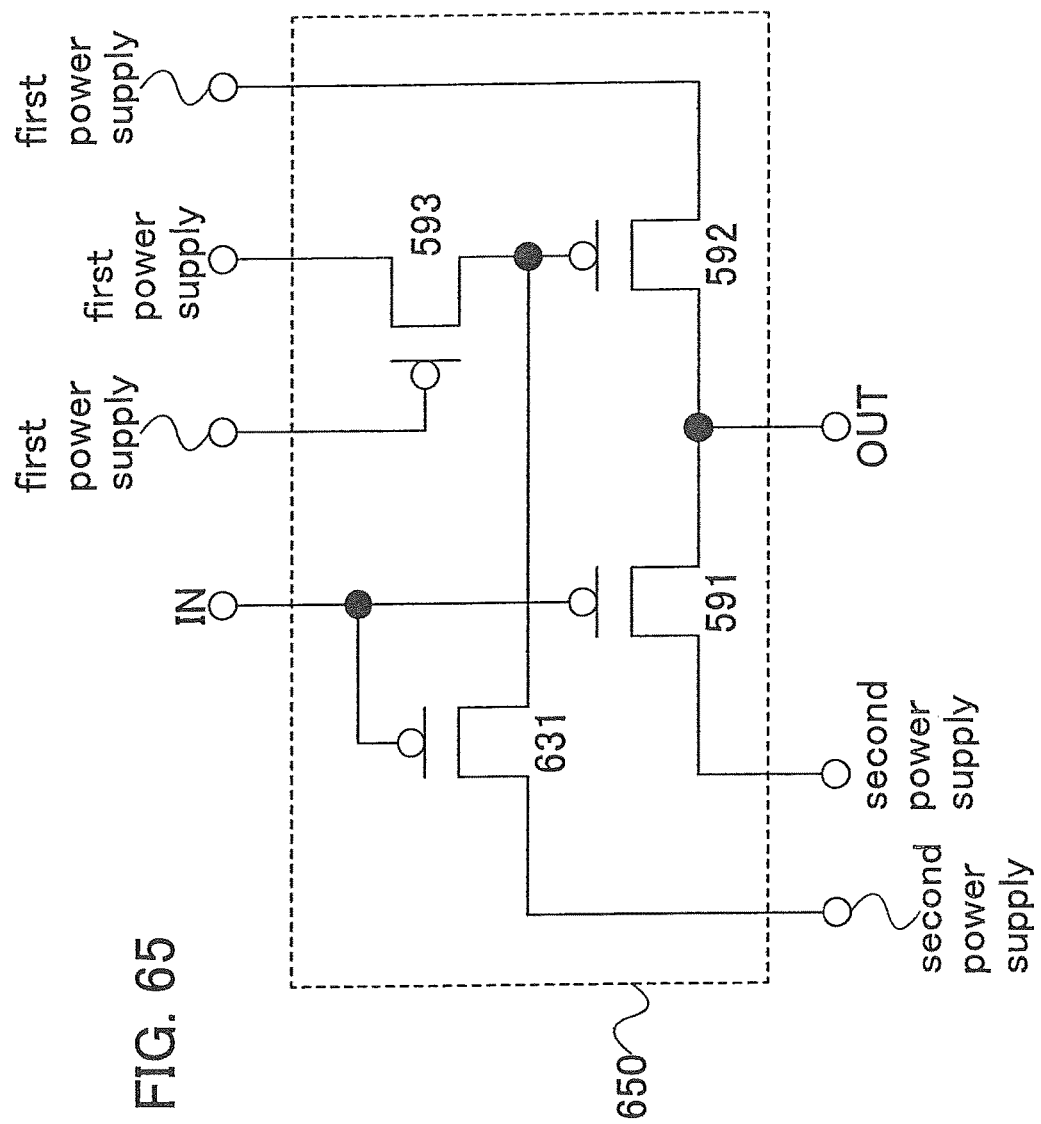
FIG. 65 is a diagram showing Embodiment Mode 3.

For example, a transistor 631 may be additionally provided as in an inverter circuit 630 in FIG. 63. This is because the potential of the output terminal OUT can be made VDD when the output terminal OUT is at an H level. That is, since the transistor 631 is turned on when the input terminal IN is at an L level, the gate terminal of the transistor 592 becomes to be at an H level. Then, the transistor 592 is turned off so that the output terminal OUT is electrically connected only to the second power supply through the transistor 591.

It is to be noted that the transistor 631 is a p-channel transistor.

Figure 66:
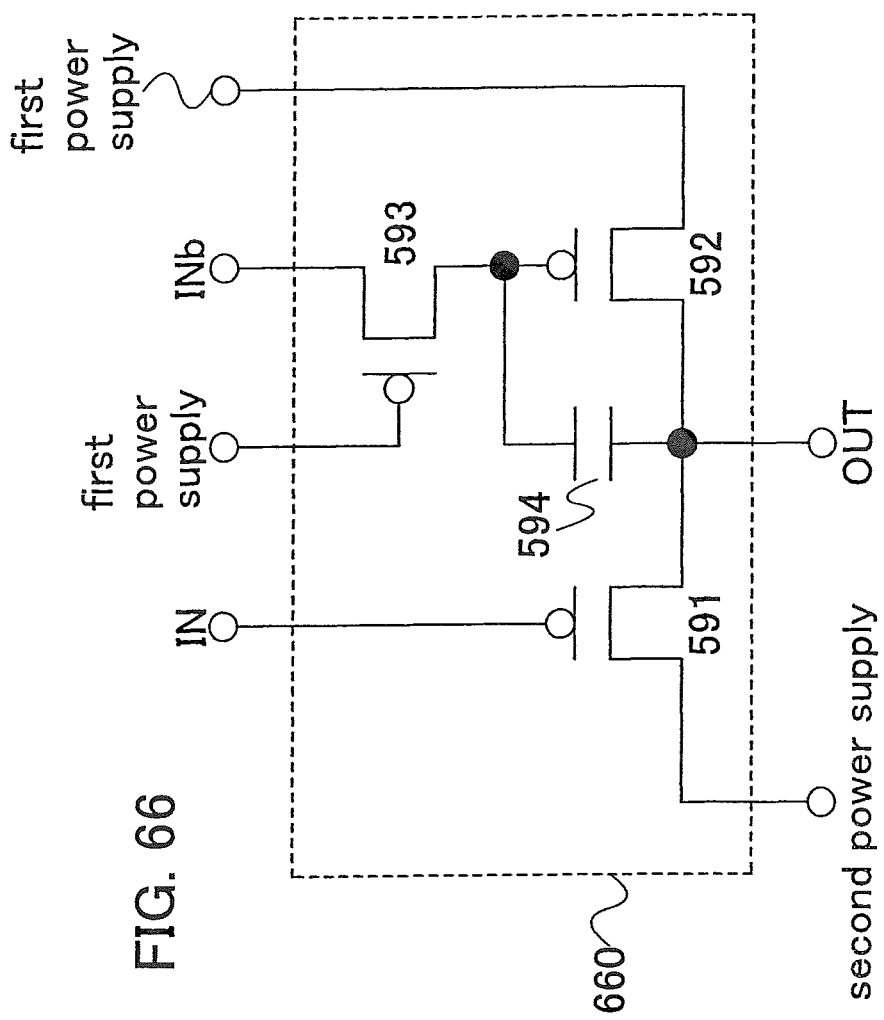
FIG. 66 is a diagram showing Embodiment Mode 3.
Figure 67:
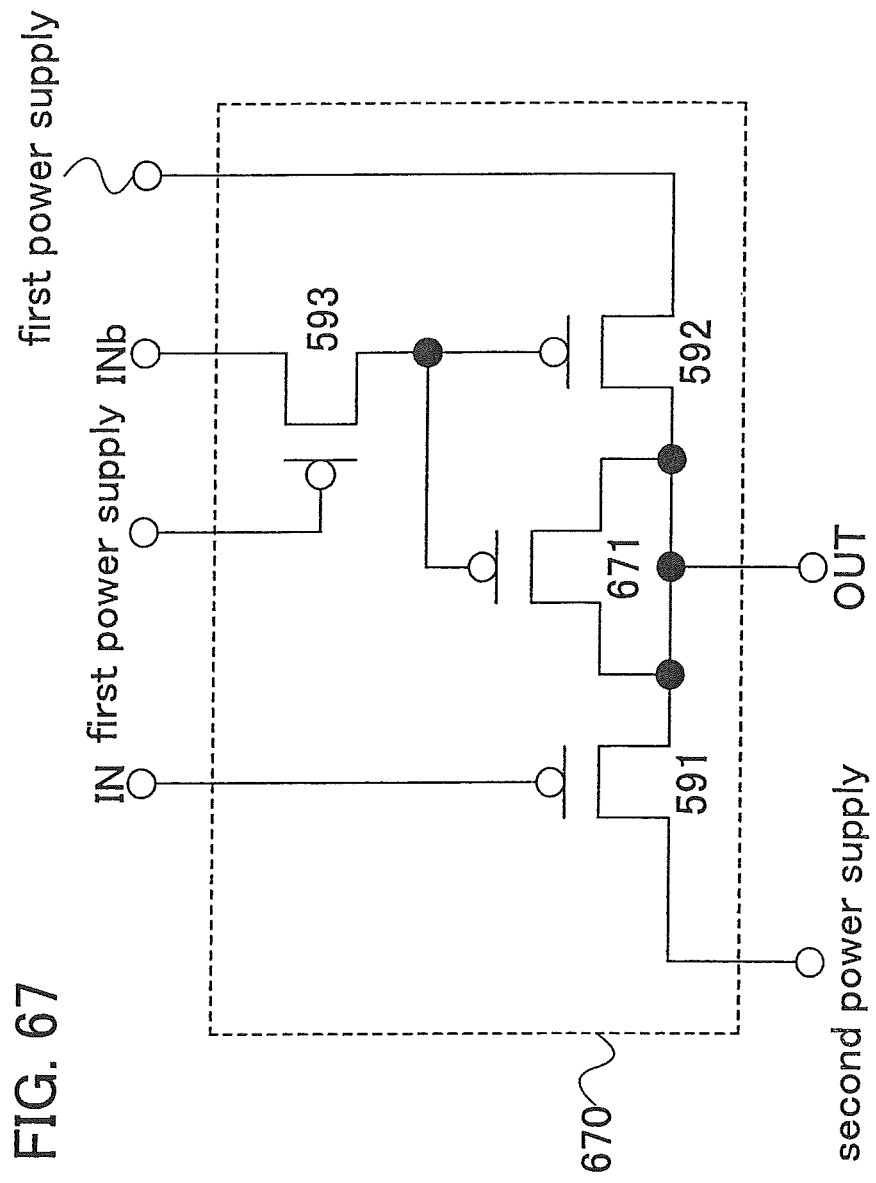
FIG. 67 is a diagram showing Embodiment Mode 3.
Figure 68:
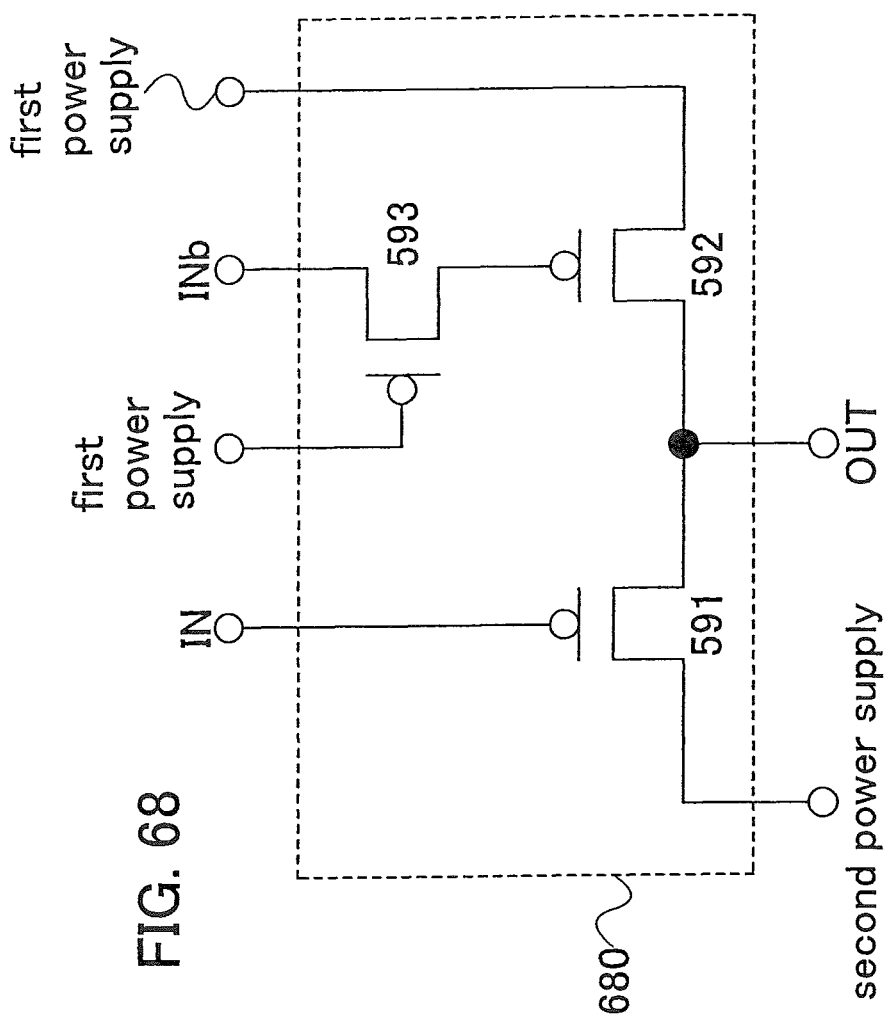
FIG. 68 is a diagram showing Embodiment Mode 3.

As another example, the first terminal of the transistor 593 may be connected to the input terminal INb as in an inverter circuit 660 in FIG. 66. This is because the potential of the output terminal OUT can be made VDD when the out terminal OUT is at an H level. That is, since the input terminal INb becomes to be at an H level when the input terminal IN is at an L level, the gate terminal of the transistor 592 becomes to be at an H level. Then, the transistor 592 is turned off so that the output terminal OUT is electrically connected only to the second power supply through the transistor 591.

It is to be noted that an inverted signal of the signal of the input terminal IN is supplied to the input terminal INb. In addition, an input terminal INb which is the same as that shown in FIG. 36 can be used as the input terminal INb.

Figure 125:
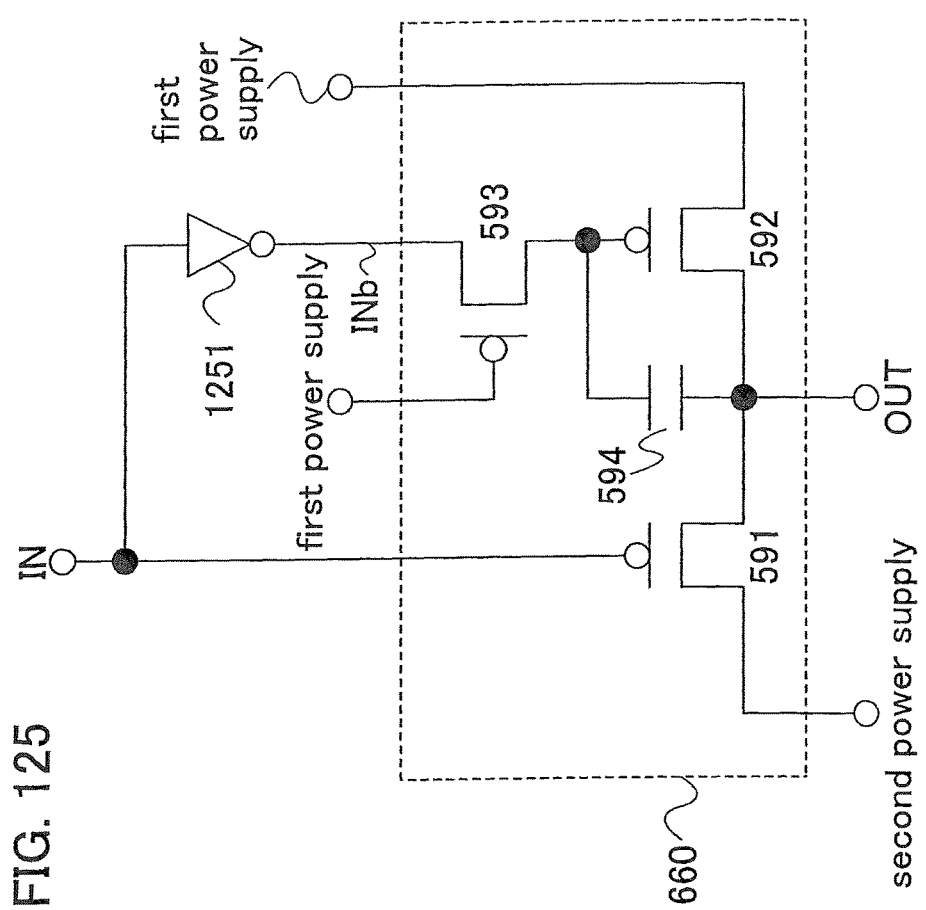
FIG. 125 is a diagram showing Embodiment Mode 3.

For example, a signal inputted to the input terminal IN may be supplied to the input terminal INb through an inverter circuit 1251 as shown in FIG. 125. In addition, the inverter circuits shown in FIGS. 58 to 65 can be applied as the inverter circuit 1251.

Further, the inverter circuit 360 functions also as a tristate buffer circuit by supplying the control signal to the input terminal INb, which is shown in FIG. 36. Here, the inverter circuit 660 shown in FIG. 66 can similarly function also as a tristate buffer circuit by supplying the control signal to the input terminal INb. That is, when the input terminal IN becomes to be at an H level and the input terminal INb becomes to be at an H level, the transistor 591 and the transistor 592 are turned off, and thus, the output terminal OUT is not connected to any power supplies; therefore, the inverter circuit 660 can function also as the tristate buffer circuit.

An application example of FIG. 59 is further described below.

Figure 69:
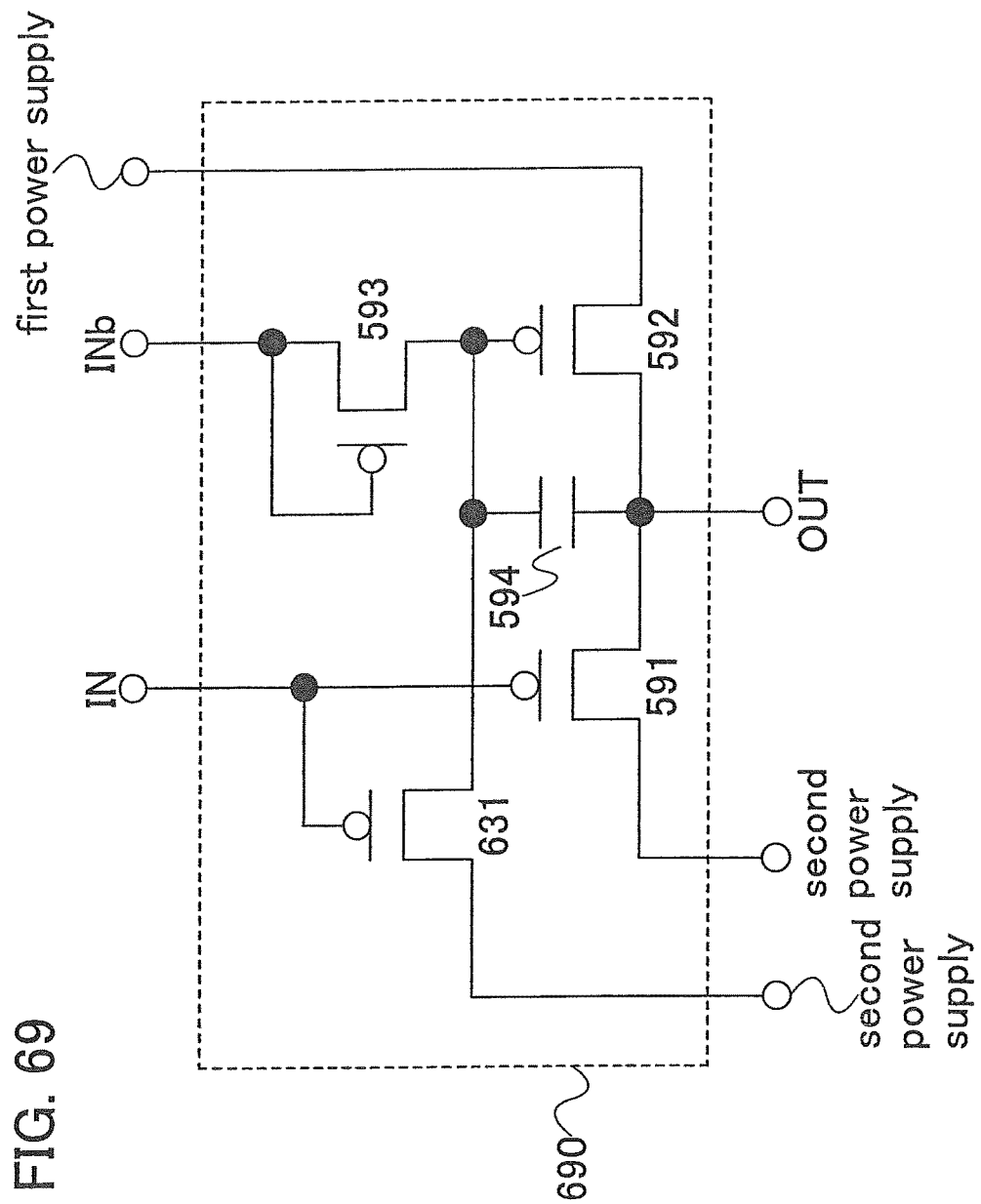
FIG. 69 is a diagram showing Embodiment Mode 3.
Figure 70:
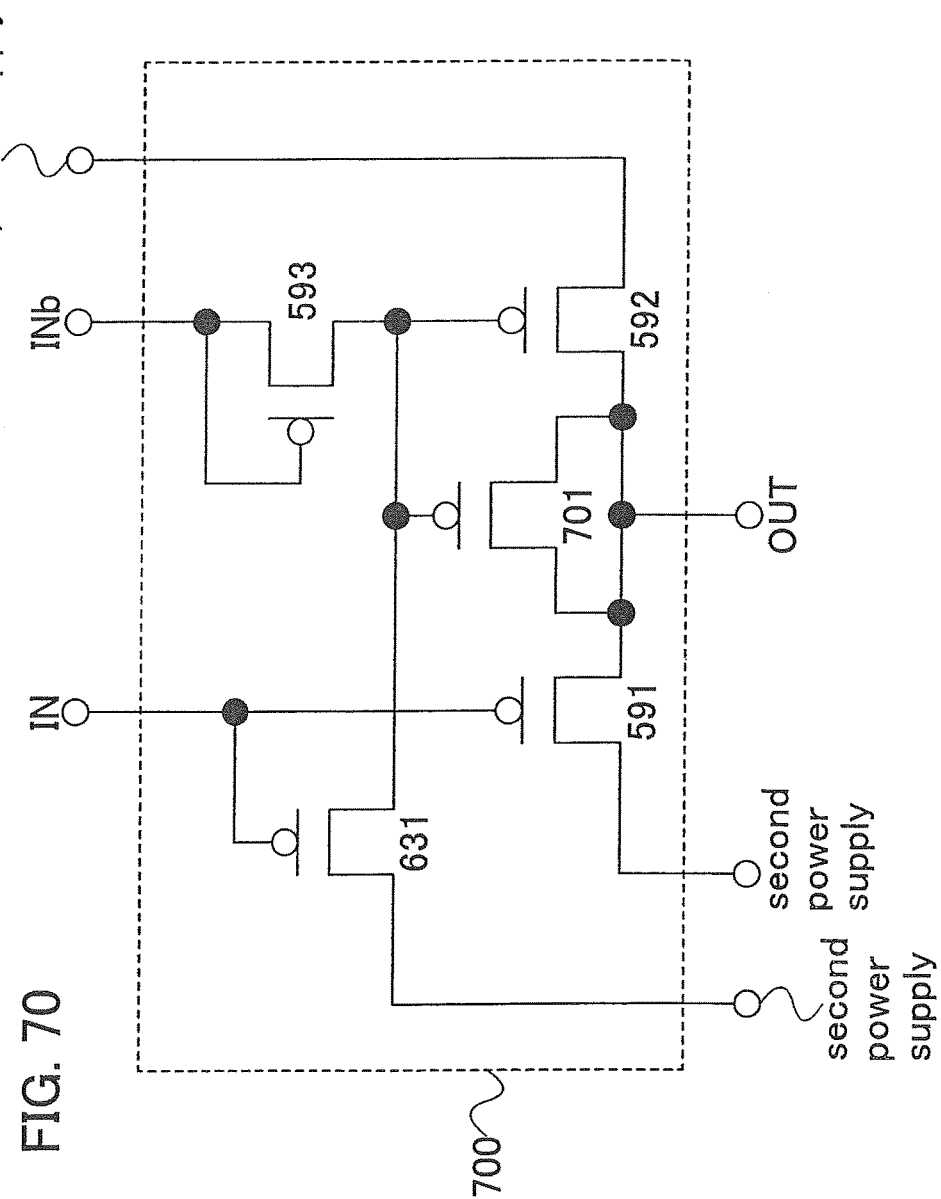
FIG. 70 is a diagram showing Embodiment Mode 3.
Figure 71:
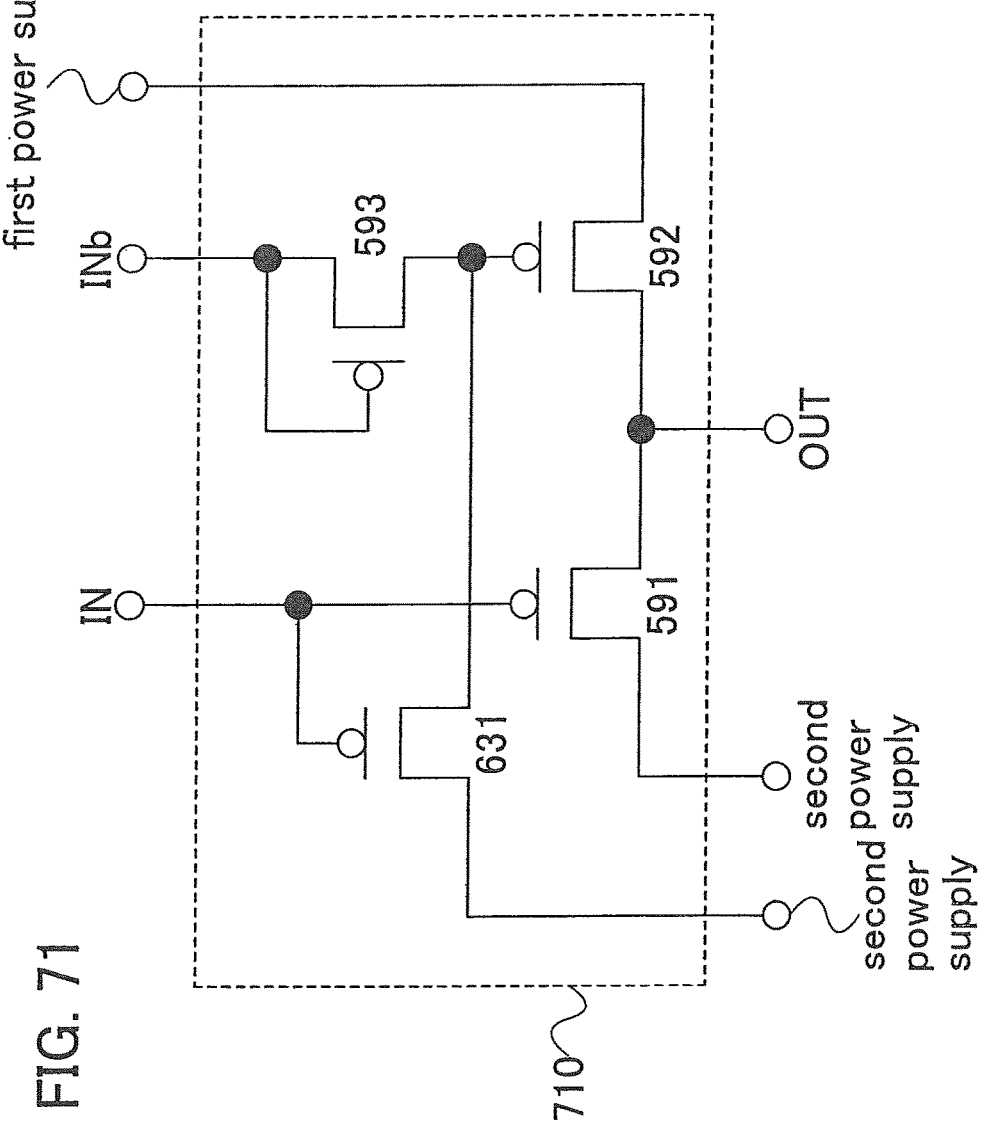
FIG. 71 is a diagram showing Embodiment Mode 3.

As another example, the first terminal and the gate terminal of the transistor 593 may be connected to the input terminal INb, and a transistor 631 may be additionally provided as in an inverter circuit 690 in FIG. 69. This is because the potential of the output terminal OUT can be made VDD when the output terminal OUT is at an H level. That is, when the input terminal INb is at an H level, the gate terminal of the transistor 592 becomes to be at an H level. Then, the transistor 592 is turned off so that the output terminal OUT is electrically connected only to the second power supply through the transistor 591.

Note that any element can be used as the capacitor 594 as long as it has capacitive properties. For example, a transistor 601, a transistor 641, a transistor 671, and a transistor 701 may be connected as a substitute for the capacitor 594, respectively, as in an inverter circuit 600 in FIG. 60, in an inverter circuit 640 in FIG. 64, in an inverter circuit 670 in FIG. 67, and in an inverter circuit 700 in FIG. 70.

Note that the capacitor 594 is not necessarily provided when a capacitance value between the second terminal and the gate terminal of the transistor 592 is sufficiently large. For example, the capacitor 594 is not required to be connected as in an inverter circuit 610 in FIG. 61, in an inverter circuit 650 in FIG. 65, in an inverter circuit 680 in FIG. 68, and in an inverter circuit 710 in FIG. 71.

Here, functions of the transistors 591 to 593, the transistor 601, the transistor 631, the transistor 641, and the capacitor 594 are described below.

The transistor 591 has a function as a switch which determines whether to connect the second power supply and the output terminal OUT or not in accordance with the potential of the input terminal IN. When the input terminal IN is at an L level, the transistor 591 has a function of supplying the power supply potential VDD to the output terminal OUT.

The transistor 592 has a function as a switch which determines whether to connect the first power supply and the output terminal OUT or not.

The transistor 593 has a function as a diode. In addition, the transistor 593 has a function of making the gate terminal of the transistor 592 at a floating state.

The transistor 601 has a function as a capacitor which is connected between the output terminal OUT and the gate terminal of the transistor 592. When the input terminal IN is at an H level, the transistor 601 has a function of lowering the potential of the gate terminal of the transistor 592.

The transistor 631 has a function as a switch which determines whether to connect the second power supply and the gate terminal of the transistor 592 or not in accordance with the potential of the input terminal IN. When the input terminal IN is at an L level, the transistor 631 has a function of supplying the power supply potential VDD to the gate terminal of the transistor 592.

The transistor 641 has a function as a capacitor which is connected between the output terminal OUT and the gate terminal of the transistor 592. When the input terminal IN is at an L level, the transistor 641 has a function of drop the potential of the gate terminal of the transistor 592 by the drop of the potential of the output terminal OUT.

The capacitor 594 has a function for changing the potential of the gate terminal of the transistor 592 in accordance with the potential of the output terminal OUT. When the input terminal IN is at an H level, the capacitor 594 has a function of lowering the potential of the gate terminal of the transistor 592 by the drop of the potential of the output terminal OUT.

In this manner, in the inverter circuits in FIGS. 58 to 71, the potential of the output terminal OUT can be changed freely by changing the power supply potential VSS when an L-level signal is output. That is, the inverter circuits in FIGS. 58 to 71 can operate not only as inverter circuits, but also as level-shift circuits.

Here, some structure examples which can be applied to the NAND circuit 221 are described.

Figure 42:
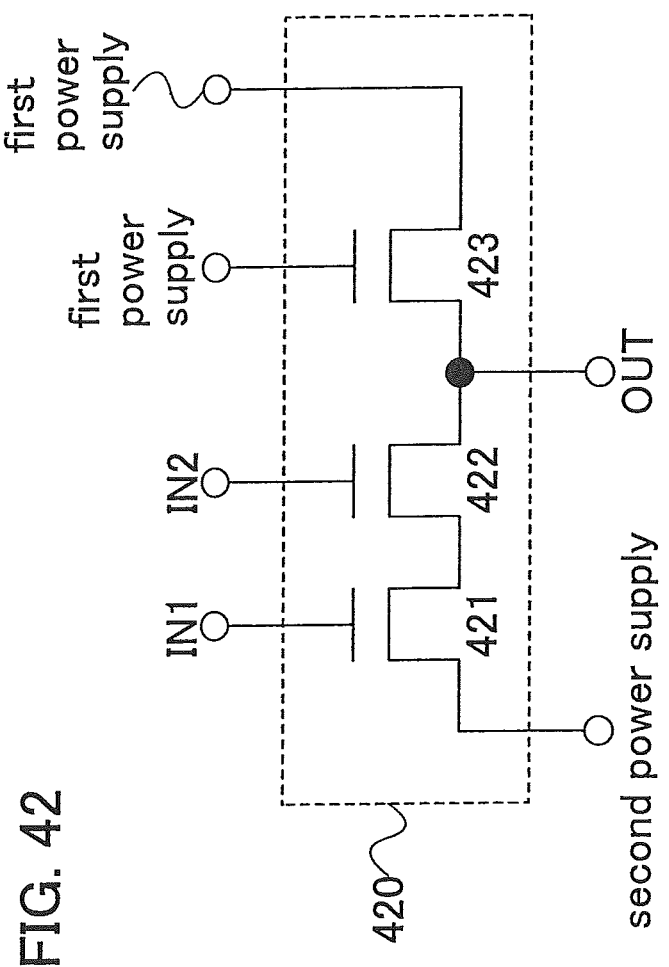
FIG. 42 is a diagram showing Embodiment Mode 3.

FIG. 42 shows one mode of the NAND circuit 221. A NAND circuit 420 in FIG. 42 includes a transistor 421, a transistor 422, and a transistor 423.

As shown in the NAND circuit 420 in FIG. 42, a first terminal of the transistor 421 is connected to the second power supply; a second terminal of the transistor 421 is connected to a first terminal of the transistor 422; and a gate terminal of the transistor 421 is connected to the input terminal IN1. A second terminal of the transistor 422 is connected to a first terminal of the transistor 423 and the output terminal OUT, and a gate terminal of the transistor 422 is connected to the input terminal IN2. A second terminal is connected to the first power supply and a gate terminal of the transistor 423 is connected to the first power supply.

It is to be noted that the power supply potential VDD is supplied to the first power supply and the power supply potential VSS is supplied to the second power supply. The potential difference (VDD−VSS) between the power supply potential VDD of the first power supply and the power supply potential VSS of the second power supply corresponds to a power supply voltage of the NAND circuit 420. In addition, the power supply potential VDD is higher than the power supply potential VSS.

It is to be noted that a digital control signal is supplied to each of the input terminal IN1 and the input terminal IN2. In addition, the output terminal OUT outputs an output signal.

In addition, each of the transistors 421 to 423 is an n-channel transistor.

Operations of the NAND circuit 420 in FIG. 42 in the cases where the input terminal IN1 is at an H level and is at an L level, and in the cases where the input terminal IN2 is at an H level and is at an L level are described, respectively.

First, the case where the input terminal IN1 is at an H level and the input terminal IN2 is at an H level is described. When the input terminal IN1 becomes to be at an H level, the transistor 421 is turned on. When the input terminal IN2 becomes to be at an H level, the transistor 422 is turned on.

Accordingly, the output terminal OUT is electrically connected to the second power supply through the transistor 421 and the transistor 422 and is electrically connected to the first power supply through the transistor 423, and thus, the potential of the output terminal OUT drops. The potential of the output terminal OUT at this time is determined by an operating point of the transistor 421, the transistor 422, and the transistor 423, so that the output terminal OUT becomes to be at an L level.

Next, the case where the input terminal IN1 is at an H level and the input terminal IN2 is at an L level are described. When the input terminal IN1 becomes to be at an H level, the transistor 421 is turned on. When the input terminal IN2 becomes to be at an L level, the transistor 422 is turned off.

Accordingly, the output terminal OUT is electrically connected to the first power supply through the transistor 423, and the potential of the output terminal OUT rises. The potential of the output terminal OUT at this time becomes a value obtained by subtracting the threshold voltage Vth423 of the transistor 423 from the power supply potential VDD (VDD−Vth423), so that the output terminal OUT becomes to be at an H level.

Next, the input terminal IN1 at an L level and the input terminal IN2 at an H level are described. When the input terminal IN1 becomes to be at an L level, the transistor 421 is turned off. When the input terminal IN2 becomes to be at an H level, the transistor 422 is turned on.

Accordingly, the output terminal OUT is electrically connected to the first power supply through the transistor 423, and the potential of the output terminal OUT rises. The potential of the output terminal OUT at this time becomes the value obtained by subtracting the threshold voltage Vth423 of the transistor 423 from the power supply potential VDD (VDD−Vth423), so that the output terminal OUT becomes to be at an H level.

Next, the case where the input terminal IN1 is at an L level and the input terminal IN2 is at an L level is described. When the input terminal IN1 becomes to be at an L level, the transistor 421 is turned off. When the input terminal IN2 becomes to be at an L level, the transistor 422 is turned off.

Accordingly, the output terminal OUT is electrically connected to the first power supply through the transistor 423, and the potential of the output terminal OUT rises. The potential of the output terminal OUT at this time becomes the value obtained by subtracting the threshold voltage Vth423 of the transistor 423 from the power supply potential VDD (VDD−Vth423), so that the output terminal OUT becomes to be at an H level.

Figure 46:
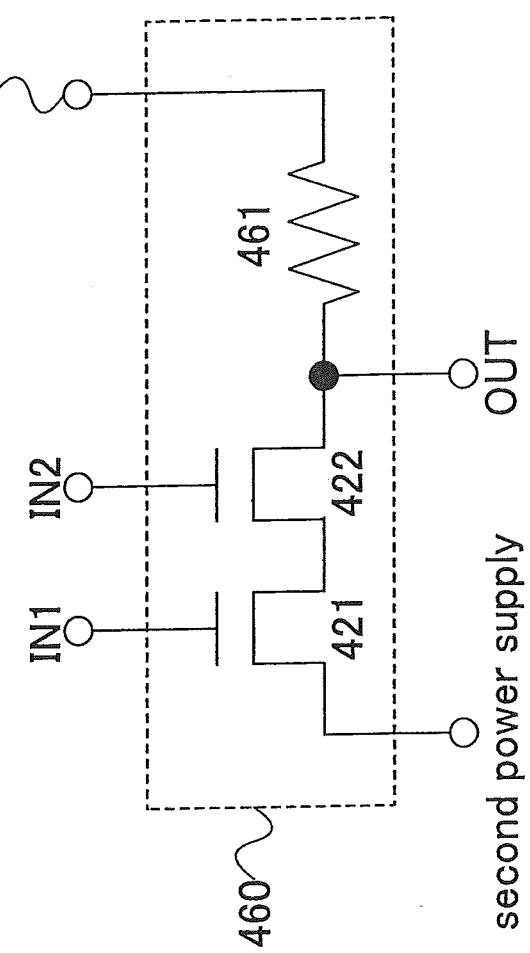
FIG. 46 is a diagram showing Embodiment Mode 3.

Note that the transistor 423 does not necessarily have rectifying properties; any element can be used as long as a voltage is generated in the element when a current is supplied thereto. For example, a resistor 461 may be connected as a substitute for the transistor 423 as in an inverter circuit 460 in FIG. 46.

Here, functions of the transistors 421 to 423 are described below.

The transistor 421 has a function as a switch which determines whether to connect the second power supply and the first terminal of the transistor 422 or not in accordance with the potential of the input terminal IN1.

The transistor 422 has a function as a switch which determines whether to connect the second terminal of the transistor 421 and the output terminal OUT or not in accordance with the potential of the input terminal IN2.

The transistor 423 has a function as a diode.

Figure 43:
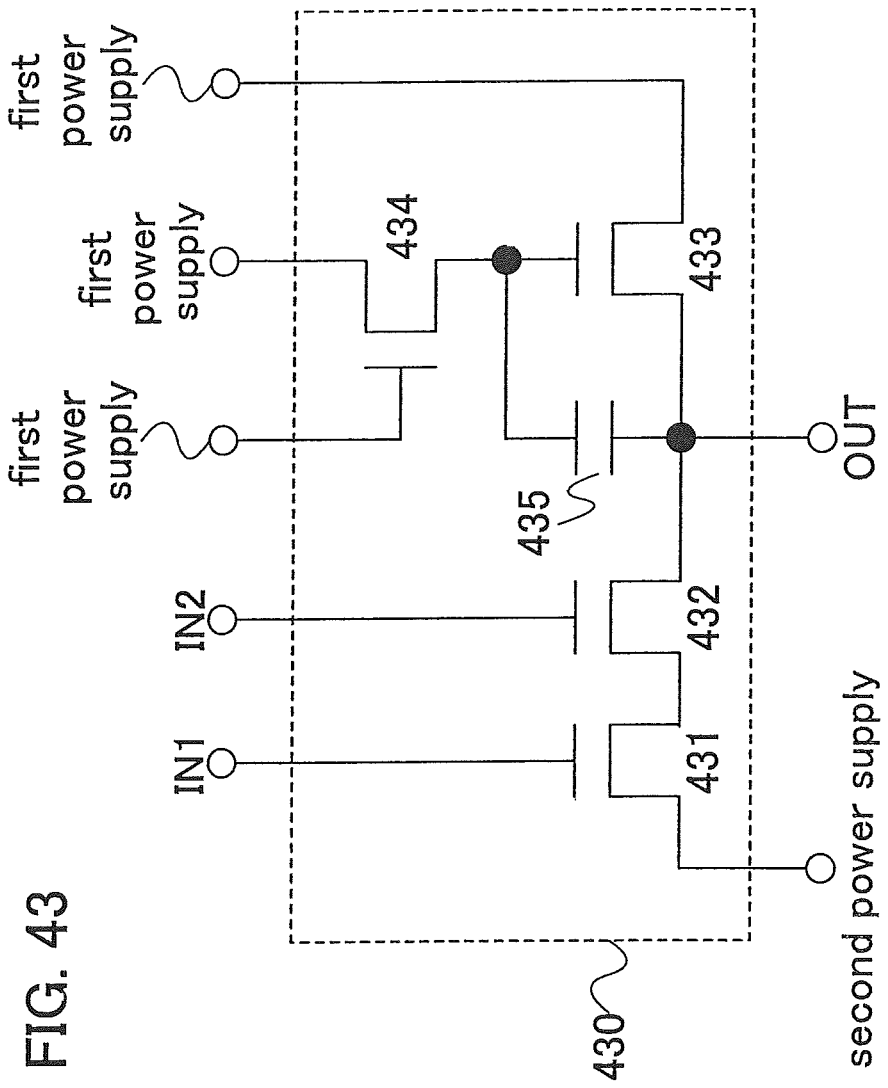
FIG. 43 is a diagram showing Embodiment Mode 3.

FIG. 43 shows another mode of the NAND circuit 221. A NAND circuit 430 shown in FIG. 43 includes a transistor 431, a transistor 432, a transistor 433, a transistor 434, and a capacitor 435.

As shown in the NAND circuit 430 in FIG. 43, a first terminal of the transistor 431 is connected to the second power supply; a second terminal of the transistor 431 is connected to a first terminal of the transistor 432; and a gate terminal of the transistor 431 is connected to the input terminal IN1. A second terminal of the transistor 432 is connected to a second terminal of the transistor 433, a second electrode of the capacitor 435, and the output terminal OUT; and a gate terminal of the transistor 432 is connected to the input terminal IN2. A first terminal of the transistor 433 is connected to the first power supply, and a gate terminal of the transistor 433 is connected to a second terminal of the transistor 434 and a first electrode of the capacitor 435. A first terminal of the transistor 434 is connected to the first power supply and a gate terminal of the transistor 434 is connected to the first power supply.

Note that a first power supply, a second power supply, an input terminal IN1, an input terminal IN2, and an output terminal OUT which are the same as those shown in FIG. 42 can be used as the first power supply, the second power supply, the input terminal IN, and the output terminal OUT.

In addition, each of the transistors 431 to 434 is an n-channel transistor.

Operations of the NAND circuit 430 in FIG. 43 in the cases where the input terminal IN1 is at an H level and is at an L level, and in the cases where the input terminal IN2 is at an H level and is at an L level are described, respectively.

First, the case where the input terminal IN1 is at an H level and the input terminal IN2 is at an H level is described. When the input terminal IN1 becomes to be at an H level, the transistor 431 is turned on. When the input terminal IN2 becomes to be at an H level, the transistor 432 is turned on. A potential of the gate terminal of the transistor 433 becomes to be at a value obtained by subtracting the threshold voltage Vth434 of the transistor 434 from the power supply potential VDD (VDD−Vth434), so that the transistor 433 is on.

Accordingly, the output terminal OUT is electrically connected to the second power supply through the transistor 431 and the transistor 432 and is electrically connected to the first power supply through the transistor 433, and thus, the potential of the output terminal OUT lowers. The potential of the output terminal OUT at this time is determined by an operating point of the transistor 431, the transistor 432, and the transistor 433, so that the output terminal OUT becomes to be at an L level.

Next, the case where the input terminal IN1 is at an H level and the input terminal IN2 is at an L level is described. When the input terminal IN1 becomes to be at an H level, the transistor 431 is turned on. When the input terminal IN2 becomes to be at an L level, the transistor 432 is turned off. The potential of the gate terminal of the transistor 433 becomes the value obtained by subtracting the threshold voltage Vth434 of the transistor 434 from the power supply potential VDD (VDD−Vth434), so that the transistor 433 is on. In addition, the gate terminal of the transistor 433 is in a floating state.

Accordingly, the output terminal OUT is electrically connected to the first power supply through the transistor 433, and the potential of the output terminal OUT rises. The potential of the gate terminal of the transistor 433 rises to a value which is greater than or equal to the sum of the power supply potential VDD and the threshold voltage Vth433 of the transistor 433 by the capacitive coupling of the capacitor 435, so that the transistor 433 is continuously kept on. A so-called bootstrap operation is performed. Accordingly, the potential of the output terminal OUT at this time becomes VDD, so that the output terminal OUT becomes to be at an H level.

Next, the case where the input terminal IN1 is at an L level and the input terminal IN2 is at an H level is described. When the input terminal IN1 becomes to be at an L level, the transistor 431 is turned off. When the input terminal IN2 becomes to be at an H level, the transistor 432 is turned on. The potential of the gate terminal of the transistor 433 becomes the value obtained by subtracting the threshold voltage Vth434 of the transistor 434 from the power supply potential VDD (VDD−Vth434), so that the transistor 433 is on. In addition, the gate terminal of the transistor 433 is in a floating state.

Accordingly, the output terminal OUT is electrically connected to the first power supply through the transistor 433, and the potential of the output terminal OUT rises. The potential of the gate terminal of the transistor 433 rises to a value which is greater than or equal to the sum of the power supply potential VDD and the threshold voltage Vth433 of the transistor 433 by the capacitive coupling of the capacitor 435, so that the transistor 433 is continuously kept on. A so-called bootstrap operation is performed. Accordingly, the potential of the output terminal OUT at this time becomes VDD, so that the output terminal OUT becomes to be at an H level.

Next, the case where the input terminal IN1 is at an L level and the input terminal IN2 is at an L level is described. When the input terminal IN1 becomes to be at an L level, the transistor 431 is turned off. When the input terminal IN2 becomes to be at an L level, the transistor 432 is turned off. The potential of the gate terminal of the transistor 433 becomes the value obtained by subtracting the threshold voltage Vth434 of the transistor 434 from the power supply potential VDD (VDD−Vth434), so that the transistor 433 is on. In addition, the gate terminal of the transistor 433 is in a floating state.

Accordingly, the output terminal OUT is electrically connected to the first power supply through the transistor 433, and the potential of the output terminal OUT rises. The potential of the gate terminal of the transistor 433 rises to a value which is greater than or equal to the sum of the power supply potential VDD and the threshold voltage Vth433 of the transistor 433 by the capacitive coupling of the capacitor 435, so that the transistor 433 is continuously kept on. A so-called bootstrap operation is performed. Accordingly, the potential of the output terminal OUT at this time becomes VDD, so that the output terminal OUT becomes to be at an H level.

In this manner, the H-level potential of the output terminal OUT can be raised to the power supply potential VDD of the first power supply by the bootstrap operation in the inverter circuit 430 in FIG. 43.

Note that a circuit structure of the NAND circuit 430 in FIG. 43 is not limited to the circuit structure in FIG. 43 as long as the bootstrap operation can be performed when the input terminal IN1 or the input terminal IN2 is at an L level. When the input terminal IN1 and the input terminal IN2 are an H level, a potential may be supplied to the gate terminal of the transistor 433.

Figure 47:
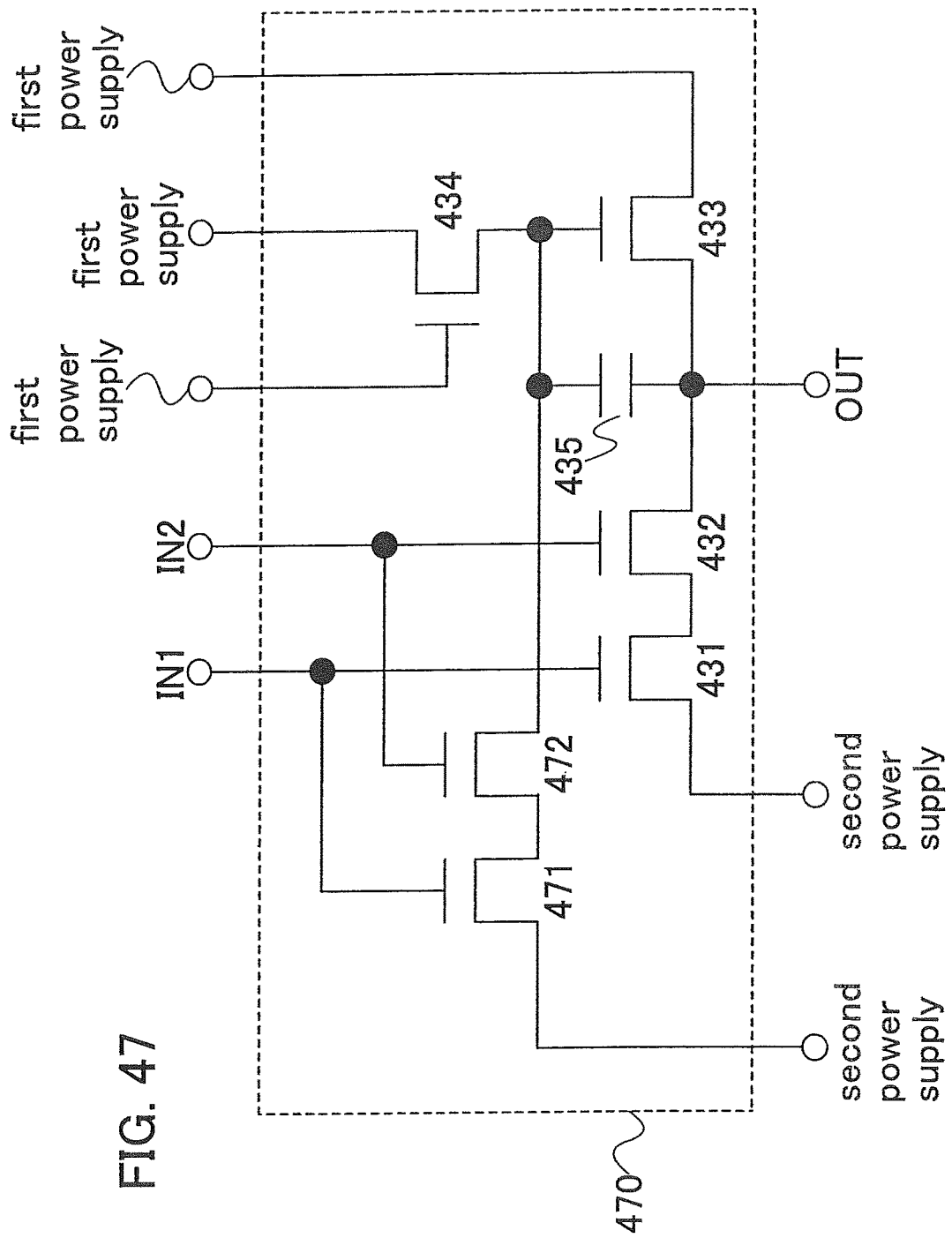
FIG. 47 is a diagram showing Embodiment Mode 3.

For example, a transistor 471 and a transistor 472 may be additionally provided as in a NAND circuit 470 in FIG. 47. This is because the potential of the output terminal OUT can be made VSS when the output terminal OUT is at an L level. That is, since the transistor 471 and the transistor 472 are turned on when the input terminal IN1 and the input terminal IN2 are at an H level, the gate terminal of the transistor 433 becomes to be at an L level. Then, the transistor 433 is turned off so that the output terminal OUT is electrically connected only to the second power supply through the transistor 431 and the transistor 432.

It is to be noted that each of the transistor 471 and the transistor 472 is an n-channel transistor.

Figure 44:
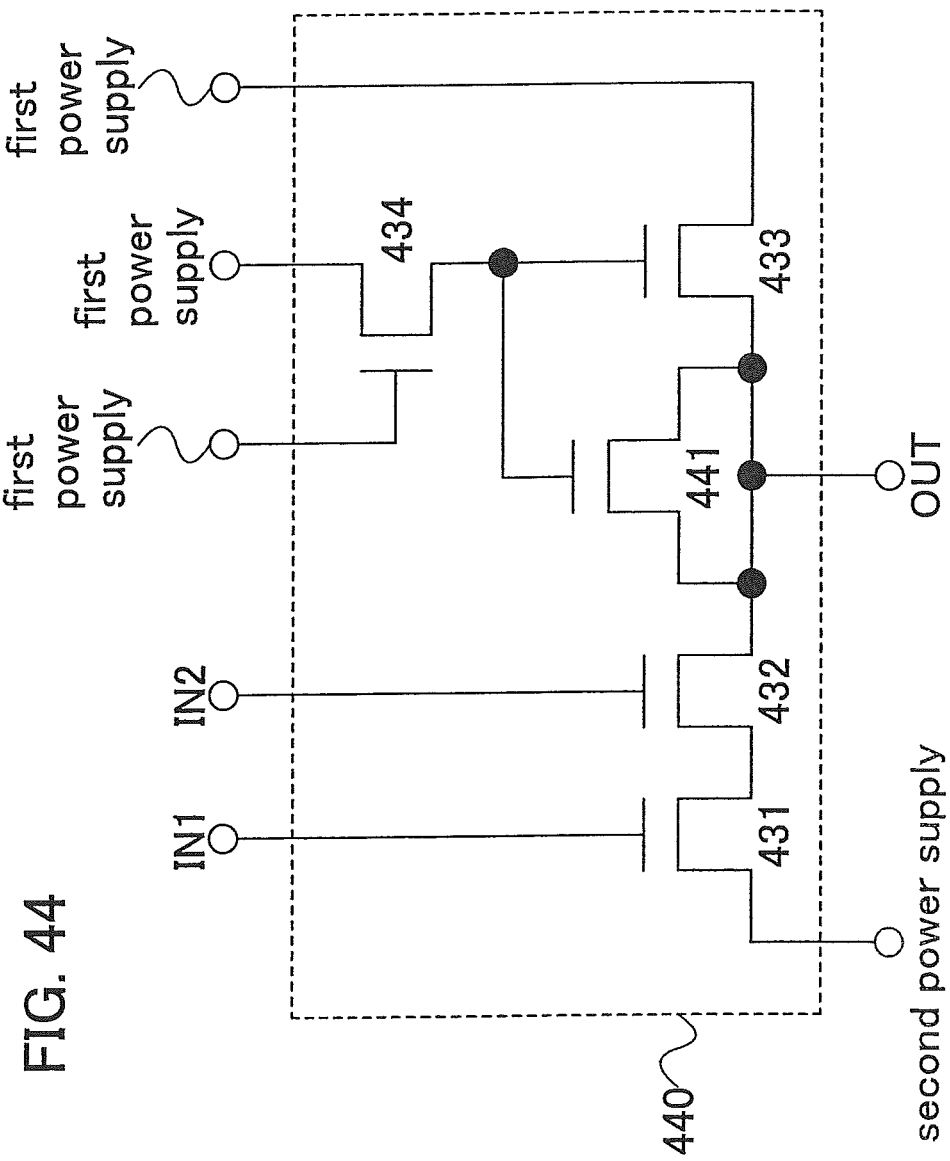
FIG. 44 is a diagram showing Embodiment Mode 3.
Figure 48:
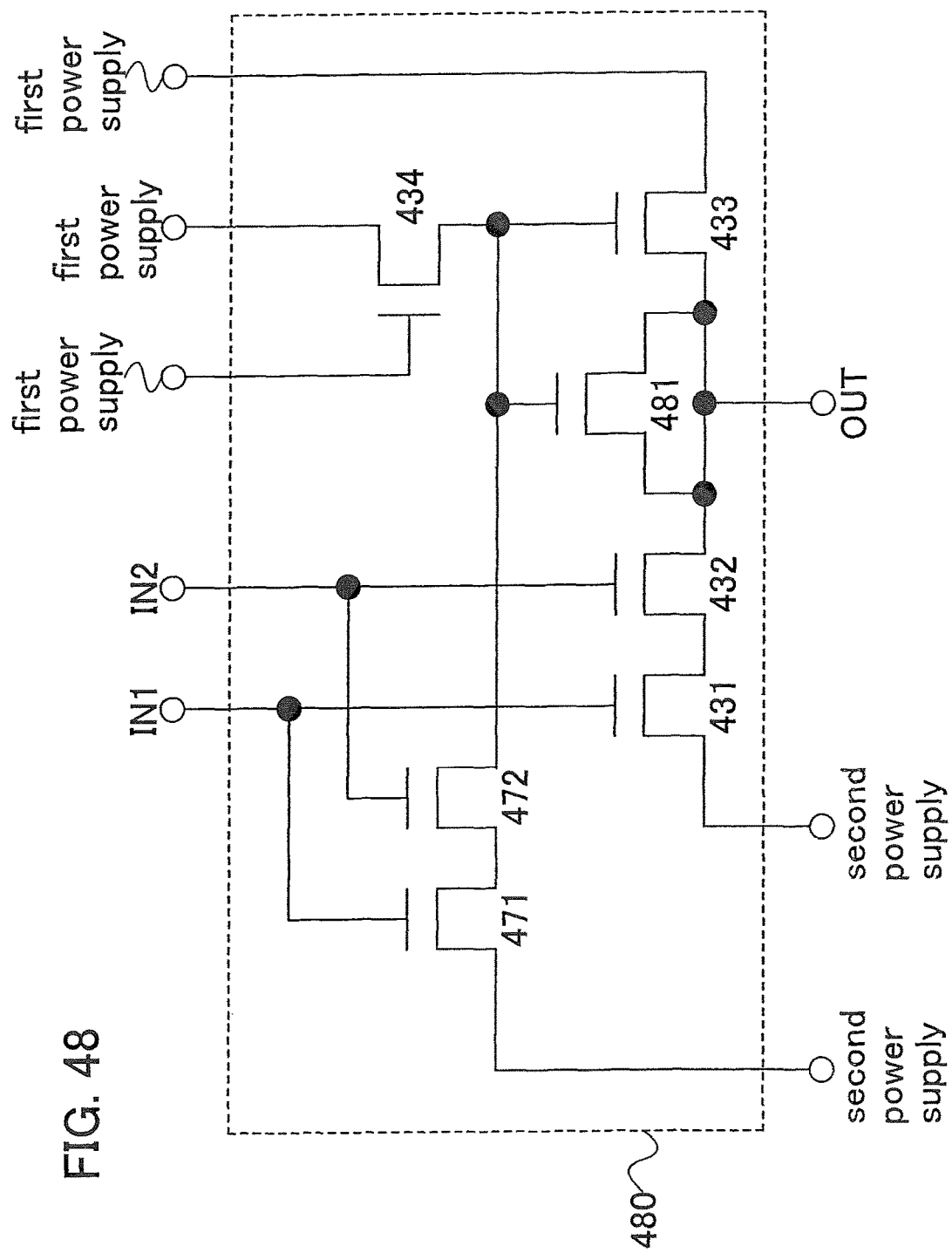
FIG. 48 is a diagram showing Embodiment Mode 3.

Note that any element can be used as the capacitor 435 as long as it has capacitive properties. For example, a transistor 441 and a transistor 481 may be connected as a substitute for the capacitor 435, respectively, as in a NAND circuit 440 in FIG. 44 and in a NAND circuit 480 in FIG. 48.

Figure 45:
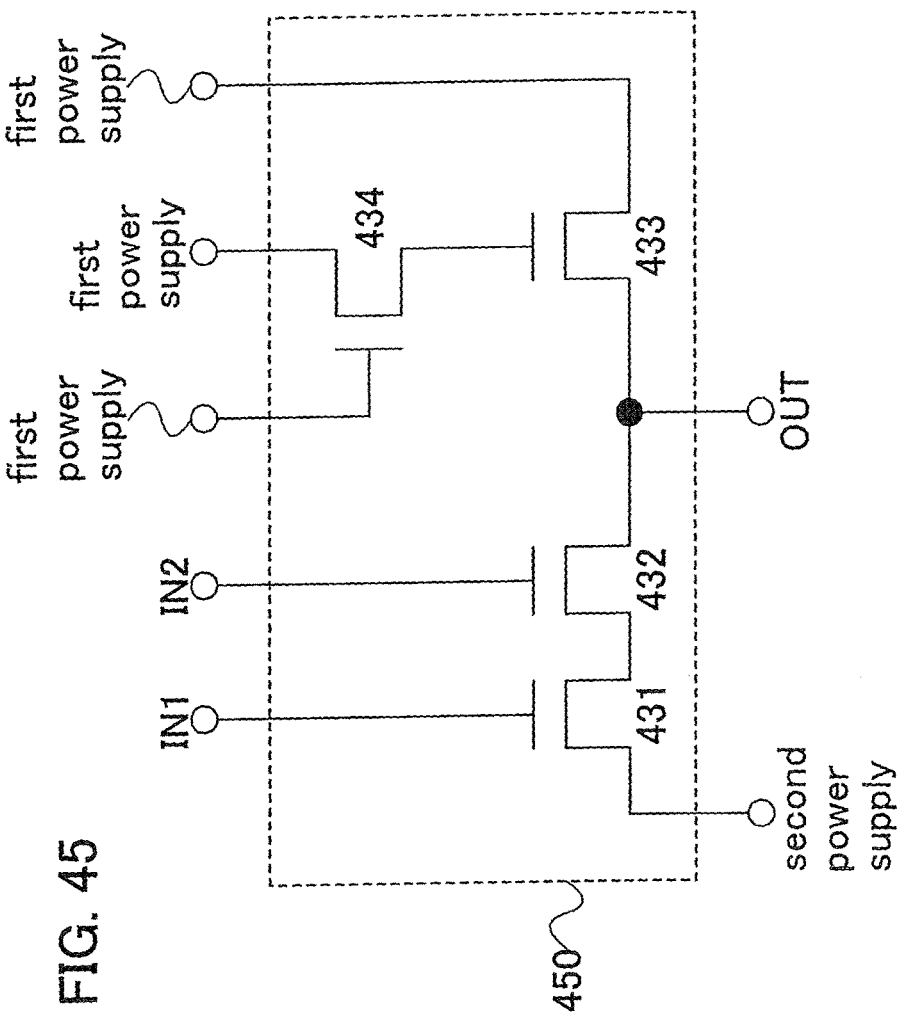
FIG. 45 is a diagram showing Embodiment Mode 3.
Figure 49:
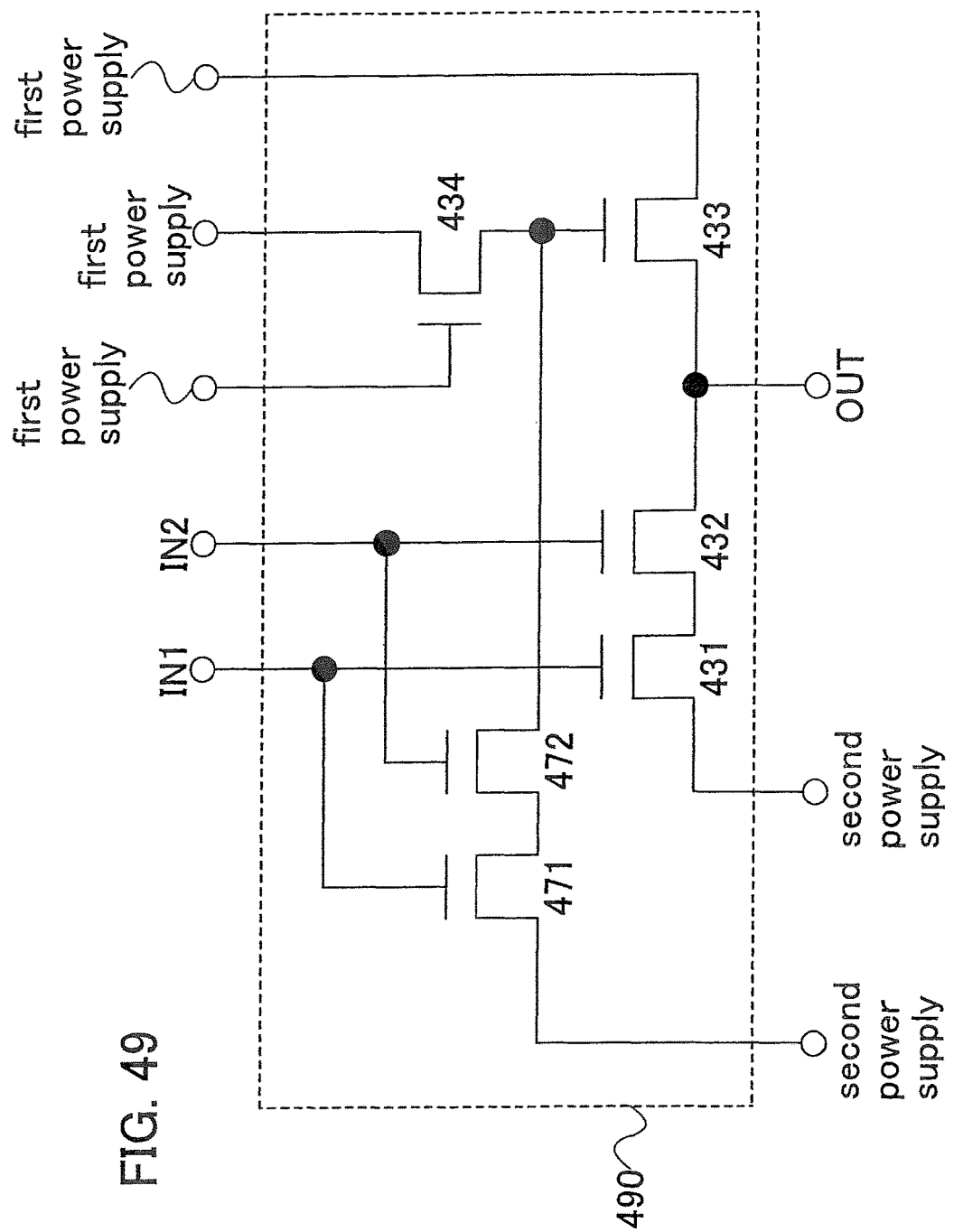
FIG. 49 is a diagram showing Embodiment Mode 3.

Note that the capacitor 435 is not necessarily provided when a capacitance value between the second terminal and the gate terminal of the transistor 433 is sufficiently large. For example, the capacitor 435 is not required to be connected as in a NAND circuit 450 in FIG. 45 and in a NAND circuit 490 in FIG. 49.

Here, functions of the transistors 431 to 433, the transistor 441, the transistor 471, the transistor 472, the transistor 481, and the capacitor 435 are described below.

The transistor 431 has a function as a switch which determines whether to connect the second power supply and the first terminal of the transistor 432 or not in accordance with the potential of the input terminal IN1.

The transistor 432 has a function as a switch which determines whether to connect the second terminal of the transistor 432 and the output terminal OUT or not in accordance with the potential of the input terminal IN2.

The transistor 433 has a function as a switch which determines whether to connect the first power supply and the output terminal OUT or not.

The transistor 434 has a function as a diode. In addition, the transistor 434 has a function of making the gate terminal of the transistor 433 into a floating state.

The transistor 441 has a function as a capacitor which is connected between the output terminal OUT and the gate terminal of the transistor 433. When the input terminal IN1 or the input terminal IN2 is at an L level, the transistor 441 has a function of raising the potential of the gate terminal of the transistor 433.

The transistor 471 has a function as a switch which determines whether to connect the second power supply and a first terminal of the transistor 472 or not in accordance with the potential of the input terminal IN1.

The transistor 472 has a function as a switch which determines whether to connect a first terminal of the transistor 471 and the gate terminal of the transistor 433 or not in accordance with the potential of the input terminal IN2.

The transistor 481 has a function as a capacitor which is connected between the output terminal OUT and the gate terminal of the transistor 433. When the input terminal IN1 or the input terminal IN2 is at an L level, the transistor 481 has a function of raising the potential of the gate terminal of the transistor 433.

The capacitor 435 has a function for changing the potential of the gate terminal of the transistor 433 in accordance with the potential of the output terminal OUT. When the input terminal IN1 or the input terminal IN2 is at an L level, the capacitor 435 has a function of raising the potential of the gate terminal of the transistor 433.

In this manner, in the NAND circuits in FIGS. 42 to 49, the potential of the output terminal OUT can be changed freely by changing the power supply potential VDD when an H-level signal is output. That is, the NAND circuits in FIGS. 42 to 49 can operate not only as inverter circuits, but also as level-shift circuits.

Although the NAND circuits formed by using all n-channel transistors are described in FIGS. 42 to 49, the NAND circuits may be formed by using all p-channel transistors as well. Here, NAND circuits formed by using all p-channel transistors are shown in FIGS. 80 to 87.

Figure 80:
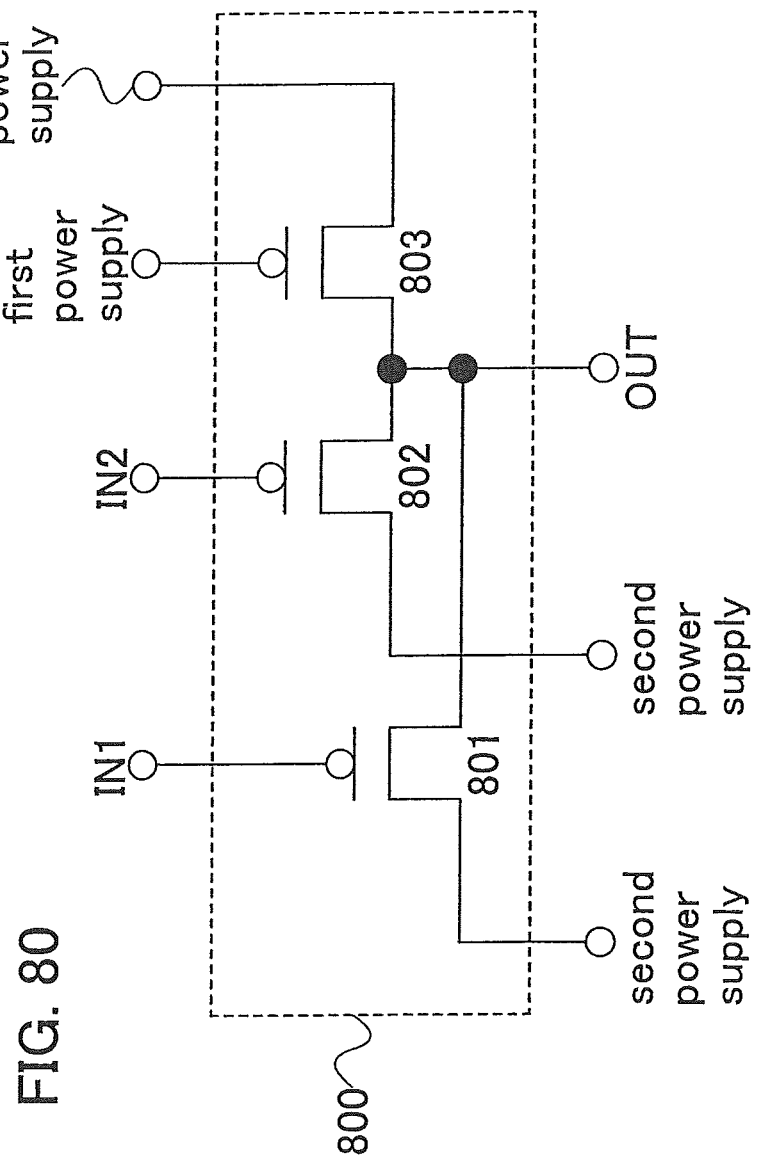
FIG. 80 is a diagram showing Embodiment Mode 3.

FIG. 80 shows another mode of the NAND circuit 221. A NAND circuit 800 in FIG. 80 includes a transistor 801, a transistor 802, and a transistor 803.

As shown in the NAND circuit 800 in FIG. 80, a first terminal of the transistor 801 is connected to the second power supply; a second terminal of the transistor 801 is connected to a second terminal of the transistor 802, a second terminal of the transistor 803, and the output terminal OUT; and a gate terminal of the transistor 801 is connected to the input terminal IN1. A first terminal of the transistor 802 is connected to the second power supply, and a gate terminal of the transistor 802 is connected to the input terminal IN2. A first terminal of the transistor 803 is connected to the first power supply and a gate terminal of the transistor 803 is connected to the first power supply.

It is to be noted that the power supply potential VSS is supplied to the first power supply and the power supply potential VDD is supplied to the second power supply. The potential difference (VDD−VSS) between the power supply potential VSS of the first power supply and the power supply potential VDD of the second power supply corresponds to a power supply voltage of the NAND circuit 800. In addition, the power supply potential VDD is higher than the power supply potential VSS.

It is to be noted that a digital control signal is supplied to each of the input terminal IN1 and the input terminal IN2. In addition, the output terminal OUT outputs an output signal.

In addition, each of the transistors 801 to 803 is a p-channel transistor.

Operations of the NAND circuit 800 in FIG. 80 in the cases where the input terminal IN1 is at an H level and is at an L level, and in the cases where the input terminal IN2 is at an H level and is at an L level are described, respectively.

Next, the case where the input terminal IN1 is at an H level and the input terminal IN2 is at an H level is described. When the input terminal IN1 becomes to be at an H level, the transistor 801 is turned off. When the input terminal IN2 becomes to be at an H level, the transistor 802 is turned off.

Accordingly, the output terminal OUT is electrically connected to the first power supply through the transistor 803, and the potential of the output terminal OUT drops. The potential of the output terminal OUT at this time becomes a value which is the sum of the power supply potential VSS and the absolute value of the threshold voltage Vth803 of the transistor 803 (VSS+|Vth803|), so that the output terminal OUT becomes to be at an L level.

Next, the case where the input terminal IN1 is at an H level and the input terminal IN2 is at an L level are described. When the input terminal IN1 becomes to be at an H level, the transistor 801 is turned off. When the input terminal IN2 becomes to be at an L level, the transistor 802 is turned on.

Accordingly, the output terminal OUT is electrically connected to the second power supply through the transistor 802 and is electrically connected to the first power supply through the transistor 803, and thus, the potential of the output terminal OUT rises. The potential of the output terminal OUT at this time is determined by an operating point of the transistor 802 and the transistor 803, so that the output terminal OUT becomes to be at an H level.

Next, the case where the input terminal IN1 is at an L level and the input terminal IN2 is at an H level is described. When the input terminal IN1 becomes to be at an L level, the transistor 801 is turned on. When the input terminal IN2 becomes to be at an H level, the transistor 802 is turned off.

Accordingly, the output terminal OUT is electrically connected to the second power supply through the transistor 801 and is electrically connected to the first power supply through the transistor 803, and thus, the potential of the output terminal OUT rises. The potential of the output terminal OUT at this time is determined by an operating point of the transistor 801 and the transistor 803, so that the output terminal OUT becomes to be at an H level.

Next, the case where the input terminal IN1 is at an L level and the input terminal IN2 is at an L level is described. When the input terminal IN1 becomes to be at an L level, the transistor 801 is turned on. When the input terminal IN2 becomes to be at an L level, the transistor 802 is turned on.

Accordingly, the output terminal OUT is electrically connected to the second power supply through the transistor 801, is electrically connected to the second power supply through the transistor 802 and is electrically connected to the first power supply through the transistor 803, and thus, the potential of the output terminal OUT rises. The potential of the output terminal OUT at this time is determined by an operating point of the transistor 801, the transistor 802, and the transistor 803, so that the output terminal OUT becomes to be at an H level.

Note that the transistor 803 does not necessarily have rectifying properties; any element can be used as long as a voltage is generated in the element when a current is supplied thereto. For example, a resistor 841 may be connected as a substitute for the transistor 803 as in a NAND circuit 840 in FIG. 84.

Here, functions of the transistors 801 to 803 are described below.

The transistor 801 has a function as a switch which determines whether to connect the second power supply and the output terminal OUT or not in accordance with the potential of the input terminal M. When the input terminal IN1 is at an L level, the transistor 801 has a function of supplying the power supply potential VDD to the output terminal OUT.

The transistor 802 has a function as a switch which determines whether to connect the second power supply and the output terminal OUT or not in accordance with the potential of the input terminal IN2. When the input terminal IN2 is at an L level, the transistor 802 has a function of supplying the power supply potential VDD to the output terminal OUT.

The transistor 803 has a function as a diode.

Figure 81:
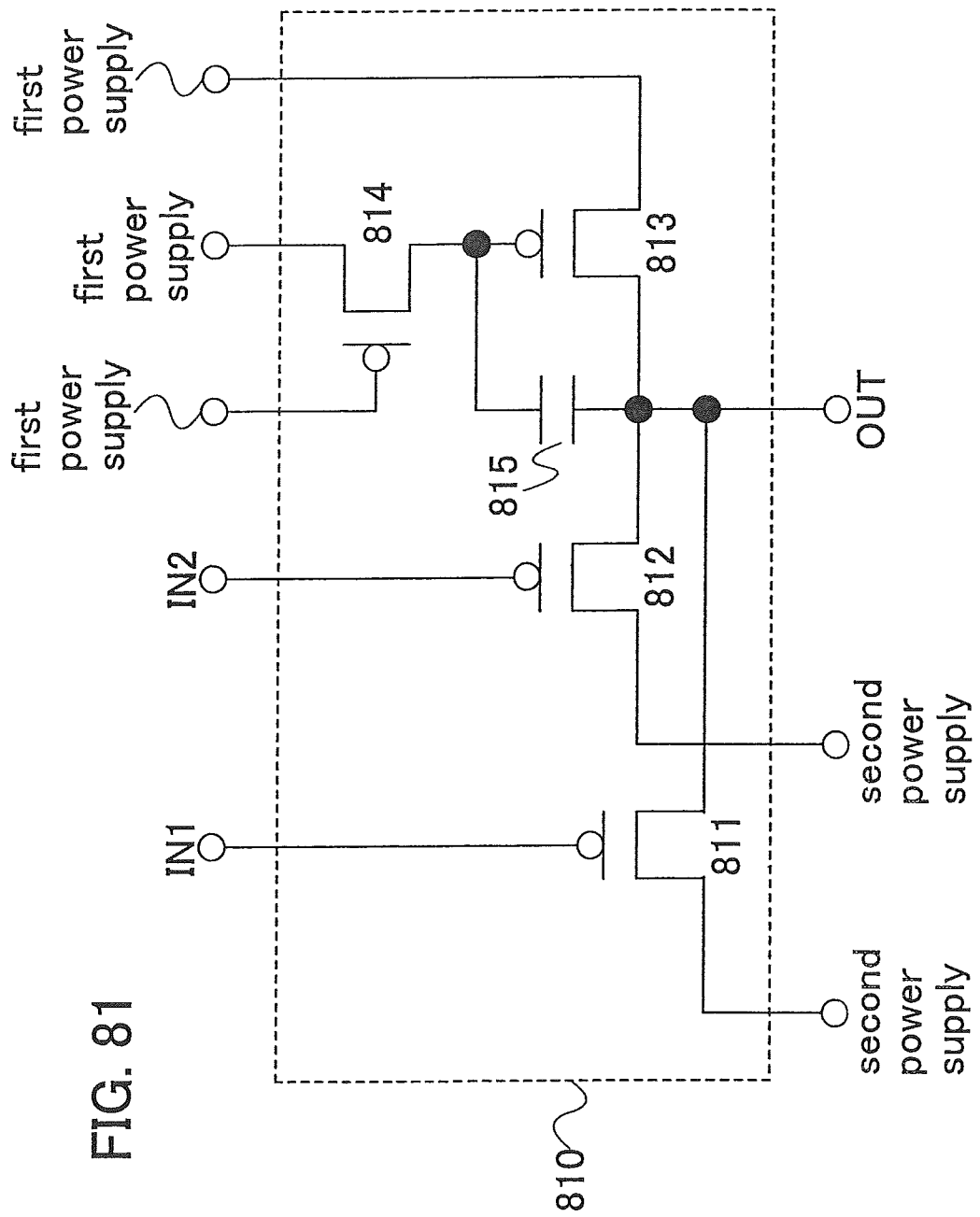
FIG. 81 is a diagram showing Embodiment Mode 3.
Figure 82:
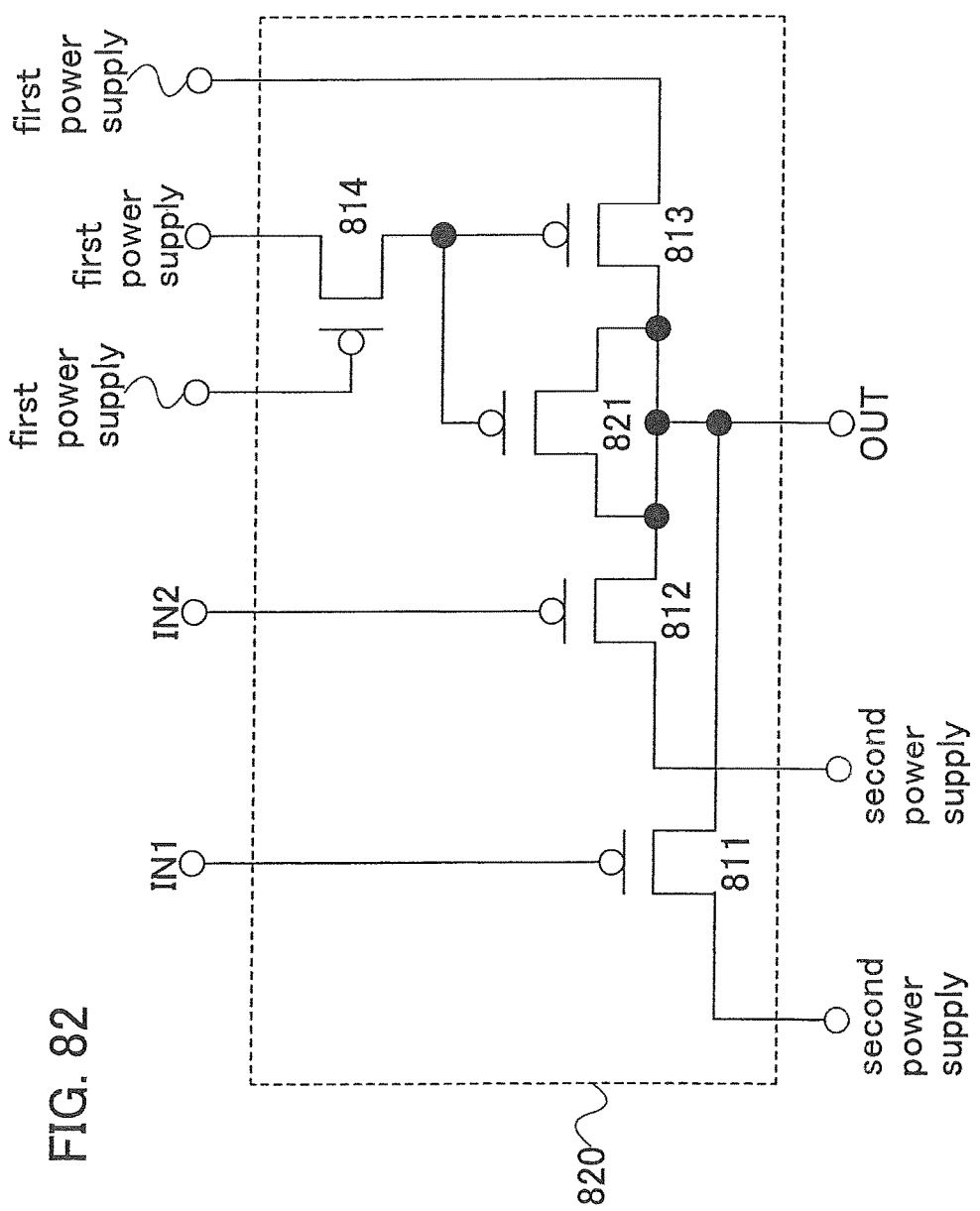
FIG. 82 is a diagram showing Embodiment Mode 3.
Figure 83:
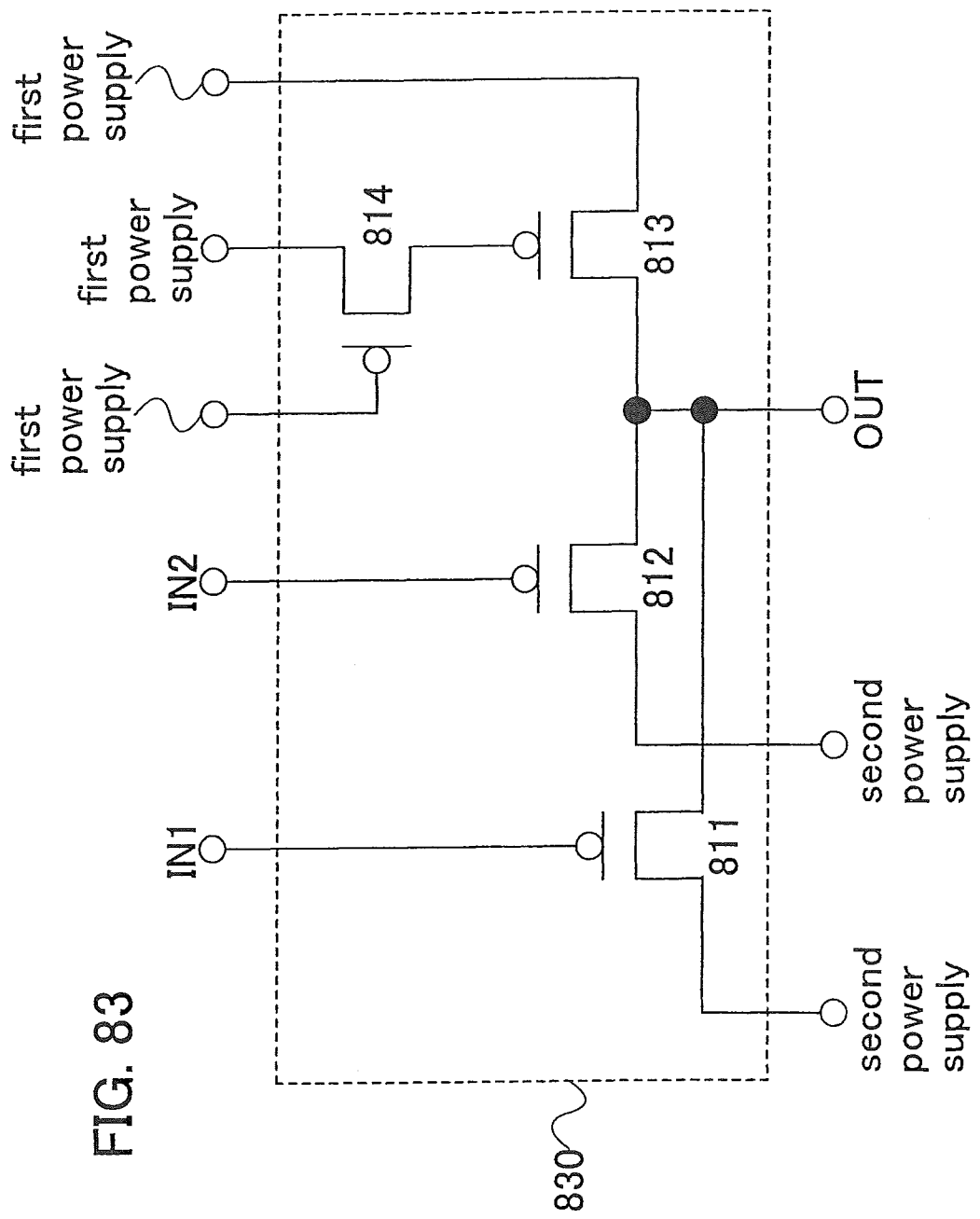
FIG. 83 is a diagram showing Embodiment Mode 3.
Figure 84:
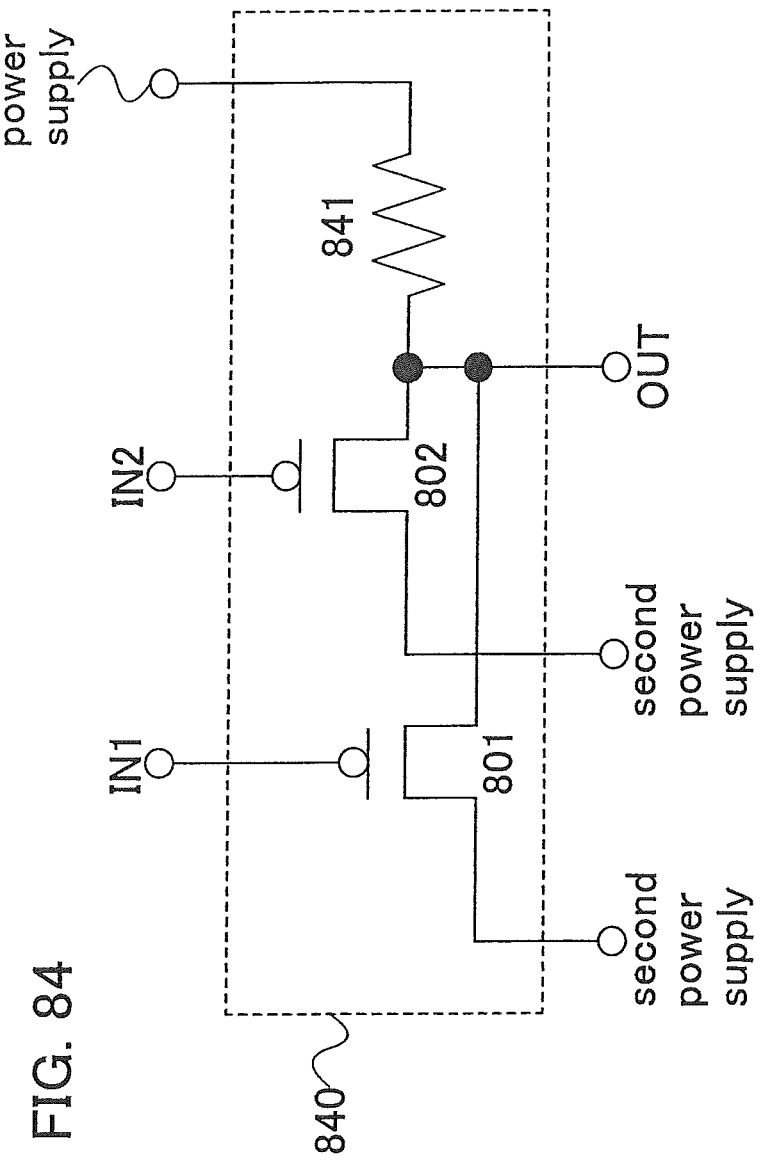
FIG. 84 is a diagram showing Embodiment Mode 3.

FIG. 81 shows another mode of the NAND circuit 221. A NAND circuit 810 shown in FIG. 81 includes a transistor 811, a transistor 812, a transistor 813, a transistor 814, and a capacitor 815.

As shown in the NAND circuit 810 in FIG. 81, a first terminal of the transistor 811 is connected to the second power supply; a second terminal of the transistor 811 is connected to a second terminal of the transistor 812, a second terminal of the transistor 813, and a first electrode of the capacitor 815; and a gate terminal of the transistor 811 is connected to the input terminal IN1. A first terminal of the transistor 812 is connected to the second power supply, and a gate terminal of the transistor 812 is connected to the input terminal IN2. A first terminal of the transistor 813 is connected to the first power supply, and a gate terminal of the transistor 813 is connected to a second terminal of the transistor 814 and a second electrode of the capacitor 815. A first terminal of the transistor 814 is connected to the first power supply and a gate terminal of the transistor 814 is connected to the first power supply.

Note that a first power supply, a second power supply, an input terminal IN1, an input terminal IN2, and an output terminal OUT which are the same as those shown in FIG. 80 can be used as the first power supply, the second power supply, the input terminal IN, and the output terminal OUT.

In addition, each of the transistors 811 to 814 is a p-channel transistor.

Operations of the NAND circuit 810 in FIG. 81 in the cases where the input terminal IN1 is at an H level and is at an L level, and in the cases where the input terminal IN2 is at an H level and is at an L level are described, respectively.

First, the case where the input terminal IN1 is at an H level and the input terminal IN2 is at an H level is described. When the input terminal IN1 becomes to be at an H level, the transistor 811 is turned off. When the input terminal IN2 becomes to be at an H level, the transistor 812 is turned off. A potential of the gate terminal of the transistor 813 becomes a value of the sum of the power supply potential VSS and the absolute value of the threshold voltage Vth814 of the transistor 814 (VSS+|Vth814|), so that the transistor 813 is on. In addition, the gate terminal of the transistor 813 is in a floating state.

Accordingly, the output terminal OUT is electrically connected to the first power supply through the transistor 813, and the potential of the output terminal OUT drops. The potential of the gate terminal of the transistor 813 drops to a value which is less than or equal to a value obtained by subtracting the threshold voltage Vth813 of the transistor 813 from the power supply potential VSS by the capacitive coupling of the capacitor 815, so that the transistor 813 is continuously kept on. A so-called bootstrap operation is performed. The potential of the output terminal OUT at this time becomes VSS, so that the output terminal OUT becomes to be at an L level.

Next, the case where the input terminal IN1 is at an H level and the input terminal IN2 is at an L level is described. When the input terminal IN1 becomes to be at an H level, the transistor 811 is turned off. When the input terminal IN2 becomes to be at an L level, the transistor 812 is turned on. The potential of the gate terminal of the transistor 813 becomes the value of the sum of the power supply potential VSS and the absolute value of the threshold voltage Vth814 of the transistor 814 (VSS+|Vth814|), so that the transistor 813 is on. In addition, the gate terminal of the transistor 813 is in a floating state.

Accordingly, the output terminal OUT is electrically connected to the second power supply through the transistor 812 and is electrically connected to the first power supply through the transistor 813, and thus, the potential of the output terminal OUT rises. The potential of the output terminal OUT at this time is determined by an operating point of the transistor 812 and the transistor 813, so that the output terminal OUT becomes to be at an H level.

Next, the case where the input terminal IN1 is at an L level and the input terminal IN2 is at an H level is described. When the input terminal IN1 becomes to be at an L level, the transistor 811 is turned on. When the input terminal IN2 becomes to be at an H level, the transistor 812 is turned off. The potential of the gate terminal of the transistor 813 becomes the value of the sum of the power supply potential VSS and the absolute value of the threshold voltage Vth814 of the transistor 814 (VSS+|Vth814|), so that the transistor 813 is on. In addition, the gate terminal of the transistor 813 is in a floating state.

Accordingly, the output terminal OUT is electrically connected to the second power supply through the transistor 811 and is electrically connected to the first power supply through the transistor 813, and thus, the potential of the output terminal OUT rises. The potential of the output terminal OUT at this time is determined by an operating point of the transistor 811 and the transistor 813, so that the output terminal OUT becomes to be at an H level.

Next, the case where the input terminal IN1 is at an L level and the input terminal IN2 is at an L level is described. When the input terminal IN1 becomes to be at an L level, the transistor 811 is turned on. When the input terminal IN2 becomes to be at an L level, the transistor 812 is turned on. The potential of the gate terminal of the transistor 813 becomes the value of the sum of the power supply potential VSS and the absolute value of the threshold voltage Vth814 of the transistor 814 (VSS+|Vth814|), so that the transistor 813 is on. In addition, the gate terminal of the transistor 813 is in a floating state.

Accordingly, the output terminal OUT is electrically connected to the second power supply through the transistor 811, is electrically connected to the second power supply through the transistor 812 and is electrically connected to the first power supply through the transistor 813, and thus, the potential of the output terminal OUT rises. The potential of the output terminal OUT at this time is determined by an operating point of the transistor 811, the transistor 812, and the transistor 813, so that the output terminal OUT becomes to be at an H level.

In this manner, the L-level potential of the output terminal OUT can be lowered to the power supply potential VSS of the first power supply by the bootstrap operation in the NAND circuit 810 in FIG. 81.

Note that a circuit structure of the NAND circuit 810 in FIG. 81 is not limited to the circuit structure in FIG. 81 as long as the bootstrap operation can be performed when the input terminal IN1 and the input terminal IN2 are at an H level. When the input terminal IN1 or the input terminal IN2 is at an L level, a potential may be supplied to the gate terminal of the transistor 813.

Figure 85:
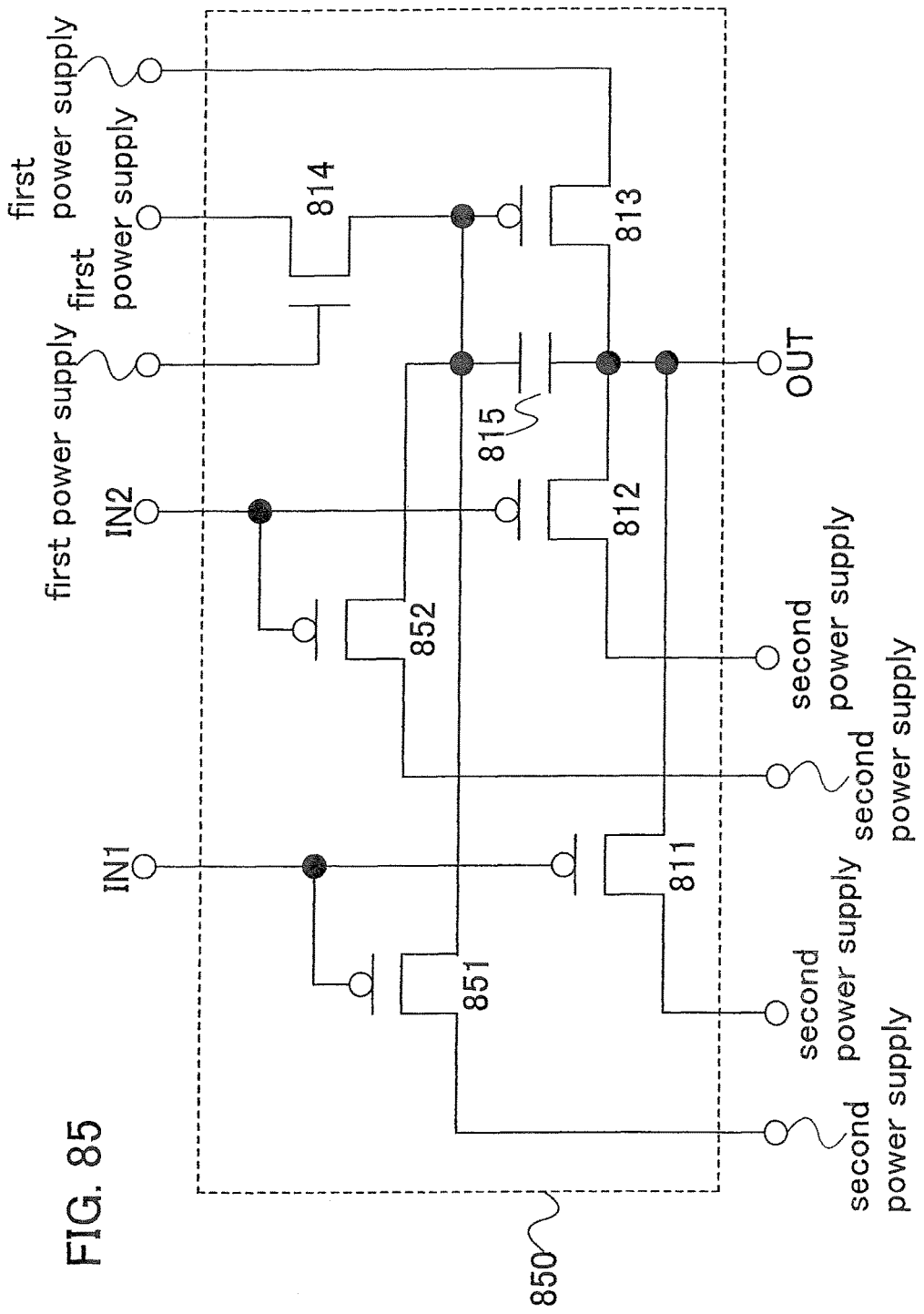
FIG. 85 is a diagram showing Embodiment Mode 3.
Figure 86:
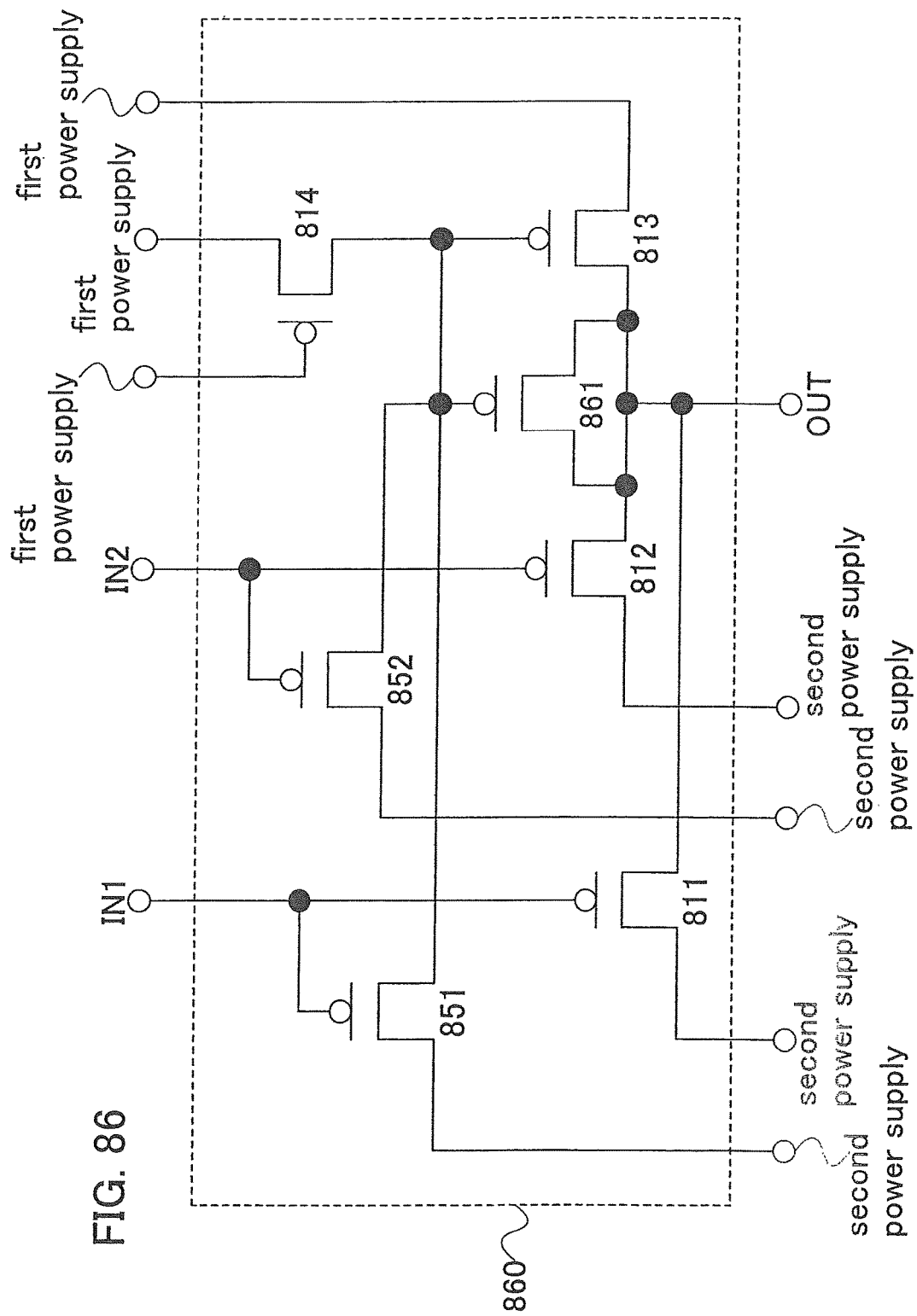
FIG. 86 is a diagram showing Embodiment Mode 3.

For example, a transistor 851 and a transistor 852 may be additionally provided as in a NAND circuit 850 in FIG. 85. This is because the potential of the output terminal OUT can be made VDD when the output terminal OUT is at an H level. That is, since the transistor 851 or the transistor 852 is turned on when the input terminal IN1 or the input terminal IN2 is at an L level, the gate terminal of the transistor 813 becomes to be at an H level. Then, the transistor 813 is turned off so that the output terminal OUT is electrically connected only to the second power supply through the transistor 811 or the transistor 812.

It is to be noted that each of the transistor 851 and the transistor 852 is a p-channel transistor.

Note that any element can be used as the capacitor 815 as long as it has capacitive properties. For example, a transistor 821 and a transistor 861 may be connected as a substitute for the capacitor 815, respectively, as in a NAND circuit 820 in FIG. 82 and in a NAND circuit 860 in FIG. 86.

Note that the capacitor 815 is not necessarily provided when a capacitance value between the second terminal and the gate terminal of the transistor 813 is sufficiently large. For example, the capacitor 815 is not required to be connected as in a NAND circuit 830 in FIG. 83 and in a NAND circuit 870 in FIG. 87.

Here, functions of the transistors 811 to 814, the transistor 821, the transistor 851, the transistor 852, the transistor 861, and the capacitor 815 are described below.

The transistor 811 has a function as a switch which determines whether to connect the second power supply and the output terminal OUT or not in accordance with the potential of the input terminal IN1. When the input terminal IN1 is at an L level, the transistor 811 has a function of supplying the power supply potential VDD to the output terminal OUT.

The transistor 812 has a function as a switch which determines whether to connect the second power supply and the output terminal OUT or not in accordance with the potential of the input terminal IN2. When the input terminal IN2 is at an L level, the transistor 812 has a function of supplying the power supply potential VDD to the output terminal OUT.

The transistor 813 has a function as a switch which determines whether to connect the first power supply and the output terminal OUT or not.

The transistor 814 has a function as a diode. In addition, the transistor 814 has a function of making the gate terminal of the transistor 813 at a floating state.

The transistor 821 has a function as a capacitor which is connected between the output terminal OUT and the gate terminal of the transistor 813. When the input terminal IN1 and the input terminal IN2 are at an H level, the transistor 821 has a function of lowering the potential of the gate terminal of the transistor 813.

The transistor 851 has a function as a switch which determines whether to connect the second power supply and the gate terminal of the transistor 813 or not in accordance with the potential of the input terminal IN1. When the input terminal IN1 is at an L level, the transistor 851 has a function of supplying the power supply potential VDD to the gate terminal of the transistor 813.

The transistor 852 has a function as a switch which determines whether to connect the second power supply and the gate terminal of the transistor 813 or not in accordance with the potential of the input terminal IN2. When the input terminal IN2 is at an L level, the transistor 852 has a function of supplying the power supply potential VDD to the gate terminal of the transistor 813.

The transistor 861 has a function as a capacitor which is connected between the output terminal OUT and the gate terminal of the transistor 813. When the input terminal IN1 and the input terminal IN2 are at an H level, the transistor 861 has a function of lowering the potential of the gate terminal of the transistor 813.

The capacitor 815 has a function for changing the potential of the gate terminal of the transistor 813 in accordance with the potential of the output terminal OUT. When the input terminal IN1 or the input terminal IN2 is at an H level, the capacitor 815 has a function of lowering the potential of the gate terminal of the transistor 813.

In this manner, in the NAND circuits in FIGS. 81 to 87, the potential of the output terminal OUT can be changed freely by changing the power supply potential VSS when an L-level signal is output. That is, the NAND circuits in FIGS. 81 to 87 can operate not only as NAND circuits, but also as level-shift circuits.

Here, some structure examples which can be applied to the NOR circuit 231 are described.

Figure 50:
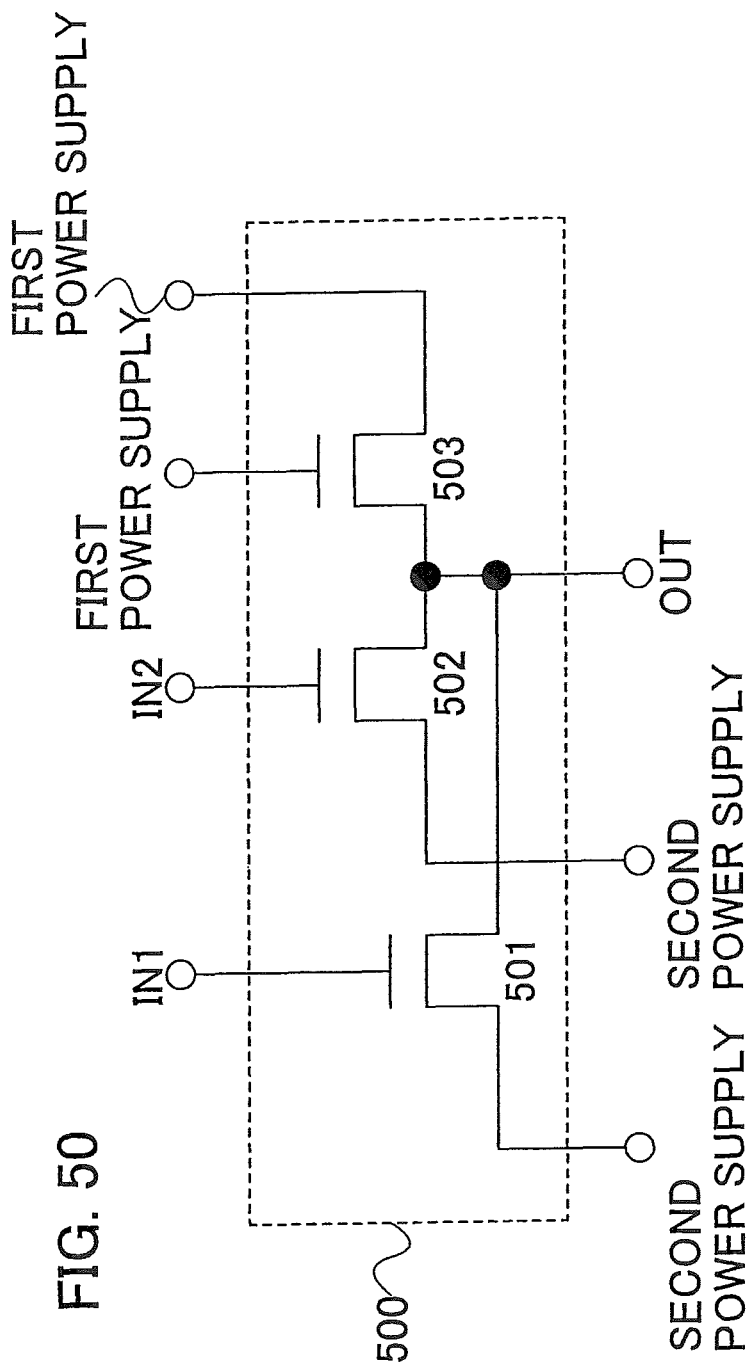
FIG. 50 is a diagram showing Embodiment Mode 3.

FIG. 50 shows one mode of the NOR circuit 231. A NOR circuit 500 in FIG. 50 includes a transistor 501, a transistor 502, and a transistor 503.

As shown in the NOR circuit 500 of FIG. 50, a first terminal of the transistor 501 is connected to the second power supply. A second terminal of the transistor 501 is connected to a second terminal of the transistor 502, a second terminal of the transistor 503, and the output terminal OUT. A gate terminal of the transistor 501 is connected to the input terminal IN1. A first terminal of the transistor 502 is connected to the second power supply. A gate terminal of the transistor 502 is connected to the input terminal IN2. A first terminal of the transistor 503 is connected to the first power supply. A gate terminal of the transistor 503 is connected to the first power supply.

Note that the power supply potential VDD is supplied to the first power supply and the power supply potential VSS is supplied to the second power supply. The potential difference (VDD−VSS) between the power supply potential VDD of the first power supply and the power supply potential VSS of the second power supply corresponds to a power supply voltage of the NOR circuit 500. Further, the power supply potential VDD is higher than the power supply potential VSS.

Note that a digital control signal is supplied to each of the input terminal IN1 and the input terminal IN2. In addition, the output terminal OUT outputs an output signal.

Moreover, each of the transistors 501 to 503 is an n-channel transistor.

Operations of the NOR circuit 500 in FIG. 50 in the case where the input terminal IN1 is at an H level, the case where the input terminal IN1 is at an L level, the case where the input terminal IN2 is at an H level, and the case where the input terminal IN2 is at an L level are described, respectively.

First, the case is described where the input terminal IN1 is at an H level and the input terminal IN2' is at an H level. When the input terminal IN1 becomes an H level, the transistor 501 is turned on. When the input terminal IN2 becomes an H level, the transistor 502 is turned on.

Thus, the output terminal OUT is electrically connected to the second power supply through the transistor 501 and the transistor 502, and to the first power supply through the transistor 503; therefore, the potential of the output terminal OUT is lowered. The potential of the output terminal OUT at this time is determined by an operating point of the transistor 501, the transistor 502, and the transistor 503, and the output terminal OUT becomes an L level.

Next, the case is described where the input terminal IN1 is at an H level and the input terminal IN2 is at an L level. When the input terminal IN1 becomes an H level, the transistor 501 is turned on. When the input terminal IN2 becomes an L level, the transistor 502 is turned off.

Thus, the output terminal OUT is electrically connected to the second power supply through the transistor 501 and to the first power supply through the transistor 503; therefore, the potential of the output terminal OUT is lowered. The potential of the output terminal OUT at this time is determined by an operating point of the transistor 501 and the transistor 503, and the output terminal OUT becomes an L level.

Next, the case is described where the input terminal IN1 is at an L level and the input terminal IN2 is at an H level. When the input terminal IN1 becomes an L level, the transistor 501 is turned off. When the input terminal IN2 becomes an H level, the transistor 502 is turned on.

Thus, the output terminal OUT is electrically connected to the second power supply through the transistor 502 and to the first power supply through the transistor 503; therefore, the potential of the output terminal OUT is lowered. The potential of the output terminal OUT at this time is determined by an operating point of the transistor 502 and the transistor 503, and the output terminal OUT becomes an L level.

Next, the case is described where the input terminal IN1 is at an L level and the input terminal IN2 is at an L level. When the input terminal IN1 becomes an L level, the transistor 501 is turned off. When the input terminal IN2 becomes an L level, the transistor 502 is turned off.

Thus, the output terminal OUT is electrically connected to the first power supply through the transistor 503; therefore, the potential of the output terminal OUT rises. The potential of the output terminal OUT at this time is a value obtained by subtracting the threshold voltage Vth503 of the transistor 503 from the power supply potential VDD (VDD−Vth503), and the output terminal OUT becomes an H level.

Figure 54:
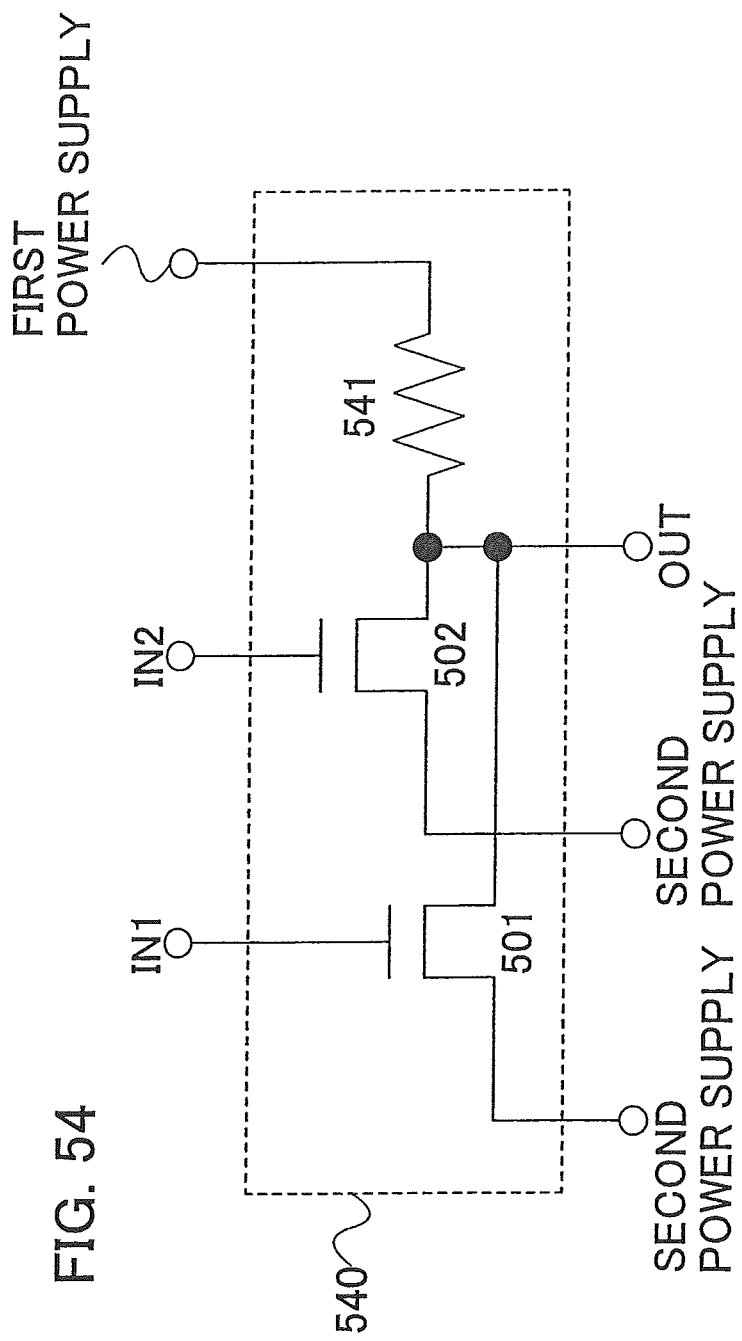
FIG. 54 is a diagram showing Embodiment Mode 3.

Note that the transistor 503 is not required to have rectifying properties; any element can be used as long as a voltage is generated in the element when a current is supplied thereto. For example, as shown in a NOR circuit 540 of FIG. 54, a resistor 541 may be connected as a substitute for the transistor 503.

Here, functions of the transistors 501 to 503 are described below.

The transistor 501 has a function as a switch which selects whether to connect the second power supply and the output terminal OUT or not in accordance with the potential of the input terminal IN1.

The transistor 502 has a function as a switch which selects whether to connect the second power supply and the output terminal OUT or not in accordance with the potential of the input terminal IN2.

The transistor 503 has a function as a diode.

Figure 51:
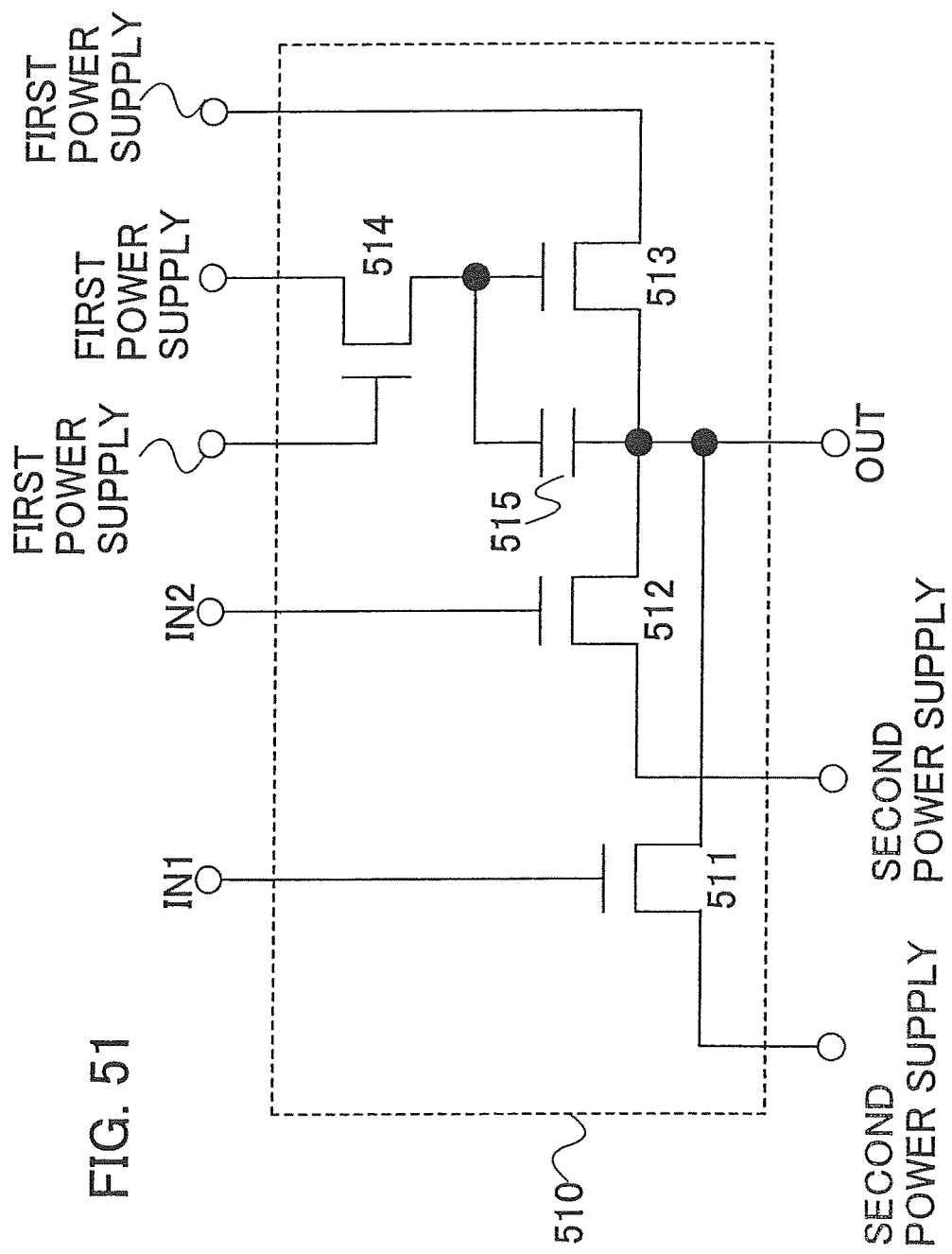
FIG. 51 is a diagram showing Embodiment Mode 3.

FIG. 51 shows another mode of the NOR circuit 231. A NOR circuit 510 in FIG. 51 includes a transistor 511, a transistor 512, a transistor 513, a transistor 514, and a capacitor 515 having two electrodes.

As shown in the NOR circuit 510 of FIG. 51, a first terminal of the transistor 511 is connected to the second power supply. A second terminal of the transistor 511 is connected to a second terminal of the transistor 512, a second terminal of the transistor 513, a second electrode of the capacitor 515, and the output terminal OUT. A gate terminal of the transistor 511 is connected to the input terminal IN1. A first terminal of the transistor 512 is connected to the second power supply. A gate terminal of the transistor 512 is connected to the input terminal IN2. A first terminal of the transistor 513 is connected to the first power supply. A gate terminal of the transistor 513 is connected to a second terminal of the transistor 514 and a first electrode of the capacitor 515. A first terminal of the transistor 514 is connected to the first power supply. A gate terminal of the transistor 514 is connected to the first power supply.

Note that the first power supply, the second power supply, the input terminal IN1, the input terminal IN2, and the output terminal OUT may be similar to those in FIG. 50.

Moreover, each of the transistors 511 to 514 is an n-channel transistor.

Operations of the NOR circuit 510 in FIG. 51 in the case where the input terminal IN1 is at an H level, the case where the input terminal IN1 is at an L level, the case where the input terminal IN2 is at an H level, and the case where the input terminal IN2 is at an L level are described, respectively.

First, the case is described where the input terminal IN1 is at an H level and the input terminal IN2 is at an H level. When the input terminal IN1 becomes an H level, the transistor 511 is turned on. When the input terminal IN2 becomes an H level, the transistor 512 is turned on. A potential of the gate terminal of the transistor 513 is a value obtained by subtracting the threshold voltage Vth514 of the transistor 514 from the power supply potential VDD (VDD−Vth514), and the transistor 513 is on. Further, the gate terminal of the transistor 513 is in a floating state.

Thus, the output terminal OUT is electrically connected to the second power supply through the transistor 511 and the transistor 512, and to the first power supply through the transistor 513; therefore, the potential of the output terminal OUT is lowered. The potential of the output terminal OUT at this time is determined by an operating point of the transistor 511, the transistor 512, and the transistor 513, and the output terminal OUT becomes an L level.

Next, the case is described where the input terminal IN1 is at an H level and the input terminal IN2 is at an L level. When the input terminal IN1 becomes an H level, the transistor 511 is turned on. When the input terminal IN2 becomes an L level, the transistor 512 is turned off. The potential of the gate terminal of the transistor 513 is a value obtained by subtracting the threshold voltage Vth514 of the transistor 514 from the power supply potential VDD (VDD−Vth514), and the transistor 513 is on. Further, the gate terminal of the transistor 513 is in a floating state.

Thus, the output terminal OUT is electrically connected to the second power supply through the transistor 511 and to the first power supply through the transistor 513; therefore, the potential of the output terminal OUT is lowered. The potential of the output terminal OUT at this time is determined by the operating point of the transistor 511, the transistor 512, and the transistor 513, and the output terminal OUT becomes an L level.

Next, the case is described where the input terminal IN1 is at an L level and the input terminal IN2 is at an H level. When the input terminal IN1 becomes an L level, the transistor 511 is turned off. When the input terminal IN1 becomes an H level, the transistor 512 is turned on. The potential of the gate terminal of the transistor 513 is a value obtained by subtracting the threshold voltage Vth514 of the transistor 514 from the power supply potential VDD (VDD−Vth514), and the transistor 513 is on. Further, the gate terminal of the transistor 513 is in a floating state.

Thus, the output terminal OUT is electrically connected to the second power supply through the transistor 512 and to the first power supply through the transistor 513; therefore, the potential of the output terminal OUT is lowered. The potential of the output terminal OUT at this time is determined by the operating point of the transistor 511, the transistor 512, and the transistor 513, and the output terminal OUT becomes an L level.

Next, the case is described where the input terminal IN1 is at an L level and the input terminal IN2 is at an L level.

When the input terminal IN1 becomes an L level, the transistor 511 is turned off. When the input terminal IN2 becomes an L level, the transistor 512 is turned off. The potential of the gate terminal of the transistor 513 is a value obtained by subtracting the threshold voltage Vth514 of the transistor 514 from the power supply potential VDD (VDD−Vth514), and the transistor 513 is on. Further, the gate terminal of the transistor 513 is in a floating state.

Thus, the output terminal OUT is electrically connected to the first power supply through the transistor 513; therefore, the potential of the output terminal OUT rises. The potential of the gate terminal of the transistor 513 is increased to a value which is greater than or equal to the sum of the power supply potential VDD and the threshold voltage Vth513 of the transistor 513 in accordance with the capacitive coupling of the capacitor 515, and the transistor 503 continues to be in an on state. A so-called bootstrap operation is performed. The potential of the output terminal OUT at this time is VDD, and the output terminal OUT becomes an H level.

In this manner, in the NOR circuit 510 of FIG. 51, the potential of the output terminal OUT can be increased from an H level to the power supply potential VDD of the first power supply by the bootstrap operation.

Note that the NOR circuit 510 of FIG. 51 is not limited to a circuit structure of FIG. 51 as long as the bootstrap operation can be performed when the input terminal 1N1 and the input terminal IN2 are at an L level. When the input terminal IN1 or the input terminal IN2 is at an H level, a potential may be supplied to the gate terminal of the transistor 513.

Figure 55:
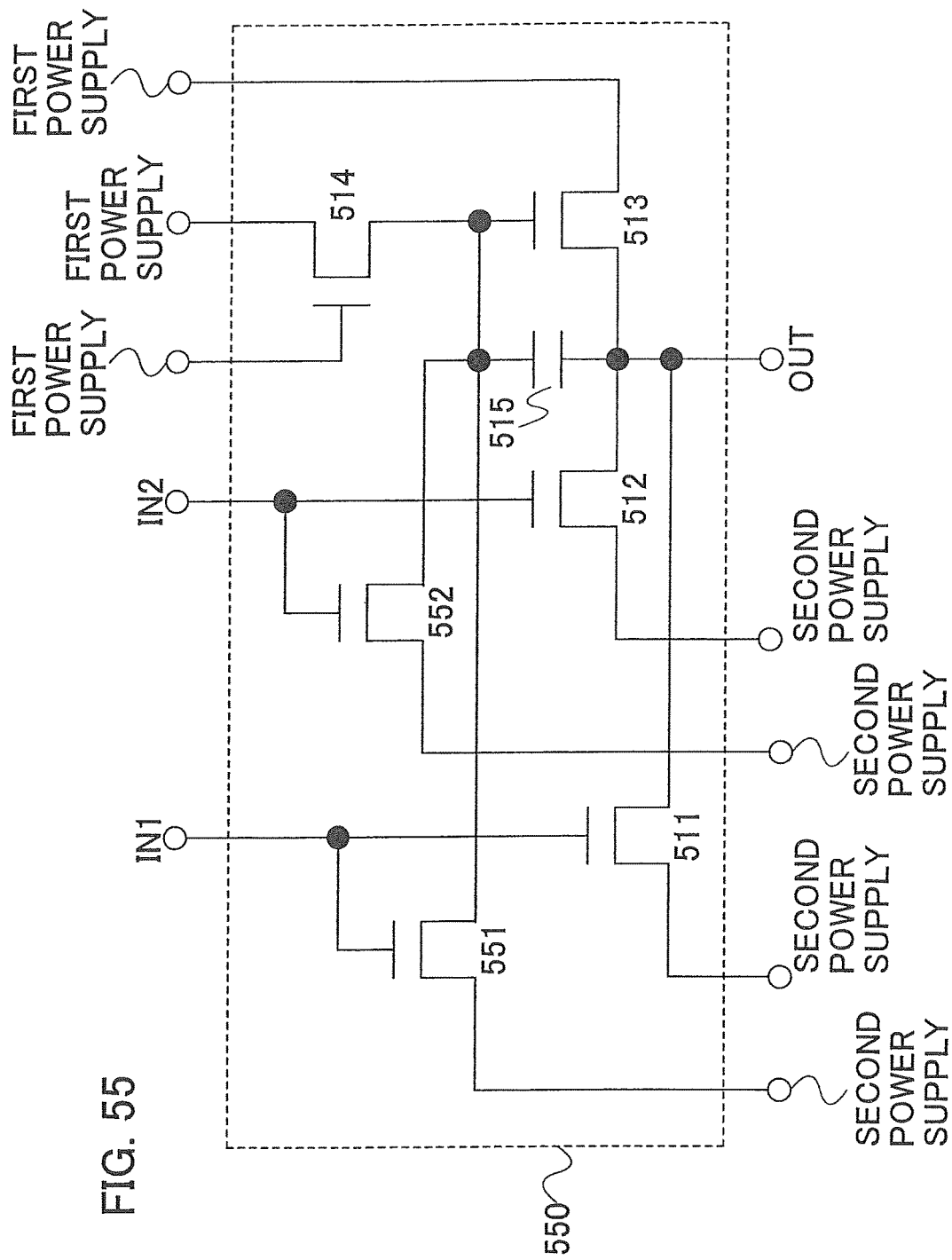
FIG. 55 is a diagram showing Embodiment Mode 3.

For example, as shown in a NOR circuit 550 of FIG. 55, a transistor 551 and a transistor 552 may be added. This is because the potential of the output terminal OUT can be VSS when the output terminal OUT is at an L level. That is, this is because when one or both of the input terminal IN1 and the input terminal IN2 is/are at an H level, one or both of the transistor 551 and the transistor 552 is/are turned on; therefore, a gate terminal of the transistor 513 becomes an L level, and subsequently, the transistor 513 is turned off, and the output terminal OUT is electrically connected only to the second power supply through one or both of the transistor 551 and the transistor 552.

Note that each of the transistors 551 and 552 is an n-channel transistor.

Figure 52:
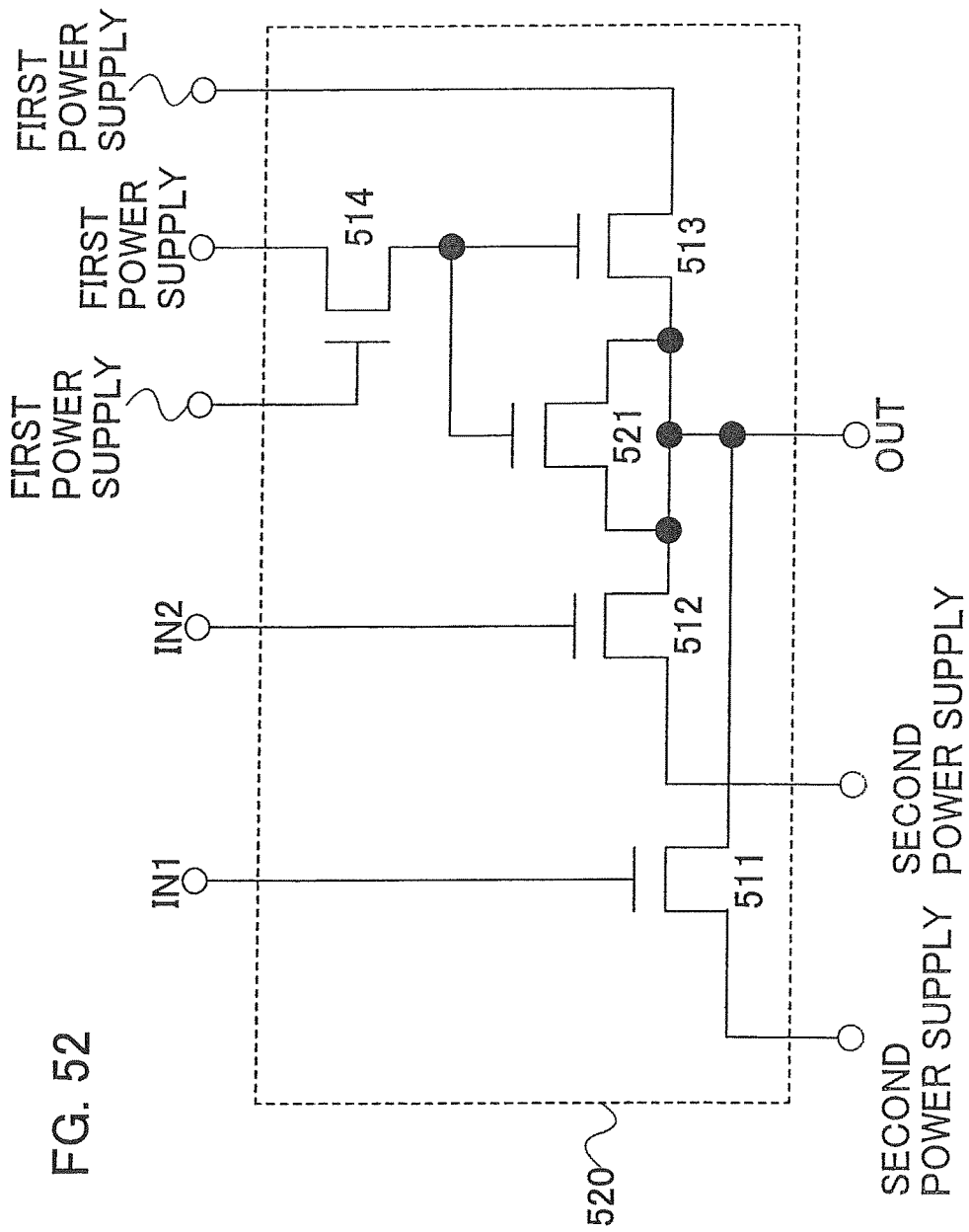
FIG. 52 is a diagram showing Embodiment Mode 3.
Figure 56:
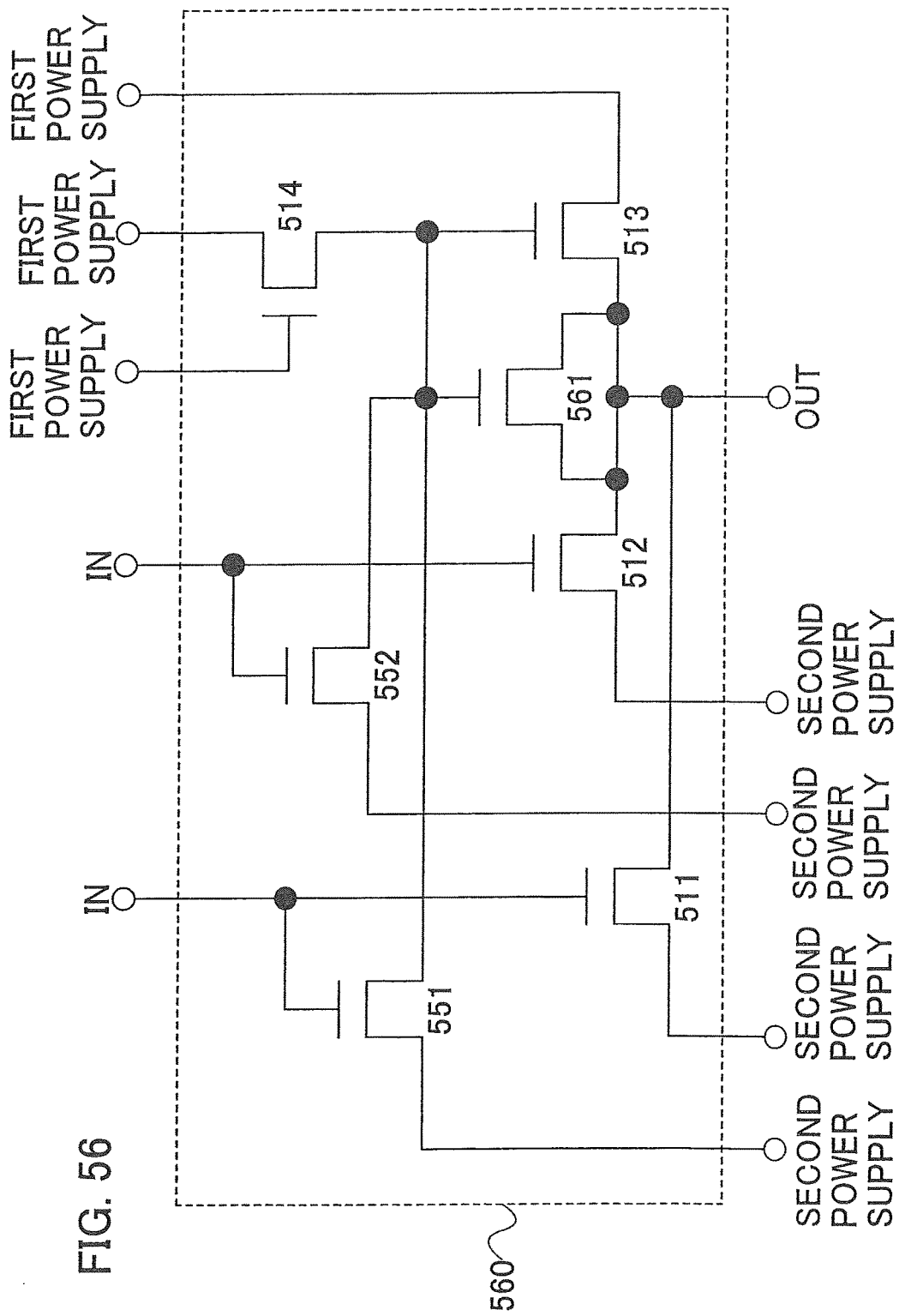
FIG. 56 is a diagram showing Embodiment Mode 3.

Note that any element can be used for the capacitor 515 as long as it has capacitive properties. For example, as shown in a NOR circuit 520 of FIG. 52 and a NOR circuit 560 of FIG. 56, each of a transistor 521 and a transistor 561 may be connected as a substitute for the capacitor 515.

Figure 53:
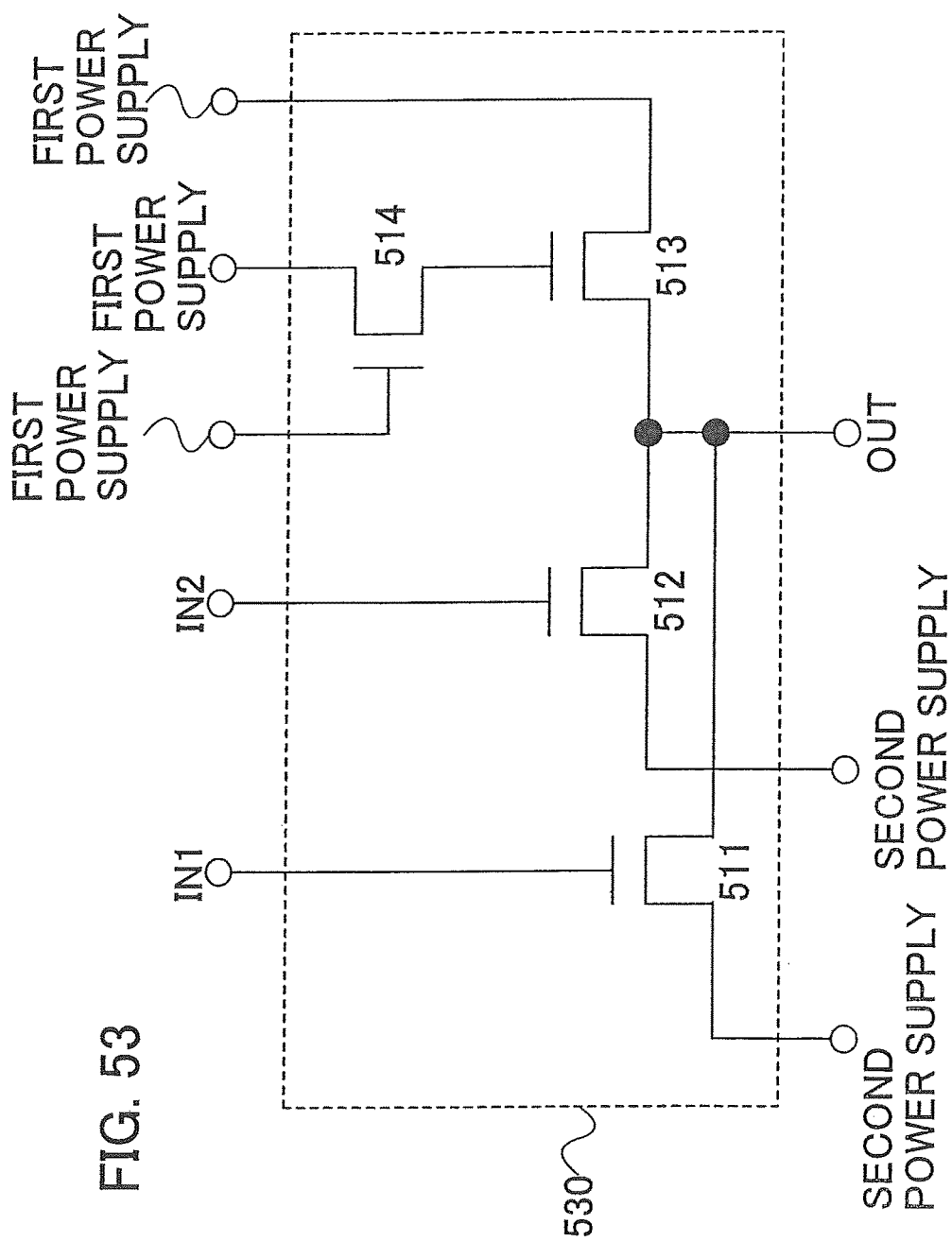
FIG. 53 is a diagram showing Embodiment Mode 3.
Figure 57:
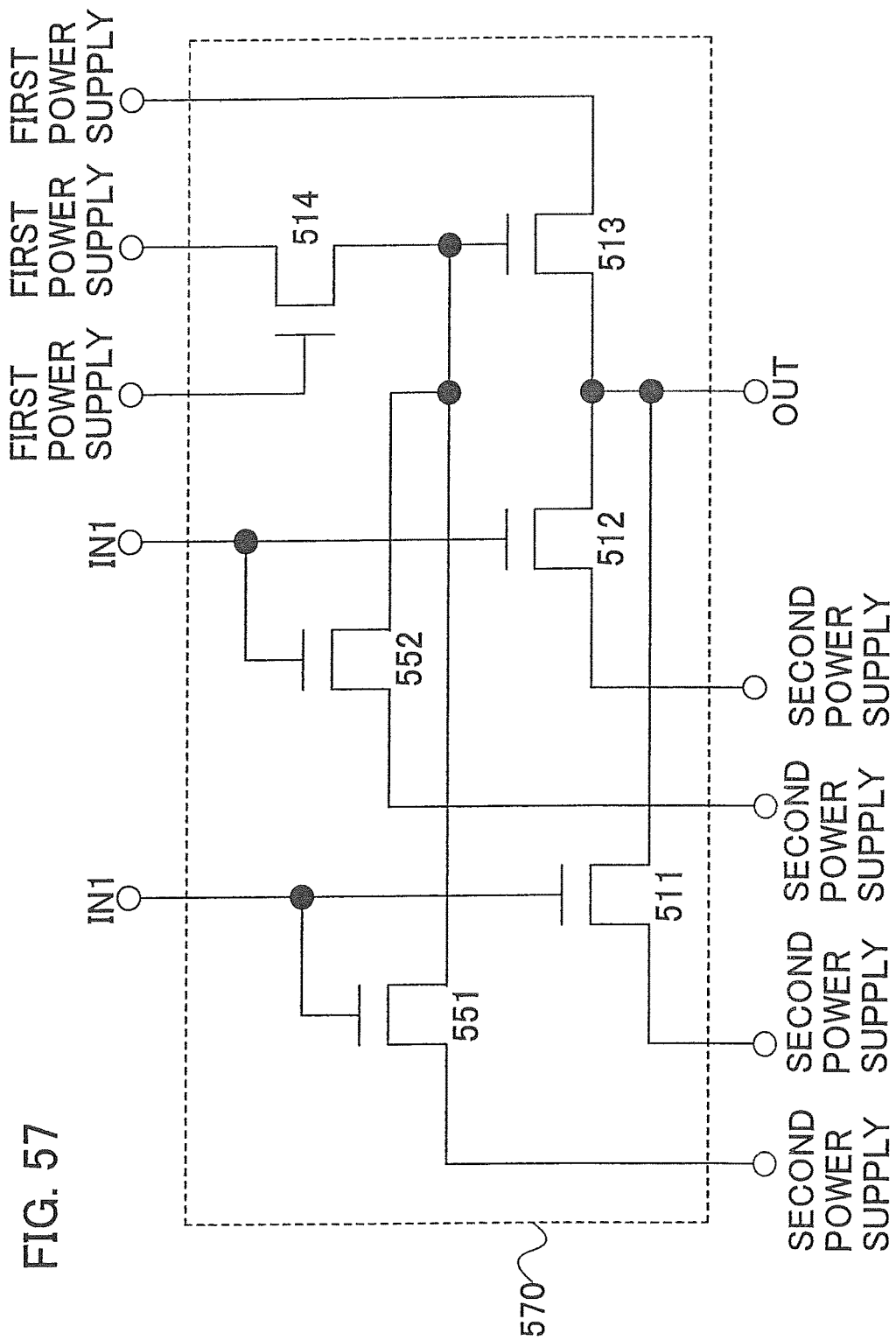
FIG. 57 is a diagram showing Embodiment Mode 3.

In addition, the capacitor 515 is not necessarily required if a capacitance value between the second terminal and the gate terminal of the transistor 513 is sufficiently large. For example, as shown in a NOR circuit 530 of FIG. 53 and a NOR circuit 570 of FIG. 57, the capacitor 515 is not required to be connected.

Here, functions of the transistors 511 to 514, the transistor 521, the transistor 551, the transistor 552, the transistor 561, and the capacitor 515 are described below, respectively.

The transistor 511 has a function as a switch which selects whether to connect the second power supply and the output terminal OUT or not in accordance with the potential of the input terminal IN1. When the input terminal IN1 is at an H level, the power supply potential VSS is supplied to the output terminal OUT.

The transistor 512 has a function as a switch which selects whether to connect the second power supply and the output terminal OUT or not in accordance with the potential of the input terminal IN2. When the input terminal IN2 is at an H level, the power supply potential VSS is supplied to the output terminal OUT.

The transistor 513 has a function as a switch which selects whether to connect the first power supply and the output terminal OUT or not.

The transistor 514 has a function as a diode and a function to make the gate terminal of the transistor 513 into a floating state.

The transistor 521 has a function as a capacitor which is connected between the output terminal OUT and the gate terminal of the transistor 513. When the input terminal IN1 and the input terminal IN2 are at an L level, the transistor 521 has a function to increase the potential of the gate terminal of the transistor 513.

The transistor 551 has a function as a switch which selects whether to connect the second power supply and the gate terminal of the transistor 513 or not in accordance with the potential of the input terminal IN1. When the input terminal IN1 is at an H level, the transistor 551 has a function to supply the power supply potential VSS to the gate terminal of the transistor 513.

The transistor 552 has a function as a switch which selects whether to connect the second power supply and the gate terminal of the transistor 513 or not in accordance with the potential of the input terminal IN2. When the input terminal IN2 is at an H level, the transistor 552 has a function to supply the power supply potential VSS to the gate terminal of the transistor 513.

The transistor 561 has a function as a capacitor which is connected between the output terminal OUT and the gate terminal of the transistor 513. When the input terminal IN1 and the input terminal IN2 are at an L level, the transistor 561 has a function to increase the potential of the gate terminal of the transistor 513.

The capacitor 515 has a function to change the potential of the gate terminal of the transistor 513 in accordance with the potential of the output terminal OUT. When the input terminal IN1 and the input terminal IN2 are at an L level, the capacitor 515 has a function to increase the potential of the gate terminal of the transistor 513.

As described above, in the NOR circuits in FIGS. 50 to 57, the potential of the output terminal OUT can be freely changed by changing the power supply potential VDD when an H level signal is output. That is, each of the NOR circuits in FIGS. 50 to 57 is not only operated as an inverter circuit but can also be operated as a level-shift circuit.

Although the cases where the NOR circuits in FIGS. 50 to 57 are formed by using all n-channel transistors are described, they may be formed by using all p-channel transistors. Here, FIGS. 72 to 79 show inverter circuits in the case of forming by using all p-channel transistors.

Figure 72:
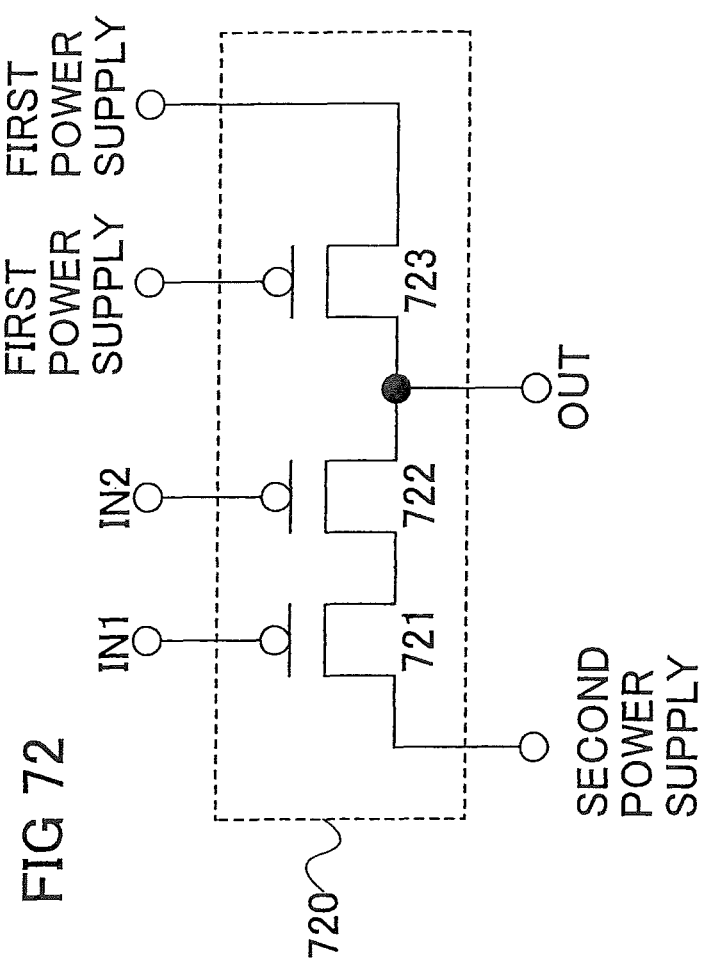
FIG. 72 is a diagram showing Embodiment Mode 3.

FIG. 72 shows another mode of the NOR circuit 231. A NOR circuit 720 in FIG. 72 includes a transistor 721, a transistor 722, and a transistor 723.

As shown in the NOR circuit 720 of FIG. 72, a first terminal of the transistor 721 is connected to the second power supply. A second terminal of the transistor 721 is connected to a first terminal of the transistor 722. A gate terminal of the transistor 721 is connected to the input terminal IN1. A second terminal of the transistor 722 is connected to a second terminal of the transistor 723 and the output terminal OUT. A gate terminal of the transistor 722 is connected to the input terminal IN2. A first terminal of the transistor 723 is connected to the first power supply. A gate terminal of the transistor 723 is connected to the first power supply.

Note that the power supply potential VSS is supplied to the first power supply and the power supply potential VDD is supplied to the second power supply. The potential difference (VDD−VSS) between the power supply potential VSS of the first power supply and the power supply potential VDD of the second power supply corresponds to a power supply voltage of the NOR circuit 720. Further, the power supply potential VDD is higher than the power supply potential VSS.

Note that a control signal is supplied to each of the input terminal IN1 and the input terminal IN2. In addition, the output terminal OUT outputs an output signal.

Moreover, each of the transistors 721 to 723 is a p-channel transistor.

Operations of the NOR circuit 720 in FIG. 72 in the case where the input terminal IN1 is at an H level, the case where the input terminal IN1 is L level, the case where the input terminal IN2 is at an H level, and the case where the input terminal IN2 is at an L level are described, respectively.

First, the case is described where the input terminal IN1 is at an H level and the input terminal IN2 is at an H level. When the input terminal IN1 becomes an H level, the transistor 721 is turned off. When the input terminal IN2 becomes an H level, the transistor 722 is turned off.

Thus, the output terminal OUT is electrically connected to the first power supply through the transistor 723; therefore, the potential of the output terminal OUT is lowered. The potential of the output terminal OUT at this time is a value which is the sum of the power supply potential VSS and the absolute value of the threshold voltage Vth723 of the transistor 723 (VSS+|Vth723|), and the output terminal OUT becomes an L level.

Next, the case is described where the input terminal IN1 is at an H level and the input terminal IN2 is at an L level. When the input terminal IN1 becomes an H level, the transistor 721 is turned off. When the input terminal IN2 becomes an L level, the transistor 722 is turned on.

Thus, the output terminal OUT is electrically connected to the first power supply through the transistor 723; therefore, the potential of the output terminal OUT is lowered. The potential of the output terminal OUT at this time is a value which is the sum of the power supply potential VSS and the absolute value of the threshold voltage Vth723 of the transistor 723 (VSS+|Vth723|), and the output terminal OUT becomes an L level.

Next, the case is described where the input terminal IN1 is at an L level and the input terminal IN2 is at an H level. When the input terminal IN1 becomes an L level, the transistor 721 is turned on. When the input terminal IN2 becomes an H level, the transistor 722 is turned off.

Thus, the output terminal OUT is electrically connected to the first power supply through the transistor 723; therefore, the potential of the output terminal OUT is lowered. The potential of the output terminal OUT at this time is a value which is the sum of the power supply potential VSS and the absolute value of the threshold voltage Vth723 of the transistor 723 (VSS+|Vth723|), and the output terminal OUT becomes an L level.

Next, the case is described where the input terminal IN1 is at an L level and the input terminal IN2 is at an L level. When the input terminal IN1 becomes an L level, the transistor 721 is turned on. When the input terminal IN2 becomes an L level, the transistor 722 is turned on.

Thus, the output terminal OUT is electrically connected to the second power supply through the transistor 721 and the transistor 722, and to the first power supply through the transistor 723; therefore, the potential of the output terminal OUT rises. The potential of the output terminal OUT at this time is determined by an operating point of a transistor 721, a transistor 722, and a transistor 723, and the output terminal OUT becomes an H level.

Note that the transistor 723 is not required to have rectifying properties; any element can be used as long as a voltage is generated in the element when a current is supplied thereto. For example, as shown in a NOR circuit 760 of FIG. 76, a resistor 761 may be connected as a substitute for the transistor 723.

Here, functions of the transistors 721 to 723 are described below.

The transistor 721 has a function as a switch which selects whether to connect the second power supply and the first terminal of the transistor 722 or not in accordance with the potential of the input terminal IN1.

The transistor 722 has a function as a switch which selects whether to connect the second terminal of the transistor 721 and the output terminal OUT or not in accordance with the potential of the input terminal IN2.

The transistor 723 has a function as a diode.

Figure 73:
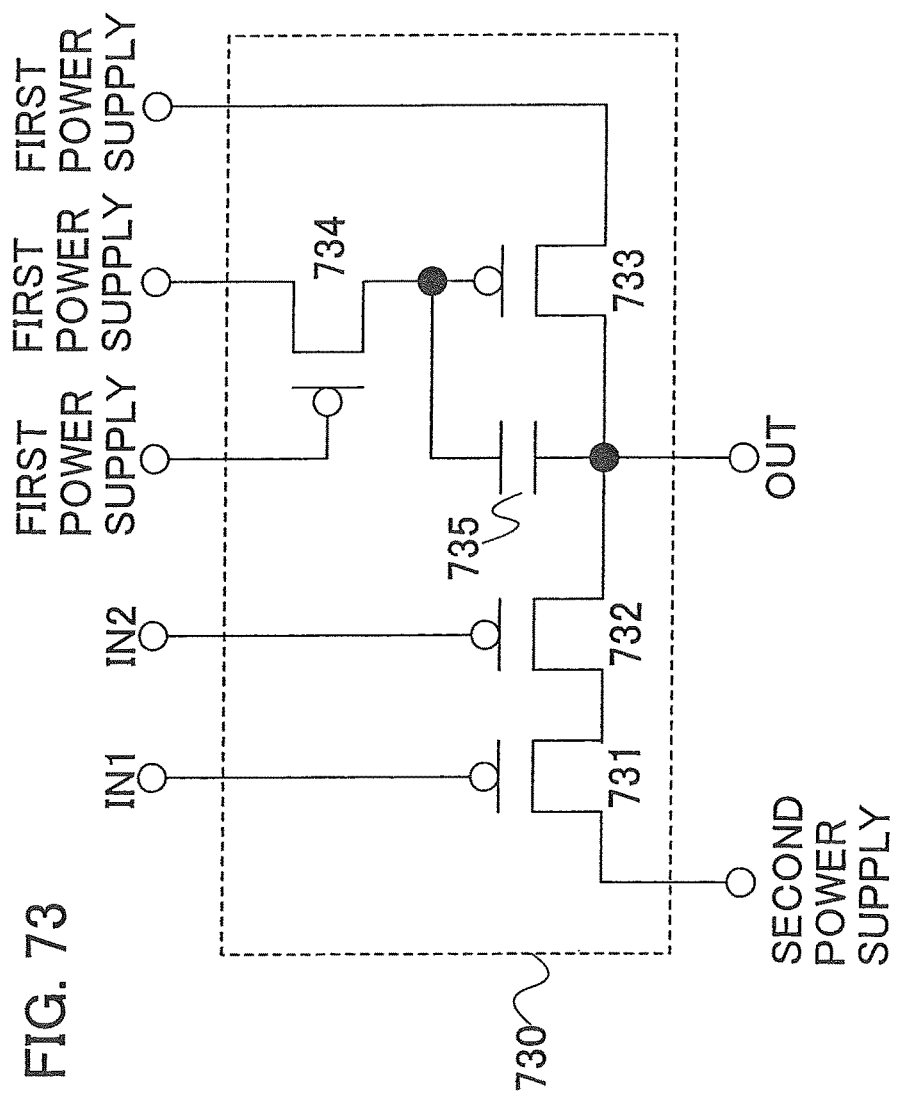
FIG. 73 is a diagram showing Embodiment Mode 3.
Figure 74:
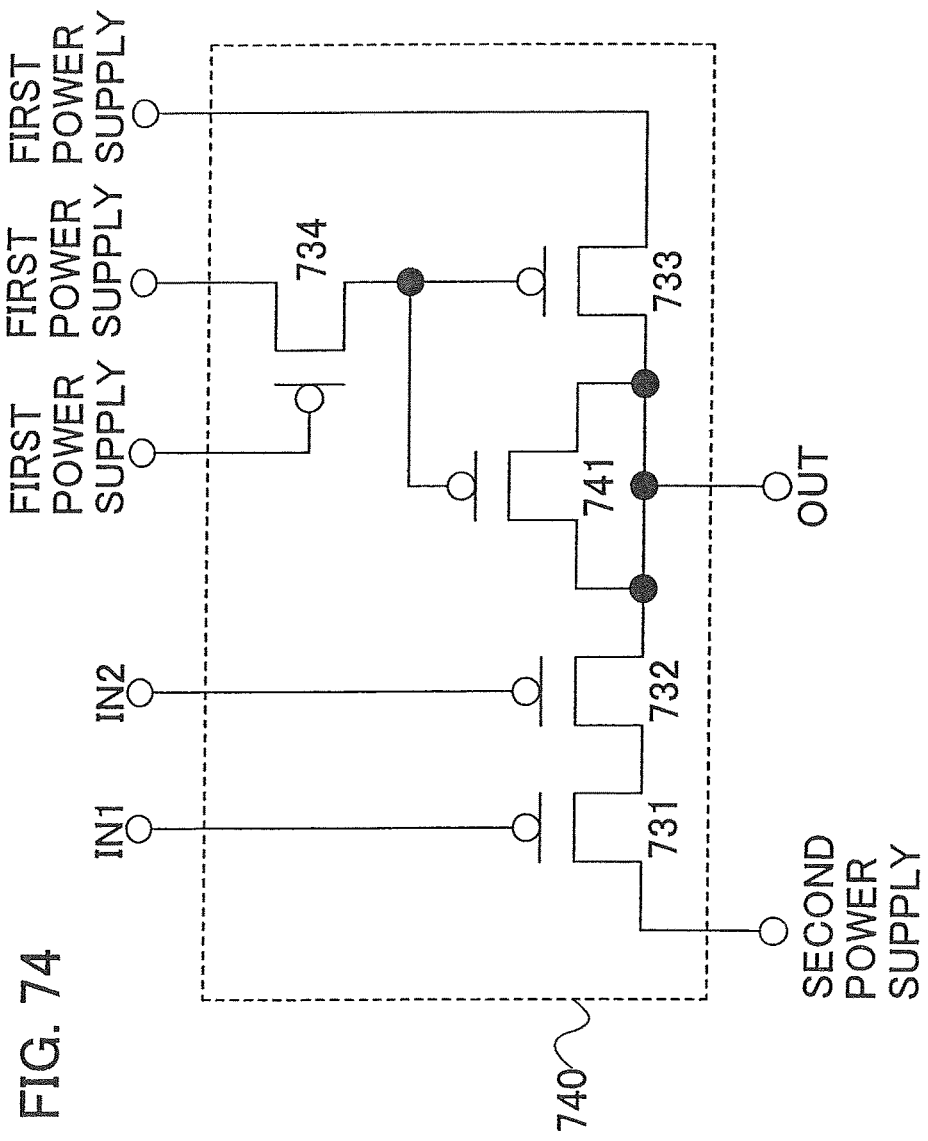
FIG. 74 is a diagram showing Embodiment Mode 3.
Figure 75:
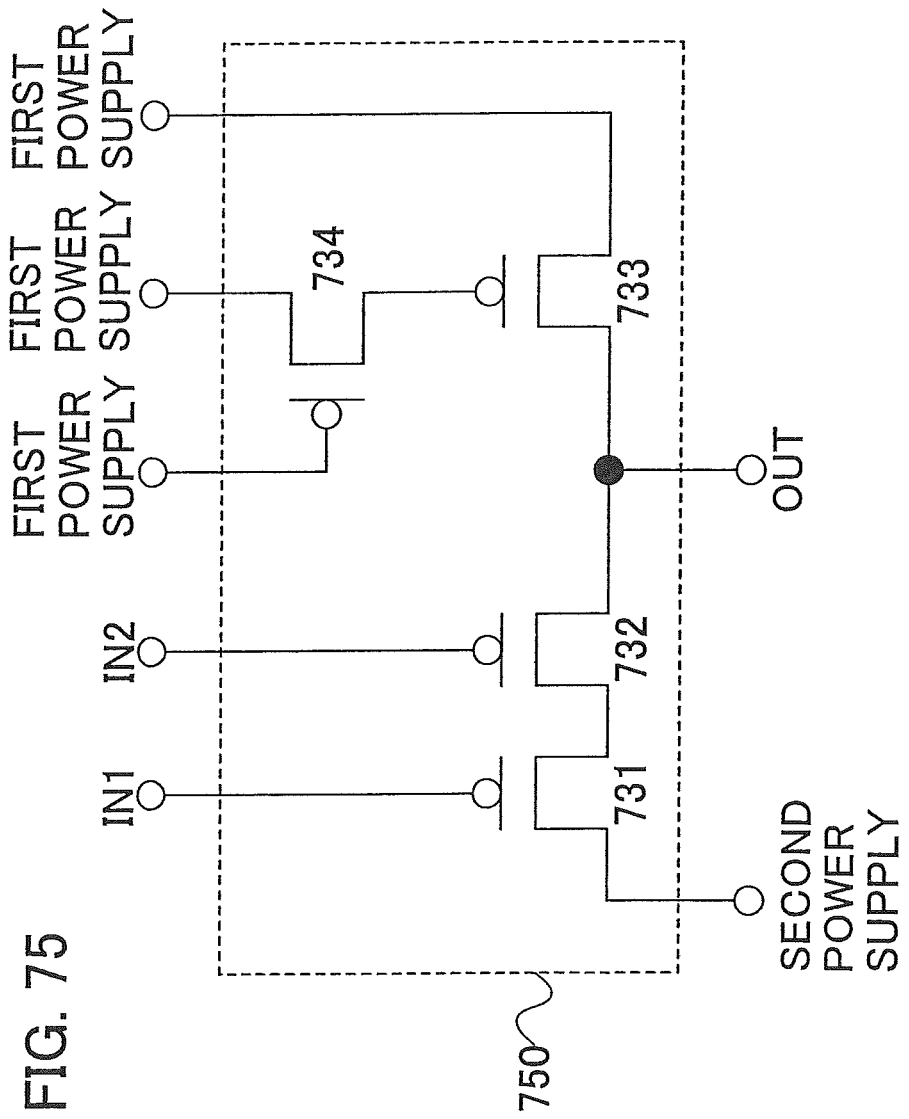
FIG. 75 is a diagram showing Embodiment Mode 3.
Figure 76:
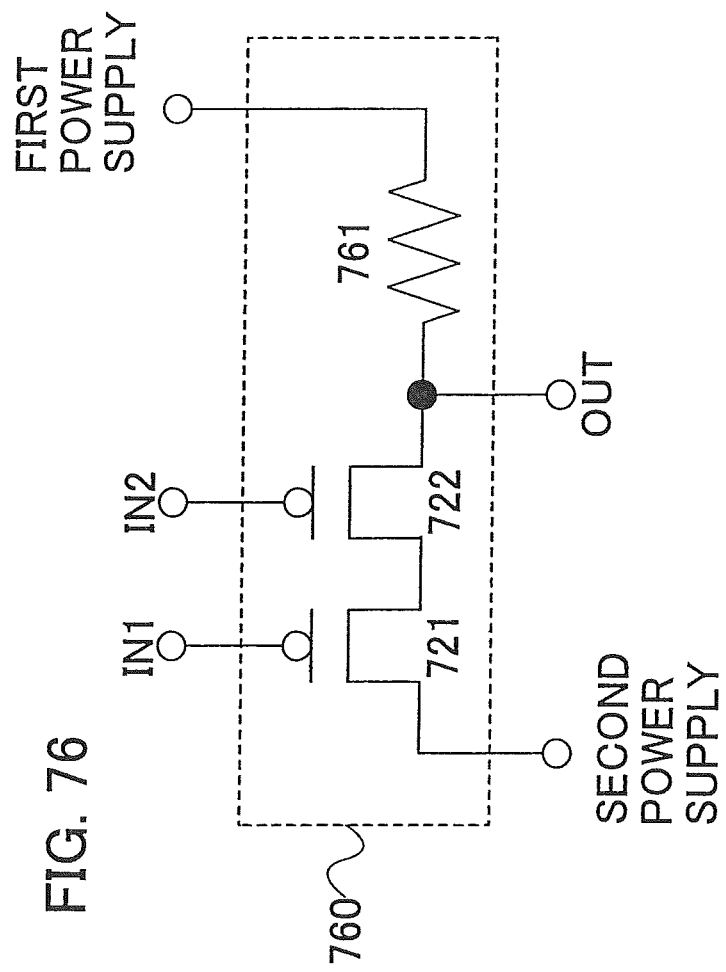
FIG. 76 is a diagram showing Embodiment Mode 3.

FIG. 73 shows another mode of the NOR circuit 231. A NOR circuit 730 in FIG. 73 includes a transistor 731, a transistor 732, a transistor 733, a transistor 734, and a capacitor 735 having two electrodes.

As shown in the NOR circuit 730 of FIG. 73, a first terminal of the transistor 731 is connected to the second power supply. A second terminal of the transistor 731 is connected to a first terminal of the transistor 732. A gate terminal of the transistor 731 is connected to the input terminal IN1. A second terminal of the transistor 732 is connected to a second terminal of the transistor 733, a second electrode of the capacitor 735, and the output terminal OUT. A gate terminal of the transistor 732 is connected to the input terminal IN2. A first terminal of the transistor 733 is connected to the first power supply. A gate terminal of the transistor 733 is connected to a second terminal of the transistor 734 and a first electrode of the capacitor 735. A first terminal of the transistor 734 is connected to the first power supply. A gate terminal of the transistor 734 is connected to the first power supply.

Note that the first power supply, the second power supply, the input terminal IN1, the input terminal IN2, and the output terminal OUT may be similar to those in FIG. 72.

Moreover, each of the transistors 731 to 734 is a p-channel transistor.

Operations of the NOR circuit 730 in FIG. 73 in the case where the input terminal IN1 is at an H level, the case where the input terminal IN1 is at an L level, the case where the input terminal IN2 is at an H level, and the case where the input terminal IN2 is at an L level are described, respectively.

First, the case is described where the input terminal IN1 is at an H level and the input terminal IN2 is at an H level. When the input terminal IN1 becomes an H level, the transistor 731 is turned off. When the input terminal IN2 becomes an H level, the transistor 732 is turned off. A potential of the gate terminal of the transistor 733 is a value which is the sum of the power supply potential VSS and the absolute value of the threshold voltage Vth734 of the transistor 734 (VSS+|Vth734|), and the transistor 733 is on. Further, the gate terminal of the transistor 733 is in a floating state.

Thus, the output terminal OUT is electrically connected to the first power supply through the transistor 733; therefore, the potential of the output terminal OUT is lowered. The potential of the gate terminal of the transistor 733 is lowered to be less than or equal to a value obtained by subtracting the absolute value of the threshold voltage Vth733 of the transistor 733 from the power supply potential VSS in accordance with the capacitive coupling of the capacitor 735 (VSS−|Vth733|), and the transistor 733 continues to be in an on state. A so-called bootstrap operation is performed. The potential of the output terminal OUT at this time is VSS, and the output terminal OUT becomes an L level.

Next, the case is described where the input terminal IN1 is at an H level and the input terminal IN2 is at an L level. When the input terminal IN1 becomes an H level, the transistor 731 is turned off. When the input terminal IN2 becomes an L level, the transistor 732 is turned on. The potential of the gate terminal of the transistor 733 is a value which is the sum of the power supply potential VSS and the absolute value of the threshold voltage Vth734 of the transistor 734 (VSS+|Vth734|), and the transistor 733 is on. Further, the gate terminal of the transistor 733 is in a floating state.

Thus, the output terminal OUT is electrically connected to the first power supply through the transistor 733; therefore, the potential of the output terminal OUT is lowered. The potential of the gate terminal of the transistor 733 is lowered to be less than or equal to a value obtained by subtracting the absolute value of the threshold voltage Vth733 of the transistor 733 from the power supply potential VSS in accordance with the capacitive coupling of the capacitor 735 (VSS−Vth733|), and the transistor 733 continues to be in an on state. A so-called bootstrap operation is performed. The potential of the output terminal OUT at this time is VSS, and the output terminal OUT becomes an L level.

Next, the case is described where the input terminal IN1 is at an L level and the input terminal IN2 is at an H level. When the input terminal IN1 becomes an L level, the transistor 731 is turned on. When the input terminal IN2 becomes an H level, the transistor 732 is turned off. The potential of the gate terminal of the transistor 733 is a value which is the sum of the power supply potential VSS and the absolute value of the threshold voltage Vth734 of the transistor 734 (VSS+|Vth734|), and the transistor 733 is on. Further, the gate terminal of the transistor 733 is in a floating state.

Thus, the output terminal OUT is electrically connected to the first power supply through the transistor 733; therefore, the potential of the output terminal OUT is lowered. The potential of the gate terminal of the transistor 733 is lowered to be less than or equal to a value obtained by subtracting the absolute value of the threshold voltage Vth733 of the transistor 733 from the power supply potential VSS in accordance with the capacitive coupling of the capacitor 735 (VSS−|Vth733|), and the transistor 733 continues to be in an on state. A so-called bootstrap operation is performed. The potential of the output terminal OUT at this time is VSS, and the output terminal OUT becomes an L level.

Next, the case is described where the input terminal IN1 is at an L level and the input terminal IN2 is at an L level. When the input terminal IN1 becomes an L level, the transistor 731 is turned on. When the input terminal IN2 becomes an L level, the transistor 732 is turned on. The potential of the gate terminal of the transistor 733 is a value which is the sum of the power supply potential VSS and the absolute value of the threshold voltage Vth734 of the transistor 734 (VSS+|Vth734|), and the transistor 733 is on. Further, the gate terminal of the transistor 733 is in a floating state.

Thus, the output terminal OUT is electrically connected to the second power supply through the transistor 731 and the transistor 732, and to the first power supply through the transistor 733; therefore, the potential of the output terminal OUT is increased. The potential of the output terminal OUT at this time is determined by an operating point of the transistor 731, the transistor 732, and the transistor 733, and the output terminal OUT becomes an H level.

In this manner, in the NOR circuit 730 of FIG. 73, the potential of the output terminal OUT can be lowered from an L level to the power supply potential VSS of the first power supply by the bootstrap operation.

Note that the NOR circuit 730 of FIG. 73 is not limited to a circuit structure of FIG. 73 as long as the bootstrap operation can be performed when the input terminal IN1 or the input terminal IN2 is at an H level. When the input terminal IN1 and the input terminal IN2 are at an L level, a potential may be supplied to the gate terminal of the transistor 733.

Figure 77:
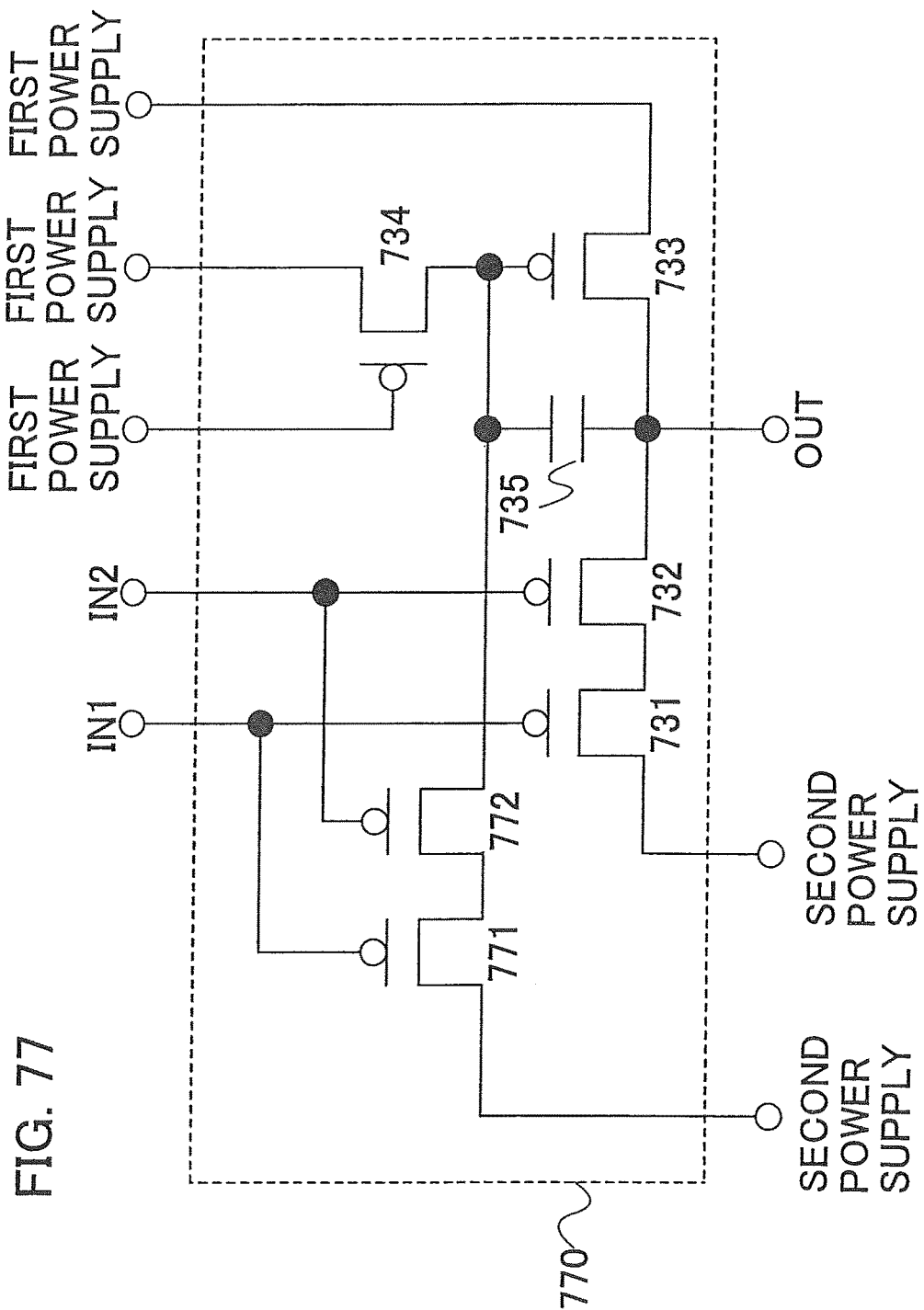
FIG. 77 is a diagram showing Embodiment Mode 3.
Figure 78:
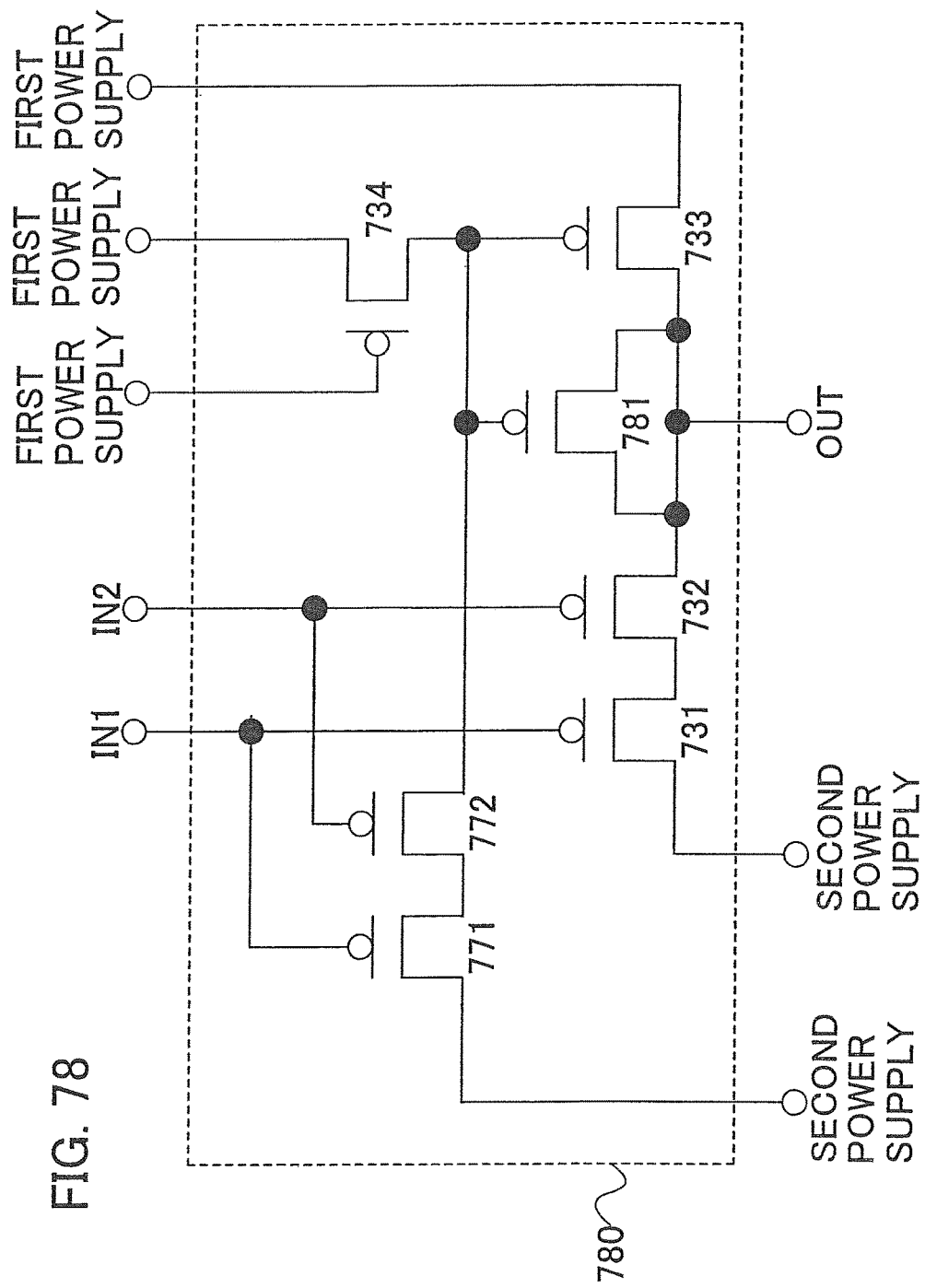
FIG. 78 is a diagram showing Embodiment Mode 3.
Figure 79:
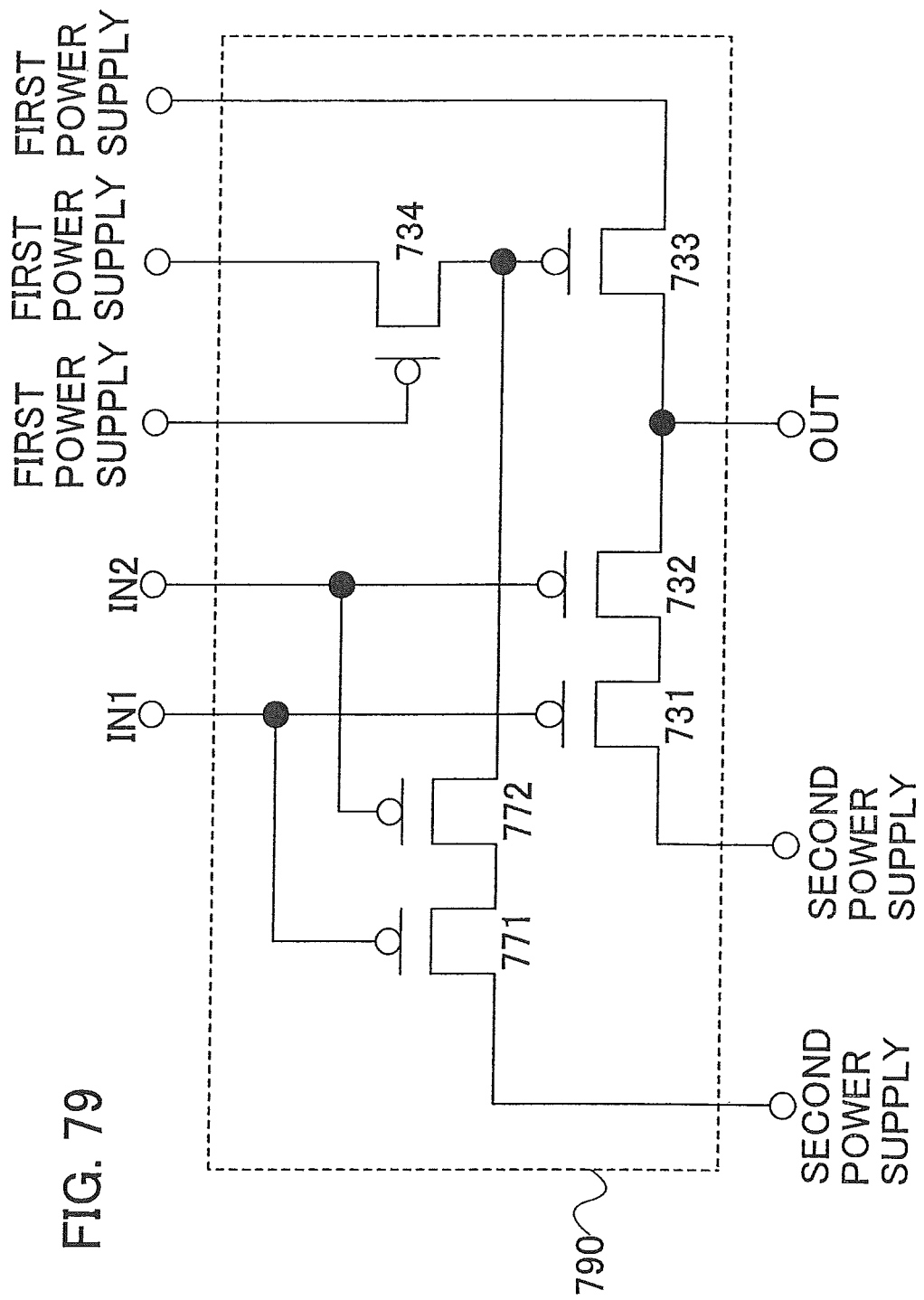
FIG. 79 is a diagram showing Embodiment Mode 3.

For example, as shown in a NOR circuit 770 of FIG. 77, a transistor 771 and a transistor 772 may be added. This is because the potential of the output terminal OUT can be VDD when the output terminal OUT is at an H level. That is, this is because when the input terminal IN1 and the input terminal IN2 are at an L level, the transistor 771 and the transistor 772 are turned on; therefore, the gate terminal of the transistor 733 becomes an H level, and subsequently, the transistor 733 is turned off, and the output terminal OUT is electrically connected only to the second power supply through the transistor 731 or the transistor 732.

Note that each of the transistors 771 and 772 is a p-channel transistor.

Note that any element can be used for the capacitor 735 as long as it has capacitive properties. For example, as shown in a NOR circuit 740 of FIG. 74 and a NOR circuit 780 of FIG. 78, each of a transistor 741 and a transistor 781 may be connected as a substitute for the capacitor 735.

In addition, the capacitor 735 is not necessarily required if a capacitance value between the second terminal and the gate terminal of the transistor 733 is sufficiently large. For example, as shown in a NOR circuit 750 of FIG. 75 and a NOR circuit 790 of FIG. 79, the capacitor 735 is not required to be connected.

Here, functions of the transistors 731 to 734, the transistor 741, the transistor 771, the transistor 772, the transistor 781, and the capacitor 735 are described below.

The transistor 731 has a function as a switch which selects whether to connect the second power supply and the first terminal of the transistor 732 or not in accordance with the potential of the input terminal IN1.

The transistor 732 has a function as a switch which selects whether to connect the second terminal of the transistor 731 and the output terminal OUT or not in accordance with the potential of the input terminal IN2.

The transistor 733 has a function as a switch which selects whether to connect the first power supply and the output terminal OUT or not.

The transistor 734 has a function as a diode and a function to put the gate terminal of the transistor 733 in a floating state.

The transistor 741 has a function as a capacitor which is connected between the output terminal OUT and the gate terminal of the transistor 733. When one or both of the input terminal IN1 and the input terminal IN2 is/are at an H level, the transistor 741 has a function to lower the potential of the gate terminal of the transistor 733.

The transistor 771 has a function as a switch which selects whether to connect the second power supply and a first terminal of the transistor 772 or not in accordance with the potential of the input terminal IN1.

The transistor 772 has a function as a switch which selects whether to connect a first terminal of the transistor 771 and the gate terminal of the transistor 733 or not in accordance with the potential of the input terminal IN2.

The transistor 781 has a function as a capacitor which is connected between the output terminal OUT and the gate terminal of the transistor 733. When one or both of the input terminal IN1 and the input terminal IN2 is/are at an H level, the transistor 781 has a function to lower the potential of the gate terminal of the transistor 733.

The capacitor 735 has a function to change the potential of the gate terminal of the transistor 733 in accordance with the potential of the output terminal OUT. When one or both of the input terminal IN1 and the input terminal IN2 is/are at an L level, the capacitor 735 has a function to lower the potential of the gate terminal of the transistor 733.

As described above, in the NOR circuits in FIGS. 73 to 78, the potential of the output terminal OUT can be freely changed by changing the power supply potential VSS when an L level signal is output. That is, each of the NOR circuits in FIGS. 73 to 78 is not only operated as a NAND circuit but can also be operated as a level-shift circuit.

Figure 87:
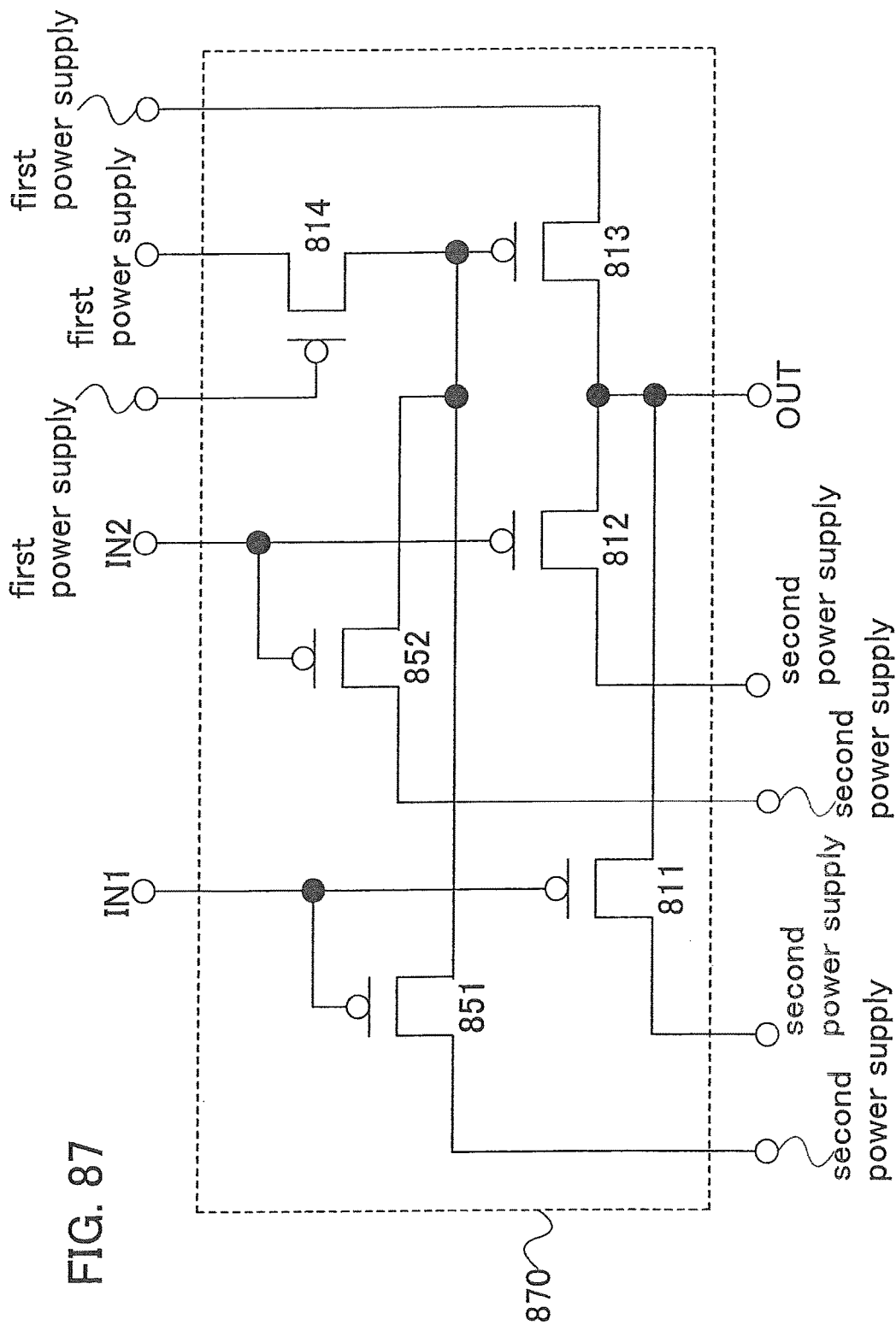
FIG. 87 is a diagram showing Embodiment Mode 3.

In addition, circuit structures in FIGS. 28 to 87 are used as the inverter circuit 211, the NAND circuit 221, and the NOR circuit 231; therefore, a margin for operating the shift register circuit 200 is increased. This is because in the inverter circuit 211, the NAND circuit 221, and the NOR circuit 231, a gate terminal of one transistor is connected to the output terminal SRout. Thus, load capacitance of the output terminal SRout is decreased; therefore, a margin for operating the shift register circuit 200 can be increased.

In addition, the inverter circuits, the NAND circuits, and the NOR circuits shown in FIGS. 28 to 87 are formed by using transistors having the same polarity, respectively. Therefore, when the polarity of these transistors is the same as a polarity of other transistors over the same substrate, simplification of a manufacturing process can be realized. Accordingly, reduction in manufacturing cost and improvement in yield can be realized.

Note that although the power supply potential VDD or the power supply potential VSS is supplied to the first power supply and the second power supply shown in FIGS. 28 to 87, the invention is not limited thereto.

For example, a different potential may be supplied to each of the first power supply and the second power supply in FIGS. 28 to 87.

As another example, the control signal may be supplied to each of the first power supply and the second power supply in FIGS. 28 to 87.

Note that although the control signal is supplied to each of the input terminals in FIGS. 28 to 87, the invention is not limited thereto.

For example, the power supply voltage may be supplied to the input terminal in FIGS. 28 to 87.

Note that this embodiment mode can be freely implemented in combination with any description in other embodiment modes and embodiments in this specification. That is, in a non-selection period, the transistor in the shift register circuit of the invention is turned on at regular intervals, so that a power supply potential to the output terminal is supplied. Therefore, the power supply potential is supplied to the output terminal of the shift register circuit through the transistor. Since the transistor is not always on in the non-selection period, the threshold voltage shift of the transistor can be suppressed. Further, the power supply potential is supplied to the output terminal of the shift register circuit through the transistor at regular intervals. Therefore, the shift register circuit can suppress noise which is generated in the output terminal.

Embodiment Mode 4

In this embodiment mode, a structure which is different from the driver circuit described in Embodiment Mode 3 is described.

As a driver circuit, a structure example which can be applied to a source driver is described with reference to FIGS. 88 to 91. Driver circuits in FIGS. 88 to 91 can be applied not only to a source driver but also to any kind of circuit structures.

Figure 88:
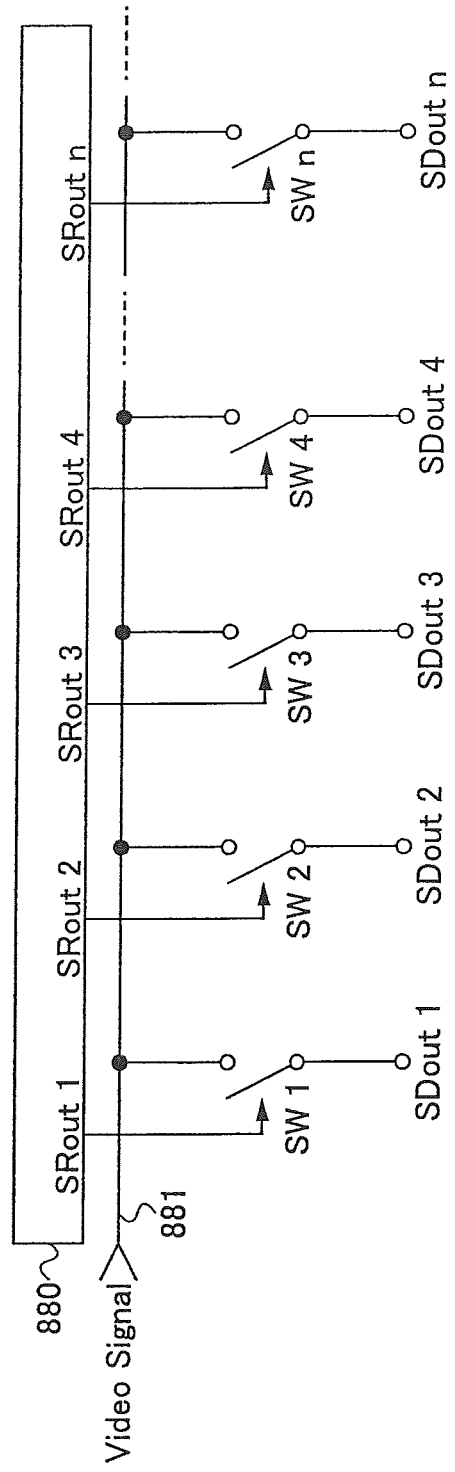
FIG. 88 is a diagram showing Embodiment Mode 4.

FIG. 88 shows one mode of a source driver of the invention. The source driver of the invention includes a shift register circuit 880, a plurality of switches SW, and a video signal line 881.

As shown in the source driver of FIG. 88, the video signal line 881 is connected to a first terminal of the switch SW and a second terminal of the switch SW is connected to an output terminal SDout. A control terminal of the switch SW is connected to an output terminal SRout of the shift register circuit 880.

Note that the shift register circuit 880 is similar to that described in Embodiment Mode 2. Further, the gate driver described in Embodiment Mode 3 may be applied to the shift register circuit 880.

Output terminals SRout1 to SRout4 and an output terminal SRoutn of the shift register circuit 880 may be similar to those described in Embodiment Mode 2.

An output terminal SDout of a first stage of the gate driver of the invention is denoted by an output terminal SDout1. An output terminal SDout of a second stage is denoted by an output terminal SDout2. An output terminal SDout of a third stage is denoted by an output terminal SDout3. An output terminal SDout of an n-th stage is denoted by an output terminal SDoutn.

In the source driver of FIG. 88, a power supply line and a control signal line are not shown in the figure for convenience.

In the case where the shift register circuit 880 is formed by using an n-channel transistor, an output signal of the shift register circuit 880 is similar to that in the timing chart of FIG. 18. In the case where the shift register circuit 880 is formed by using a p-channel transistor, an output signal of the shift register circuit 880 is similar to that in the timing chart of FIG. 19.

A video signal is supplied to the video signal line 881. The video signal may be a current or a voltage; and an analog signal or a digital signal. The video signal is preferably an analog voltage since a number of external circuits are for a liquid crystal display device. That is, when the video signal is an analog voltage, an inexpensive conventional circuit can be used as the external circuit.

Operations of the source driver in FIG. 88 in the cases where the output terminal SRout of the shift register circuit 880 is at an H level and an L level are described, respectively.

Note that for convenience, the switch SW in FIG. 88 is turned on when the control terminal is at an H level and turned off when the control terminal is at an L level. Needless to say, the switch SW may be turned off when the control terminal is at an H level and turned on when the control terminal is at an L level.

First, the case where the output terminal SRout is at an H level is described. When the output terminal SRout of the shift register circuit becomes an H level, the switch SW is turned on. When the switch SW is turned on, the video signal line 881 is connected to the output terminal SRout of the source driver through the switch SW.

Therefore, the output terminal SDout of the source driver has the same potential or the same current as the video signal line 881, and the source driver outputs a video signal.

Next, the case where the output terminal SRout is at an L level is described. When the output terminal SRout of the shift register circuit becomes an L level, the switch SW is turned off. When the switch SW is turned off, the video signal line 881 is disconnected from the output terminal SRout of the source driver.

Therefore, the output terminal SDout of the source driver is not affected by a potential of the video signal line 881, and the source driver stops outputting the video signal.

As described in Embodiment Mode 2, in the case where the shift register circuit 880 includes an n-channel transistor, the shift register circuit 880 becomes an H level sequentially from the output terminal SRout1. That is, the switch shown in FIG. 88 is turned on sequentially from a switch SW1 (in a first column) and the output terminals SDout of the source driver have the same potential or the same current as the video signal sequentially from the output terminal SDout1 (in a first column).

Note that the source driver shown in FIG. 88 can output different video signals sequentially from the output terminal SDout1 by changing the video signal each time the shift register circuit 880 outputs an H level signal.

Note that although each output terminal SRout of the shift register circuit 880 controls one switch, the invention is not necessarily limited to this. Each output terminal SRout of the shift register circuit 880 may control a plurality of switches SW. In this case, a plurality of video signal lines may connect to the first terminals of the switches SW, respectively.

Figure 89:
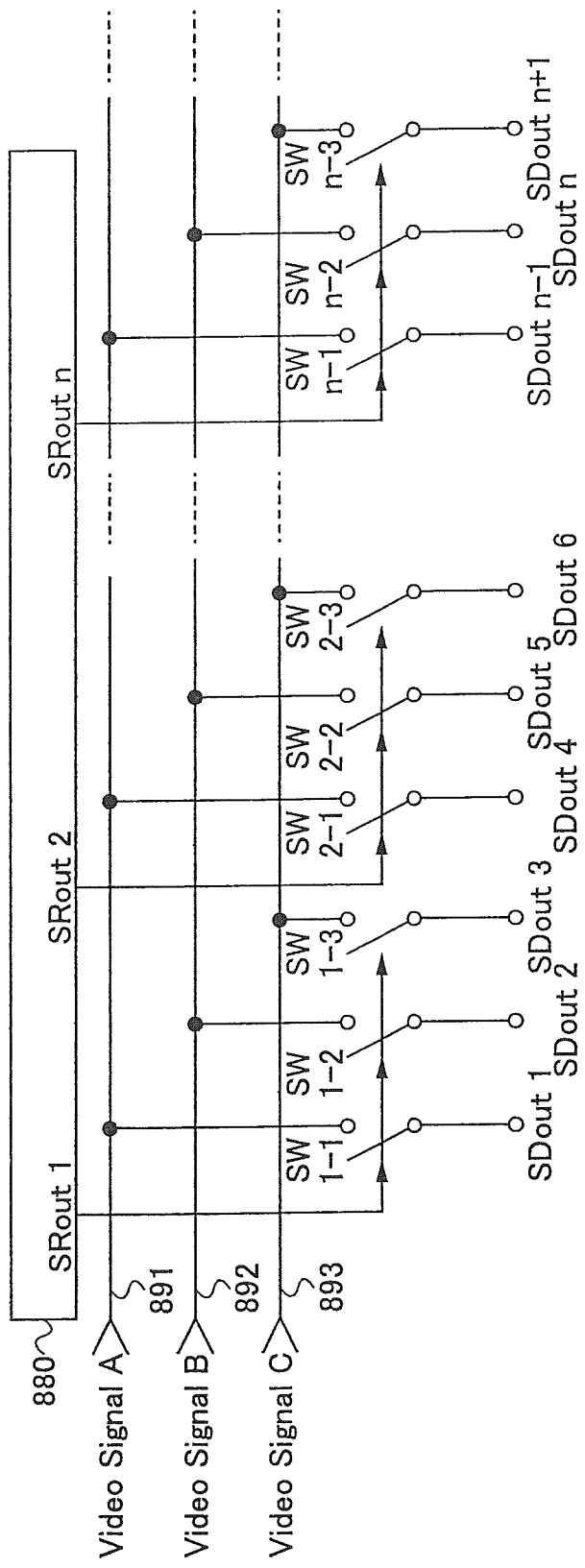
FIG. 89 is a diagram showing Embodiment Mode 4.

For example, as shown in a source driver of FIG. 89, one output terminal SRout of the shift register circuit 880 may control three switches SW. This is because a video signal line 891, a video signal line 892, and a video signal line 893 are connected to first terminals of the three switches, so that three output terminals SDout of the source driver can output video signals simultaneously. Therefore, an operating frequency of the shift register circuit 880 can be low, and thereby power consumption of the shift register circuit 880 is reduced.

Note that as the switch SW, an electrical switch or a mechanical switch can be used, for example. That is, any element which can control a flow of current can be employed and the switch is not limited to a specific element. A transistor, a diode, or a logic circuit that is a combination thereof may be employed. When a transistor is used as a switch, a polarity (conductivity type) thereof is not specifically limited since the transistor is operated as a mere switch. However, in the case where an off-current is preferably small, a transistor with a polarity of a small off-current is preferably used. As a transistor with a small off-current, a transistor provided with an LDD region, a transistor having a multi-gate structure, or the like may be used. In addition, an n-channel transistor is preferably used when operating in a state where a potential of a source terminal of the transistor, which operates as a switch, is close to a low potential side power supply (Vss, GND, 0V, or the like), whereas a p-channel transistor is preferably used when operating in a state where a potential of a source terminal of the transistor is close to a high potential side power supply (Vdd or the like). This is because the transistor can easily function as a switch since the absolute value of a gate-source voltage thereof can be made to be large. Note that a CMOS type switch may also be applied by using both an n-channel transistor and a p-channel transistor.

Figure 90:
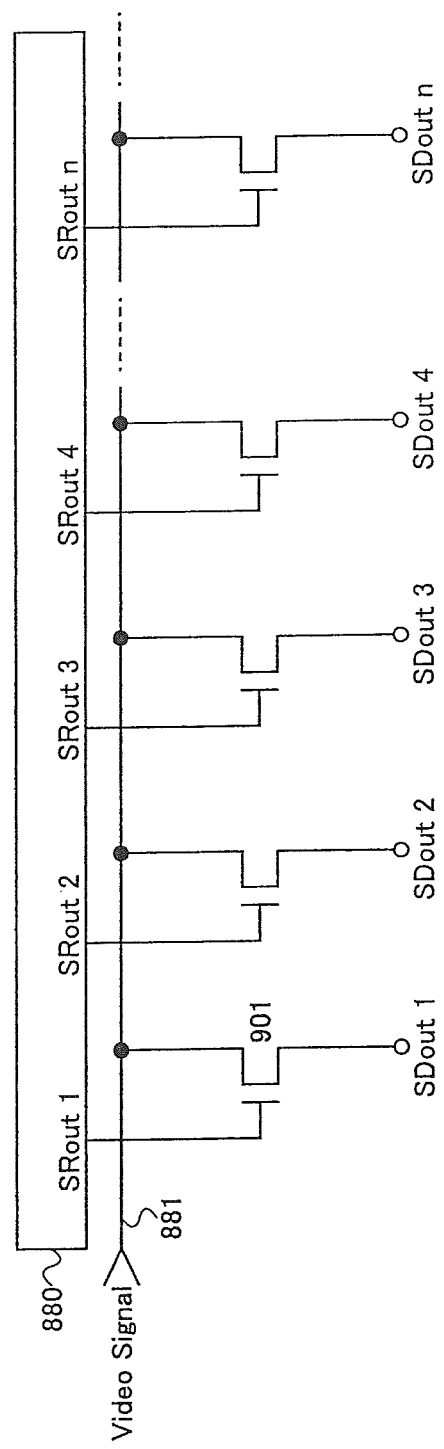
FIG. 90 is a diagram showing Embodiment Mode 4.

For example, as shown in a source driver of FIG. 90, a transistor 901 may be connected as the switch SW. The transistor 901 is controlled to be turned on and off by the shift register circuit 880. When the transistor 901 is turned on, an output terminal SDout of the source driver outputs a video signal.

Note that the transistor 901 is an n-channel transistor.

Note that the transistor 901 has a function as a switch which selects whether to connect the video signal line 881 and the output terminal SDout of the source driver or not in accordance with a potential of the output terminal SRout of the shift register circuit 880. When the output terminal SRout of the shift register circuit 880 is at an H level, the video signal is supplied to the output terminal SDout of the source driver by the transistor 901.

Note that the shift register circuit 880 at this time is preferably formed by using an n-channel transistor. When the shift register circuit 880 is formed by using an n-channel transistor, simplification of a manufacturing process can be realized. Therefore, reduction in manufacturing cost and improvement in yield can be realized.

Figure 91:
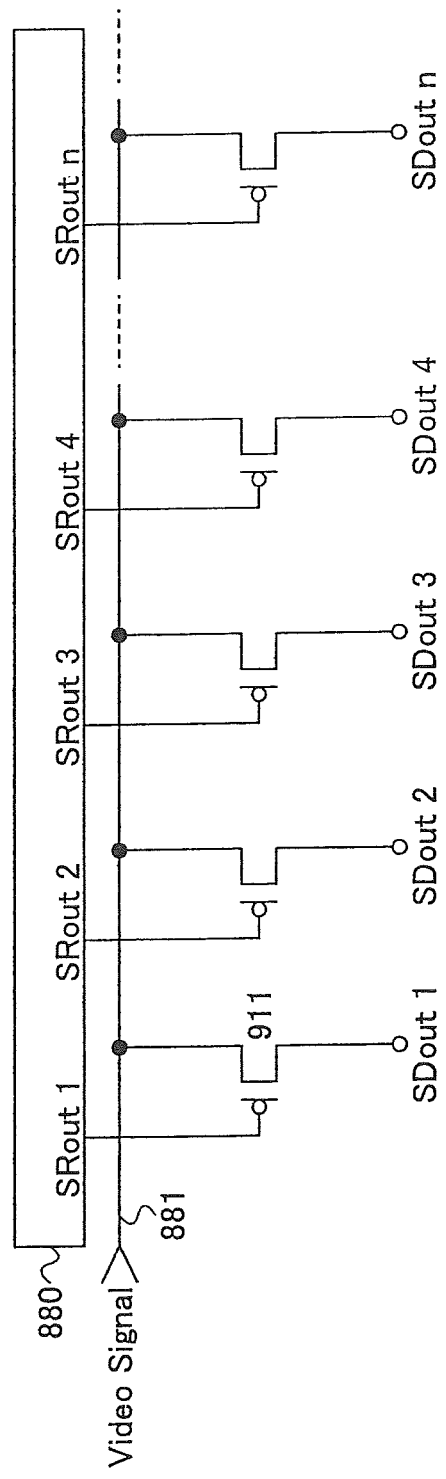
FIG. 91 is a diagram showing Embodiment Mode 4.

As another example, as shown in a source driver of FIG. 91, a transistor 911 may be connected as the switch SW. The transistor 911 is controlled to be turned on and off by the shift register circuit 880. When the transistor 911 is turned on, the output terminal SDout of the source driver outputs the video signal.

Note that the transistor 911 is a p-channel transistor.

Note that the transistor 911 has a function as a switch which selects whether to connect the video signal line 881 and the output terminal SDout of the source driver or not in accordance with the potential of the output terminal SRout of the shift register circuit 880. When the output terminal SRout of the shift register circuit 880 is at an L level, the video signal is supplied to the output terminal SDout of the source driver by the transistor 911.

Note that the shift register circuit 880 at this time is preferably formed by using a p-channel transistor. When the shift register circuit 880 is formed by using a p-channel transistor, simplification of a manufacturing process can be realized. Therefore, reduction in manufacturing cost and improvement in yield can be realized.

Note that this embodiment mode can be freely implemented in combination with any description in other embodiment modes and embodiments in this specification. That is, in a non-selection period, the transistor in the shift register circuit of the invention is turned on at regular intervals, so that a power supply potential to the output terminal is supplied. Therefore, the power supply potential is supplied to the output terminal of the shift register circuit through the transistor. Since the transistor is not always on in the non-selection period, the threshold voltage shift of the transistor can be suppressed. Further, the power supply potential is supplied to the output terminal of the shift register circuit through the transistor at regular intervals. Therefore, the shift register circuit can suppress noise which is generated in the output terminal.

Embodiment Mode 5

In this embodiment mode, a layout diagram of the flip-flop circuit shown in Embodiment Mode 1 is described.

Figure 122:
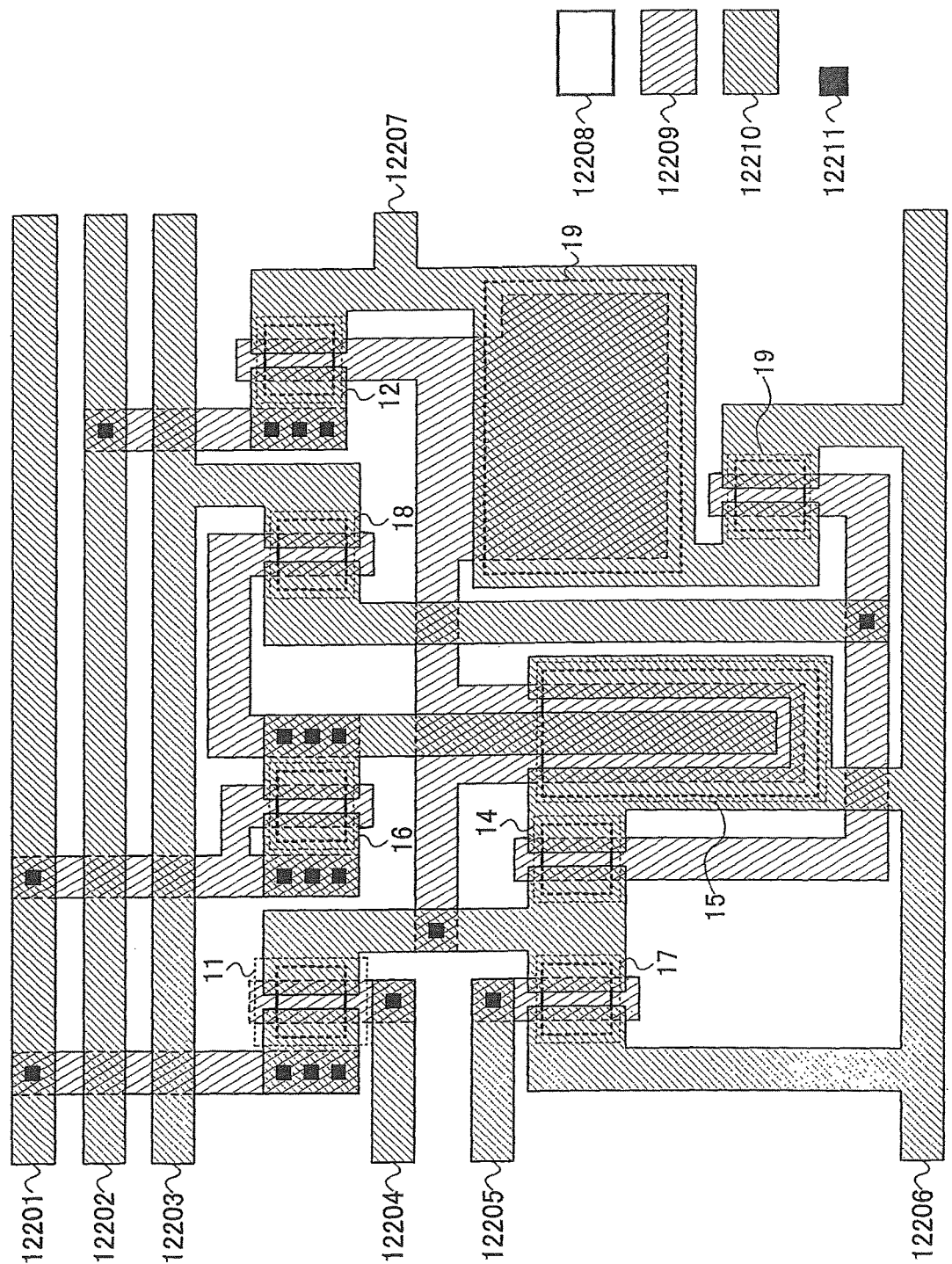
FIG. 122 is a diagram showing Embodiment Mode 4.

FIG. 122 is a layout diagram of the flip-flop circuit 10 shown in FIG. 1.

Note that the layout diagram of the flip-flop circuit 10 shown in FIG. 122 shows the case where the flip-flop circuit is formed by using a transistor made from amorphous silicon.

The flip-flop circuit in FIG. 122 includes a power supply line 12201, a control line 12202, a control line 12203, a control line 12204, a control line 12205, a power supply line 12206, an output terminal 12207, the transistor 11, the transistor 12, the transistor 13, the transistor 14, the transistor 15, the transistor 16, the transistor 17, and the transistor 18.

Reference numeral 12208 denotes a semiconductor layer. Reference numeral 12209 denotes a gate electrode and a gate wiring layer. Reference numeral 12210 denotes a second wiring layer. Reference numeral 12211 denotes a contact layer.

Connection relations of the flip-flop circuit shown in FIG. 122 is described. As shown in the flip-flop circuit 10, the gate terminal of the transistor 11 is connected to the input terminal IN1. The first terminal of the transistor 11 is connected to the first power supply. The second terminal of the transistor 11 is connected to the gate terminal of the transistor 12, the second terminal of the transistor 14, the gate terminal of the transistor 15, the second terminal of the transistor 17, and the second electrode of the capacitor 19. The first terminal of the transistor 15 is connected to the second power supply. The second terminal of the transistor 15 is connected to the second terminal of the transistor 16 and the gate terminal of the transistor 18. The gate terminal and the first terminal of the transistor 16 are connected to the first power supply. The first terminal of the transistor 18 is connected to the input terminal IN3. The second terminal of the transistor 18 is connected to the gate terminal of the transistor 13 and the gate terminal of the transistor 14. The first terminal of the transistor 13 is connected to the second power supply. The second terminal of the transistor 13 is connected to the first electrode of the capacitor 19, the second terminal of the transistor 12, and the output terminal OUT. The first terminal of the transistor 12 is connected to the input terminal IN2. The first terminal of the transistor 14 is connected to the second power supply. The gate terminal of the transistor 17 is connected to the input terminal IN4, and the first terminal of the transistor 17 is connected to the second power supply.

Note that the transistors 11 to 18 in FIG. 122 correspond to the transistors 11 to 18 in FIG. 1, respectively. The control line 12204, the control line 12202, the control line 12203, and the control line 12205 correspond to the input terminals 1N1 to 1N4 in FIG. 1, respectively. The output terminal 12207 corresponds to the output terminal Out in FIG. 1.

Note that in the layout diagram of the flip-flop circuit 10 in FIG. 122, a channel region of the transistor 15 is U-shaped. Note that as described above, the size of the transistor 15 is required to be large. Therefore, by making the channel region U-shaped like the transistor 15 in FIG. 122, the transistor 15 occupying a small area and having a large size (or a large W/L ratio) can be realized.

Note that line widths of the control line 12202 and the control line 12203 are larger than that of the power supply line 12201. In the flip-flop circuit of FIG. 122, a current or a voltage is supplied to the flip-flop circuit more from the control line 12202 and the control line 12203 than from the power supply line 12201. Therefore, an effect of a voltage drop of the control line 12202 and the control line 12203 can be reduced when the control line 12202 and the control line 12203 are wide.

Note that although the flip-flop circuit in FIG. 122 is formed using a transistor made from amorphous silicon, the invention is not limited to this.

Figure 123:
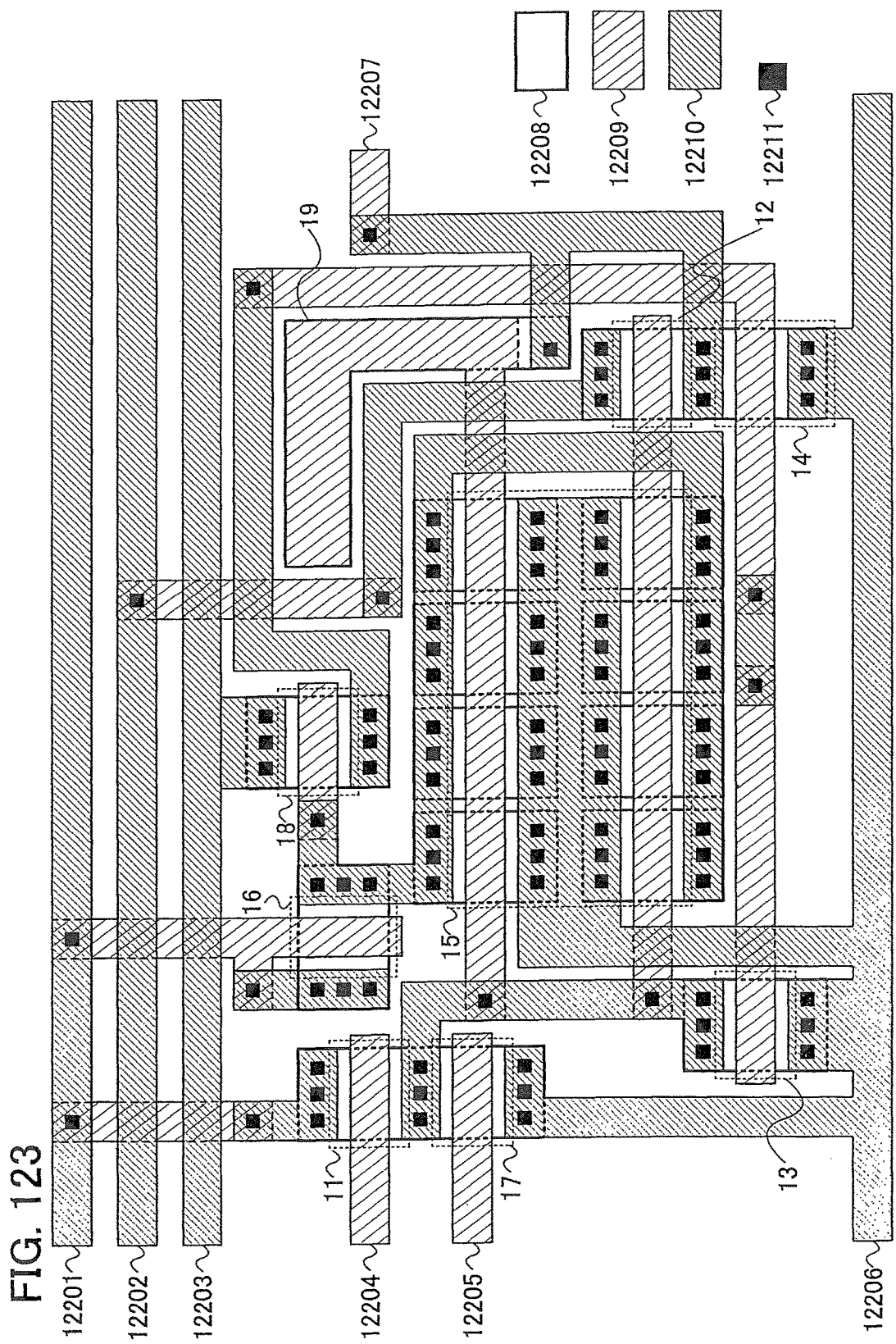
FIG. 123 is a diagram showing Embodiment Mode 5.

For example, as shown in a flip-flop circuit of FIG. 123, the flip-flop circuit may be formed by using a transistor made from polysilicon.

Here, the case where the flip-flop circuit is formed by using a transistor made from polysilicon is described.

The flip-flop circuit in FIG. 123 includes the power supply line 12201, the control line 12202, the control line 12203, the control line 12204, the control line 12205, the power supply line 12206, the output terminal 12207, the transistor 11, the transistor 12, the transistor 13, the transistor 14, the transistor 15, the transistor 16, the transistor 17, and the transistor 18.

The reference numeral 12208 denotes the semiconductor layer. The reference numeral 12209 denotes the gate electrode and the gate wiring layer. The reference numeral 12210 denotes the second wiring layer. The reference numeral 12211 denotes the contact layer.

Connection relations of the flip-flop circuit shown in FIG. 123 is described. As shown in the flip-flop circuit 10, the gate terminal of the transistor 11 is connected to the input terminal IN1. The first terminal of the transistor 11 is connected to the first power supply. The second terminal of the transistor 11 is connected to the gate terminal of the transistor 12, the second terminal of the transistor 14, the gate terminal of the transistor 15, the second terminal of the transistor 17, and the second electrode of the capacitor 19. The first terminal of the transistor 15 is connected to the second power supply. The second terminal of the transistor 15 is connected to the second terminal of the transistor 16 and the gate terminal of the transistor 18. The gate terminal and the first terminal of the transistor 16 are connected to the first power supply. The first terminal of the transistor 18 is connected to the input terminal IN3. The second terminal of the transistor 18 is connected to the gate terminal of the transistor 13 and the gate terminal of the transistor 14. The first terminal of the transistor 13 is connected to the second power supply. The second terminal of the transistor 13 is connected to the first electrode of the capacitor 19, the second terminal of the transistor 12, and the output terminal OUT. The first terminal of the transistor 12 is connected to the input terminal IN2. The first terminal of the transistor 14 is connected to the second power supply. The gate terminal of the transistor 17 is connected to the input terminal IN4, and the first terminal of the transistor 17 is connected to the second power supply.

Note that the power supply line 12201, the control line 12202, the control line 12203, the control line 12204, the control line 12205, the power supply line 12206, the output terminal 12207, the transistor 11, the transistor 12, the transistor 13, the transistor 14, the transistor 15, the transistor 16, the transistor 17, and the transistor 18 may be similar to those in FIG. 122.

Note that the semiconductor layer 12208, the gate wiring layer 12209 (a gate electrode layer), the second wiring layer 12210, and the contact layer 12211 may be similar to those in FIG. 122.

Note that in the layout diagram of the flip-flop circuit in FIG. 123, the gate terminal of the transistor 13 and the gate terminal of the transistor 14 are connected to each other thorough the second wiring layer 12210, and thereby the gate wiring layer 12209 can be shortened. In a manufacturing process of a semiconductor device, it is known that electrostatic discharge damage is likely to occur through the gate wiring layer 12209 if the gate wiring layer 12209 is long. Therefore, the gate terminal of the transistor 13 and the gate terminal of the transistor 14 are connected to each other thorough the second wiring layer 12210, so that electrostatic discharge damage through the gate wiring layer 12209 can be reduced. Reducing electrostatic discharge damage offers advantages such as improvement in yield, improvement in productivity, and long lifetime of a semiconductor device.

Note that the transistor 15 is provided with a plurality of channel regions. By dividing the channel region into a plurality of regions, heat generation of the transistor 15 can be reduced and characteristics deterioration of the transistor 15 can be suppressed.

Note that this embodiment mode can be freely implemented in combination with any description in other embodiment modes and embodiments in this specification. That is, in a non-selection period, the transistor in the shift register circuit of the invention is turned on at regular intervals, so that a power supply potential to the output terminal is supplied. Therefore, the power supply potential is supplied to the output terminal of the shift register circuit through the transistor. Since the transistor is not always on in the non-selection period, the threshold voltage shift of the transistor can be suppressed. Further, the power supply potential is supplied to the output terminal of the shift register circuit through the transistor at regular intervals. Therefore, the shift register circuit can suppress noise which is generated in the output terminal.

Embodiment 1

In this embodiment, structures of a display device, a gate driver, a source driver, and the like are described. Note that the semiconductor device of the invention can be applied to a part of the gate driver or the source driver.

Figure 92:
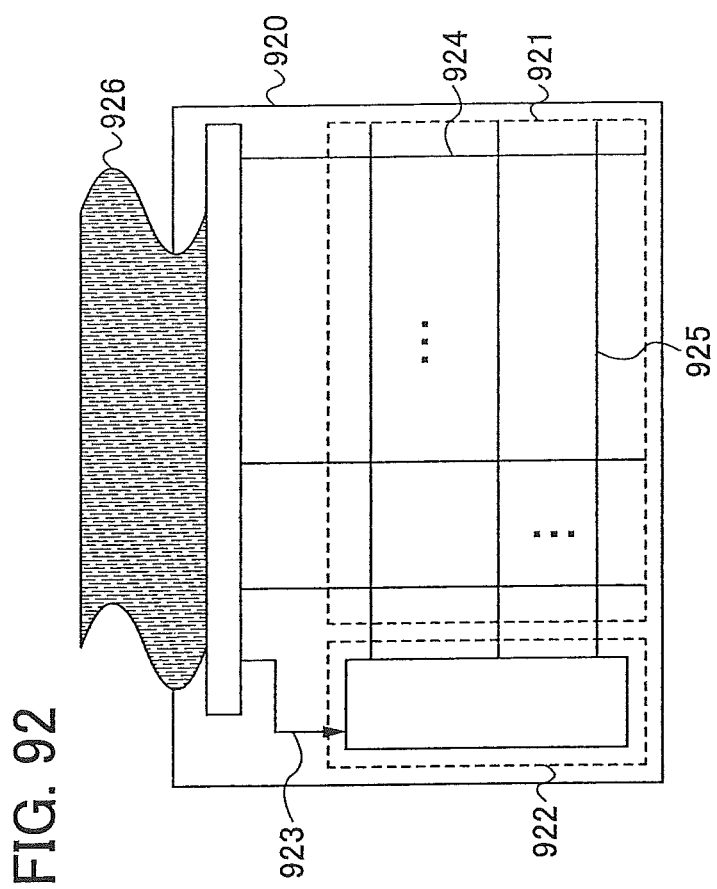
FIG. 92 is a diagram showing Embodiment 1.

FIG. 92 shows one mode of a display device to which the invention is applied. A display device 920 to which the invention is applied includes a pixel region 921, a gate driver 922, a control signal line 923, and an FPC 926. The pixel region 921 includes a pixel. The pixel includes a display element and a circuit for controlling the display element.

In FIG. 92, the FPC 926 is connected to the control signal line 923 and a source signal line 924. The gate driver 922 is connected to the control signal line 923 and a gate signal line 925.

Note that as the gate driver 922 similar to those described in Embodiment Mode 3 can be used.

Further, the number of the gate drivers 922 may be more than one.

As described above, a display device, which is a device including a display element, or a light-emitting device, which is a device including a light-emitting element, can employ various modes or include various element. For example, a display medium in which contrast is changed by an electrical or magnetic effect, such as an EL element (an organic EL element, an inorganic EL element, or an EL element including an organic compound and an inorganic compound), an electron-emissive element, a liquid crystal element, or electronic ink can be applied. Note that display devices using an EL element include an EL display; display devices using an electron-emissive element include a field emission display (FED), an SED type flat panel display (Surface-conduction Electron-emitter Display), and the like; display devices using a liquid crystal element include a liquid crystal display; and display devices using electronic ink include electronic paper.

An operation of the display device 920 is briefly described.

The gate driver 922 outputs selection signals sequentially to the pixel region 921 through the gate signal line 925. An external circuit outputs video signals sequentially to the pixel region 921 through the FPC 926 and the source signal line 924. The external circuit is not shown in the figure. In the pixel region 921, an image is displayed by controlling a state of light in accordance with the video signal.

Note that a control signal is supplied to the control signal line 923 from the external circuit and the gate driver 922 is controlled by the control signal. For example, a start pulse, a clock signal, an inverted clock signal, or the like is used as the control signal.

Note that the video signal may be a voltage value input or a current value input. For example, when a liquid crystal element is used as the display element, the video signal is preferably a voltage value input. This is because a tilt of the liquid crystal element is controlled by en electric field, so that the liquid crystal element can be controlled more easily by a video signal having a voltage value.

Note that the video signal may be either a digital value or an analog value. For example, when a liquid crystal element is used as the display element, the video signal is preferably an analog value. This is because a response speed of the liquid crystal element is slow, so that the liquid crystal element can be controlled by supplying the video signal having an analog value only once in one frame period.

Note that although the FPC 926 is formed of one FPC 926, the invention is not necessarily limited to this. The FPC 926 may be divided into a plurality of FPCs.

Figure 93:
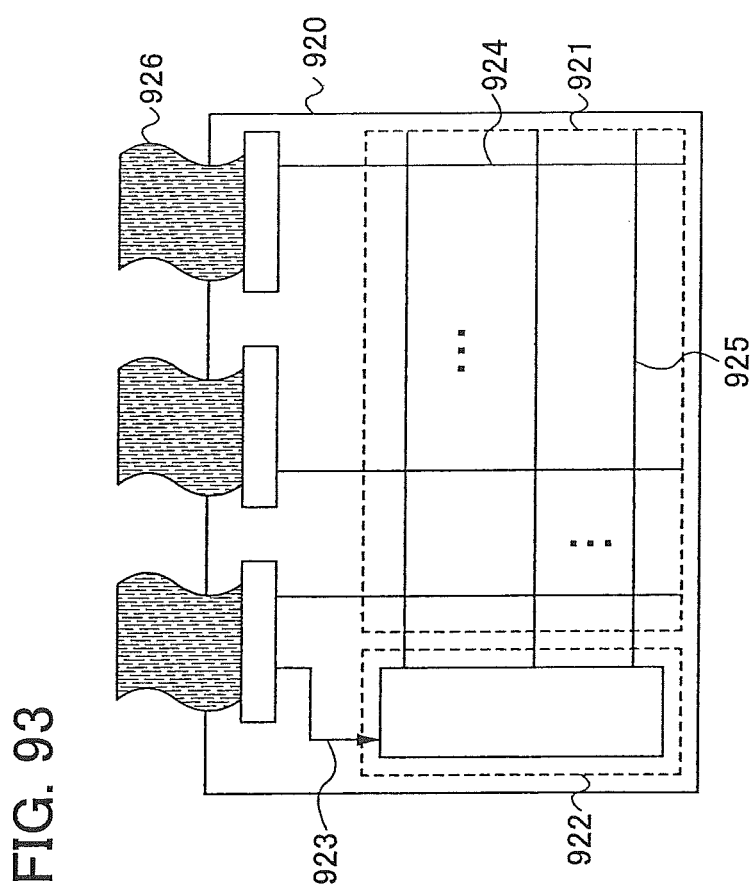
FIG. 93 is a diagram showing Embodiment 1.

For example, as shown in the display device 920 of FIG. 93, the FPC 926 may be divided into three. This is because even in the case where the display device is large or the case where the number of connections between the FPC 926 and the display device 920 is large, a conventional FPC and a conventional FPC pressure bonding device can be used, and thereby manufacturing cost can be reduced. Further, if the connection between the FPC 926 and the display device 920 fails, only an FPC 926 which fails to connect needs to be changed; therefore, manufacturing cost can be reduced.

Note that the video signal may be output to the pixel region 921 through any circuit and any element.

Figure 94:
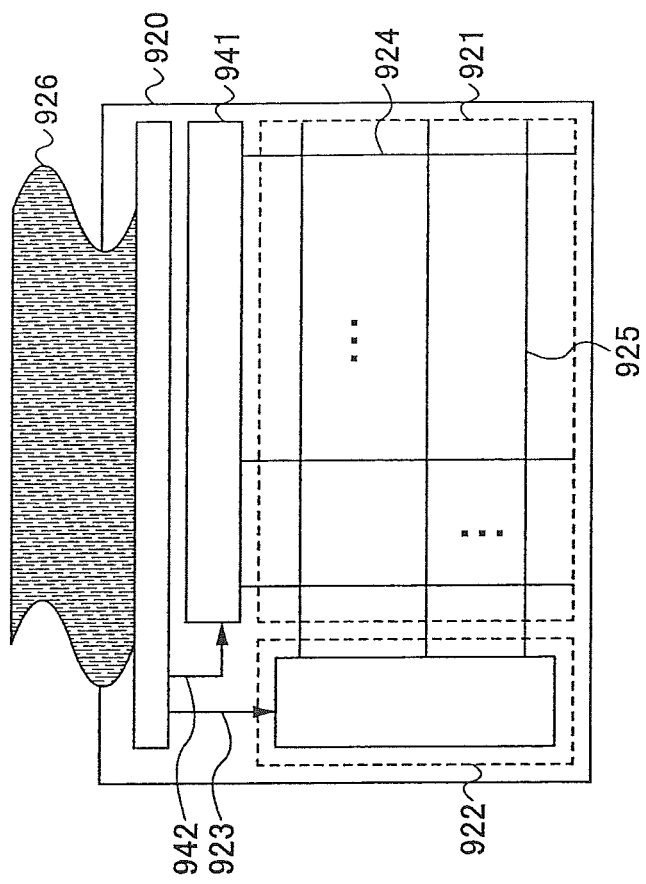
FIG. 94 is a diagram showing Embodiment 1.

For example, as shown in FIG. 94, the video signal may be output to the pixel region 921 through a signal line control circuit 941. This is because when the signal line control circuit 941 has various functions, a structure of the external circuit can be simplified; therefore, cost of the display device as a whole can be reduced. Further, the number of connections between the FPC 926 and the display device 920 can be greatly reduced.

Note that the video signal and the control signal are supplied to the signal line control circuit 941 through a control signal line 942.

As described above, various structures can be applied to the display device of the invention.

Note that in this embodiment, although the structures of various display devices are shown, a structure of the display device of the invention is not limited to these display devices.

Note that this embodiment can be freely implemented in combination with any description in other embodiment modes and embodiments in this specification. That is, in a non-selection period, the transistor is turned on at regular intervals, so that the gate driver and the source driver provided with the shift register circuit of the invention supply a power supply potential to the output terminal. Therefore, the power supply potential is supplied to the output terminal of the shift register circuit through the transistor. Since the transistor is not always on in the non-selection period, the threshold voltage shift of the transistor can be suppressed. Further, the power supply potential is supplied to the output terminal of the shift register circuit through the transistor at regular intervals. Therefore, the shift register circuit can suppress noise which is generated in the output terminal.

Embodiment 2

Next, a specific structure of the signal line control circuit 941 described in Embodiment 1 is described.

As the signal line control circuit 941, the source driver described in Embodiment Mode 4 can be applied.

Figure 95:
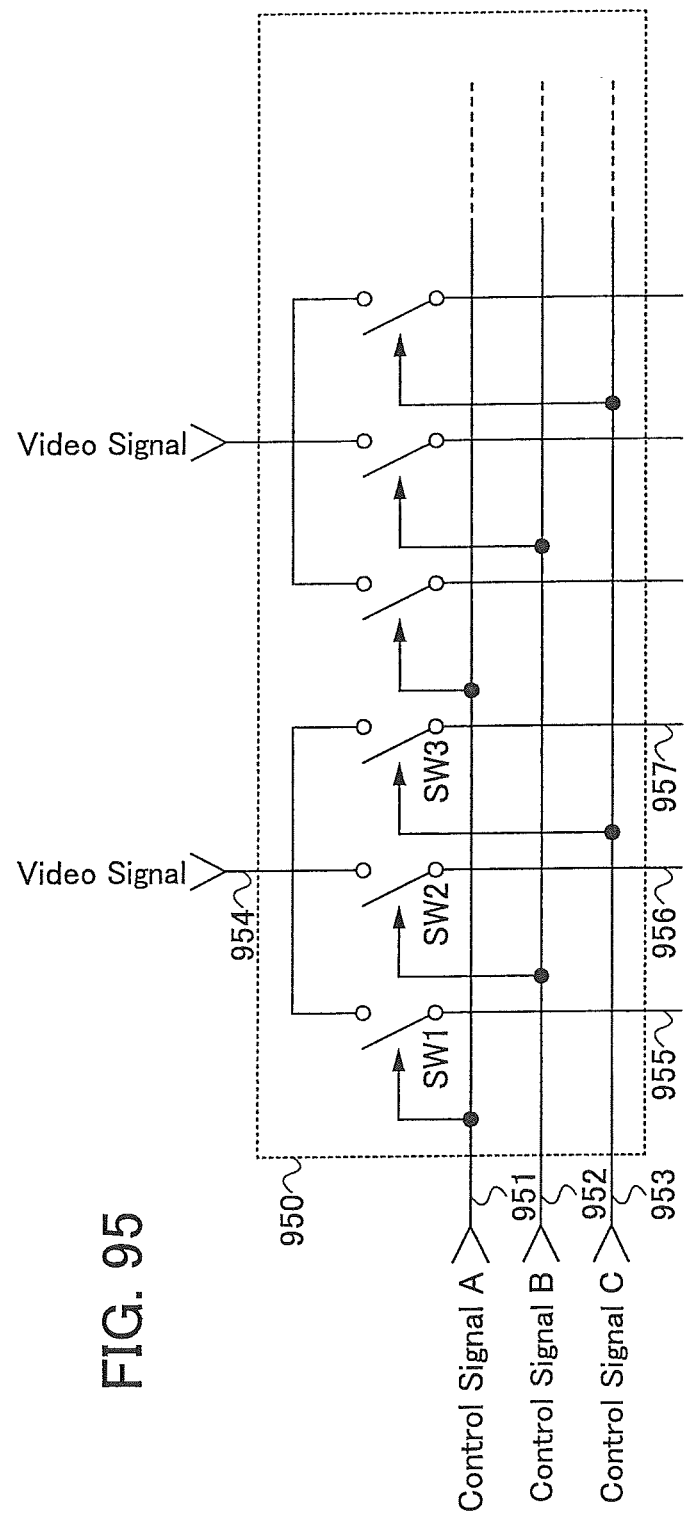
FIG. 95 is a diagram showing Embodiment 2.

FIG. 95 shows one mode of the signal line control circuit 941 different from the source driver described in Embodiment Mode 4. A signal line control circuit 950 in FIG. 95 includes a plurality of switches SW.

As shown in FIG. 95, a video signal line 954 is connected to a first terminal of a switch SW1, a first terminal of a switch SW2, and a first terminal of a switch SW3. A second terminal of the switch SW1 is connected to a source signal line 955. A second terminal of the switch SW2 is connected to a source signal line 956. A second terminal of the switch SW3 is connected to a source signal line 957. A control terminal of the switch SW1 is connected to a control signal line 951. A control terminal of the switch SW2 is connected to a control signal line 952. A control terminal of the switch SW3 is connected to a control signal line 953. The video signal line 954, the control signal line 951, the control signal line 952, and the control signal line 953 are connected to an external circuit through an FPC.

Note that a control signal A is supplied to the control signal line 951. A control signal B is supplied to the control signal line 952. A control signal C is supplied to the control signal line 953. A video signal is supplied to the video signal line 954.

As described above, an electrical switch or a mechanical switch can be used as the switches SW1 to SW3, for example. That is, any element which can control a flow of current can be employed and the switch is not limited to a specific element. A transistor, a diode, or a logic circuit that is a combination thereof may be employed. When a transistor is used as a switch, a polarity (conductivity type) thereof is not specifically limited since the transistor is operated as a mere switch. However, in the case where an off-current is preferably small, a transistor with a polarity of a smaller off-current is preferably used. As a transistor with a small off-current, a transistor provided with an LDD region, a transistor having a multi-gate structure, or the like may be used. In addition, an n-channel transistor is preferably used when operating in a state where a potential of a source terminal of the transistor, which operates as a switch, is close to a low potential side power supply (Vss, GND, 0V, or the like), whereas a p-channel transistor is preferably used when operating in a state where a potential of a source terminal of the transistor is close to a high potential side power supply (Vdd or the like). This is because the transistor can easily function as a switch since the absolute value of a gate-source voltage thereof can be made to be large. Note that a CMOS type switch may also be applied by using both an n-channel transistor and a p-channel transistor.

An operation of the signal line control circuit 950 in FIG. 95 is described.

The control signal A, the control signal B, and the control signal C are signals for turning on the switch SW1, the switch SW2, and the switch SW3 sequentially. A value of the video signal is changed in accordance with on and off states of the switch SW1, the switch SW2, and the switch SW3.

First, the switch SW1 is turned on by the control signal A. At this time, the switch SW2 is turned off by the control signal B and the switch SW3 is turned off by the control signal C. Therefore, the video signal is supplied to the source signal line 955 through the video signal line 954 and the switch SW1. Since the switch SW2 and the switch SW3 are off at this time, the video signal is not supplied to the source signal line 956 and the source signal line 957.

Next, the switch SW2 is turned on by the control signal B. At this time, the switch SW1 is turned off by the control signal A and the switch SW3 is turned off by the control signal C. Therefore, the video signal is supplied to the source signal line 956 through the video signal line 954 and the switch SW2. Since the switch SW1 and the switch SW3 are off at this time, the video signal is not supplied to the source signal line 955 and the source signal line 957.

Next, the switch SW3 is turned on by the control signal C. At this time, the switch SW1 is turned off by the control signal A and the switch SW2 is turned off by the control signal B. Therefore, the video signal is supplied to the source signal line 957 through the video signal line 954 and the switch SW3. Since the switch SW1 and the switch SW2 are off at this time, the video signal is not supplied to the source signal line 955 and the source signal line 956.

By such an operation as described above, the video signal is supplied to three lines of the source signal line 955, the source signal line 956, and the source signal line 957 using one video signal line 954. That is, the number of the video signal lines 954 is one third of the number of the source signal lines; therefore, the number of connections between the FPC and a display device is greatly reduced. Accordingly, a failure ratio of a connection between the FPC and the display device is greatly reduced.

Note that although the signal line control circuit 950 in FIG. 95 includes three switches SW, the invention is not limited to this. The number of the switches is not limited. The number of the control signals are required to be changed in accordance with the number of switches SW. For example, in the case of providing four switches SW, four control signals are provided.

Note that the signal line control circuit 950 in FIG. 95 may be provided with a period when none of the switches SW1 to SW3 is turned on since image defect such as crosstalk can be reduced. That is, when a new video signal is supplied to the source signal line, a potential of the source signal line is not changed immediately. This is because when an effect of a previous potential remains in the source signal line in some cases, image defect such as crosstalk occurs. This period is a preparation period for writing to a next row.

Note that the control signal A, the control signal B, and the control signal C may be supplied by the shift register circuit in Embodiment Mode 2. At this time, the shift register circuit includes three or more flip-flop circuits. Preferably, the shift register circuit includes three or more flip-flop circuits and five or less flip-flop circuits.

Note that in the display device 920, the signal line control circuit 950 is formed over the same substrate, so that the number of connections between the FPC and the display device 920 can be further reduced.

As described above, various signal control circuits can be used for the display device of the invention.

Note that in this embodiment, although various signal control circuits are shown, a signal control circuit to which can be applied to the display device of the invention is not limited to these signal control circuits.

Note that this embodiment can be freely implemented in combination with any description in other embodiment modes and embodiments in this specification. That is, in a non-selection period, the transistor is turned on at regular intervals, so that the signal control circuit provided with the shift register circuit of the invention supplies a power supply potential to the output terminal. Therefore, the power supply potential is supplied to the output terminal of the shift register circuit through the transistor. Since the transistor is not always on in the non-selection period, the threshold voltage shift of the transistor can be suppressed. Further, the power supply potential is supplied to the output terminal of the shift register circuit through the transistor at regular intervals. Therefore, the shift register circuit can suppress noise which is generated in the output terminal.

Embodiment 3

Next, a specific structure of the pixel described in Embodiment 1 is described.

Figure 96:
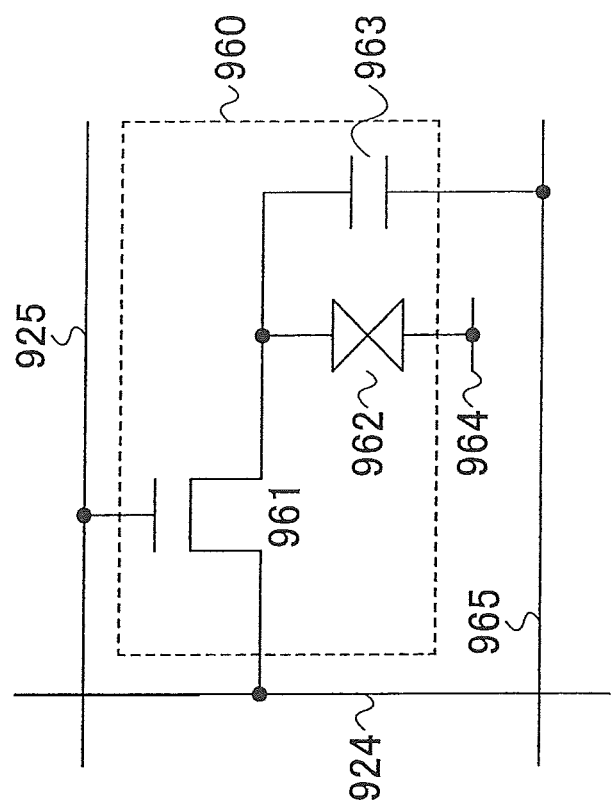
FIG. 96 is a diagram showing Embodiment 3.

FIG. 96 shows one mode of a pixel. A pixel 960 in FIG. 96 includes a transistor 961, a liquid crystal element 962 having two electrodes, and a capacitor 963 having two electrodes.

As shown in the pixel 960 of FIG. 96, a first terminal of the transistor 961 is connected to the source signal line 924. A second terminal of the transistor 961 is connected to a first electrode of the liquid crystal element 962 and a first electrode of the capacitor 963. A gate terminal of the transistor 961 is connected to the gate signal line 925. A second electrode of the liquid crystal element 962 is an opposite electrode 964. A second electrode of the capacitor 963 is connected to a common line 965.

Note that a video signal is supplied to the source signal line 924. A selection signal is supplied to the gate signal line 925. The source signal line 924 and the gate signal line 925 may be similar to those in Embodiment 1.

Note that a common potential is supplied to the common line 965. A substrate potential is supplied to the opposite electrode 964. The common potential and the substrate potential are constant potentials.

The transistor 961 is an n-channel transistor.

Operations of the pixel 960 in FIG. 96 in the case where the selection signal is supplied to the gate signal line 925 (H level) and the case where the selection signal is not supplied (L level) are described, respectively. A first period is a period when the selection signal is supplied to the gate signal line 925. A second period is a period when the selection signal is not supplied.

First, the first period is described. The gate signal line 925 is at an H level, and the transistor 961 is turned on. The source signal line 924 is electrically connected to the first electrode of the liquid crystal element 962 and the first electrode of the capacitor 963. Potentials of the first electrode of the liquid crystal element 962 and the first electrode of the capacitor 963 become the same potential as that of the source signal line 924.

Here, the potential of the source signal line 924 corresponds to the video signal.

Light transmittance of the liquid crystal element 962 is determined by a potential corresponding to the video signal. The potential corresponding to the video signal is held in the capacitor 963.

Next, the second period is described. The gate signal line 925 is at an L level, and the transistor 961 is turned off. The source signal line 924 is electrically disconnected from the first electrode of the liquid crystal element 962 and the first electrode of the capacitor 963. Therefore, the potential corresponding to the video signal input previously is maintained as the potentials of the first electrode of the liquid crystal element 962 and the first electrode of the capacitor 963, and thereby the light transmittance of the liquid crystal element 962 is maintained as well.

Here, functions of the transistor 961 and the capacitor 963 are described below.

The transistor 961 has a function as a switch which selects whether the source signal line 924 is connected to the first electrode of the liquid crystal element 962 and the first electrode of the capacitor 963 in accordance with a potential of the gate signal line 925. In the first period, the transistor 961 has a function to supply the video signal to the pixel 960.

The capacitor 963 has a function to hold the video signal. In the first period, the video signal is supplied to the capacitor 963, which has a function to hold the video signal. In the second period, the capacitor 963 has a function to hold the video signal until the next first period.

As described above, active drive of the pixel 960 can be achieved. When the other transistors over the substrate over which the pixel 960 is formed are n-channel transistors, simplification of a manufacturing process can be realized. Therefore, reduction in manufacturing cost and improvement in yield can be realized.

Note that the second electrode of the capacitor 963 can be connected to anywhere as long as the second electrode of the capacitor 963 is held at a constant potential in an operation period of the pixel 960. For example, the second electrode of the capacitor 963 may be connected to the gate signal line 925 of a previous row. This is because the common line 965 is not required to be provided; therefore, an aperture ratio of the pixel 960 is increased.

Note that although a constant potential is supplied to the opposite electrode 964, the invention is not limited to this. For example, when the pixel 960 is reversely driven, a potential of the opposite electrode 964 may be changed corresponding to the reverse drive. At this time, in the case where the video signal is a positive potential, the potential of the opposite electrode 964 is a negative potential. In the case where the video signal is a negative potential, the potential of the opposite electrode 964 is a positive potential.

Although the pixel in FIG. 96 which is formed by using an n-channel transistor is described, a pixel may be formed by using a p-channel transistor. Here, FIG. 120 shows a pixel formed by using a p-channel transistor.

Figure 120:
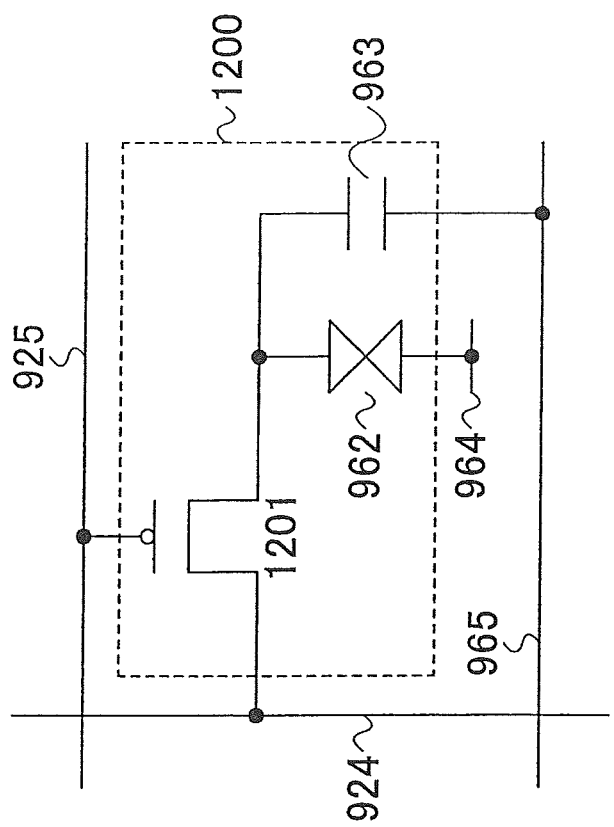
FIG. 120 is a diagram showing Embodiment 3.

FIG. 120 shows one mode of a pixel. A pixel 1200 in FIG. 120 includes a transistor 1201, the liquid crystal element 962 having the two electrodes, and the capacitor 963 having the two electrodes.

As shown in the pixel 1200 of FIG. 120, a first terminal of the transistor 1201 is connected to the source signal line 924. A second terminal of the transistor 1201 is connected to the first electrode of the liquid crystal element 962 and the first electrode of the capacitor 963. A gate terminal of the transistor 1201 is connected to the gate signal line 925. The second electrode of the liquid crystal element 962 is the opposite electrode 964. The second electrode of the capacitor 963 is connected to the common line 965.

Note that a video signal is supplied to the source signal line 924. A selection signal is supplied to the gate signal line 925. The source signal line 924 and the gate signal line 925 may be similar to those in Embodiment 1.

Note that the common potential is supplied to the common line 965. The substrate potential is supplied to the opposite electrode 964. The common potential and the substrate potential are constant potentials.

Note that the liquid crystal element 962, the capacitor 963, the opposite electrode 964, and the common line 965 may be similar to those in FIG. 96.

The transistor 1201 is a p-channel transistor.

Operations of the pixel 1200 in FIG. 120 in the case where the selection signal is supplied to the gate signal line 925 (L level) and the case where the selection signal is not supplied (H level) are described, respectively. The first period is a period when the selection signal is supplied to the gate signal line 925. The second period is a period when the selection signal is not supplied.

First, the first period is described. The gate signal line 925 is at an L level, and the transistor 1201 is turned on. The source signal line 924 is electrically connected to the first electrode of the liquid crystal element 962 and the first electrode of the capacitor 963. The potentials of the first electrode of the liquid crystal element 962 and the first electrode of the capacitor 963 become the same potential as that of the source signal line 924.

Here, the potential of the source signal line 924 corresponds to the video signal.

Light transmittance of the liquid crystal element 962 is determined by the potential corresponding to the video signal. The potential corresponding to the video signal is held in the capacitor 963.

Next, the second period is described. The gate signal line 925 is at an H level, and the transistor 1201 is turned off. The source signal line 924 is electrically disconnected from the first electrode of the liquid crystal element 962 and the first electrode of the capacitor 963. Therefore, the potential corresponding to the video signal input previously is maintained as the potentials of the first electrode of the liquid crystal element 962 and the first electrode of the capacitor 963, and thereby the light transmittance of the liquid crystal element 962 is maintained as well.

Here, functions of the transistor 1201 and the capacitor 963 are described below.

The transistor 1201 has a function as a switch which selects whether the source signal line 924 is connected to the first electrode of the liquid crystal element 962 and the first electrode of the capacitor 963 in accordance with the potential of the gate signal line 925. In the first period, the transistor 1201 has a function to supply the video signal to the pixel 1200.

As described above, active drive of the pixel 1200 can be achieved. When the other transistors over the substrate over which the pixel 1200 is formed are p-channel transistors, simplification of a manufacturing process can be realized. Therefore, reduction in manufacturing cost and improvement in yield can be realized.

Note that the second electrode of the capacitor 963 can be connected to anywhere as long as the second electrode of the capacitor 963 is held at a constant potential in an operation period of the pixel 1200. For example, the second electrode of the capacitor 963 may be connected to the gate signal line 925 of a previous row. This is because the common line 965 is not required to be provided; therefore, an aperture ratio of the pixel 1200 is increased.

Note that although a constant potential is supplied to the opposite electrode 964, the invention is not limited to this. For example, when the pixel 1200 is reversely driven, the potential of the opposite electrode 964 may be changed corresponding to the reverse drive. At this time, in the case where the video signal is a positive potential, the potential of the opposite electrode 964 is a negative potential. In the case where the video signal is a negative potential, the potential of the opposite electrode 964 is a positive potential.

Figure 97:
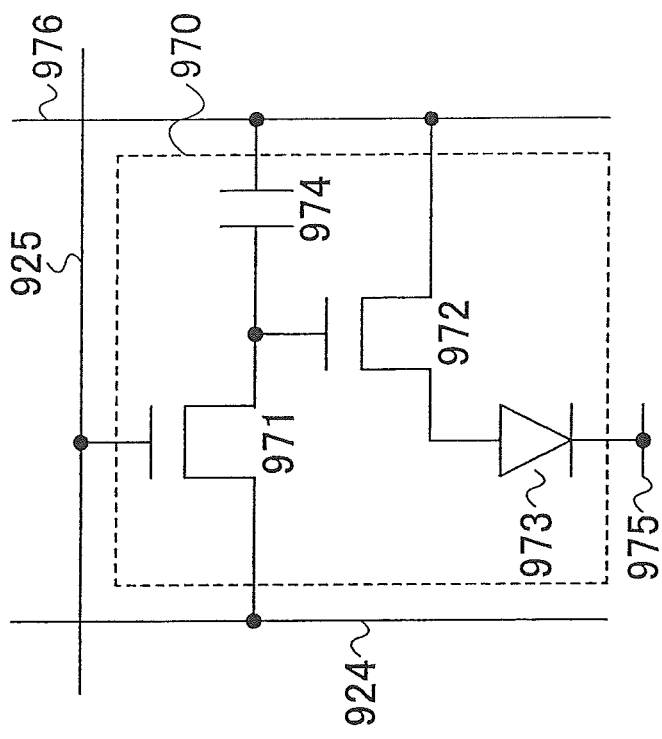
FIG. 97 is a diagram showing Embodiment 3.

FIG. 97 shows another mode of a pixel. A pixel 970 in FIG. 97 includes a transistor 971, a transistor 972, a display element 973 having two electrodes, and a capacitor 974 having two electrodes.

As shown in the pixel 970 of FIG. 97, a first terminal of the transistor 971 is connected to the source signal line 924. A second terminal of the transistor 971 is connected to a gate terminal of the transistor 972 and a first electrode of the capacitor 974. A gate terminal of the transistor 971 is connected to the gate signal line 925. A second electrode of the capacitor 974 is connected to a power supply line 976. A first terminal of the transistor 972 is connected to the power supply line 976. A second terminal of the transistor 972 is connected to a first electrode of the display element 973. A second electrode of the display element 973 is a common electrode 975.

Note that a video signal is supplied to the source signal line 924. A selection signal is supplied to the gate signal line 925. The source signal line 924 and the gate signal line 925 may be similar to those in Embodiment 1.

Note that an anode potential is supplied to the power supply line 976. A cathode potential is supplied to the common electrode 975. The anode potential is higher than the cathode potential.

Each of the transistors 971 and 972 is an n-channel transistor.

Operations of the pixel 970 in FIG. 97 in the case where the selection signal is supplied to the gate signal line 925 (H level) and the case where the selection signal is not supplied (L level) are described, respectively. The first period is a period when the selection signal is supplied to the gate signal line 925. The second period is a period when the selection signal is not supplied.

First, the first period is described. The gate signal line 925 is at an H level, and the transistor 971 is turned on. The source signal line 924 is electrically connected to the gate terminal of the transistor 972 and the first electrode of the capacitor 974. Potentials of the gate terminal of the transistor 972 and the first electrode of the capacitor 974 become the same potential as the source signal line 924.

Here, the potential of the source signal line 924 corresponds to the video signal.

A current value of the transistor 972 is determined by a potential difference (Vgs) between a potential corresponding to the video signal and a potential of the second terminal of the transistor 972, and the same current as the transistor 972 flows to the display element 973. In this case, an operating point of the transistor 972 and the display element 973 is required to be set in a saturation region. Thus, a current value of the display element 973 can be freely determined by the video signal.

Note that when the operating point of the transistor 972 and the display element 973 is set in a linear region, the first electrode of the display element 973 is electrically connected to the power supply line 976 through the transistor 972, and a voltage approximately equal to a potential of the power supply line 976 is applied to the first electrode of the display element 973. It is advantageous to set the operating point of the transistor 972 and the display element 973 in the linear region since the current value of the transistor 972 is not affected by characteristics variation and deterioration of the transistor 972.

Next, the case where the selection signal is not supplied to the gate signal line 925 is described. The gate signal line 925 is at an L level, and the transistor 971 is turned off. The source signal line 924 is electrically disconnected from the second terminal of the transistor 972. Therefore, Vgs of the transistor 972 is held since the potential corresponding to the video signal input previously is maintained as the potential of the second terminal of the transistor 972, and thereby the current value of the display element 973 is held as well.

Here, functions of the transistor 971, the transistor 972, and the capacitor 974 are described below.

The transistor 971 has a function as a switch which selects whether the source signal line 924 is connected to the gate terminal of the transistor 972 and the first electrode of the capacitor 974 in accordance with a potential of the gate signal line 925. In the first period, the transistor 971 has a function to supply the video signal to the pixel 970.

The transistor 972 has a function as a driving transistor which supplies a current or a voltage to the display element 973 in accordance with potentials of the gate terminal of the transistor 972 and the first electrode of the capacitor 974. When the operating point of the transistor 972 and the display element 973 is set in the saturation region, the transistor 972 has a function as a current source which supplies a current to the display element 973. When the operating point of the transistor 972 and the display element 973 is set in the linear region, the transistor 972 has a function as a switch which selects whether to connect the power supply line 976 and the first electrode of the display element 973.

The capacitor 974 has a function to hold the video signal. In the first period, the video signal is supplied to the capacitor 974, which has a function to hold the video signal. In the second period, the capacitor 974 has a function to hold the video signal until the next first period.

As described above, active drive of the pixel 970 can be achieved. When the other transistors over the substrate over which the pixel 970 is formed are n-channel transistors, simplification of a manufacturing process can be realized. Therefore, reduction in manufacturing cost and improvement in yield can be realized.

Note that the second electrode of the capacitor 974 can be connected to anywhere as long as the second electrode of the capacitor 974 is held at a constant potential in an operation period of the pixel 970. For example, the second electrode of the capacitor 974 may be connected to the gate signal line 925 of a previous row.

Figure 98:
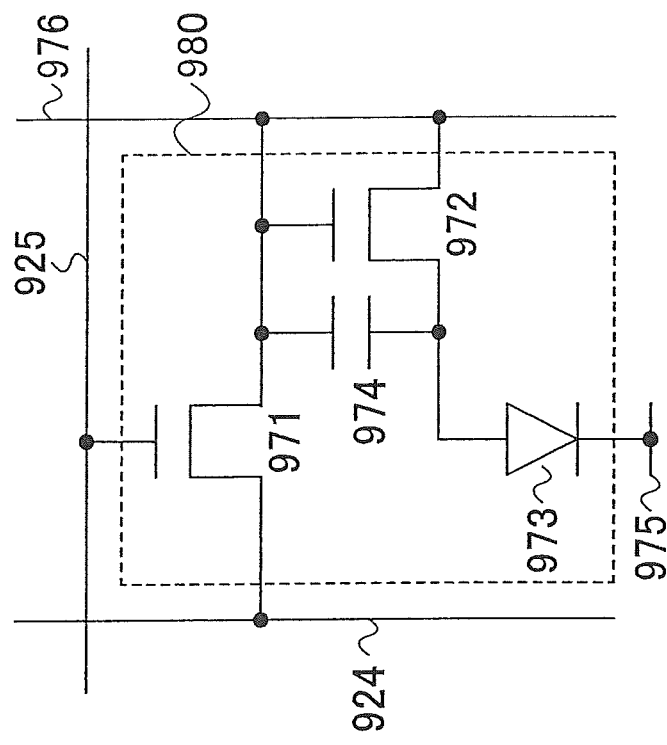
FIG. 98 is a diagram showing Embodiment 3.

As another example, as shown in a pixel 980 of FIG. 98, the second electrode of the capacitor 974 may be connected to the second terminal of the transistor 972. This is because a potential of the gate terminal of the transistor 972 is changed according to change in the potential of the second terminal of the transistor 972; therefore, more accurate current is supplied to the display element. That is, when the potential of the second terminal of the transistor 972 is changed, the potential of the gate terminal of the transistor 972 is changed simultaneously in accordance with the capacitive coupling of the capacitor 974. A so-called bootstrap operation is performed.

Although the pixel in FIG. 97 which is formed by using all n-channel transistors is described, a pixel may be formed by using all p-channel transistors. Here, FIG. 121 shows a pixel formed by using all p-channel transistors.

Figure 121:
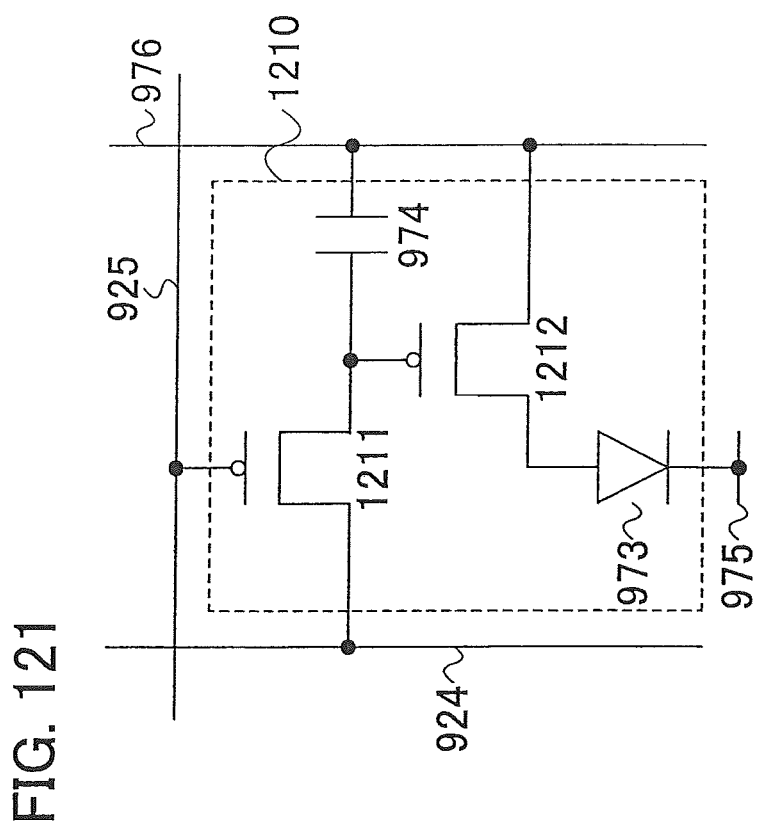
FIG. 121 is a diagram showing Embodiment 3.

FIG. 121 shows another mode of a pixel. A pixel 1210 in FIG. 121 includes a transistor 1211, a transistor 1212, the display element 973 having two electrodes, and the capacitor 974 having two electrodes.

As shown in the pixel 1210 of FIG. 121, a first terminal of the transistor 1211 is connected to the source signal line 924. A second terminal of the transistor 1211 is connected to a gate terminal of the transistor 1212 and the first electrode of the capacitor 974. A gate terminal of the transistor 1211 is connected to the gate signal line 925. The second electrode of the capacitor 974 is connected to the power supply line 976. A first terminal of the transistor 1212 is connected to the power supply line 976. A second terminal of the transistor 1212 is connected to the first electrode of the display element 973. The second electrode of the display element 973 is the common electrode 975.

Note that a video signal is supplied to the source signal line 924. A selection signal is supplied to the gate signal line 925. The source signal line 924 and the gate signal line 925 may be similar to those in Embodiment 1.

Note that the anode potential is supplied to the power supply line 976. The cathode potential is supplied to the common electrode 975. The anode potential is higher than the cathode potential.

Note that the display element 973, the capacitor 974, the common electrode 975, and the power supply line 976 may be similar to those in FIG. 97.

The transistor 1211 and the transistor 1212 are p-channel transistors.

Operations of the pixel 1210 in FIG. 121 in the case where the selection signal is supplied to the gate signal line 925 (L level) and the case where the selection signal is not supplied (H level) are described, respectively. The first period is a period when the selection signal is supplied to the gate signal line 925. The second period is a period when the selection signal is not supplied.

First, the first period is described. The gate signal line 925 is at an L level, and the transistor 1211 is turned on. The source signal line 924 is electrically connected to a gate terminal of the transistor 1212 and the first electrode of the capacitor 974. Potentials of the gate terminal of the transistor 1212 and the first electrode of the capacitor 974 become the same potential as the source signal line 924.

Here, the potential of the source signal line 924 corresponds to the video signal.

A current value of the transistor 1212 is determined by a potential difference (Vgs) between a potential corresponding to the video signal and a potential of the power supply line 976, and the same current flows to the display element 973. In this case, an operating point of the transistor 1212 and the display element 973 is required to be set in the saturation region. Thus, a current value of the display element 973 can be freely determined by the video signal.

Note that when the operating point of the transistor 1212 and the display element 973 is set in a linear region, the first electrode of the display element 973 is electrically connected to the power supply line 976 through the transistor 1212, and a voltage of the first electrode of the display element 973 is applied thereto. It is advantageous to set the operating point of the transistor 1212 and the display element 973 in the linear region since the current value of the transistor 1212 is not affected by characteristics variation and deterioration of the transistor 1212.

Next, the case where the selection signal is not supplied to the gate signal line 925 is described. The gate signal line 925 is at an H level, and the transistor 1211 is turned off. The source signal line 924 is electrically disconnected from the second terminal of the transistor 1212. Therefore, Vgs of the transistor 1212 is held since the potential corresponding to the video signal input previously is maintained as a potential of the second terminal of the transistor 1212, and thereby the current value of the display element 973 is held as well.

Here, functions of the transistor 1211 and the transistor 1212 are described below.

The transistor 1211 has a function as a switch which selects whether the source signal line 924 is connected to the gate terminal of the transistor 1212 and the first electrode of the capacitor 974 in accordance with the potential of the gate signal line 925. In the first period, the transistor 1211 has a function to supply the video signal to the pixel 1210.

The transistor 1212 has a function as a driving transistor which supplies a current or a voltage to the display element 973 in accordance with potentials of the gate terminal of the transistor 1212 and the second electrode of the capacitor 974. When the operating point of the transistor 1212 and the display element 973 is set in the saturation region, the transistor 1212 has a function as a current source which supplies a current to the display element 973. When the operating point of the transistor 1212 and the display element 973 is set in the linear region, the transistor 1212 has a function as a switch which selects whether to connect the power supply line 976 and the first electrode of the display element 973.

As described above, active drive of the pixel 970 can be achieved. When the other transistors over the substrate over which the pixel 970 is formed are n-channel transistors, simplification of a manufacturing process can be realized. Therefore, reduction in manufacturing cost and improvement in yield can be realized.

Note that the second electrode of the capacitor 974 can be connected to anywhere as long as the second electrode of the capacitor 974 is held at a constant potential in an operation period of the pixel 1210. For example, the second electrode of the capacitor 974 may be connected to the gate signal line 925 of a previous row.

Figure 99:
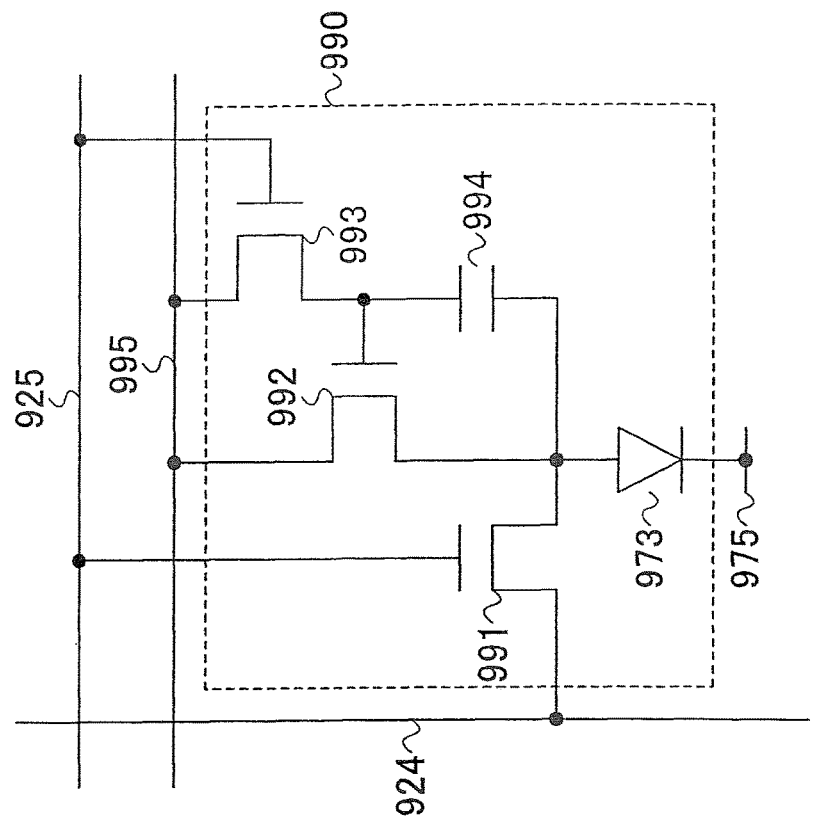
FIG. 99 is a diagram showing Embodiment 3.

FIG. 99 shows another mode of a pixel. A pixel 990 in FIG. 99 includes a transistor 991, a transistor 992, a transistor 993, the display element 973 having two electrodes, and a capacitor 994 having two electrodes.

As shown in the pixel 990 of FIG. 99, a first terminal of the transistor 991 is connected to the source signal line 924. A second terminal of the transistor 991 is connected to a second terminal of the transistor 992, a first electrode of the capacitor 994, and the first electrode of the display element 973. A first terminal of the transistor 992 is connected to a power supply line 995. A gate terminal of the transistor 992 is connected to a second terminal of the transistor 993 and a second electrode of the capacitor 994. A first terminal of the transistor 993 is connected to the gate signal line 925. A gate terminal of the transistor 993 is connected to the power supply line 995. The second electrode of the display element 973 is the common electrode 975.

Note that a video signal is supplied to the source signal line 924. A selection signal is supplied to the gate signal line 925. The source signal line 924 and the gate signal line 925 may be similar to those in Embodiment 1.

Note that the video signal is an analog current.

Note that a control potential is supplied to the power supply line 995. The cathode potential is supplied to the common electrode. The control potential is changed according to operation of the pixel 990.

Note that the display element 973 and the common electrode 975 may be similar to those in FIG. 97.

The transistors 991, 992 and 993 are n-channel transistors.

Operations of the pixel 990 in FIG. 99 in the case where the selection signal is supplied to the gate signal line 925 (H level) and the case where the selection signal is not supplied (L level) are described, respectively. The first period is a period when the selection signal is supplied to the gate signal line 925. The second period is a period when the selection signal is not supplied.

First, the first period is described. The gate signal line 925 is at an H level, and the transistor 991 and the transistor 993 are turned on. The first terminal and the gate terminal of the transistor 992 are electrically connected through the transistor 993, and the transistor 992 is diode-connected. Further, the source signal line 924 is electrically connected to the second terminal of the transistor 992, the first electrode of the capacitor 994, and the first electrode of the display element 973.

At this time, a potential of the power supply line 995 is set so that a potential of the first electrode of the display element 973 is lower than a potential of the common electrode 975.

As for the video signal, an analog current which flows from the power supply line 995 to the source signal line 924 through the transistor 992 and the transistor 991 is supplied to the pixel 990. A current same as the video signal is supplied to the transistor 992. Since the transistor 992 is diode-connected, a voltage (Vgs) between the first terminal and the gate terminal of the transistor 992 at that time is held in the capacitor 994.

Note that the potential of the first electrode of the display element 973 is lower than the potential of the common electrode; therefore, the display element 973 does not emit light.

Next, the second period is described. The gate signal line 925 is at an L level, and the transistor 991 and the transistor 993 are turned off. The first terminal and the gate terminal of the transistor 992 are not electrically connected through the transistor 993, and the transistor 992 is not diode-connected. Further, the source signal line 924 is not electrically connected to the second terminal of the transistor 992, the first electrode of the capacitor 994, and the first electrode of the display element 973.

At this time, a potential of the power supply line 995 is set so that the potential of the first electrode of the display element 973 is higher than the potential of the common electrode 975.

A voltage such that the transistor 992 supplies a current similar to the video signal is held in the capacitor 994. When the potential of the power supply line 995 rises, a potential of the first electrode of the capacitor 994 also rises. Here, a potential of the gate terminal of the transistor 992 is raised by the capacitive coupling of the capacitor 994, and Vgs of the transistor 992 is held. Therefore, the current same as the video signal is supplied to the display element 973.

Here, functions of the transistors 991, 992, and 993 and the capacitor 994 are described below.

The transistor 991 has a function as a switch which selects whether the source signal line 924 is connected to the second terminal of the transistor 992, the first electrode of the capacitor 994, and the first electrode of the display element 973 in accordance with the potential of the gate signal line 925. In the first period, the transistor 991 has a function to supply the video signal to the pixel 990.

The transistor 992 has a function as a current source which supplies a current to the display element 973 in accordance with potentials of the gate terminal of the transistor 992, the second terminal of the transistor 993, and the second electrode of the capacitor 994.

The transistor 993 has a function as a switch which selects whether to connect the first terminal of the transistor 992 and the gate terminal of the transistor 992. In the first period, the transistor 993 has a function to make the transistor 992 diode-connected.

The capacitor 994 has a function to change the potential of the gate terminal of the transistor 992 in accordance with the potential of the first electrode of the display element 973. In the second period, the capacitor 994 has a function to raise the potential of the gate terminal of the transistor 992 by raising the potential of the first electrode of the display element 973.

As described above, active drive of the pixel 990 can be achieved. When the other transistors over the substrate over which the pixel 990 is formed are n-channel transistors, simplification of a manufacturing process can be realized. Therefore, reduction in manufacturing cost and improvement in yield can be realized.

Figure 118:
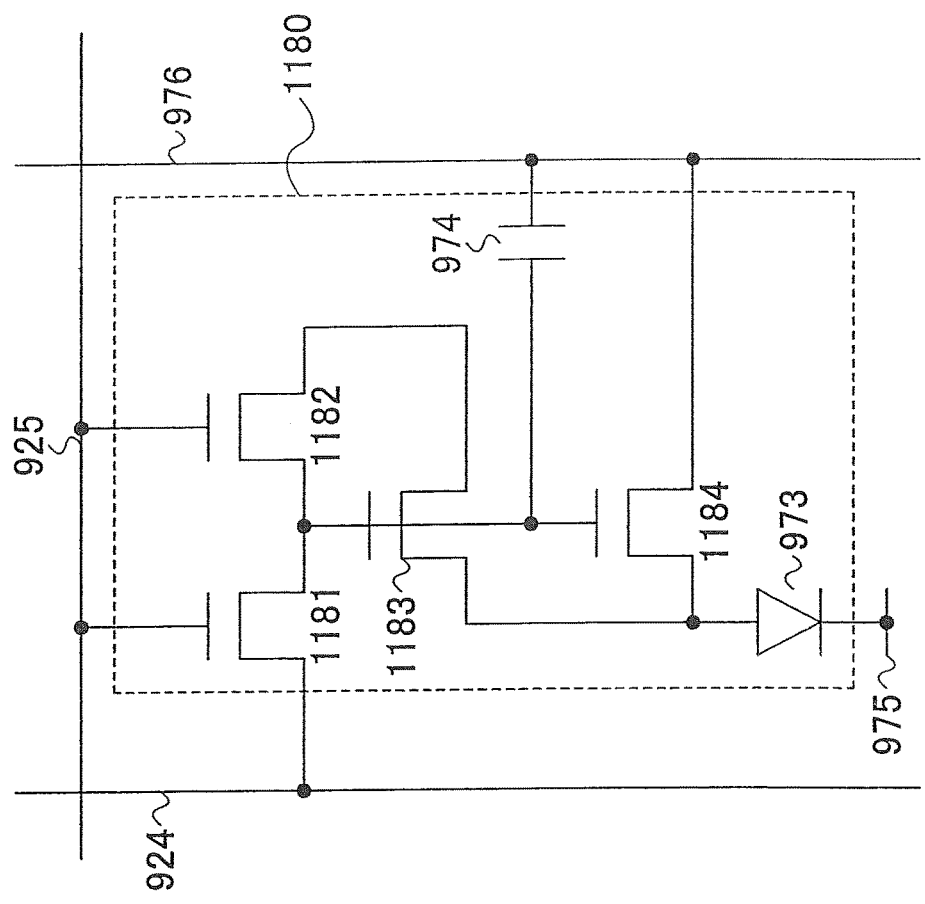
FIG. 118 is a diagram showing Embodiment 3.

FIG. 118 shows another mode of a pixel. A pixel 1180 in FIG. 118 includes a transistor 1181, a transistor 1182, a transistor 1183, a transistor 1184, the display element 973 having two electrodes, and the capacitor 974 having two electrodes.

As shown in the pixel 1180 of FIG. 118, a first terminal of the transistor 1181 is connected to the source signal line 924. A second terminal of the transistor 1181 is connected to a second terminal of the transistor 1182, a gate terminal of the transistor 1183, a gate terminal of the transistor 1184, and the second electrode of the capacitor 974. A gate terminal of the transistor 1181 is connected to the gate signal line 925. A first terminal of the transistor 1182 is connected to a first terminal of the transistor 1183. A gate terminal of the transistor 1182 is connected to the gate signal line 925. A second terminal of the transistor 1183 is connected to a second terminal of the transistor 1184 and the first electrode of the display element 973. A first terminal of the transistor 1184 is connected to the power supply line 976. The second electrode of the capacitor 974 is connected to the power supply line 976. The second electrode of the display element 973 is the common electrode 975.

Note that the video signal is supplied to the source signal line 924. The selection signal is supplied to the gate signal line 925. The source signal line 924 and the gate signal line 925 may be similar to those in Embodiment 1.

Note that the video signal is an analog current.

Note that the anode potential is supplied to the power supply line 976. The cathode potential is supplied to the common electrode 975. The anode potential is higher than the cathode potential.

Note that the display element 973, the common electrode 975, and the power supply line 976 may be similar to those in FIG. 97.

The transistors 1181 to 1184 are n-channel transistors.

Operations of the pixel 1180 in FIG. 118 in the case where the selection signal is supplied to the gate signal line 925 (H level) and the case where the selection signal is not supplied (L level) are described, respectively. The first period is a period when the selection signal is supplied to the gate signal line 925. The second period is a period when the selection signal is not supplied.

First, the first period is described. The gate signal line 925 is at an H level, and the transistor 1181 and the transistor 1182 are turned on. The first terminal and the gate terminal of the transistor 1183 are electrically connected through the transistor 1182, and the transistor 1183 is diode-connected. Further, the source signal line 924 is electrically connected to the first terminal of the transistor 1182, the gate terminal of the transistor 1183, the gate terminal of the transistor 1184, and the second electrode of the capacitor 974.

As for the video signal, an analog current which flows from the source signal line 924 to the common electrode 975 through the transistor 1181, the transistor 1182, the transistor 1183, and the display element 973 is supplied to the pixel 1180. A current same as the video signal is supplied to the transistor 1183. Since the gate terminal of the transistor 1183, the gate terminal of the transistor 1184, and the second electrode of the capacitor 974 are connected to one another, a potential of the gate terminal of the transistor 1183 at that time is held in the second electrode of the capacitor 974.

Next, the second period is described. The gate signal line 925 is at an L level, and the transistor 1181 and the transistor 1182 are turned off. The first terminal and the gate terminal of the transistor 1183 are not electrically connected through the transistor 1182. Further, the source signal line 924 is not electrically connected to the first terminal of the transistor 1182, the gate terminal of the transistor 1183, the gate terminal of the transistor 1184, and the second electrode of the capacitor 974.

The potential corresponding to the video signal is held in the capacitor 974. That is, the potential of the gate terminal of the transistor 1183 is the same as the potential obtained in the first period. Accordingly, a potential of a gate terminal of the transistor 1184 is the same as a potential of the second electrode of the capacitor 974 as well; therefore, the transistor 1184 can supply a current corresponding to the video signal to the display element 973.

Here, functions of the transistors 1181 to 1184 are described below.

The transistor 1181 has a function as a switch which selects whether the source signal line 924 is connected to the first terminal of the transistor 1182, the gate terminal of the transistor 1183, the gate terminal of the transistor 1184, and the second electrode of the capacitor 974 in accordance with the potential of the gate signal line 925. In the first period, the transistor 1181 has a function to supply the video signal to the pixel 1180.

The transistor 1182 has a function as a switch which selects whether to connect the first terminal of the transistor 1183 and the gate terminal of the transistor 1183 in accordance with the potential of the gate signal line 925. In the first period, the transistor 1182 has a function to make the transistor 1183 diode-connected.

The transistor 1183 has a function to determine the potential of the first electrode of the display element 973 and the potential of the gate terminal of the transistor 1184 in accordance with the video signal.

The transistor 1184 has a function as a current source which supplies a current to the display element 973 in accordance with the potential of the second electrode of the capacitor 974.

As described above, active drive of the pixel 1180 can be achieved. When the other transistors over the substrate over which the pixel 1180 is formed are n-channel transistors, simplification of a manufacturing process can be realized. Therefore, reduction in manufacturing cost and improvement in yield can be realized.

Note that the first electrode of the capacitor 974 can be connected to anywhere as long as the first electrode of the capacitor 974 is held at a constant potential in an operation period of the pixel 1180. For example, the first electrode of the capacitor 974 may be connected to the gate signal line 925 of a previous row.

Figure 119:
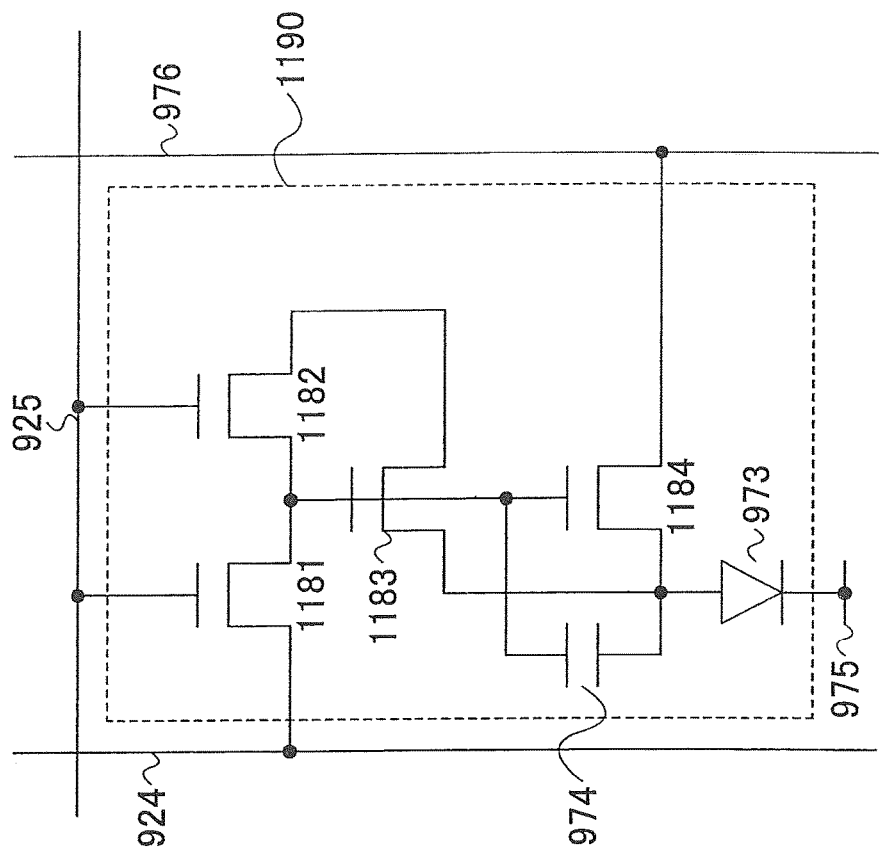
FIG. 119 is a diagram showing Embodiment 3.

As another example, as shown in a pixel 1190 of FIG. 119, the first electrode of the capacitor 974 may be connected to the second terminal of the transistor 1184. This is because the potential of the gate terminal of the transistor 1184 is changed according to change in a potential of the second terminal of the transistor 1184; therefore, more accurate current is supplied to the display element. That is, when the size of the transistor 1183 is different from the size of the transistor 1184, a current supplied to the display element 973 is changed; therefore, the potential of the first electrode of the display element 973 in the first period and the potential thereof in the second period are different from each other. Accordingly, the potential of the gate terminal of the transistor 1184 is changed simultaneously in accordance with the capacitive coupling of the capacitor 974. A so-called bootstrap operation is performed.

As described above, various pixels can be used for the display device of the invention.

Note that in this embodiment, although various pixels are shown, a pixel to which can be applied to the display device of the invention is not limited to these pixels.

Note that this embodiment can be freely implemented in combination with any description in other embodiment modes and embodiments in this specification. That is, in a non-selection period, the transistor is turned on at regular intervals, so that the shift register circuit of the invention connected to the pixel described in this embodiment supplies a power supply potential to the output terminal. Therefore, the power supply potential is supplied to the output terminal of the shift register circuit through the transistor. Since the transistor is not always on in the non-selection period, the threshold voltage shift of the transistor can be suppressed. Further, the power supply potential is supplied to the output terminal of the shift register circuit through the transistor at regular intervals. Therefore, the shift register circuit can suppress noise which is generated in the output terminal.

Embodiment 4

In this embodiment, a structure of a display panel having the pixel structure shown in the above embodiment is described with reference to FIGS. 100A and 100B.

FIG. 100A is a top plan view showing a display panel and FIG. 100B is a cross sectional view along A-A' of FIG. 100A. The display panel includes a signal line control circuit 6701, a pixel portion 6702, a first gate driver 6703, and a second gate driver 6706, which are shown by dotted lines. The display panel also includes a sealing substrate 6704 and a sealing material 6705. A portion surrounded by the sealing material 6705 is a space 6707.

Note that a wiring 6708 is for transmitting a signal input to the first gate driver 6703, the second gate driver 6706, and the signal line control circuit 6701 and receives a video signal, a clock signal, a start signal, and the like from an FPC 6709 (Flexible Printed Circuit) functioning as an external input terminal. An IC chip 6719 (a semiconductor chip including a memory circuit, a buffer circuit, and the like) is mounted over a connection portion of the FPC 6709 and the display panel by COG (Chip On Glass) or the like. Note that although only the FPC 6709 is shown here, a printed wiring board (PWB) may be attached to the FPC 6709. The display device in this specification includes not only a main body of the display panel but also a display panel with an FPC or a PWB attached thereto and a display panel on which an IC chip or the like is mounted.

Next, a cross-sectional structure is described with reference with FIG. 100B. The pixel portion 6702 and peripheral driver circuits (the first gate driver 6703, the second gate driver 6706, and the signal line control circuit 6701) are formed over a substrate 6710. Here, the signal line control circuit 6701 and the pixel portion 6702 are shown.

Note that the signal line control circuit 6701 is formed using a single conductivity type transistor such as an n-channel transistor 6720 or an n-channel transistor 6721. As for a pixel structure, a pixel can be formed using a single conductivity type transistor by applying the pixel structure of any of FIGS. 96 to 99, 118 and 119. Accordingly, when the peripheral driver circuits are formed using n-channel transistors, a single conductivity typesingle conductivity type display panel can be manufactured. Needless to say, a CMOS circuit may be formed using a p-channel transistor as well as the single conductivity typesingle conductivity type transistor.

Note that in the case where the n-channel transistor 6720 and the n-channel transistor 6721 are p-channel transistors, a pixel can be formed using a single conductivity type transistor by applying the pixel structure of FIG. 120 or 121. Accordingly, when the peripheral driver circuits are formed using p-channel transistors, a single conductivity type display panel can be manufactured. Needless to say, a CMOS circuit may be formed using an n-channel transistor as well as the single conductivity type transistor.

In this embodiment, although a display panel in which the peripheral driver circuits are formed over the same substrate as the pixel portion is shown, it is not necessarily required and all or a part of the peripheral driver circuits is formed over an IC chip or the like and the IC chip may be mounted by COG or the like. In that case, the driver circuit is not required to be single conductivity type and an n-channel transistor and a p-channel transistor can be used in combination Further, the pixel portion 6702 includes a transistor 6711 and a transistor 6712. Note that a source electrode of the transistor 6712 is connected to a first electrode (a pixel electrode 6713). An insulator 6714 is formed so as to cover end portions of the pixel electrode 6713. Here, a positive photosensitive acrylic resin film is used for the insulator 6714.

In order to obtain good coverage, the insulator 6714 is formed to have a curved surface having a curvature at a top end portion or a bottom end portion of the insulator 6714. For example, in the case of using a positive photosensitive acrylic as a material for the insulator 6714, it is preferable that only the top end portion of the insulator 6714 have a curved surface having a curvature radius (0.2 to 3 μm). Further, as the insulator 6714, either a negative photosensitive acrylic which becomes insoluble in an etchant by light or a positive photosensitive acrylic which becomes soluble in an etchant by light can be used.

A layer 6716 containing an organic compound and a second electrode (an opposite electrode 6717) are formed over the pixel electrode 6713. Here, as a material for the pixel electrode 6713 which functions as an anode, a material having a high work function is preferably used. For example, a single layer of an ITO (indium tin oxide) film, an indium zinc oxide (IZO) film, a titanium nitride film, a chromium film, a tungsten film, a Zn film, a Pt film, or the like, a stacked layer of a titanium nitride film and a film containing aluminum as a main component, a three-layer structure of a titanium nitride film, a film containing aluminum as a main component, and a titanium nitride film, or the like can be used. Note that in the case of a stacked layer structure, resistance as a wiring is low, good ohmic contact can be obtained, and a function as an anode can be obtained.

The layer 6716 containing an organic compound is formed by an evaporation method using an evaporation mask, or an ink-jet method. A complex of a metal belonging to group 4 of the periodic table of the elements is used for a part of the layer 6716 containing an organic compound, and a low molecular material or a high molecular material may be used in combination as well. Further, as a material used for the layer containing an organic compound, a single layer or a stacked layer of an organic compound is often used; however, in this embodiment, an inorganic compound may be used in a part of a film formed of an organic compound. Moreover, a known triplet material can also be used.

Further, as a material used for the opposite electrode 6717 which is formed over the layer 6716 containing an organic compound, a material having a low work function (Al, Ag, Li, Ca, or an alloy thereof such as MgAg, MgIn, AlLi, calcium fluoride, or calcium nitride) may be used. Note that in the case where light generated from the layer 6716 containing an organic compound is transmitted through the opposite electrode 6717, a stacked layer of a thin metal film having a thinner thickness and a transparent conductive film (of ITO (indium tin oxide), indium oxide zinc oxide alloy ($In_2O_3$—ZnO), zinc oxide (ZnO), or the like) is preferably used as the opposite electrode 6717 (a cathode).

Further, by attaching the sealing substrate 6704 to the substrate 6710 with the sealing material 6705, a light-emitting element 6718 is provided in the space 6707 surrounded by the substrate 6710, the sealing substrate 6704, and the sealing material 6705. Note that the space 6707 may be filled with the sealing material 6705 as well as with an inert gas (nitrogen, argon, or the like).

Note that an epoxy-based resin is preferably used for the sealing material 6705. It is preferable that a material for the sealing material does not transmit moisture and oxygen as much as possible. As a material for the sealing substrate 6704, a glass substrate, a quartz substrate, or a plastic substrate formed of FRP (Fiberglass-Reinforced Plastics), PVF (polyvinyl fluoride), myler, polyester, acrylic, or the like can be used.

As described above, a display panel having a pixel structure of the invention can be obtained. Note that the structure described above is only an example, and a structure of a display panel of the invention is not limited to this.

As shown in FIGS. 100A and 100B, the signal line control circuit 6701, the pixel portion 6702, the first gate driver 6703, and the second gate driver 6706 are formed over the same substrate; therefore, reduction in cost of the display device can be realized. Further, in this case, single conductivity type transistors are used for the signal line control circuit 6701, the pixel portion 6702, the first gate driver 6703, and the second gate driver 6706, thereby simplification of a manufacturing process can be realized; therefore, further cost reduction can be realized.

Note that the structure of the display panel is not limited to the structure shown in FIG. 100A where the signal line control circuit 6701, the pixel portion 6702, the first gate driver 6703, and the second gate driver 6706 are formed over the same substrate, and a signal line control circuit 6801 shown in FIG. 101A corresponding to the signal line control circuit 6701 may be formed over an IC chip and mounted on the display panel by COG or the like. Note that a substrate 6800, a pixel portion 6802, a first gate driver 6803, a second gate driver 6804, an FPC 6805, an IC chip 6806, an IC chip 6807, a sealing substrate 6808, and a sealing material 6809 in FIG. 101A correspond to the substrate 6710, the pixel portion 6702, the first gate driver 6703, the second gate driver 6706, the FPC 6709, the IC chip 6719, the sealing substrate 6704, and the sealing material 6705 in FIG. 100A, respectively.

That is, only the signal line control circuit of which high speed operation is required is formed into an IC chip using a CMOS or the like, thereby lower power consumption is realized. Further, higher speed operation and lower power consumption can be achieved by using a semiconductor chip formed of a silicon wafer or the like as the IC chip.

Cost reduction can be realized by forming the first gate driver 6803 and the second gate driver 6804 over the same substrate as the pixel portion 6802. Further, single conductivity type transistors are used for the first gate driver 6803, the second gate driver 6804, and the pixel portion 6802; therefore, further cost reduction can be realized. As for a structure of a pixel included in the pixel portion 6802, the pixels shown in Embodiment 3 can be applied.

As described above, cost reduction of a high-definition display device can be realized. Further, by mounting an IC chip including a functional circuit (memory or buffer) on a connecting portion of the FPC 6805 and the substrate 6800, a substrate area can be effectively utilized.

Further, a signal line control circuit 6811, a first gate driver 6814, and a second gate driver 6813 shown in FIG. 101B corresponding to the signal line control circuit 6701, the first gate driver 6703, and the second gate driver 6706 shown in FIG. 100A may be formed over an IC chip and mounted on a display panel by COG or the like. In this case, reduction in power consumption of a high-definition display device can be realized. Therefore, in order to obtain a display device with less power consumption, amorphous silicon is preferably used for a semiconductor layer of a transistor used in the pixel portion. Note that a substrate 6810, a pixel portion 6812, an FPC 6815, an IC chip 6816, an IC chip 6817, a sealing substrate 6818, and a sealing material 6819 in FIG. 101B correspond to the substrate 6710, the pixel portion 6702, the FPC 6709, the IC chip 6719, the IC chip 6719, the sealing substrate 6704, and the sealing material 6705 in FIG. 100A, respectively.

In addition, further cost reduction can be realized by using amorphous silicon for a semiconductor layer of a transistor in the pixel portion 6812. Moreover, a large display panel can be manufactured as well.

Figure 102A:
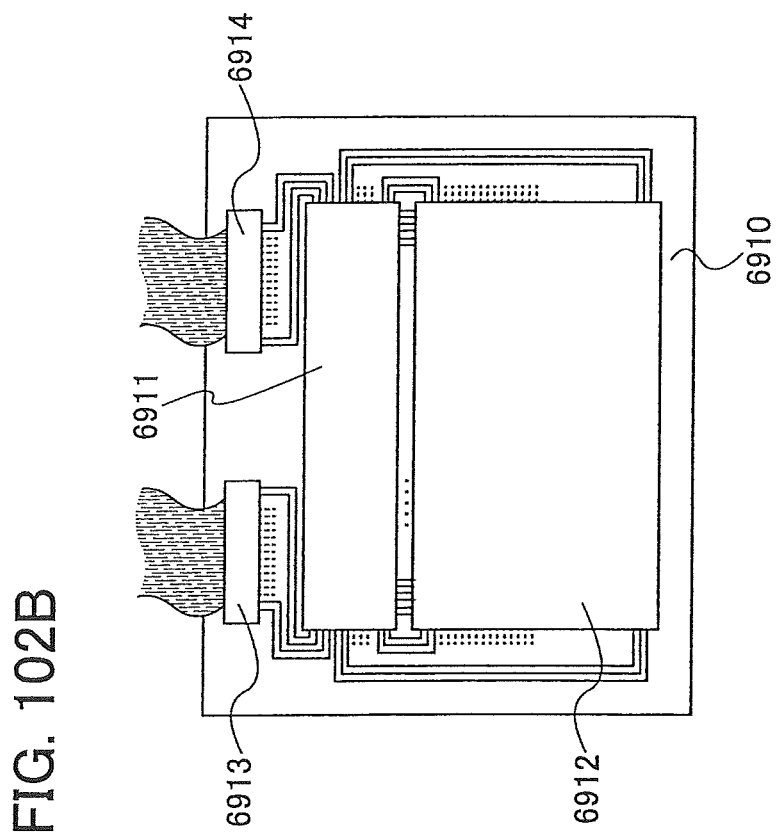
FIGS. 102A and 102B are diagrams showing Embodiment 4.

Further, the second gate driver, the first gate driver, and the signal line control circuit are not required to be provided in a row direction and a column direction of the pixels. For example, a peripheral driver circuit 6901 formed over an IC chip as shown in FIG. 102A may have functions of the first gate driver 6814, the second gate driver 6813, and the signal line control circuit 6811 shown in FIG. 101B. Note that a substrate 6900, a pixel portion 6902, an FPC 6904, an IC chip 6905, an IC chip 6906, a sealing substrate 6907, and a sealing material 6908 in FIG. 102A correspond to the substrate 6710, the pixel portion 6702, the FPC 6709, the IC chip 6719, the IC chip 6719, the sealing substrate 6704, and the sealing material 6705 in FIG. 100A, respectively.

Figure 102B:
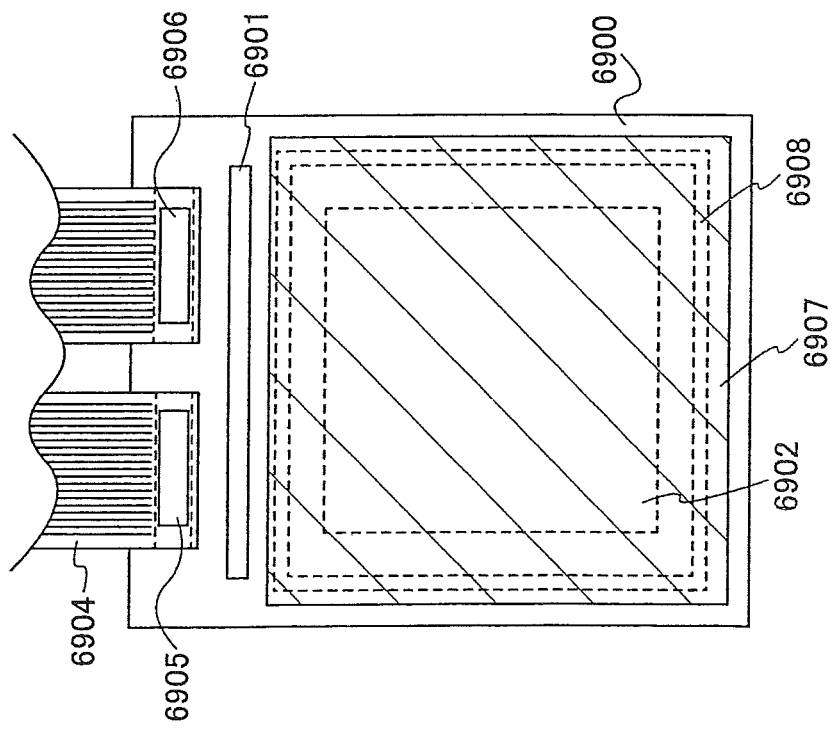

FIG. 102B shows a schematic diagram showing connections of wirings of the display device shown in FIG. 102A. The display device includes a substrate 6910, a peripheral driver circuit 6911, a pixel portion 6912, an FPC 6913, and an FPC 6914. A signal and a power supply potential are externally input from the FPC 6913 to the peripheral driver circuit 6911. An output from the peripheral driver circuit 6911 is input to wirings in the row direction and in the column direction, which are connected to the pixels included in the pixel portion 6912.

FIGS. 103A and 103B show examples of light-emitting elements which can be applied to the light-emitting element 6718. That is, a structure of a light-emitting element which can be applied to the pixels shown in the above embodiments is described with reference to FIGS. 103A and 103B.

A light-emitting element in FIG. 103A has an element structure where an anode 7002, a hole injecting layer 7003 formed of a hole injecting material, a hole transporting layer 7004 formed of a hole transporting material, a light emitting layer 7005, an electron transporting layer 7006 formed of an electron transporting material, an electron injecting layer 7007 formed of an electron injecting material, and a cathode 7008 are stacked over a substrate 7001. Here, the light emitting layer 7005 is formed of only one kind of a light emitting material in some cases, but may also be formed of two or more kinds of materials in other cases. A structure of the element of the invention is not limited to this.

In addition to a stacked layer structure shown in FIG. 103A where functional layers are stacked, there are wide variations such as an element formed using a high molecular compound, a high efficiency element utilizing a triplet light emitting material which emits light in returning from a triplet excitation state in a light emitting layer. These variations can also be applied to a white light-emitting element which can be obtained by dividing a light emitting region into two regions by controlling a recombination region of carriers using a hole blocking layer, and the like.

As a manufacturing method of the element of the invention shown in FIG. 103A, a hole injecting material, a hole transporting material, and a light emitting material are sequentially deposited over the substrate 7001 including the anode 7002 (ITO). Next, an electron transporting material and an electron injecting material are deposited, and finally the cathode 7008 is formed by evaporation.

Next, materials suitable for the hole injecting material, the hole transporting material, the electron transporting material, the electron injecting material, and the light emitting material are described as follows.

As the hole injecting material, an organic compound such as a porphyrin-based compound, phthalocyanine (hereinafter referred to as "$H_2Pc$"), copper phthalocyanine (hereinafter referred to as "CuPc"), or the like is available. A material which has a smaller value of an ionization potential than that of the hole transporting material to be used and has a hole transporting function can also be used as the hole injecting material. There are also materials obtained by chemically doping a conductive high molecular compound, such as polyaniline, polyethylene dioxythiophene (hereinafter referred to as "PEDOT") doped with polystyrene sulfonate (hereinafter referred to as "PSS") and the like. Further, an insulating high molecular compound is effective in planarization of an anode, and polyimide (hereinafter referred to as "PI") is often used. Further, an inorganic compound is also used, which includes an ultrathin film of aluminum oxide (hereinafter referred to as "alumina") as well as a thin film of a metal such as gold or platinum.

An aromatic amine-based compound (that is, a compound having a bond of benzene ring-nitrogen) is most widely used as the hole transporting material. A material which is widely used as the hole transporting material includes 4,4'-bis (diphenylamino)-biphenyl (hereinafter referred to as "TAD"), derivatives thereof such as 4,4'-bis[N-(3-methylphenyl)-N-phenyl-amino]-biphenyl (hereinafter referred to as "TPD"), 4,4'-bis[N-(1-naphthyl)-N-phenyl-amino]-biphenyl (hereinafter referred to as "α-NPD"), and star burst aromatic amine compounds such as 4,4',4''-tris(N,N-diphenyl-amino)-triphenylamine (hereinafter, referred to as "TDATA") and 4,4',4''-tris[N-(3-methylphenyl)-N-phenyl-amino]-triphenylamine (hereinafter referred to as "MTDATA").

As the electron transporting material, a metal complex is often used, which includes a metal complex having a quinoline skeleton or a benzoquinoline skeleton such as Alq, BAlq, tris(4-methyl-8-quinolinolato)aluminum (hereinafter referred to as "Almq"), or bis(10-hydroxybenzo[h]-quinolinato)beryllium (hereinafter referred to as "BeBq"), and in addition, a metal complex having an oxazole-based or a thiazole-based ligand such as bis[2-(2-hydroxyphenyl)-benzoxazolato]zinc (hereinafter referred to as "$Zn(BOX)_2$") or bis[2-(2-hydroxyphenyl)-benzothiazolato]zinc (hereinafter referred to as "$Zn(BTZ)_2$"). Further, in addition to the metal complexes, oxadiazole derivatives such as 2-(4-biphenylyl)-5-(4-tert-butylphenyl)-1,3,4-oxadiazole (hereinafter referred to as "PBD") and OXD-7, triazole derivatives such as TAZ and 3-(4-tert-butylphenyl)-4-(4-ethylphenyl)-5-(4-biphenylyl)-2,3,4-triazole (hereinafter referred to as "p-EtTAZ"), and phenanthroline derivatives such as bathophenanthroline (hereinafter referred to as "BPhen") and BCP have an electron transporting property.

As the electron injecting material, the above-mentioned electron transporting materials can be used. In addition, an ultrathin film of an insulator, for example, metal halide such as calcium fluoride, lithium fluoride, or cesium fluoride, alkali metal oxide such as lithium oxide, or the like is often used. Further, an alkali metal complex such as lithium acetyl acetonate (hereinafter referred to as "Li(acac)") or 8-quinolinato-lithium (hereinafter referred to as "Liq") is also available.

As the light emitting material, in addition to the above-mentioned metal complexes such as Alq, Almq, BeBq, BAlq, $Zn(BOX)_2$, and $Zn(BTZ)_2$, various fluorescent pigments are available. The fluorescent pigments include 4,4'-bis(2,2-diphenyl-vinyl)-biphenyl, which is blue, and 4-(dicyanomethylene)-2-methyl-6-(p-dimethylaminostyryl)-4H-pyran, which is red-orange, and the like. In addition, a triplet light emitting material is available, which mainly includes a complex with platinum or iridium as a central metal. As the triplet light emitting material, tris(2-phenylpyridine)iridium, bis(2-(4'-tolyl)pyridinato-N,$C^{2'}$)acetylacetonato iridium (hereinafter referred to as "acacIr(tpy)$_2$"), 2,3,7,8,12,13,17,18-octaethyl-21H,23Hporphyrin-platinum, and the like are known.

By using the materials each having a function as described above in combination, a highly reliable light-emitting element can be formed.

As the display element 973 shown in Embodiment 3, a light-emitting element in which layers are formed in reverse order of that in FIG. 103A can be used as shown in FIG. 103B. That is, a cathode 7018, an electron injecting layer 7017 formed of an electron injecting material, an electron transporting layer 7016 formed of an electron transporting material, a light emitting layer 7015, a hole transporting layer 7014 formed of a hole transporting material, a hole injecting layer 7013 formed of a hole injecting material, and an anode 7012 are sequentially stacked over a substrate 7011.

In addition, at least one of an anode and a cathode of a light-emitting element is required to be transparent in order to extract light emission. A transistor and a light-emitting element are formed over a substrate; and there are light-emitting elements having a top emission structure where light emission is extracted from a surface on the side opposite to the substrate, having a bottom emission structure where light emission is extracted from a surface on the substrate side, and having a dual emission structure where light emission is extracted from both of the surface on the side opposite to the substrate and the surface on the substrate side. The pixel structure of the invention can be applied to a light-emitting element having any emission structure.

A light-emitting element having a top emission structure is described with reference to FIG. 104A.

A driving TFT 7101 is formed over a substrate 7100. A first electrode 7102 is formed in contact with a source electrode of the driving TFT 7101, over which a layer 7103 containing an organic compound and a second electrode 7104 are formed.

The first electrode 7102 is an anode of the light-emitting element. The second electrode 7104 is a cathode of the light-emitting element. That is, a region where the layer 7103 containing an organic compound is interposed between the first electrode 7102 and the second electrode 7104 functions as the light-emitting element.

Further, as a material used for the first electrode 7102 which functions as an anode, a material having a high work function is preferably used. For example, a single layer of a titanium nitride film, a chromium film, a tungsten film, a Zn film, a Pt film, or the like, a stacked layer of a titanium nitride film and a film containing aluminum as a main component, a three-layer structure of a titanium nitride film, a film containing aluminum as a main component, and a titanium nitride film, or the like can be used. Note that in the case of a stacked layer structure, the resistance as a wiring is low, a good ohmic contact can be obtained, and further a function as an anode can be obtained. By using a metal film which reflects light, an anode which does not transmit light can be formed.

As a material used for the second electrode 7104 which functions as a cathode, a stacked layer of a thin metal film formed of a material having a low work function (Al, Ag, Li, Ca, or an alloy thereof such as MgAg, MgIn, AlLi, calcium fluoride, or calcium nitride) and a transparent conductive film (of ITO (indium tin oxide), indium zinc oxide (IZO), zinc oxide (ZnO), or the like) is preferably used. By using a thin metal film and a transparent conductive film having a light transmitting property, a cathode which can transmit light can be formed.

As described above, light from the light-emitting element can be extracted from the top surface as shown by an arrow in FIG. 104A. That is, in the case of applying to the display panel shown in FIGS. 100A and 100B, light is emitted to the sealing substrate 6704 side. Therefore, in the case where a light-emitting element having a top emission structure is applied to a display device, a substrate having a light transmitting property is used as the sealing substrate 6704.

In the case of providing an optical film, the sealing substrate 6704 may be provided with an optical film.

A metal film formed of a material which functions as a cathode and has a low work function, such as MgAg, MgIn, or AlLi can be used for the first electrode 7102. For the second electrode 7104, a transparent conductive film such as an ITO (indium tin oxide) film or an indium zinc oxide (IZO) film can be used. Therefore, the transmittance of the top light emission can be improved according to this structure.

Further, a light-emitting element having a bottom emission structure is described with reference to FIG. 104B. The same reference numerals as those in FIG. 104A are used since the structure of the light-emitting element is the same except for the light emission structure.

Here, as a material used for the first electrode 7102 which functions as an anode, a material having a high work function is preferably used. For example, a transparent conductive film such as an ITO (indium tin oxide) film or an indium zinc oxide (IZO) film can be used. By using a transparent conductive film having a light transmitting property, an anode which can transmit light can be formed.

As a material used for the second electrode 7104 which functions as a cathode, a metal film formed of a material having a low work function (Al, Ag, Li, Ca, or an alloy thereof such as MgAg, MgIn, AlLi, calcium fluoride, or $Ca_3N_2$) can be used. By using a metal film which reflects light, a cathode which does not transmit light can be formed.

As described above, light from the light-emitting element can be extracted from a bottom surface as shown by an arrow in FIG. 104B. That is, in the case of applying to the display panel shown in FIGS. 100A and 100B, light is emitted to the substrate 6710 side. Therefore, in the case where a light-emitting element having a bottom emission structure is applied to a display device, a substrate having a light transmitting property is used as the substrate 6710.

In the case of providing an optical film, the substrate 6710 may be provided with an optical film.

Further, a light-emitting element having a dual emission structure is described with reference to FIG. 104C. The same reference numerals as those in FIG. 104A are used since the structure of the light-emitting element is the same except for the light emission structure.

Here, as a material used for the first electrode 7102 which functions as an anode, a material having a high work function is preferably used. For example, a transparent conductive film such as an ITO (indium tin oxide) film or an indium zinc oxide (IZO) film can be used. By using a transparent conductive film having a light transmitting property, an anode which can transmit light can be formed.

As a material used for the second electrode 7104 which functions as a cathode, a stacked layer of a thin metal film formed of a material having a low work function (Al, Ag, Li, Ca, or an alloy thereof such as MgAg, MgIn, AlLi, calcium fluoride, or calcium nitride) and a transparent conductive film (of ITO (indium tin oxide), indium oxide zinc oxide alloy ($In_2O_3$—ZnO), zinc oxide (ZnO), or the like) can be used. By using a thin metal film and a transparent conductive film having a light transmitting property, a cathode which can transmit light can be formed.

As described above, light from the light-emitting element can be extracted from both sides as shown by arrows in FIG. 104C. That is, in the case of applying to the display panel shown in FIGS. 100A and 100B, light is emitted to the substrate 6710 side and the sealing substrate 6704 side. Therefore, in the case where a light-emitting element having a dual emission structure is applied to a display device, a substrate having a light transmitting property is used as each of the substrate 6710 and the sealing substrate 6704.

In the case of providing an optical film, each of the substrate 6710 and the sealing substrate 6704 is provided with an optical film.

In addition, the invention can be applied to a display device which realizes full color display by using a white light-emitting element and a color filter.

Figure 105:
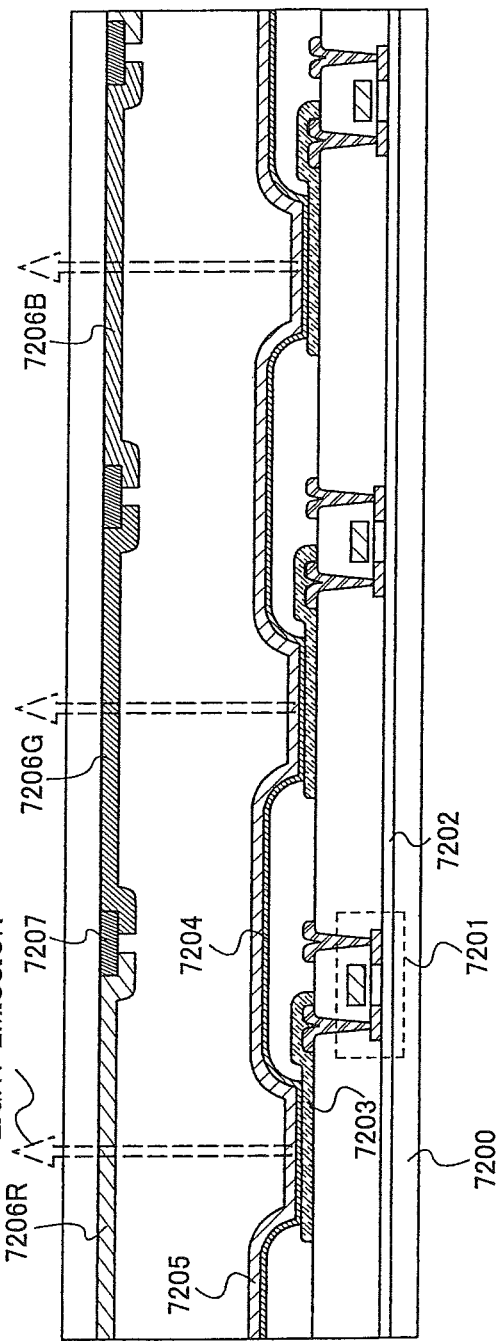
FIG. 105 is a diagram showing Embodiment 4.

As shown in FIG. 105, a base film 7202 is formed over a substrate 7200, over which a driving TFT 7201 is formed. A first electrode 7203 is formed in contact with a source electrode of the driving TFT 7201, over which a layer 7204 containing an organic compound and a second electrode 7205 are formed.

The first electrode 7203 is an anode of a light-emitting element. The second electrode 7205 is a cathode of the light-emitting element. That is, a region where the layer 7204 containing an organic compound is interposed between the first electrode 7203 and the second electrode 7205 functions as the light-emitting element. In a structure shown in FIG. 105, white light is emitted. A red color filter 7206R, a green color filter 7206G and a blue color filter 7206B are provided over the light-emitting elements; therefore, full color display can be performed. Further, a black matrix (BM 7207) which separates these color filters is provided.

The aforementioned structures of the light-emitting element can be used in combination and can be applied to the display device having the pixel structure of the invention. The structures of the display panel and the light-emitting elements which are described above are only examples, and it is needless to say that the pixel structure of the invention can be applied to display devices having other structures.

Next, a partial cross sectional view of a pixel portion of a display panel is described.

First, the case is described where a crystalline semiconductor film (polysilicon (p-Si:H) film) is used as a semiconductor layer of a transistor, with reference to FIGS. 106A, 106B, 107A, and 107B.

The semiconductor layer is obtained by forming an amorphous silicon (a-Si) film over a substrate by a known film formation method, for example. Note that the semiconductor layer is not limited to the amorphous silicon film, and any semiconductor film having an amorphous structure (including a microcrystalline semiconductor film) may be used. Further, a compound semiconductor film having an amorphous structure, such as an amorphous silicon germanium film may be used.

Then, the amorphous silicon film is crystallized by a laser crystallization method, a thermal crystallization method using RTA or an annealing furnace, a thermal crystallization method using a metal element which promotes crystallization, or the like. Needless to say, such crystallization methods may be performed in combination.

As a result of the aforementioned crystallization, a crystallized region is formed in a part of the amorphous semiconductor film.

In addition, the crystalline semiconductor film having partially increased crystallinity is patterned into a desired shape, and an island-shaped semiconductor film is formed using the crystallized region. This semiconductor film is used as the semiconductor layer of the transistor.

As shown in FIG. 106A, a base film 26102 is formed over a substrate 26101, over which a semiconductor layer is formed. The semiconductor layer includes a channel forming region 26103, an impurity region 26105 functioning as a source region or a drain region of the driving transistor 26118; and a channel forming region 26106, an LDD region 26107, and an impurity region 26108 which function as a lower electrode of a capacitor 26119. Note that channel doping may be performed to the channel forming region 26103 and the channel forming region 26106.

As the substrate, a glass substrate, a quartz substrate, a ceramic substrate, a plastic substrate, or the like can be used. As the base film 26102, a single layer of aluminum nitride (AlN), silicon oxide ($SiO_2$), silicon oxynitride ($SiO_xN_y$), or the like, or a stacked layer thereof can be used.

A gate electrode 26110 and an upper electrode 26111 of the capacitor are formed over the semiconductor layer with a gate insulating film 26109 interposed therebetween.

An interlayer insulator 26112 is formed so as to cover the driving transistor 26118 and the capacitor 26119. A wiring 26113 is in contact with the impurity region 26105 over the interlayer insulator 26112 through a contact hole. A pixel electrode 26114 is formed in contact with the wiring 26113. A second interlayer insulator 26115 is formed so as to cover end portions of the pixel electrode 26114 and the wiring 26113. Here, the second interlayer insulator 26115 is formed using a positive photosensitive acrylic resin film. Then, a layer 26116 containing an organic compound and an opposite electrode 26117 are formed over the pixel electrode 26114. A light-emitting element 26120 is formed in a region where the layer 26116 containing an organic compound is interposed between the pixel electrode 26114 and the opposite electrode 26117.

In addition, as shown in FIG. 106B, a region 26202 may be provided so that the LDD region which forms a part of the lower electrode of the capacitor 26119 is overlapped with the upper electrode 26111. Note that common portions to those in FIG. 106A are denoted by the same reference numerals, and description thereof is omitted.

In addition, as shown in FIG. 107A, a second upper electrode 26301 may be provided, which is formed in the same layer as the wiring 26113 in contact with the impurity region 26105 of the driving transistor 26118. Note that common portions to those in FIG. 106A are denoted by the same reference numerals, and description thereof is omitted. A second capacitor is formed by interposing the interlayer insulator 26112 between the second upper electrode 26301 and the upper electrode 26111. Further, since the second upper electrode 26301 is in contact with the impurity region 26108, a first capacitor having a structure in which the gate insulating film 26109 is interposed between the upper electrode 26111 and the channel forming region 26106; and the second capacitor having a structure in which the interlayer insulator 26112 is interposed between the upper electrode 26111 and the second upper electrode 26301 are connected in parallel, so that a capacitor 26302 having the first capacitor and the second capacitor is formed. Since the capacitor 26302 has a total capacitance of the first capacitor and the second capacitor, the capacitor having a large capacitance can be formed in a small area. That is, an aperture ratio can be further improved by using the capacitor in the pixel structure of the invention.

Alternatively, a structure of a capacitor as shown in FIG. 107B may be employed. A base film 27102 is formed over a substrate 27101, over which a semiconductor layer is formed. The semiconductor layer includes a channel forming region 27103 and an impurity region 27105 functioning as a source region or a drain region of a driving transistor 27118. Note that channel doping may be performed to the channel forming region 27103.

As the substrate, a glass substrate, a quartz substrate, a ceramic substrate, a plastic substrate, or the like can be used. As the base film 27102, a single layer of aluminum nitride (AlN), silicon oxide ($SiO_2$), silicon oxynitride ($SiO_xN_y$), or the like, or a stacked layer thereof can be used.

A gate electrode 27107 and a first electrode 27108 are formed over the semiconductor layer with a gate insulating film 27106 interposed therebetween.

A first interlayer insulator 27109 is formed so as to cover the driving transistor 27118 and the first electrode 27108. A wiring 27110 is in contact with the impurity region 27105 over the first interlayer insulator 27109 through a contact hole. In addition, a second electrode 27111 is formed in the same layer and with the same material as the wiring 27110.

Further, a second interlayer insulator 27112 is formed so as to cover the wiring 27110 and the second electrode 27111. A pixel electrode 27113 is formed in contact with the wiring 27110 over the second interlayer insulator 27112 through a contact hole. A third electrode 27114 is formed in the same layer and with the same material as the pixel electrode 27113. Here, a capacitor 27119 is formed of the first electrode 27108, the second electrode 27111, and the third electrode 27114.

A third interlayer insulator 27115 is formed so as to cover end portions of the pixel electrode 27113 and the third electrode 27114. A layer 27116 containing an organic compound and an opposite electrode 27117 are formed over the third interlayer insulator 27115 and the third electrode 27114. A light-emitting element 27120 is formed in a region where the layer 27116 containing an organic compound is interposed between the pixel electrode 27113 and the opposite electrode 27117.

As described above, each of the structures shown in FIGS. 106A, 106B, 107A, and 107B can be given as an example of a structure of a transistor using a crystalline semiconductor film for its semiconductor layer. Note that the transistors having the structures shown in FIGS. 106A, 106B, 107A, and 107B are examples of a top gate transistor. That is, the transistor may be a p-channel transistor or an n-channel transistor. In the case of an n-channel transistor, the LDD region may be formed so as to overlap with the gate electrode or not, or a part of the LDD region may be formed so as to overlap with the gate electrode. Further, the gate electrode may have a tapered shape and the LDD region may be provided below the tapered portion of the gate electrode in a self-aligned manner. In addition, the number of gate electrodes is not limited to two, and a multigate structure with three or more gate electrodes may be employed, or a single gate structure may also be employed.

By using a crystalline semiconductor film for a semiconductor layer (a channel forming region, a source region, a drain region, and the like) of a transistor included in the pixel of the invention, for example, the first gate driver 6703, the second gate driver 6706, and the signal line control circuit 6701 are easily formed over the same substrate as the pixel portion 6702 in FIGS. 100A and 100B.

As a structure of a transistor which uses polysilicon (p-Si:H) for its semiconductor layer, each of FIGS. 108A and 108B shows a partial cross section of a display panel using a transistor having a structure where a gate electrode is interposed between a substrate and a semiconductor layer, that is, a bottom gate structure where a gate electrode is located below a semiconductor layer.

A base film 7502 is formed over a substrate 7501. A gate electrode 7503 is formed over the base film 7502. A first electrode 7504 is formed in the same layer and with the same material as the gate electrode. As a material for the gate electrode 7503, polycrystalline silicon to which phosphorus is added can be used. Besides polycrystalline silicon, silicide which is a compound of metal and silicon may be used.

Then, a gate insulating film 7505 is formed so as to cover the gate electrode 7503 and the first electrode 7504. As the gate insulating film 7505, a silicon oxide film, a silicon nitride film, or the like is used.

A semiconductor layer is formed over the gate insulating film 7505. The semiconductor layer includes a channel forming region 7506, an LDD region 7507, and an impurity region 7508 functioning as a source region or a drain region of a driving transistor 7522; and a channel forming region 7509, an LDD region 7510, and an impurity region 7511, which function as a second electrode of a capacitor 7523. Note that channel doping may be performed to the channel forming region 7506 and the channel forming region 7509.

As the substrate, a glass substrate, a quartz substrate, a ceramic substrate, a plastic substrate, or the like can be used. As the base film 7502, a single layer of aluminum nitride (AlN), silicon oxide ($SiO_2$), silicon oxynitride ($SiO_xN_y$), or the like, or a stacked layer thereof can be used.

A first interlayer insulator 7512 is formed so as to cover the semiconductor layer. A wiring 7513 is in contact with the impurity region 7508 over the first interlayer insulator 7512 through a contact hole. A third electrode 7514 is formed in the same layer and with the same material as the wiring 7513. The capacitor 7523 is formed of the first electrode 7504, the second electrode, and the third electrode 7514.

In addition, an opening 7515 is formed in the first interlayer insulator 7512. A second interlayer insulator 7516 is formed so as to cover the driving transistor 7522, the capacitor 7523, and the opening 7515. A pixel electrode 7517 is formed over the second interlayer insulator 7516 through a contact hole. Then, an insulator 7518 is formed so as to cover end portions of the pixel electrode 7517. As the insulator, a positive photosensitive acrylic resin film can be used, for example. A layer 7519 containing an organic compound and an opposite electrode 7520 are formed over the pixel electrode 7517. A light-emitting element 7521 is formed in a region where the layer 7519 containing an organic compound is interposed between the pixel electrode 7517 and the opposite electrode 7520. The opening 7515 is located below the light-emitting element 7521. That is, when light emitted from the light-emitting element 7521 is extracted from the substrate side, the transmittance can be improved since the opening 7515 is provided.

Further, a structure shown in FIG. 108B in which a fourth electrode 7524 is formed in the same layer and with the same material as the pixel electrode 7517 in FIG. 108A may be employed. Therefore, the capacitor 7523 can be formed of the first electrode 7504, the second electrode, the third electrode 7514, and the fourth electrode 7524.

Figure 109A:
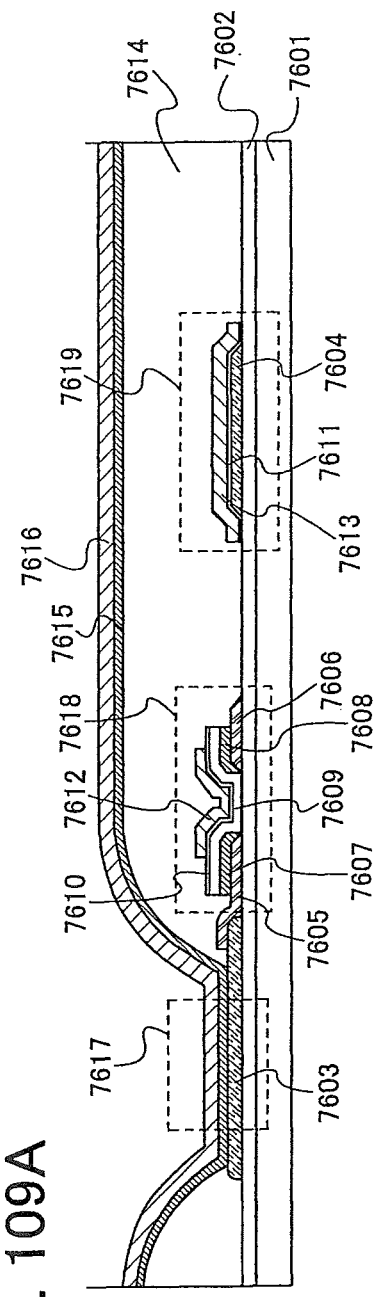
FIGS. 109A and 109B are diagrams showing Embodiment 4.
Figure 109B:
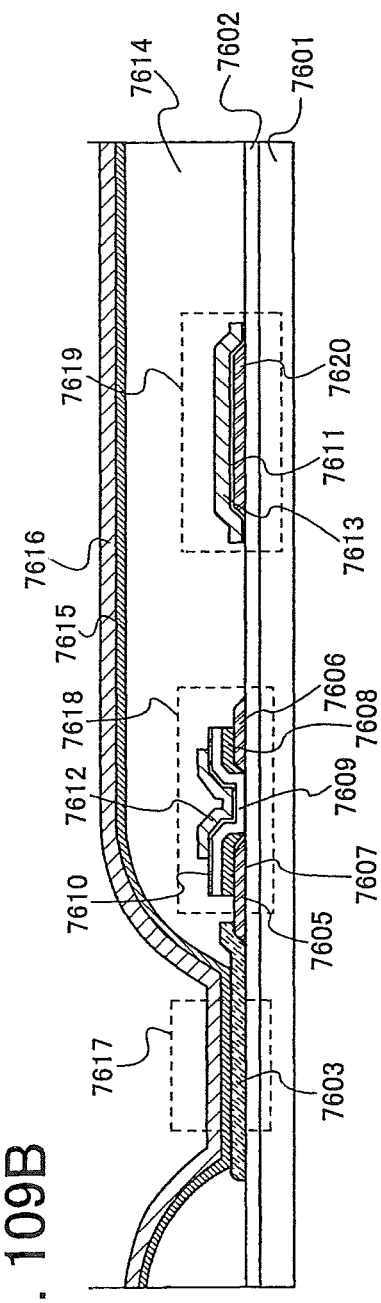

Next, the case where an amorphous silicon (a-Si:H) film is used for a semiconductor layer of a transistor is described. FIGS. 109A and 109B show the case of a top gate transistor. FIGS. 110A, 110B, 111A, and 111B show the case of a bottom gate transistor.

FIG. 109A shows a cross section of a transistor having a forward staggered structure, which uses amorphous silicon for its semiconductor layer. A base film 7602 is formed over a substrate 7601. A pixel electrode 7603 is formed over the base film 7602. A first electrode 7604 is formed in the same layer and with the same material as the pixel electrode 7603.

As the substrate, a glass substrate, a quartz substrate, a ceramic substrate, a plastic substrate, or the like can be used. As the base film 7602, a single layer of aluminum nitride (AlN), silicon oxide ($SiO_2$), silicon oxynitride ($SiO_xN_y$), or the like, or a stacked layer thereof can be used.

A wiring 7605 and a wiring 7606 are formed over the base film 7602, and an end portion of the pixel electrode 7603 is covered with the wiring 7605. An n-type semiconductor layer 7607 and an n-type semiconductor layer 7608 which have an n-type conductivity are formed over the wiring 7605 and the wiring 7606, respectively. In addition, a semiconductor layer 7609 is formed between the wiring 7605 and the wiring 7606 and over the base film 7602. A part of the semiconductor layer 7609 is extended over the n-type semiconductor layer 7607 and the n-type semiconductor layer 7608. Note that this semiconductor layer is formed of a non-crystalline semiconductor film such as an amorphous silicon (a-Si:H) film or a microcrystalline semiconductor (μ-Si:H) film. Further, a gate insulating film 7610 is formed over the semiconductor layer 7609. An insulating film 7611 is formed in the same layer and with the same material as the gate insulating film 7610 and also formed over the first electrode 7604. Note that as the gate insulating film 7610, a silicon oxide film, a silicon nitride film, or the like is used.

A gate electrode 7612 is formed over the gate insulating film 7610. A second electrode 7613 which is formed in the same layer and with the same material as the gate electrode is formed over the first electrode 7604 with the insulating film 7611 interposed therebetween. A capacitor 7619 in which the insulating film 7611 is interposed between the first electrode 7604 and the second electrode 7613 is formed. An interlayer insulator 7614 is formed so as to cover an end portion of the pixel electrode 7603, the driving transistor 7618, and the capacitor 7619.

A layer 7615 containing an organic compound and an opposite electrode 7616 are formed over the interlayer insulator 7614 and the pixel electrode 7603 located in an opening of the interlayer insulator 7614. A light-emitting element 7617 is formed in a region where the layer 7615 containing an organic compound is interposed between the pixel electrode 7603 and the opposite electrode 7616.

A first electrode 7620 as shown in FIG. 109B may be formed instead of the first electrode 7604 shown in FIG. 109A. The first electrode 7620 is formed in the same layer and with the same material as the wirings 7605 and 7606.

FIGS. 110A and 110B are partial cross sections of a display panel including a bottom gate transistor which uses amorphous silicon for its semiconductor layer.

A base film 7702 is formed over a substrate 7701. A gate electrode 7703 is formed over the base film 7702. A first electrode 7704 is formed in the same layer and with the same material as the gate electrode 7703. As a material for the gate electrode 7703, polycrystalline silicon to which phosphorus is added can be used. Besides polycrystalline silicon, silicide which is a compound of metal and silicon may be used.

Then, a gate insulating film 7705 is formed so as to cover the gate electrode 7703 and the first electrode 7704. As the gate insulating film 7705, a silicon oxide film, a silicon nitride film, or the like is used.

A semiconductor layer 7706 is formed over the gate insulating film 7705. In addition, a semiconductor layer 7707 is formed in the same layer and with the same material as the semiconductor layer 7706.

As the substrate, a glass substrate, a quartz substrate, a ceramic substrate, a plastic substrate, or the like can be used. As the base film 7602, a single layer of aluminum nitride (AlN), silicon oxide (SiO$_2$), silicon oxynitride (SiO$_x$N$_y$), or the like or a stacked layer thereof can be used.

N-type semiconductor layers 7708 and 7709 having n-type conductivity are formed over the semiconductor layer 7706. An n-type semiconductor layer 7710 is formed over the semiconductor layer 7707.

Wirings 7711 and 7712 are formed over the n-type semiconductor layers 7708 and 7709, respectively. A conductive layer 7713 formed in the same layer and with the same material as the wirings 7711 and 7712, are formed over the n-type semiconductor layer 7710.

A second electrode is formed with the semiconductor layer 7707, the n-type semiconductor layer 7710, and the conductive layer 7713. Note that a capacitor 7720 having a structure where the gate insulating film 7705 is interposed between the second electrode and the first electrode 7704 is formed.

One end portion of the wiring 7711 is extended, and a pixel electrode 7714 is formed so as to be in contact with an upper potion of the extended wiring 7711.

An insulator 7715 is formed so as to cover an end portion of the pixel electrode 7714, a driving transistor 7719, and the capacitor 7720.

A layer 7716 containing an organic compound and an opposite electrode 7717 are formed over the pixel electrode 7714 and the insulator 7715. A light-emitting element 7718 is formed in a region where the layer 7716 containing an organic compound is interposed between the pixel electrode 7714 and the opposite electrode 7717.

The semiconductor layer 7707 and the n-type semiconductor layer 7710 which are a part of the second electrode of the capacitor are not necessarily required to be formed. That is, the second electrode may be the conductive layer 7713, so that the capacitor may have a structure in which the gate insulating film is interposed between the first electrode 7704 and the conductive layer 7713.

Note that in FIG. 110A, the pixel electrode 7714 may be formed before forming the wiring 7711, thereby the capacitor 7720 as shown in FIG. 110B can be formed, which has a structure where the gate insulating film 7705 is interposed between the first electrode 7704 and a second electrode 7721 formed of the pixel electrode 7714.

Note that although FIGS. 110A and 110B show inverted staggered channel-etched transistors, a channel protective transistor may also be used. A channel protective transistor is described with reference to FIGS. 111A and 111B.

A channel protective transistor shown in FIG. 111A is different from the driving transistor 7719 having a channel-etched structure shown in FIG. 110A in that an insulator 7801 functioning as an etching mask is provided over a region where a channel of the semiconductor layer 7706 is to be formed. Common portions except that point are denoted by the same reference numerals.

Similarly, a channel protective transistor shown in FIG. 111B is different from the driving transistor 7719 having a channel-etched structure shown in FIG. 110B in that an insulator 7802 functioning as an etching mask is provided over the region where a channel of the semiconductor layer 7706 is to be formed. Common portions except that point are denoted by the same reference numerals.

By using an amorphous semiconductor film as a semiconductor layer (a channel forming region, a source region, a drain region, and the like) of a transistor included in the pixel of the invention, the manufacturing cost can be reduced. For example, an amorphous semiconductor film can be applied by using the pixel structure shown in Embodiment 3.

Note that structures of the transistors and the capacitor to which the pixel structure of the invention can be applied are not limited to those described above, and transistors and capacitor with various structures can be used.

Note that this embodiment can be freely implemented in combination with any description in other embodiment modes and embodiments in this specification. That is, in a non-selection period, the transistor is turned on at regular intervals, so that the shift register circuit of the invention connected to the display panel described in this embodiment supplies a power supply potential to the output terminal. Therefore, the power supply potential is supplied to the output terminal of the shift register circuit through the transistor. Since the transistor is not always on in the non-selection period, the threshold voltage shift of the transistor can be suppressed. Further, the power supply potential is supplied to the output terminal of the shift register circuit through the transistor at regular intervals. Therefore, the shift register circuit can suppress noise which is generated in the output terminal.

Embodiment 5

The display device of the invention can be applied to various electronic devices, specifically to display portions of electronic devices. The electronic devices include cameras such as a video camera and a digital camera, a goggle-type display, a navigation system, an audio reproducing device (a car audio component stereo, an audio component stereo, or the like), a computer, a game machine, a portable information terminal (a mobile computer, a mobile phone, a mobile game machine, an electronic book, or the like), an image reproducing device provided with a recording medium (specifically, a device for reproducing content of a recording medium such as a digital versatile disc (DVD) and having a display for displaying the reproduced image) and the like.

Figure 117A:
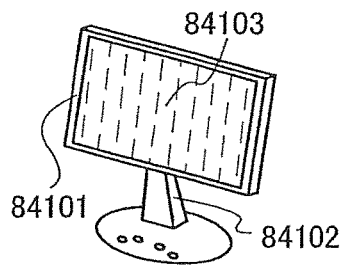
FIGS. 117A to 117H are views showing Embodiment 7.

FIG. 117A shows a display, which includes a housing 84101, a supporting base 84102, a display portion 84103, and the like. A display device having the pixel structure of the invention can be used for the display portion 84103. Note that the display includes all display devices for displaying information such as for a personal computer, TV broadcasting reception, and advertisement display. A display using the display device having the pixel structure of the invention for the display portion 84103 can reduce power consumption and prevent a display defect. Further, cost reduction can be achieved.

In recent years, the need for a large size display has been increased. As a display becomes larger, there is caused a problem of increased cost. Therefore, it is an issue to reduce the manufacturing cost as much as possible and to provide a high quality product at as low a price as possible.

For example, by applying the pixel structure shown in Embodiment 3 to a pixel portion of a display panel, a display panel formed by using single conductivity type transistors can be provided. Therefore, the number of manufacturing steps can be reduced and the manufacturing cost can be reduced.

In addition, by forming the pixel portion and the peripheral driver circuit over the same substrate as shown in FIG. 100A, the display panel can be formed using circuits constituted by single conductivity type transistors.

In addition, by using an amorphous semiconductor (such as amorphous silicon (a-Si:H)) for a semiconductor layer of a transistor in a circuit included in the pixel portion, a manufacturing process can be simplified and further cost reduction can be realized. In this case, as shown in FIGS. 101B and 102A, it is preferable that the periphery driver circuit in the pixel portion be formed over an IC chip and mounted on the display panel by COG or the like. In this manner, by using an amorphous semiconductor, the size of the display can be easily increased.

Figure 117B:
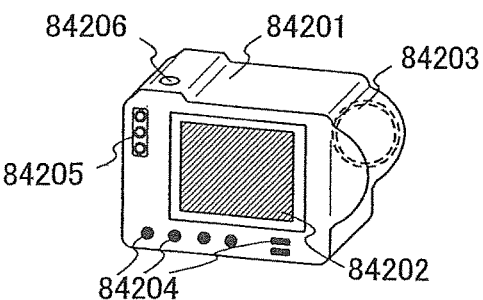

FIG. 117B shows a camera, which includes a main body 84201, a display portion 84202, an image receiving portion 84203, operation keys 84204, an external connection port 84205, a shutter 84206, and the like.

In recent years, in accordance with advance in performance of a digital camera and the like, competitive manufacturing thereof has been intensified. Thus, it is important to provide a higher-performance product at as low a price as possible. A digital camera using a display device having the pixel structure of the invention for the display portion 84202 can reduce power consumption and prevent a display defect. Further, cost reduction can be achieved.

For example, by using the pixel structure shown in Embodiment 3 for the pixel portion, the pixel portion can be constituted by single conductivity type transistors. In addition, as shown in FIG. 101A, a signal line control circuit of which operating speed is high is formed over an IC chip, and a gate driver of which operating speed is relatively low with a circuit constituted by single conductivity type transistors over the same substrate as the pixel portion; therefore, higher performance can be realized and cost reduction can be achieved. Further, an amorphous semiconductor such as amorphous silicon may be used for the pixel portion and a semiconductor layer of a transistor included in the gate driver which is formed over the same substrate as the pixel portion; therefore, further cost reduction can be achieved.

Figure 117C:
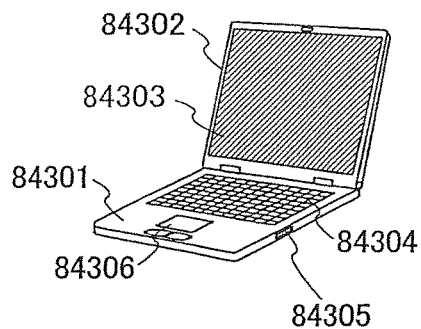

FIG. 117C shows a computer, which includes a main body 84301, a housing 84302, a display portion 84303, a keyboard 84304, an external connection port 84305, a pointing device 84306, and the like. A computer using a display device having the pixel structure of the invention for the display portion 84303 can reduce power consumption and prevent a display defect. Further, cost reduction can be achieved.

Figure 117D:
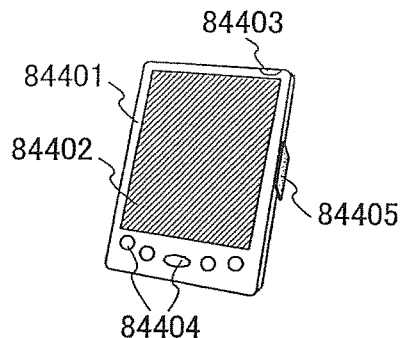

FIG. 117D shows a mobile computer, which includes a main body 84401, a display portion 84402, a switch 84403, operation keys 84404, an infrared port 84405, and the like. A mobile computer using a display device having the pixel structure of the invention for the display portion 84402 can reduce power consumption and prevent a display defect. Further, cost reduction can be achieved.

Figure 117E:
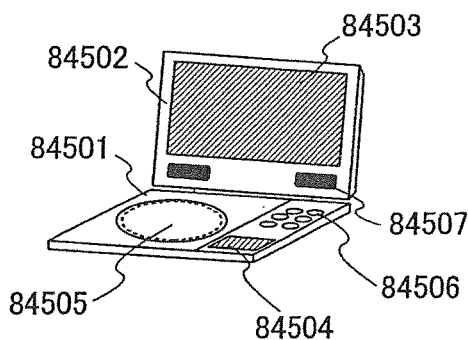

FIG. 117E shows a portable image reproducing device having a recording medium (specifically, a DVD player), which includes a main body 84501, a housing 84502, a display portion A 84503, a display portion B 84504, a recording medium reading portion 84505, operation keys 84506, a speaker portion 84507, and the like. The display portion A 84503 mainly displays image information and the display portion B 84504 mainly displays text information. An image reproducing device using a display device having the pixel structure of the invention for the display portion A 84503 and the display portion B 84504 can reduce power consumption and prevent a display defect. Further, cost reduction can be achieved.

Figure 117F:
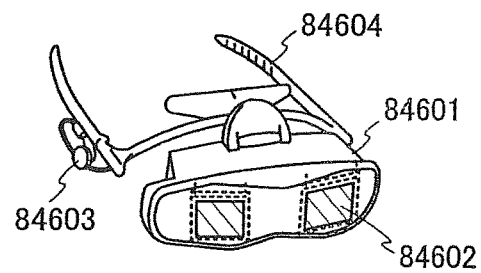

FIG. 117F shows a goggle-type display, which includes a main body 84601, a display portion 84602, an earphone 84603, and a support portion 84604. A goggle type display using a display device having the pixel structure of the invention for the display portion 84602 can reduce power consumption and prevent a display defect. Further, cost reduction can be achieved.

Figure 117G:
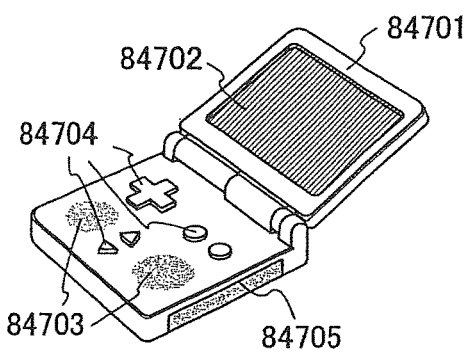

FIG. 117G shows a mobile game machine, which includes a housing 84701, a display portion 84702, a speaker portion 84703, operation keys 84704, a recording medium insert portion 84705, and the like. A portable type game machine using a display device having the pixel structure of the invention for the display portion 84702 can reduce power consumption and prevent a display defect. Further, cost reduction can be achieved.

Figure 117H:
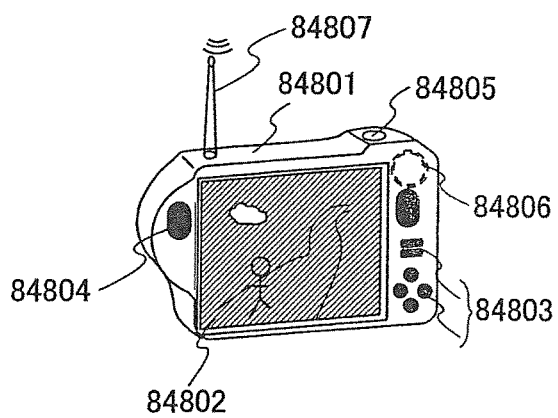

FIG. 117H shows a digital camera having a television receiving function, which includes a main body 84801, a display portion 84802, operation keys 84803, a speaker 84804, a shutter 84805, an image receiving portion 84806, an antenna 84807, and the like. A digital camera having a television receiving function using a display device having the pixel structure of the invention for the display portion 84802 can reduce power consumption and prevent a display defect. In addition, high-definition display with a high aperture ratio can be achieved. Further, cost reduction can be achieved.

For example, the pixel structures of FIGS. 96 to 99, 118 and 119 are used in the pixel portion; therefore, an aperture ratio of a pixel can be increased. Specifically, the aperture ratio can be increased by using an n-channel transistor for a driving transistor for driving a light-emitting element. Thus, a digital camera having a television receiving function which includes a high-definition display portion can be provided.

While a digital camera having a television receiving function becomes multifunctional and frequency of use thereof, such as television watching, has been increased, the battery life per charge has been required to be long.

For example, as shown in FIGS. 101B and 102A, a peripheral driver circuit is formed over an IC chip and a CMOS or the like is used; therefore, power consumption can be reduced.

As described above, the invention can be applied to various electronic devices.

Note that this embodiment can be freely implemented in combination with any description in other embodiment modes and embodiments in this specification. That is, in a non-selection period, the transistor is turned on at regular intervals, so that the shift register circuit of the invention connected to the electronic device described in this embodiment supplies a power supply potential to the output terminal. Therefore, the power supply potential is supplied to the output terminal of the shift register circuit through the transistor. Since the transistor is not always on in the non-selection period, the threshold voltage shift of the transistor can be suppressed. Further, the power supply potential is supplied to the output terminal of the shift register circuit through the transistor at regular intervals. Therefore, the shift register circuit can suppress noise which is generated in the output terminal.

Embodiment 6

Figure 116:
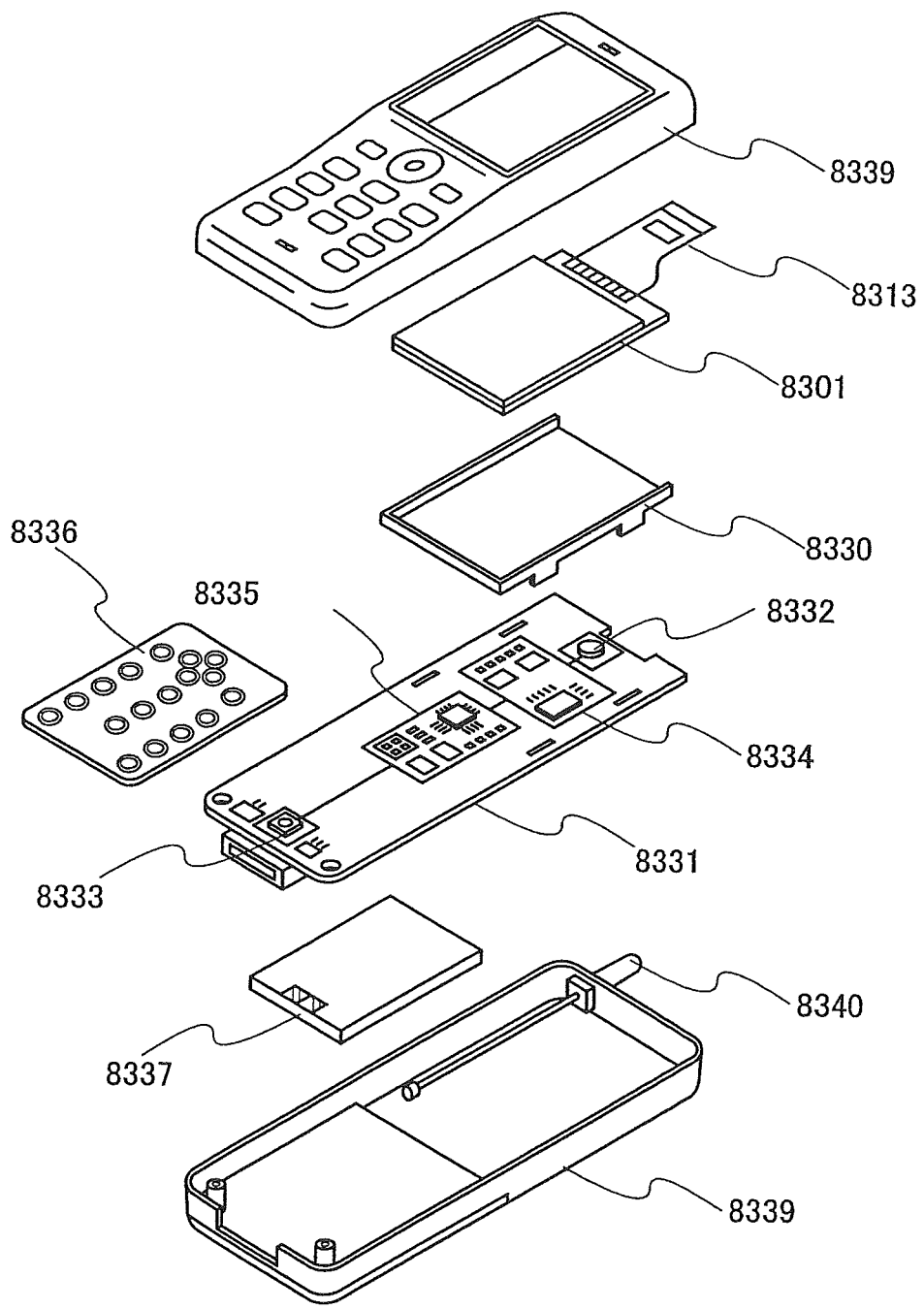
FIG. 116 is a view showing Embodiment 6.

In this embodiment, a structure example of a mobile phone which includes a display portion having a display device using the pixel structure of the invention is described with reference to FIG. 116.

A display panel 8301 is detachably incorporated in a housing 8330. The shape and the size of the housing 8330 can be changed as appropriate in accordance with the size of the display panel 8301. The housing 8330 which fixes the display panel 8301 is fitted in a printed circuit board 8331 so as to be assembled as a module.

The display panel 8301 is connected to the printed circuit board 8331 through an FPC 8313. A speaker 8332, a microphone 8333, a transmitting/receiving circuit 8334, and a signal processing circuit 8335 including a CPU, a controller, and the like are formed over the printed circuit board 8331. Such a module, an input unit 8336, a battery 8337 and an antenna 8340 are combined and stored in a housing 8339. A pixel portion of the display panel 8301 is provided so as to be seen from an opening window formed in the housing 8339.

In the display panel 8301, a pixel portion and a part of peripheral driver circuits (a driver circuit with a low operation frequency among a plurality of driver circuits) may be formed over the same substrate using transistors, a part of the peripheral driver circuits (a driver circuit with a high operation frequency among the plurality of driver circuits) may be formed over an IC chip, and the IC chip may be mounted on the display panel 8301 by COG (Chip On Glass). Alternatively, the IC chip may be connected to a glass substrate by using TAB (Tape Automated Bonding) or a printed circuit board. According to such a structure, power consumption of a display device can be reduced and the battery life of a mobile phone per charge can be made long. In addition, cost reduction of the mobile phone can be achieved.

As the pixel portion, the pixel structures shown in the above embodiments can be applied as appropriate.

For example, by applying the pixel structure shown in Embodiment 3 or the like, the number of manufacturing steps can be reduced. That is, the pixel portion and the peripheral driver circuit formed over the same substrate as the pixel portion are constituted by single conductivity type transistors; therefore, cost reduction can be achieved.

In addition, in order to further reduce power consumption, the pixel portion may be formed over a substrate by using transistors, all of the peripheral driver circuits may be formed over an IC chip, and the IC chip may be mounted on the display panel by COG (Chip On Glass) or the like as shown in FIGS. 101B and 102A.

Note that the structure shown in this embodiment is only an example of a mobile phone, and the pixel structure of the invention can be applied not only to a mobile phone having the aforementioned structure but also to mobile phones having various structures.

Note that this embodiment can be freely implemented in combination with any description in other embodiment modes and embodiments in this specification. That is, in a non-selection period, the transistor is turned on at regular intervals, so that the shift register circuit of the invention included in the mobile phone described in this embodiment supplies a power supply potential to the output terminal. Therefore, the power supply potential is supplied to the output terminal of the shift register circuit through the transistor. Since the transistor is not always on hi the non-selection period, the threshold voltage shift of the transistor can be suppressed. Further, the power supply potential is supplied to the output terminal of the shift register circuit through the transistor at regular intervals. Therefore, the shift register circuit can suppress noise which is generated in the output terminal.

Embodiment 7

In this embodiment, a structure example of an electronic device which includes a display portion having a display device using the pixel structure of the invention, and in particular, a television receiver including an EL module is described.

Figure 112:
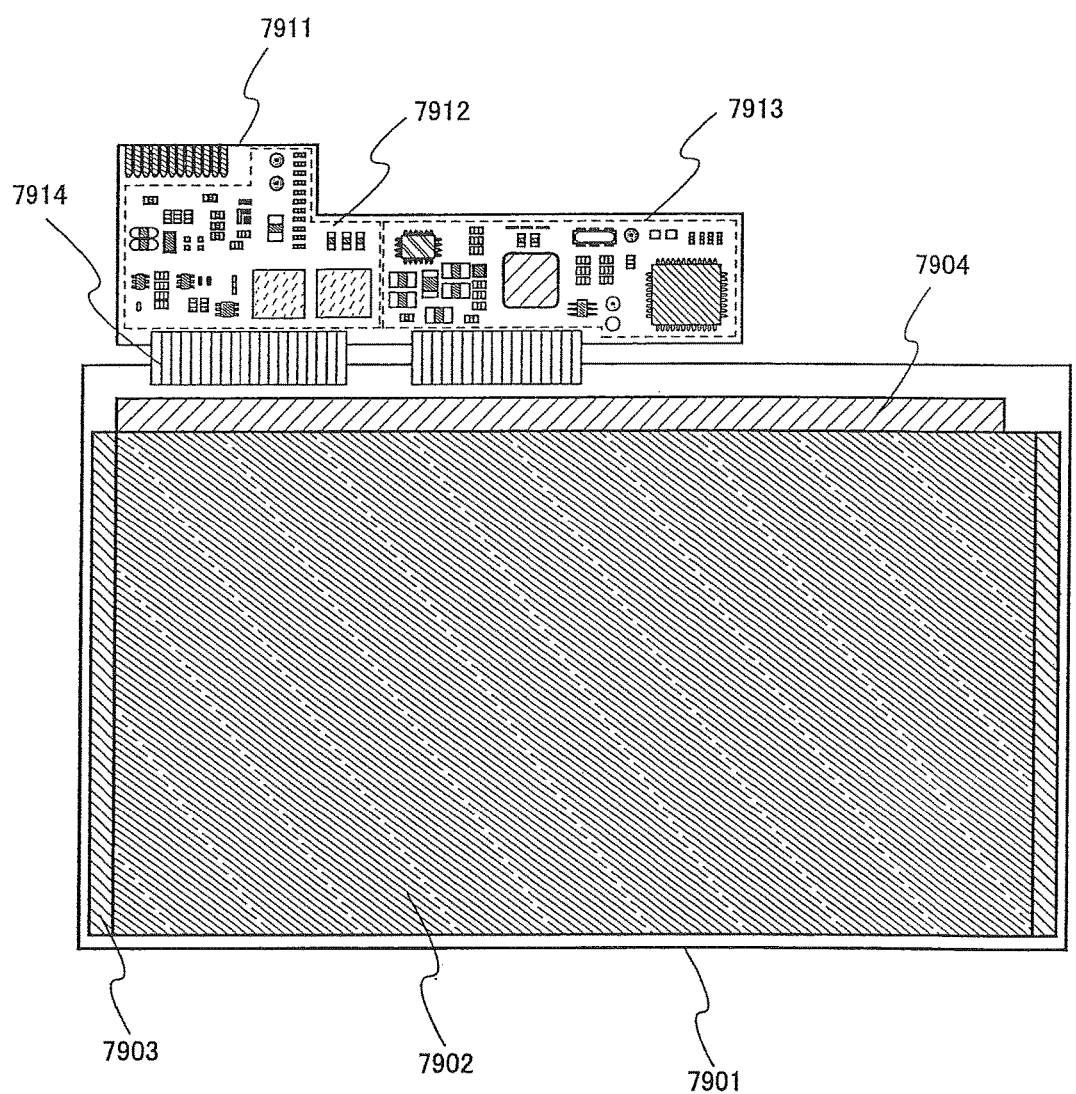
FIG. 112 is a diagram showing Embodiment 7.

FIG. 112 shows an EL module combining a display panel 7901 and a circuit board 7911. The display panel 7901 includes a pixel portion 7902, a scan line driver circuit 7903, and a signal line driver circuit 7904. A control circuit 7912, a signal dividing circuit 7913, and the like are formed over the circuit board 7911. The display panel 7901 and the circuit board 7911 are connected to each other by a connection wiring 7914. As the connection wiring, an FPC or the like can be used.

In the display panel 7901, the pixel portion 7902 and a part of peripheral driver circuits (a driver circuit with a low operation frequency among a plurality of driver circuits) may be formed over the same substrate using transistors, a part of the peripheral driver circuits (a driver circuit with a high operation frequency among the plurality of driver circuits) may be formed over an IC chip, and the IC chip may be mounted on the display panel 7901 by COG (Chip On Glass) or the like. Alternatively, the IC chip may be mounted on the display panel 7901 by using TAB (Tape Automated Bonding) or a printed circuit board.

As the pixel portion, the pixel structure shown in the above embodiments can be applied as appropriate.

For example, by applying the pixel structure and the like shown in Embodiment 3, the number of manufacturing steps can be reduced. That is, the pixel portion and the peripheral driver circuit formed over the same substrate as the pixel portion are constituted by single conductivity type transistors; therefore, cost reduction can be achieved.

In addition, in order to further reduce power consumption, the pixel portion may be formed over a glass substrate by using transistors, all of the peripheral driver circuits may be formed into an IC chip, and the IC chip may be mounted on the display panel by COG (Chip On Glass) or the like.

In addition, pixels can be constituted only by n-channel transistors by applying the pixel structures shown in FIGS. 96 to 99, 118 and 119 of the above embodiments; therefore, an amorphous semiconductor (such as amorphous silicon) can be applied to a semiconductor layer of a transistor. That is, a large display device where it is difficult to form an even crystalline semiconductor film can be manufactured. Further, by using an amorphous semiconductor film for a semiconductor layer of a transistor constituting a pixel, the number of manufacturing steps can be reduced and manufacturing cost can also be reduced.

Note that in the case where an amorphous semiconductor film is applied to a semiconductor layer of a transistor constituting a pixel, it is preferable that the pixel portion be formed over a substrate by using transistors, all of the peripheral driver circuits be formed over an IC chip, and the IC chip be mounted on the display panel by COG (Chip On Glass). FIG. 101B shows an example of the structure where a pixel portion is formed over a substrate and an IC chip provided with a peripheral driver circuit is mounted on the substrate by COG or the like.

Figure 113:
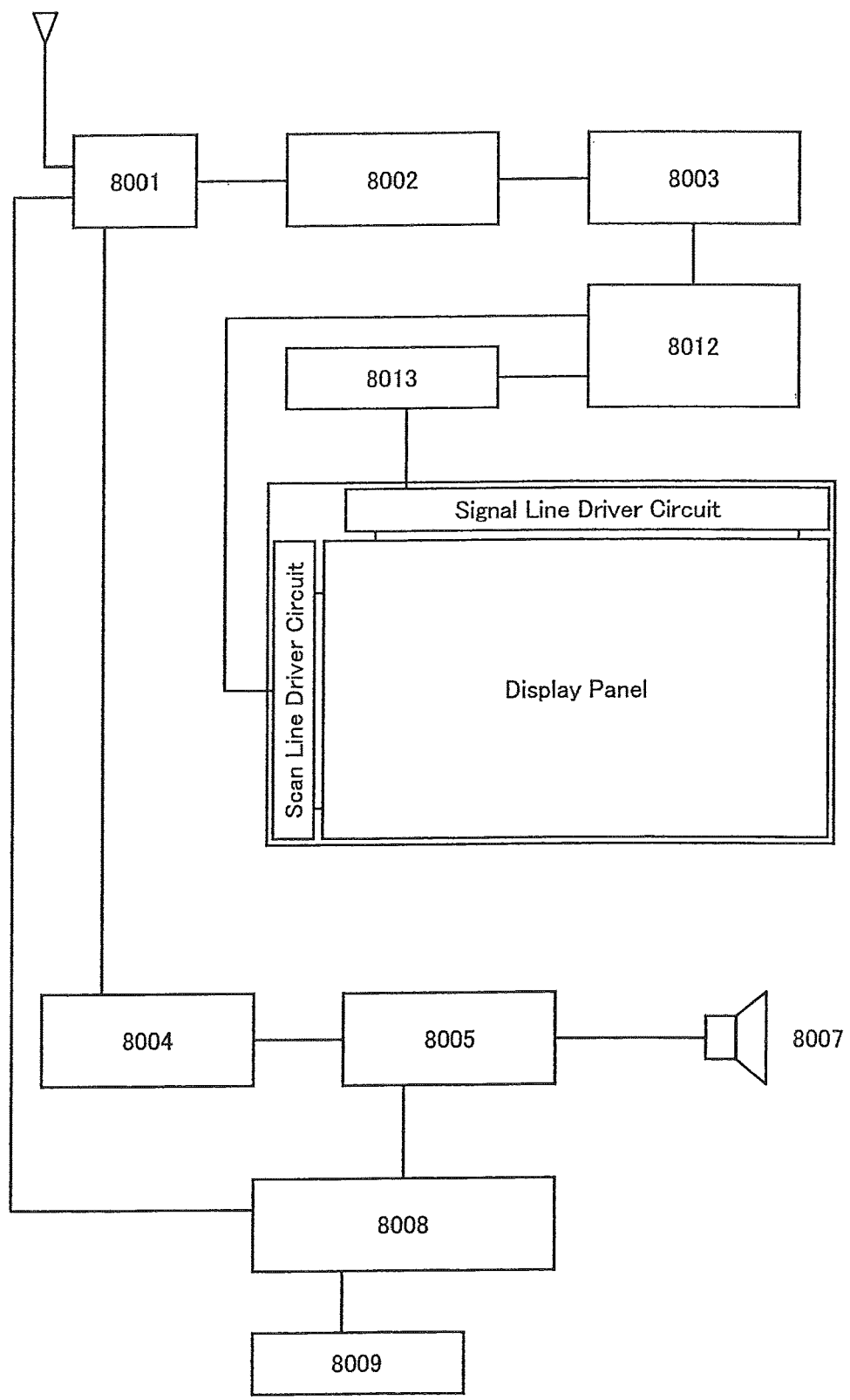
FIG. 113 is a diagram showing Embodiment 7.

An EL television receiver can be completed with this EL module. FIG. 113 is a block diagram showing a main structure of an EL television receiver. A tuner 8001 receives a video signal and an audio signal. The video signals are processed by a video signal amplifier circuit 8002, a video signal processing circuit 8003 which converts a signal output from the video signal amplifier circuit 8002 into a color signal corresponding to each color of red, green and blue, and a control circuit 8012 which converts the video signal into the input specification of a driver circuit. The control circuit 8012 outputs a signal to each of a scan line side and a signal line side. When performing digital drive, a structure where a signal dividing circuit 8013 is provided on the signal line side in order that an input digital signal is divided into m signals to be supplied.

Among the signals received by the tuner 8001, an audio signal is transmitted to an audio signal amplifier circuit 8004, and an output thereof is supplied to a speaker 8007 through an audio signal processing circuit 8005. A control circuit 8008 receives control data on receiving station (receiving frequency) and volume from an input portion 8009 and transmits signals to the tuner 8001 and the audio signal processing circuit 8005.

Figure 114A:
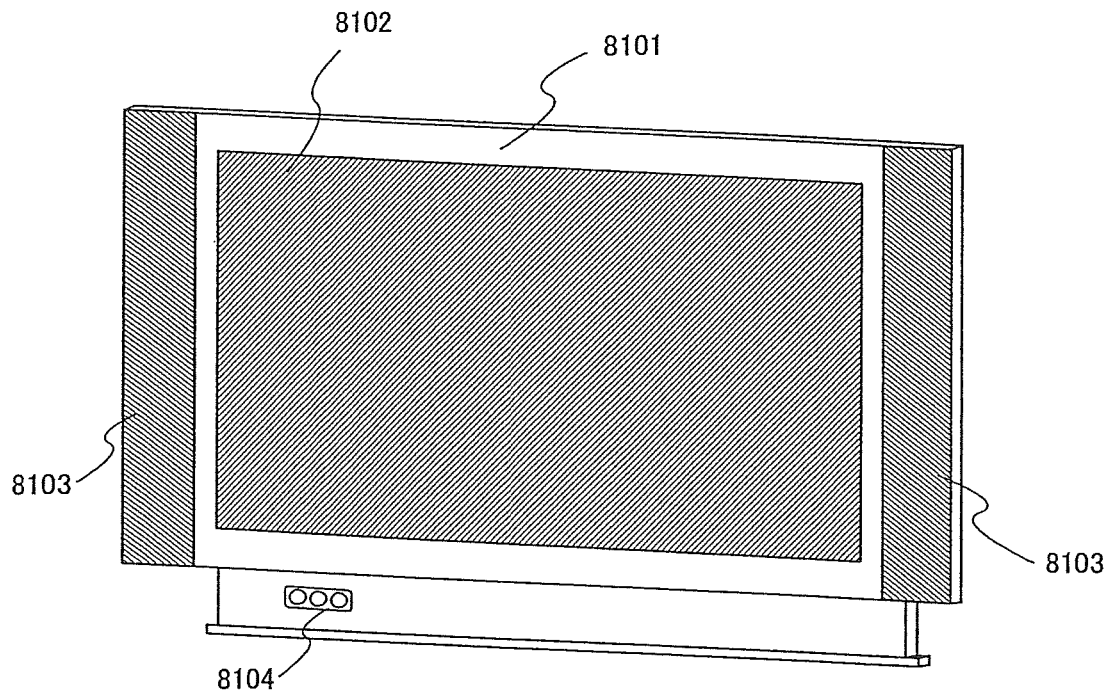
FIGS. 114A and 114B are views showing Embodiment 7.

FIG. 114A shows a television receiver incorporating an EL module having a different mode from that in FIG. 113. In FIG. 114A, a display screen 8102 is constituted by the EL module. In addition, a speaker 8103, operation switches 8104, and the like are provided in a housing 8101 as appropriate.

Figure 114B:
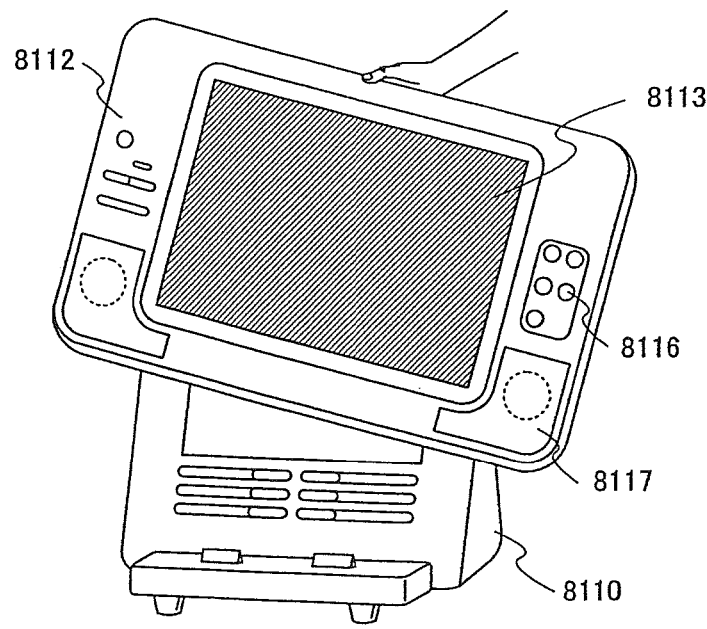

FIG. 114B shows a television receiver having a portable wireless display. A battery and a signal receiver are incorporated into a housing 8112. A display portion 8113 and a speaker portion 8117 are driven by the battery. The battery can be repeatedly charged by a battery charger 8110. The battery charger 8110 can transmit and receive a video signal and transmit the video signal to the signal receiver of the display. The housing 8112 is controlled by operation keys 8116. The device shown in FIG. 114B can also be referred to as a video-audio bidirectional communication device since a signal can be sent from the housing 8112 to the battery charger 8110 by operating the operation keys 8116. The device can also be referred to as a versatile remote control device since a signal can be sent from the housing 8112 to the battery charger 8110 by operating the operation keys 8116 and another electronic device is made to receive a signal which can be sent by the battery charger 8110, and accordingly, communication control of another electronic device is realized. The invention can be applied to the display portion 8113.

Figure 115A:
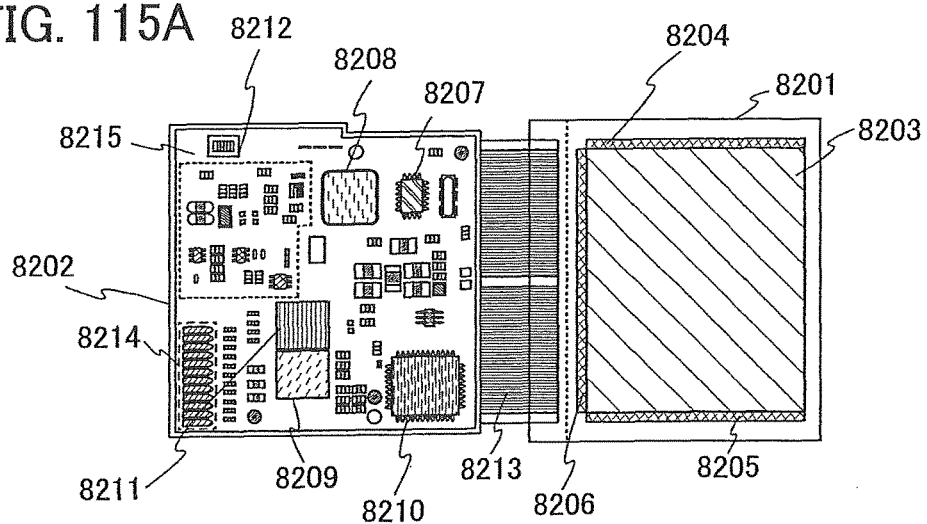
FIGS. 115A and 115B are diagrams showing Embodiment 7.

FIG. 115A shows a module formed by combining a display panel 8201 and a printed wiring board 8202. The display panel 8201 includes a pixel portion 8203 provided with a plurality of pixels, a first gate driver 8204, a second gate driver 8205, and a signal line driver circuit 8206 which supplies a video signal to a selected pixel.

The printed wiring board 8202 is provided with a controller 8207, a central processing unit (CPU 8208), a memory 8209, a power supply circuit 8210, an audio processing circuit 8211, a transmitting/receiving circuit 8212, and the like. The printed wiring board 8202 is connected to the display panel 8201 thorough a flexible printed circuit 8213 (FPC). The printed wiring board 8202 can be formed to have a structure in which a capacitor, a buffer circuit, and the like are provided in order to prevent noise on a power supply voltage or a signal, or dull signal rising. The controller 8207, the audio processing circuit 8211, the memory 8209, the CPU 8208, the power supply circuit 8210, and the like can be mounted to the display panel 8201 by using a COG (Chip On Glass) method. By using a COG method, the size of the printed wiring board 8202 can be reduced.

Various control signals are input and output through an interface portion (I/F portion 8214) which is included in the printed wiring board 8202. An antenna port 8215 for transmitting and receiving a signal to/from an antenna is included in the printed wiring board 8202.

Figure 115B:
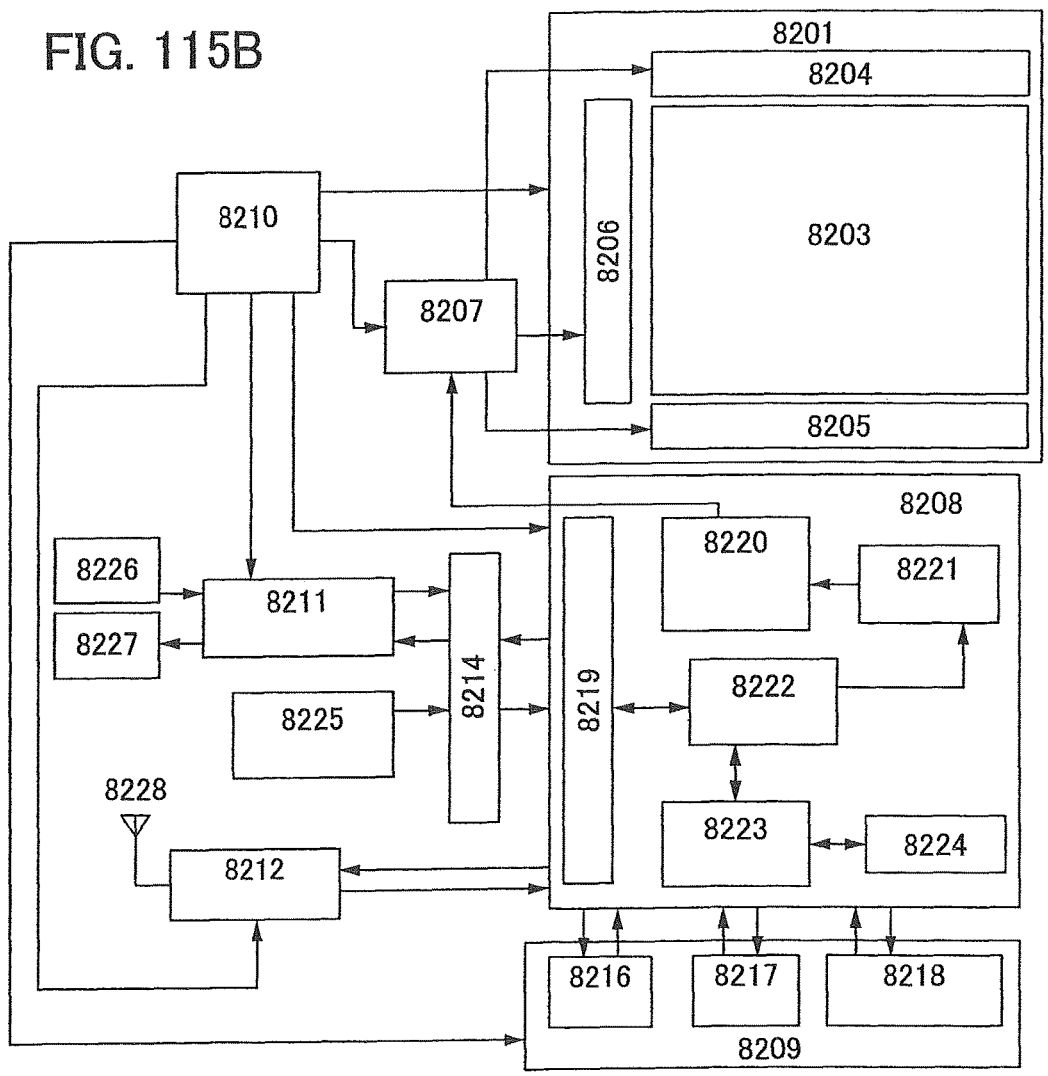

FIG. 115B is a block diagram of the module shown in FIG. 115A. The module includes a VRAM 8216, a DRAM 8217, a flash memory 8218, and the like as a memory 8209. The VRAM 8216 stores data on an image displayed on a panel, the DRAM 8217 stores video data or audio data, and the flash memory stores various programs.

The power supply circuit 8210 supplies electric power for operating the display panel 8201, the controller 8207, the CPU 8208, the audio processing circuit 8211, the memory 8209, and the transmitting/receiving circuit 8212. Depending on a panel specification, the power supply circuit 8210 is provided with a current source in some cases.

The CPU 8208 includes a control signal generation circuit 8220, a decoder 8221, a register 8222, an arithmetic circuit 8223, a RAM 8224, an interface 8219 for the CPU 8208, and the like. Various signals input to the CPU 8208 via the interface 8219 are once stored in the register 8222, and subsequently input to the arithmetic circuit 8223, the decoder 8221, or the like. The arithmetic circuit 8223 performs operation based on the input signal so as to designate a location to which various instructions are sent.

On the other hand, the signal input to the decoder 8221 is decoded and input to the control signal generation circuit 8220. The control signal generation circuit 8220 generates a signal including various instructions based on the input signal, and transmits the signal to the designated location by the arithmetic circuit 8223, specifically the location such as the memory 8209, the transmitting/receiving circuit 8212, the audio processing circuit 8211, and the controller 8207.

The memory 8209, the transmitting/receiving circuit 8212, the audio processing circuit 8211, and the controller 8207 are operated in accordance with the instructions received thereby respectively. Hereinafter, the operation is briefly described.

The signal input from an input unit 8225 is sent to the CPU 8208 mounted to the printed wiring board 8202 via the I/F portion 8214. The control signal generation circuit 8220 converts video data stored in the VRAM 8216 into a predetermined format depending on the signal sent from the input unit 8225 such as a pointing device or a keyboard, and transmits the converted data to the controller 8207.

The controller 8207 performs data processing of the signal including the video data sent from the CPU 8208 in accordance with the panel specification and supplies the signal to the display panel 8201. Further, the controller 8207 generates an Hsync signal, a Vsync signal, a clock signal CLK, an alternating voltage (AC Cont), and a switching signal L/R based on a power supply voltage from the power supply circuit 8210 or various signals input from the CPU 8208 and supplies the signals to the display panel 8201.

A signal which is to be received and sent by an antenna 8228 as an electric wave is processed by the transmitting/receiving circuit 8212. Specifically, the transmitting/receiving circuit 8212 includes a high-frequency circuit such as isolator, a band pass filter, a VCO (Voltage Controlled Oscillator), an LPF (Low Pass Filter), a coupler, or a balun. A signal including audio information among signals transmitted and received in the transmitting/receiving circuit 8212 is sent to the audio processing circuit 8211 in accordance with an instruction from the CPU 8208.

The signal including audio information which is sent in accordance with the instruction from the CPU 8208 is demodulated into an audio signal in the audio processing circuit 8211 and is sent to a speaker 8227. An audio signal sent from a microphone 8226 is modulated in the audio processing circuit 8211 and is sent to the transmitting/receiving circuit 8212 in accordance with an instruction from the CPU 8208.

The controller 8207, the CPU 8208, the power supply circuit 8210, the audio processing circuit 8211, and the memory 8209 can be mounted as a package according to this embodiment.

Needless to say, the invention is not limited to the television receiver. The invention can be applied to various usages especially as a large display medium such as an information display board at a railway station or an airport, an advertisement display board on the street, or the like, in addition to a monitor of a personal computer.

Note that this embodiment can be freely implemented in combination with any description in other embodiment modes and embodiments in this specification. That is, in a non-selection period, the transistor is turned on at regular intervals, so that the shift register circuit of the invention included in the electronic device described in this embodiment supplies a power supply potential to the output terminal. Therefore, the power supply potential is supplied to the output terminal of the shift register circuit through the transistor. Since the transistor is not always on in the non-selection period, the threshold voltage shift of the transistor can be suppressed. Further, the power supply potential is supplied to the output terminal of the shift register circuit through the transistor at regular intervals. Therefore, the shift register circuit can suppress noise which is generated in the output terminal.

This application is based on Japanese Patent Application serial No. 2006-001941 filed in Japan Patent Office on Jan. 7, 2006, the entire contents of which are hereby incorporated by reference.

The invention claimed is:

1. A semiconductor device comprising:
   a first transistor comprising a gate terminal, a first terminal, and a second terminal;
   a second transistor comprising a gate terminal, a first terminal, and a second terminal;
   a third transistor comprising a gate terminal, a first terminal, and a second terminal;
   a fourth transistor comprising a gate terminal, a first terminal, and a second terminal;
   a fifth transistor comprising a gate terminal, a first terminal, and a second terminal;
   a sixth transistor comprising a gate terminal, a first terminal, and a second terminal;
   a seventh transistor comprising a gate terminal, a first terminal, and a second terminal; and
   an eighth transistor comprising a gate terminal, a first terminal, and a second terminal;
   wherein the first terminal of the first transistor is electrically connected to the gate terminal of the second transistor, the first terminal of the fourth transistor, the gate terminal of the fifth transistor, and the first terminal of the seventh transistor,
   wherein the first terminal of the second transistor is electrically connected to the first terminal of the third transistor and an output terminal,
   wherein the gate terminal of the third transistor is electrically connected to the gate terminal of the fourth transistor, and the first terminal of the eighth transistor,
   wherein the first terminal of the fifth transistor is electrically connected to the first terminal of the sixth transistor, and the gate terminal of the eighth transistor,
   wherein the gate terminal of the sixth transistor is electrically connected to the second terminal of the sixth transistor, and
   wherein the second terminal of the eighth transistor is electrically connected to a wiring configured to be supplied with a control signal.

2. The semiconductor device according to claim 1, wherein the second terminal of the first transistor is electrically connected to a first power supply.

3. The semiconductor device according to claim 1, wherein the gate terminal of the sixth transistor and the second terminal of the sixth transistor is electrically connected to a first power supply.

4. The semiconductor device according to claim 1, wherein the second terminal of the eighth transistor is electrically connected to an input terminal.

5. The semiconductor device according to claim 1, wherein the second terminal of the second transistor is electrically connected to an input terminal.

6. The semiconductor device according to claim 1, wherein the second terminal of the seventh transistor is electrically connected to a second power supply.

7. The semiconductor device according to claim 1, wherein the output terminal is electrically connected to a buffer circuit.

8. A semiconductor device comprising:
a first transistor comprising a gate terminal, a first terminal, and a second terminal;
a second transistor comprising a gate terminal, a first terminal, and a second terminal;
a third transistor comprising a gate terminal, a first terminal, and a second terminal;
a fourth transistor comprising a gate terminal, a first terminal, and a second terminal;
a fifth transistor comprising a gate terminal, a first terminal, and a second terminal;
a sixth transistor comprising a gate terminal, a first terminal, and a second terminal;
a seventh transistor comprising a gate terminal, a first terminal, and a second terminal;
an eighth transistor comprising a gate terminal, a first terminal, and a second terminal; and
a capacitor comprising a first electrode and a second electrode,
wherein the first terminal of the first transistor is electrically connected to the gate terminal of the second transistor, the first terminal of the fourth transistor, the gate terminal of the fifth transistor, the first terminal of the seventh transistor, and the first electrode of the capacitor,
wherein the first terminal of the second transistor is electrically connected to the first terminal of the third transistor the second electrode of the capacitor, and an output terminal,
wherein the gate terminal of the third transistor is electrically connected to the gate terminal of the fourth transistor, and the first terminal of the eighth transistor,
wherein the first terminal of the fifth transistor is electrically connected to the first terminal of the sixth transistor, and the gate terminal of the eighth transistor,
wherein the gate terminal of the sixth transistor is electrically connected to the second terminal of the sixth transistor, and
wherein the second terminal of the eighth transistor is electrically connected to a wiring configured to be supplied with a control signal.

9. The semiconductor device according to claim 8, wherein the second terminal of the first transistor is electrically connected to a first power supply.

10. The semiconductor device according to claim 8, wherein the gate terminal of the sixth transistor and the second terminal of the sixth transistor is electrically connected to a first power supply.

11. The semiconductor device according to claim 8, wherein the second terminal of the eighth transistor is electrically connected to an input terminal.

12. The semiconductor device according to claim 8, wherein the second terminal of the second transistor is electrically connected to an input terminal.

13. The semiconductor device according to claim 8, wherein the second terminal of the seventh transistor is electrically connected to a second power supply.

14. The semiconductor device according to claim 8, wherein the output terminal is electrically connected to a buffer circuit.

15. A semiconductor device comprising:
a first flip-flop circuit, a second flip-flop circuit, and a third flip-flop circuit each comprising:
a first transistor comprising a gate terminal, a first terminal, and a second terminal;
a second transistor comprising a gate terminal, a first terminal, and a second terminal;
a third transistor comprising a gate terminal, a first terminal, and a second terminal;
a fourth transistor comprising a gate terminal, a first terminal, and a second terminal;
a fifth transistor comprising a gate terminal, a first terminal, and a second terminal;
a sixth transistor comprising a gate terminal, a first terminal, and a second terminal;
a seventh transistor comprising a gate terminal, a first terminal, and a second terminal;
an eighth transistor comprising a gate terminal, a first terminal, and a second terminal; and
a capacitor comprising a first electrode and a second electrode,
wherein the first terminal of the first transistor is electrically connected to the gate terminal of the second transistor, the first terminal of the fourth transistor, the gate terminal of the fifth transistor, the first terminal of the seventh transistor, and the first electrode of the capacitor,
wherein the first terminal of the second transistor is electrically connected to the first terminal of the third transistor, the second electrode of the capacitor, and an output terminal,
wherein the gate terminal of the third transistor is electrically connected to the gate terminal of the fourth transistor, and the first terminal of the eighth transistor,
wherein the first terminal of the fifth transistor is electrically connected to the first terminal of the sixth transistor, and the gate terminal of the eighth transistor, and
wherein the gate terminal of the sixth transistor is electrically connected to the second terminal of the sixth transistor;
wherein the gate of the first transistor in the second flip-flop circuit is electrically connected to the output terminal of the first flip-flop circuit,
wherein the gate of the seventh transistor in the second flip-flop circuit is electrically connected to the output terminal of the third flip-flop circuit,
wherein the second terminal of the eighth transistor in the first flip-flop circuit is electrically connected to a first wiring configured to be supplied with a first control signal, and
wherein the second terminal of the eighth transistor in the second flip-flop circuit is electrically connected to a second wiring configured to be supplied with a second control signal.

16. The semiconductor device according to claim 15, wherein the second terminal of the first transistor is electrically connected to a first power supply.

17. The semiconductor device according to claim 15, wherein the gate terminal of the sixth transistor and the second terminal of the sixth transistor is electrically connected to a first power supply.

18. The semiconductor device according to claim 15, wherein the second terminal of the eighth transistor is electrically connected to an input terminal.

19. The semiconductor device according to claim 15, wherein the second terminal of the second transistor is electrically connected to an input terminal.

20. The semiconductor device according to claim 15, wherein the second terminal of the seventh transistor is electrically connected to a second power supply.

21. The semiconductor device according to claim 15, wherein the output terminal is electrically connected to a buffer circuit.

* * * * *